United States Patent
Koike et al.

(10) Patent No.: US 10,239,279 B2
(45) Date of Patent: Mar. 26, 2019

(54) FUNCTION TRANSFER PRODUCT, FUNCTIONAL LAYER TRANSFER METHOD, PACKED PRODUCT, AND FUNCTION TRANSFER FILM ROLL

(71) Applicant: ASAHI KASEI KABUSHIKI KAISHA, Tokyo (JP)

(72) Inventors: Jun Koike, Tokyo (JP); Fujito Yamaguchi, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 737 days.

(21) Appl. No.: 14/407,332

(22) PCT Filed: Jun. 10, 2013

(86) PCT No.: PCT/JP2013/065930
§ 371 (c)(1),
(2) Date: Dec. 11, 2014

(87) PCT Pub. No.: WO2013/187349
PCT Pub. Date: Dec. 19, 2013

(65) Prior Publication Data
US 2015/0158268 A1    Jun. 11, 2015

(30) Foreign Application Priority Data

Jun. 13, 2012 (JP) .................................. 2012-134287
Jul. 27, 2012 (JP) .................................. 2012-167556
Dec. 21, 2012 (JP) .................................. 2012-280226

(51) Int. Cl.
*B32B 3/30* (2006.01)
*G03F 7/00* (2006.01)
(Continued)

(52) U.S. Cl.
CPC ............... *B32B 3/30* (2013.01); *B32B 27/08* (2013.01); *B32B 27/16* (2013.01); *B32B 27/38* (2013.01);
(Continued)

(58) Field of Classification Search
CPC .................................... B32B 3/30; B32B 3/20
See application file for complete search history.

(56) References Cited

U.S. PATENT DOCUMENTS 8,865,049 B2    10/2014  Taniguchi et al.
2008/0248334 A1  10/2008  Moriwaki et al.
(Continued)

FOREIGN PATENT DOCUMENTS

EP    2 330 876 A1    6/2011
JP    2001-27715 A    1/2001
(Continued)

OTHER PUBLICATIONS

Supplementary European Search Report completed Jun. 8, 2015, in European Patent Application No. 13804276.
(Continued)

*Primary Examiner* — William P Watkins, III
(74) *Attorney, Agent, or Firm* — Birch, Stewart, Kolasch & Birch, LLP

(57) ABSTRACT

A function transfer product (14) is provided with a carrier (10) having a concavo-convex structure (11) of nanostructure, and a functional layer (12) provided on the concavo-convex structure (11). The functional layer (12) is beforehand provided on the surface of the concavo-convex structure (11), and is directly brought into contact with one main surface of a target object (20), and then the carrier (10) is removed from the functional layer (12) to transfer the functional layer (12) to the target object (20). An average pitch of the concavo-convex structure (11) ranges from 1 nm
(Continued)

to 1500 nm, the functional layer (12) contains a resin, and a ratio (Ra/lor) between surface roughness (Ra) on the exposed surface side of the functional layer (12) and a distance between a top position of a convex-portion of the concavo-convex structure (11) and the exposed surface of the functional layer (12) is 1.2 or less. Further, the functional layer (12) is arranged inside concave portions (11a), and the exposed surface thereof is in a non-liquid state at a temperature of 20° C. under light shielding. It is possible to add the function onto the target object (20) with high accuracy.

18 Claims, 25 Drawing Sheets

(51) Int. Cl.
| | |
|---|---|
| B32B 37/00 | (2006.01) |
| B32B 37/18 | (2006.01) |
| B32B 38/10 | (2006.01) |
| B32B 27/08 | (2006.01) |
| B32B 27/16 | (2006.01) |
| B32B 27/38 | (2006.01) |
| B32B 27/42 | (2006.01) |

(52) U.S. Cl.
CPC ............ B32B 27/42 (2013.01); B32B 37/025 (2013.01); B32B 37/18 (2013.01); B32B 38/10 (2013.01); G03F 7/0002 (2013.01); B32B 2307/536 (2013.01); B32B 2307/538 (2013.01); B32B 2457/00 (2013.01); B32B 2457/18 (2013.01); B32B 2457/206 (2013.01); B32B 2551/00 (2013.01); H01L 2933/0083 (2013.01); Y10T 428/1352 (2015.01); Y10T 428/24355 (2015.01)

(56) References Cited

U.S. PATENT DOCUMENTS

| | | | |
|---|---|---|---|
| 2010/0092727 | A1 | 4/2010 | Uchida |
| 2010/0193469 | A1* | 8/2010 | Lee ..................... B81C 1/0046 |
| | | | 216/49 |
| 2011/0008577 | A1 | 1/2011 | Miyake et al. |
| 2011/0159245 | A1 | 6/2011 | Taniguchi et al. |
| 2011/0195189 | A1 | 8/2011 | Kawamura |
| 2011/0277922 | A1* | 11/2011 | Masuda ................. B85Y 10/00 |
| | | | 156/232 |
| 2013/0049255 | A1 | 2/2013 | Matsumoto et al. |
| 2013/0063826 | A1 | 3/2013 | Hoffmuller et al. |

FOREIGN PATENT DOCUMENTS

| | | | |
|---|---|---|---|
| JP | 2001-277200 A | | 10/2001 |
| JP | 2007-245702 A | | 9/2007 |
| JP | 2009-274365 A | | 11/2009 |
| JP | 2010-87500 A | | 4/2010 |
| JP | 2011-166855 A | | 8/2011 |
| JP | 2011-207221 A | | 10/2011 |
| JP | 2011-221334 A | | 11/2011 |
| JP | 2012-4547 A | | 1/2012 |
| TW | 201029915 A1 | | 8/2010 |
| WO | WO 2009/110162 A1 | | 9/2009 |
| WO | WO 2010/005032 A1 | | 1/2010 |
| WO | WO 2011/138039 A1 | | 11/2011 |

OTHER PUBLICATIONS

Office Action dated Dec. 24, 2014, in Japanese Patent Application No. 2013-263534.
English translation of International Preliminary Report on Patentability dated Dec. 24, 2014, in PCT International Application No. PCT/JP2013/065930.
Extended European Search Report dated May 20, 2016, in European Patent Application No. 15197729.5.
International Search Report, issued in PCT/JP2013/065930. dated Jul. 2, 2013.

* cited by examiner

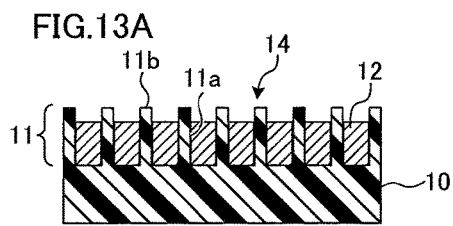
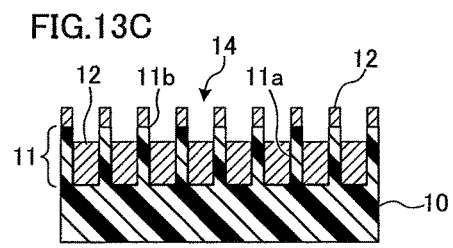
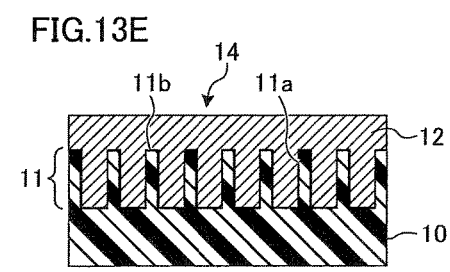

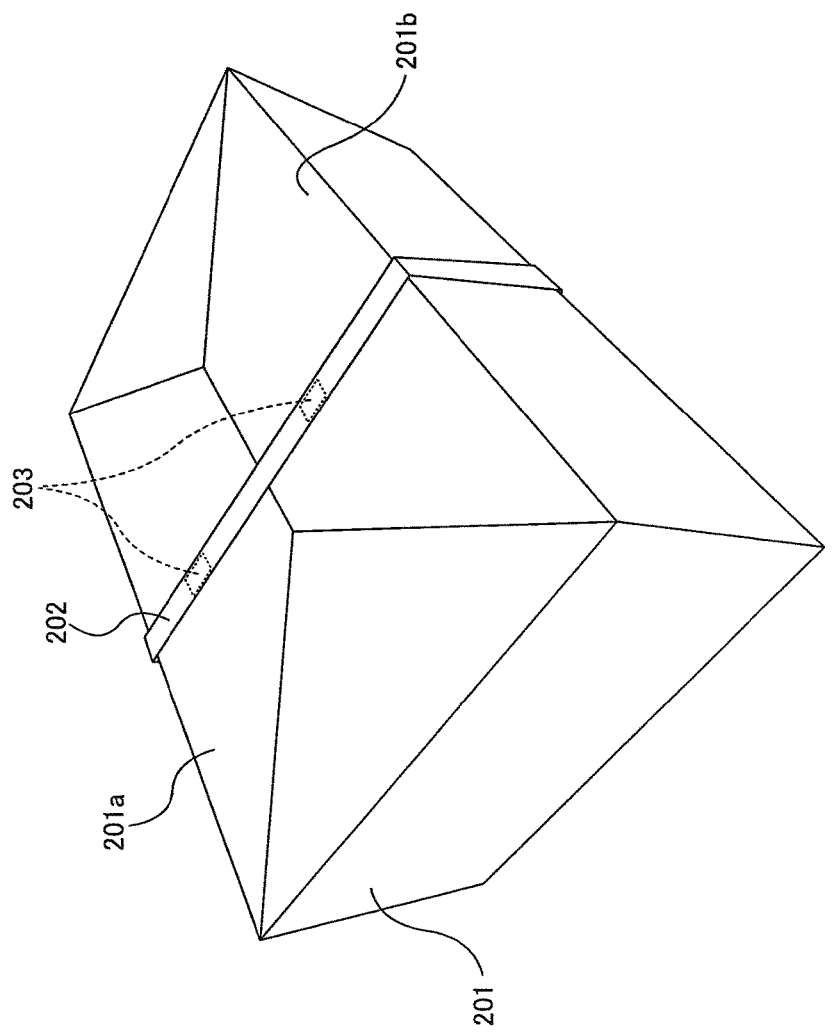

FUNCTION TRANSFER PRODUCT, FUNCTIONAL LAYER TRANSFER METHOD, PACKED PRODUCT, AND FUNCTION TRANSFER FILM ROLL

TECHNICAL FIELD

The present invention relates to a function transfer product, functional layer transfer method, packed product, and function transfer film roll used to provide a target object with a function.

BACKGROUND ART

Attention has been directed toward functions specific to nanostructure that do not develop in microstructure. For example, as an optical phenomenon, known are light diffraction, light scattering derived from light diffraction, refractive index conversion in an effective medium approximate, photonic crystal, optical confinement and the like. Further, optical additional functions such as the surface plasmon and dressed photon are also reported. Moreover, phenomena such as the surface area multiplying effect and strengthening of Lennard-Jones potential are also reported. By exploiting such a function specific to nanostructure, there are possibilities for achieving a high-efficient semiconductor light emitting device (LED and OLED), fuel cell, solar battery, photocatalyst, trace substance detecting sensor, superhydrophobic surface, superhydrophilic surface, slippery surface typified by SLIPS (Slippery Liquid-Infused Porous Surfaces), water collecting surface, water vapor collecting surface, anti-icing surface, anti-snow surface, antireflection surface, adhesive sheet without adhesive agent, radio feed, miniaturization of device and the like. Therefore, attention has been directed toward techniques for performing nano-processing on a target object itself and techniques for forming a layer having a desired nano-function on a target object.

Patent Document 1 discloses techniques of photocurable nanoimprint for performing nano-processing on a target object. In other words, a photocurable resin is used as a liquid functional raw material, and a functional layer to perform nano-processing on a target object is provided on the target object. In Patent Document 1, a predetermined photocurable resin is applied on a target object, and next, a concavo-convex structure of a mold is bonded and pressed to the photocurable resin film at a pressure ranging from 5 to 100 MPa. It is described that subsequently, the photocurable resin is cured, the mold is finally removed, and that it is thereby possible to obtain the target processing product provided with a functional layer to perform nano-processing on the target object.

Further, Patent Document 2 discloses techniques for processing a target object while adopting the techniques different from those in Patent Document 1. In Patent Document 2, an imprint material is applied onto a target film (target object), and next, a concavo-convex structure of a template is bonded. Subsequently, the imprint material is cured, and by removing the template, the concavo-convex structure is transferred onto the target film. Next, a mask is filled into concave portions of the transfer-formed concavo-convex structure, and the imprint material is processed. Finally, the target film is processed by regarding the left imprint material as a mask. In other words, by using the imprint material as a liquid functional raw material, the functional layer to perform nano-processing on the target object is provided on the target object (target film). In Patent Document 2, a predetermined imprint material is applied onto the target object, and a concavo-convex structure of a template provided with the concavo-convex structure on its surface is bonded.

PRIOR ART DOCUMENT

Patent Document

[Patent Document 1] International Publication No. 2009/110162 Pamphlet
[Patent Document 2] Japanese Unexamined Patent Publication No. 2011-165855

DISCLOSURE OF INVENTION

Problems to be Solved by the Invention

As the method of transferring a functional layer, two methods are conceivable corresponding to a use of a target object to transfer a function specific to nanostructure. First, a functional layer is transferred to a target object separately. Next, the transferred functional layer is caused to function as a processing mask of the target object, accuracy of the processing mask is reflected, and the target object is subjected to nano-processing. In either case, it is required to enhance accuracy of the functional layer to transfer onto the target object i.e. structure accuracy and film thickness accuracy. In either of techniques exemplified as described above, a liquid functional raw material (curable resin, etc.) is nipped between a target object and a concavo-convex structure surface of a mold provided with the concavo-convex structure to add the function, and next, the functional raw material is cured. Finally, by removing the mold, the functional layer is added onto the target object. In other words, in the case of providing the target object with the function, the product undergoes operation for controlling the structure of the functional layer and accuracy of a film thickness. Therefore, problems exist as described below.

(1) In the case of forming a film of a functional raw material on a target object, as the target object increases in size, and then, flatness of the surface of the target object decreases, film thickness uniformity is decreased in the formed functional raw material film. Further, it is very difficult to control a defect and flaw on the target object surface and a foreign substance of submicron, and when such unevenness exists, the functional raw material film splits in the unevenness portion to cause a coating failure. Furthermore, the operation for bonding the concavo-convex structure surface of the mold after forming the film of the liquid functional raw material on the target object increases the film thickness distribution due to the flow of the entire functional raw material film. Such splitting of the functional raw material film leads to a defect of the functional layer formed on the target object, and therefore, a portion (function incomplete portion) that does not exert the function occurs. Still furthermore, the film thickness distribution of the functional raw material film leads to the film thickness distribution of the functional layer formed on the target object, and therefore, fluctuations occur in the function to exert. Moreover, in the case of applying the functional raw material to the target object, there are limitations on the size of the apparatus for applying with high accuracy, and in order to form a liquid functional raw material film with high accuracy and large area, the needs arise for designing an excessive facility.

On the other hand, in the case of applying a liquid functional raw material onto a nanostructure surface of a mold to bond to a target object, the flow of the entire liquid functional raw material film occurs, and the film thickness distribution increases in the functional raw material film. Particularly, in the case of performing the operation on the target object with a large area or on the target object low in surface flatness, it is difficult to control a pressure in bonding, and the film thickness distribution of the functional raw material film further increases. Further, in the case where unevenness exists and the functional raw material film thickness is thinner than the unevenness, the liquid functional raw material film flows and splits in the unevenness portion, and an air void occurs. The size of the air void is larger than the diameter of the unevenness. By such a film thickness distribution of the functional raw material film, fluctuations occur in the function to exert. Furthermore, by the air void, the function incomplete portion is developed. Still furthermore, as coating properties of the functional raw material onto the concavo-convex structure of the mold are improved, in other words, as compatibility between the mold and the functional raw material is improved, the adhesion strength between the functional raw material and the mold is increased, and therefore, function transfer accuracy to the target object is reduced. Conversely, as the adhesion strength between the functional raw material and the mold is decreased, the coating properties are reduced, and such problems exist.

(2) In the case of forming a film of a liquid functional raw material on a target object, next bonding a concavo-convex structure surface of a mold, finally removing the mold and thereby adding the function onto the target object, flow filling of the functional raw material into the concavo-convex structure of the mold and wettability of the functional raw material with respect to the processing target material affects function transfer accuracy significantly. The flow filling mainly undergoes the effects of interface free energy between the mold and the functional raw material, interface free energy between the functional raw material and the target object, the viscosity of the functional raw material, and the pressing force in bonding. By controlling these factors, it is possible to fill the concavo-convex structure of the mold with the functional raw material. In other words, in the case of limiting materials of the mold and the target object, the range of usable functional raw materials is limited. Further, in the case of limiting materials of the mold and the functional raw material, the range of usable target objects is limited. In order to solve the problems, proposed is a method of adding a surfactant and leveling agent to the functional raw material, and since such additives are impurities for the functional raw material, there is the case of causing reduction in the function.

Further, in the case of using the functional layer transferred onto the target object as a processing mask to process the target object as exemplified in Patent Document 1, it is necessary to remove a residual layer of the functional layer transferred onto the target object i.e. portions positioned under the concave bottom portions of the concavo-convex structure of the functional layer. Herein, in order to reflect accuracy of the functional layer with high accuracy and process the target object, it is necessary to thin the thickness of the residual layer and increase the height of the concavo-convex structure. In order to thin the thickness of the residual layer, it is necessary to lower the viscosity of the functional raw material and increase the pressing force of the mold. As the thickness of the residual layer is thinned, the elastic modulus of the functional raw material film is increased due to the effect specific to nanoscale, and therefore, in the pressing force range of the extent to which the mold does not break, limitations occur in uniformly thinning the residual layer thickness. On the other hand, since as the residual layer thickness is thinned, the distribution of the residual layer is apparently increased, there are cases that uniformity of stress applied to the functional layer is reduced in removing the mold to break the functional layer, and that the functional layer adheres to the mold side by peeling stress concentrated on the interface between the functional raw material and the target object. Further, as the concavo-convex structure depth of the mold is deepened, flow filling properties of the functional raw material are reduced, and furthermore, since an absolute value of stress to the functional layer is increased in removing the mold, the transfer failure occurs frequently.

In addition, in the techniques as exemplified in Patent Document 2, it is possible to increase the residual layer thickness to some extent. This is because concave-portion inner portions of the concavo-convex structure of the functional layer are filled with the mask to process after transferring the functional layer. In this case, uniformity of the residual layer thickness determines processing accuracy. In other words, as described above, the distribution of the residual layer thickness develops the distribution of the processing mask, and the distribution occurs in the nanostructure of the target object processed with the mask.

As described above, by nipping a liquid functional raw material between a target object to add the function and a concavo-convex structure surface of a mold provided with the concavo-convex structure, finally removing the mold and thereby adding the function onto the target object, the film thickness distribution of the functional layer added onto the target object is large, and fluctuations occur in the function. Further, by defects caused by coating failure and transfer failure, function incomplete portions are formed. Furthermore, in the case of forming a film of a liquid functional raw material on a target object, since an excessive functional raw material is used to improve film formation properties, environmental suitability is reduced. Still furthermore, the facility to decrease the film thickness distribution of the functional layer is excessive and is not practical. Moreover, as described above, since it is difficult to add a desired function onto a target object, particularly, on a target object with a large area, and further, the institution to provide the target object with the function is limited, although theoretical researches on functions specific to nanostructure have proceeded irrespective of the educational field or industrial field, studies using the demonstration and substance are delayed.

The present invention was made in view of the problems as described above, and it is an object of the invention to provide a function transfer product, functional layer transfer method, packed product and function transfer film roll for enabling a function to be added onto a target object with high accuracy.

Means for Solving the Problem

A function transfer product of the present invention is characterized by comprising a carrier provided with a concavo-convex structure on its surface, and at least one functional layer or more provided on the concavo-convex structure, where an average pitch of the concavo-convex structure ranges from 1 nm to 1500 nm, the functional layer contains a resin, and a ratio (Ra/lor) between surface roughness (Ra) on the exposed surface side of the functional layer and a distance (lor) between a top position of a convex-portion of the concavo-convex structure and the exposed surface of the functional layer is 1.2 or less.

A function transfer product of the present invention is characterized by comprising a carrier provided with a concavo-convex structure on its surface, and at least one functional layer or more provided on the concavo-convex structure, where the functional layer contains a resin, an average pitch of the concavo-convex structure ranges from 1 nm to 1500 nm, and space exists in each concave portion of the concavo-convex structure.

A functional layer transfer method of the present invention is characterized by including a step of directly bringing a functional layer of the function transfer product as described above into contact with one main surface of a target object, and a step of removing the carrier from the functional layer, in this order.

A packed product of the present invention is characterized by packing the function transfer product as described above in a resin-made case.

A function transfer film roll of the present invention is characterized in that the function transfer product as described above is in the shape of a film, one end portion of the function transfer product is connected to a core, and that the function transfer product is wound around the core.

Advantageous Effect of the Invention

According to the present invention, by providing a target object with a function in an optimal place using the function transfer product, it is possible to add the function onto the target object with high accuracy and high efficiency.

BRIEF DESCRIPTION OF DRAWINGS

FIG. 13 contains cross-sectional schematic diagrams illustrating arrangement examples in nanostructure of the carrier of a functional layer in the function transfer product according to this Embodiment;

FIG. 20 is a perspective diagram illustrating a resin-made case to pack the function transfer product according to this Embodiment;

BEST MODE FOR CARRYING OUT THE INVENTION

Figure 1A:
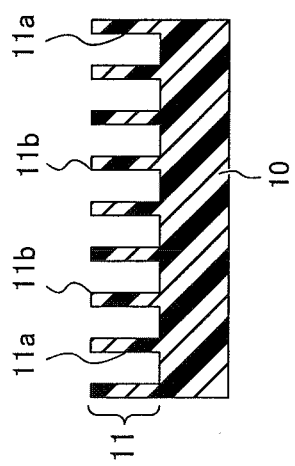
FIG. 1 contains cross-sectional schematic diagrams illustrating each step of a method of adding a function to a target object using a function transfer product according to this Embodiment.

The general outlines of the present invention will be described first.

A function transfer product of the present invention is characterized by comprising a carrier provided with a concavo-convex structure on its surface, and at least one functional layer or more provided on the concavo-convex structure, where an average pitch of the concavo-convex structure ranges from 1 nm to 1500 nm, the functional layer contains a resin, and a ratio (Ra/lor) between surface roughness (Ra) on the exposed surface side of the functional layer and a distance (lor) between a top position of a convex-portion of the concavo-convex structure and the exposed surface of the functional layer is 1.2 or less.

According to this configuration, it is possible to transfer the functional layer onto a target object while reflecting accuracy of the concavo-convex structure of the carrier and film thickness accuracy of the functional layer. In other words, it is possible to transfer the functional layer provided with the concavo-convex structure, with high accuracy, to a predetermined position or the entire surface of the target object having a desired shape, size or material in a place suitable for use of the target object.

In the function transfer product of the invention, the surface roughness (Ra) preferably ranges from 2 nm to 300 nm.

According to this configuration, in addition to the above-mentioned effect, industrial properties are significantly improved in manufacturing the function transfer product.

A function transfer product of the invention is characterized by comprising a carrier provided with a concavo-convex structure on its surface, and at least one functional layer or more provided on the concavo-convex structure, where the functional layer contains a resin, an average pitch of the concavo-convex structure ranges from 1 nm to 1500 nm, and space exists in each concave portion of the concavo-convex structure.

According to this configuration, it is possible to transfer the functional layer onto a target object while reflecting accuracy of the concavo-convex structure of the carrier and film thickness accuracy of the functional layer, and it is possible to improve versatility of the function derived from nanostructure of the functional layer. In other words, it is possible to transfer the functional layer provided with the concavo-convex structure, with high accuracy, to a predetermined position or the entire surface of the target object having a desired shape, size or material in a place suitable for use of the target object.

In the function transfer product of the invention, it is preferable that the exposed surface on the side opposite to the carrier of the function transfer product is in a non-liquid state at a temperature of 20° C. under light shielding.

According to this configuration, physical stability of the function transfer product is improved, and therefore, even in the case of transporting the function transfer product to a place suitable for use of the target object, it is possible to maintain accuracy of the functional layer of the function transfer product.

In this case, in a temperature range of exceeding 20° C. to 300° C., it is preferable that the exposed surface on the side opposite to the carrier of the function transfer product exhibits tackiness, or that tackiness of the exposed surface is increased.

According to this configuration, since physical stability of the function transfer product is improved while maintaining adhesion between the functional layer and the target object in bonding the function transfer product to the target object, and therefore, even in the case of transporting the function transfer product to a place suitable for use of the target object, it is possible to transfer the functional layer onto the target object while reflecting accuracy of the functional layer of the function transfer product.

In the function transfer product of the invention, it is preferable that the resin contains a polar group.

According to this configuration, since it is possible to particularly increase interface adhesion strength between the target object and the functional layer, transfer accuracy of the functional layer is improved.

In the function transfer product of the invention, it is preferable that the polar group contains at least one polar group or more selected from the group consisting of an epoxy group, a hydroxyl group, an acryloyl group, a methacryloyl group, a vinyl group, a carboxyl group, and a carbonyl group.

According to this configuration, it is possible to increase the interface adhesion strength between the target object and the functional layer, while decreasing the interface adhesion force between the functional layer and the carrier, and therefore, the transfer accuracy of the functional layer is improved.

In the function transfer product of the invention, it is preferable that the functional layer contains a photocurable substance.

According to this configuration, particularly, since is possible to decrease the interface adhesion force between the functional layer and the carrier, the transfer accuracy of the functional layer is improved.

In the function transfer product of the invention, it is preferable that the ratio (Ra/lor) is 0.75 or less.

According to this configuration, it is possible to suppress a destruction of the functional layer while increasing an adhesion area and adhesion force between the functional layer and the target object, and therefore, transfer properties are improved.

In the function transfer product of the invention, it is preferable that an average aspect (A) of the concavo-convex structure ranges from 0.1 to 5.0.

According to this configuration, it is possible to suppress a defect of the concavo-convex structure of the functional layer transferred to the target object.

In the function transfer product of the invention, it is preferable that the ratio (Ra/lor) is 0.25 or less.

According to this configuration, it is possible to suppress a destruction of the functional layer while increasing the adhesion area and adhesion force between the functional layer and the target object, and therefore, transfer properties are improved.

In the function transfer product of the invention, the carrier is provided with a concavo-convex structure A on a part or whole of the surface, and it is preferable that in the concavo-convex structure A, a ratio (Mcv/Mcc) between a top width of a convex-portion (Mcv) and an opening width of a concave-portion (Mcc) and a ratio (Sh/Scm) between an opening portion area (Sh) existing in a region of a unit area (Scm) of the concavo-convex structure A and the unit area (Scm) meet following equation (1), the ratio (Sh/Scm) meets following equation (2), the ratio (Mcv/Mcc) meets following equation (3), and the average aspect (A) of the concavo-convex structure A meets following equation (4).

[Mathematical Expression 1]

$$\sqrt{0.5/(Sh/Scm)}-1 \leq Mcv/Mcc \leq \sqrt{1.1/(Sh/Scm)}-1 \qquad \text{Eq. (1)}$$

$$0.23<(Sh/Scm)\leq 0.99 \qquad \text{Eq. (2)}$$

$$0.01\leq(Mcv/Mcc)<1.0 \qquad \text{Eq. (3)}$$

$$0.1\leq A\leq 5 \qquad \text{Eq. (4)}$$

According to this configuration, since arrangement accuracy of the functional layer is improved with respect to the concavo-convex structure of the carrier, and it is possible to suppress a destruction of the functional layer in removing the carrier from the functional layer, transfer accuracy of the functional layer is improved with respect to the target object.

In the function transfer product of the invention, it is preferable that the resin contains a cyclic portion.

In the function transfer product of the invention, it is preferable that the cyclic portion is comprised of at least one or more elements selected from the group consisting of a 4-membered ring, a 5-membered ring and a 6-membered ring.

According to these configurations, the interface adhesion strength is decreased in the concavo-convex structure of the carrier and the functional layer, and therefore, transfer properties are improved.

In the function transfer product of the invention, it is preferable that the functional layer contains the resin and a monomer.

In this case, physical stability of the function transfer product is improved. Therefore, even in the case of transporting the function transfer product to a place suitable for use of the target object, it is possible to transfer the functional layer with high accuracy and performance to the target object.

In the function transfer product of the invention, it is preferable that the functional layer contains a photocurable resin or a photocurable monomer.

According to this configuration, it is possible to decrease the interface adhesion strength between the functional layer and the concavo-convex structure of the carrier by the cure shrinkage action, and it is thereby possible to improve the velocity in transferring the functional layer of the function transfer product to the target object.

In the function transfer product of the invention, it is preferable that the concavo-convex structure contains at least one or more elements selected from the group consisting of a fluorine element, a methyl group and a siloxane bond.

According to this configuration, it is possible to decrease the adhesion force between the carrier and the functional layer, and therefore, transfer accuracy is improved.

In the function transfer product of the invention, it is preferable that a ratio (Es/Eb) between a surface layer fluorine element concentration (Es) on the functional layer surface side of the concavo-convex structure and an average fluorine element concentration (Eb) of the concavo-convex structure exceeds 1 and is 30000 or less.

According to this configuration, arrangement accuracy of the functional layer is improved with respect to the function transfer product, while transfer properties of the functional layer are improved with respect to the target object. Further, repletion use properties of the carrier are improved.

In the function transfer product of the invention, it is preferable that the carrier is in the shape of a film, and that a width of the carrier is 3 inches or more.

According to this configuration, it is possible to transfer a seamless functional layer to the target object.

A functional layer transfer method of the invention is characterized by including a step of directly bringing a functional layer of the function transfer product as described above into contact with one main surface of a target object, and a step of removing the carrier from the functional layer, in this order.

According to this configuration, it is possible to add the functional layer to the target object without using an adhesive separately, and therefore, the effect of the functional layer is developed maximally.

A packed product of the invention is characterized by packing the function transfer product as described above in a resin-made case.

According to this configuration, it is possible to suppress the occurrence of a foreign substance in using the function transfer product in a place suitable for use of the target object, and to reuse the resin-made case.

A function transfer film roll of the invention is characterized in that the function transfer product as described above is in the shape of a film, one end portion of the function transfer product is connected to a core, and that the function transfer product is wound around the core.

According to this configuration, it is possible to add the function to the target object continuously, to improve accumulation properties in transporting the function transfer product, and to suppress the occurrence of a defect of the function transfer product in transportation.

<General Outlines of the Function Transfer Product>

An Embodiment of the present invention will specifically be described below with reference to drawings.

FIGS. 1 and 2 contain cross-sectional schematic diagrams illustrating each step of a method of adding a function to a target object using a function transfer product according to this Embodiment.

First, as shown in FIG. 1A, a concave-convex structure is formed on one main surface of a carrier 10. The concavo-convex structure 11 is a nanostructure comprised of pluralities of concave portions 11a and convex portions 11b. Hereinafter, the concavo-convex structure 11 is also referred to as a nanostructure 11. For example, the carrier 10 is in the shape of a film or in the shape of a sheet.

Figure 1B:
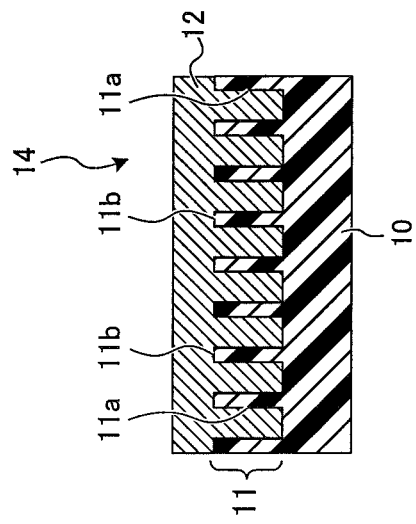
Figure 1C:
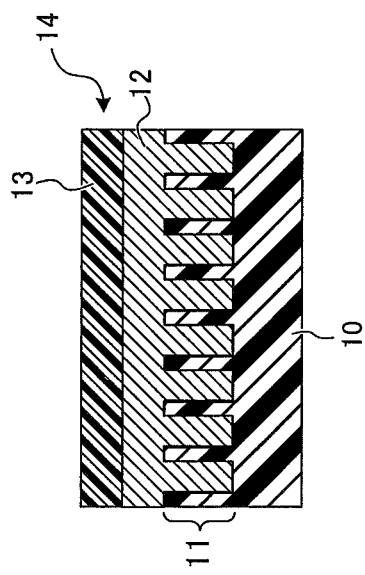

Next, as shown in FIG. 1B, a functional layer 12 is provided on the surface of the nanostructure 11 of the carrier 10. The arrangement of the functional layer 12 and the number of layers of the functional layer 12 are not limited thereto. Further, as shown in FIG. 1C, it is possible to provide a protective layer 13 on the functional layer 12. The protective layer 13 is to protect the functional layer 12 and is not indispensable. Hereinafter, a layered product formed of the carrier 10 and the functional layer 12 is called the function transfer product 14.

Figure 2C:
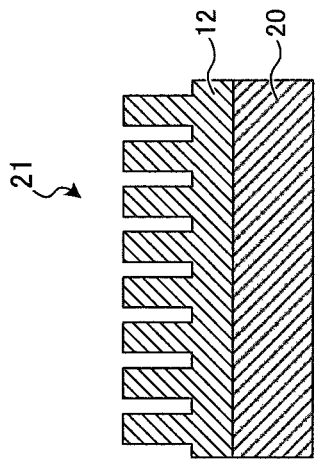
FIG. 2 contains cross-sectional schematic diagrams illustrating each step of the method of adding a function to a target object using a function transfer product according to this Embodiment.
Figure 2B:
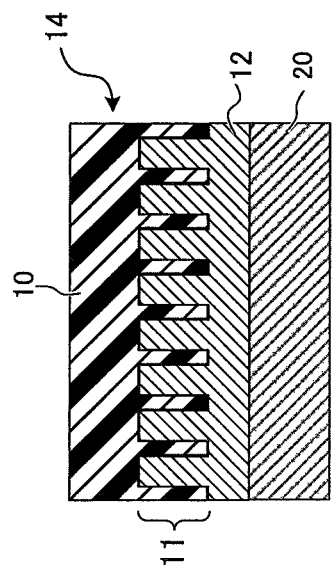
Figure 2A:
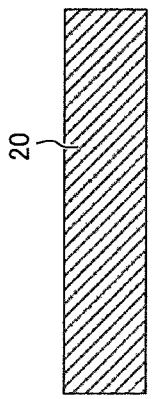

Next, a target object 20 as shown in FIG. 2A is prepared. Next, as shown in FIG. 2B, an exposed surface of the functional layer 12 of the function transfer product 14 after removing the protective layer 13 is directly brought into contact with the main surface of the target object 20. Next, as shown in FIG. 2C, the carrier 10 is removed from the functional layer 12. As a result, a layered product 21 formed of the functional layer 12 and the target object 20 is obtained. As the layered product 21, corresponding to a use thereof, it is possible to use the layered product 21 in a state of the layered product 21, or it is possible to cause the functional layer 12 of the layered product 21 to function as a processing mask of the target object 20 and then, use after performing nano-processing on the target object 20. Herein, it is the gist of transferring the functional layer 12 to the target object 20 with high accuracy to improve adhesion strength between the functional layer 12 and the target object 20, and to suppress a destruction of the functional layer 12 in removing the carrier 10. In addition, in the following description, the functional layer 12 of the layered product 21 and the nanostructure 11 of the functional layer 12 of the layered product 21 may also be described respectively as a functional layer S12 and a nanostructure S11.

In addition, in between contact and removal as described above, for example, the layered product 21 is irradiated with an energy ray to stabilize the functional layer 12. Further, for example, by heat applied in contact, the functional layer 12 is stabilized. Alternatively, for example, after irradiating the layered product 21 with the energy ray, the layered product 21 is heated to stabilize the functional layer 12. Furthermore, by providing a shield mask for the energy ray in applying the energy ray, it is possible to obtain the layered product 21 provided with the patterned functional layer 12.

In this Embodiment, steps from the carrier 10 up to the obtainment of the function transfer product 14 as shown in FIGS. 1A to 1C are performed in one line (hereinafter, referred to a first line). Subsequent steps as shown in FIGS. 2A to 2C are performed in another line (hereinafter, referred to as a second line). In a more preferable aspect, the first line and the second line are performed in different facilities. Therefore, in the function transfer product 14, for example, the carrier 10 is in the shape of a film, and in the case of having flexibility, the function transfer product 14 is made a function transfer film roll in the shape of a roll and is stored or transported.

In a further preferable aspect, the first line is a line of a supplier of the function transfer product 14, and the second line is a line of a user of the function transfer product 14. By thus beforehand mass producing the function transfer products 14 in the supplier to provide to the user, there are advantages as described below.

(1) It is possible to add the function to the target object 20 and manufacture the layered product 21, while reflecting accuracy of the nanostructure 11 of the carrier 10 and thickness accuracy of the functional layer 12 forming the function transfer product 14. In other words, in the line of the supplier, it is possible to beforehand determine the accuracy such as the shape and arrangement of the nanostructure 11 and the thickness of the functional layer 12. Then, in the line of the user, it is possible to add the accuracy of the functional layer 12 that is beforehand determined to the entire surface of the target object 20 or in only a predetermined range of the target object 20 with high accuracy, without using complicated process and apparatus.

(2) It is possible to manufacture the layered product 21 using the function transfer product 14 in a place best suited to using the target object 20 provided with the function. In other words, in a user's line best suited for use of the layered product 21, it is possible to add the function to the target object 20 using the function transfer product 14. Accordingly, it is possible to shorten a shift distance up to use of the layered product 21 in the user's line and simplify the process, and it is thereby possible to suppress adherence of a foreign substance to the functional layer 12 of the layered product 21 and breakage of the functional layer S12. By this means, for example, it is possible to manufacture a device having the stable function in the target object surface.

As described above, the function transfer product 14 is a layered product comprised of the carrier 10, and the functional layer 12 provided on the nanostructure 11 of the carrier 10. In other words, it is possible to beforehand determine and guarantee the accuracy (shape, arrangement and the like of the nanostructure) of the nanostructure and thickness accuracy of the functional layer dominating function accuracy of the layered product 21 with the accuracy of the nanostructure 11 of the carrier 10 of the function transfer product 14 and thickness accuracy of the functional layer 12 of the function transfer product 14. Further, by making the first line the line of the supplier of the function transfer product 14 and the second line the line of the user of the function transfer product 14, it is possible to obtain the layered product 21 in an environment that is the most suitable for addition of the function to the target object 20 and that is the most suitable for use of the layered product 21. Therefore, it is possible to improve accuracy (yield) and throughput in the layered product 21 and device assembly using the layered product 21.

Figure 3:
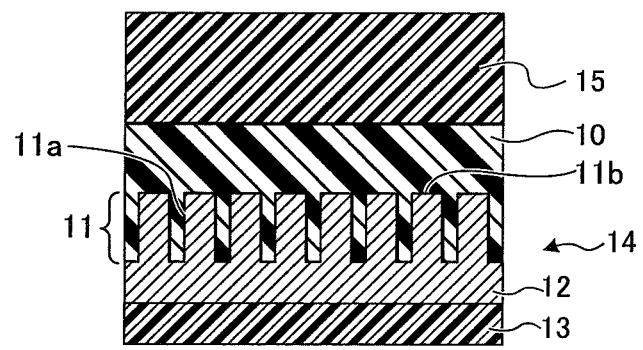
FIG. 3 is a cross-sectional diagram illustrating the function transfer product according to this Embodiment.

The function transfer product 14 according to this Embodiment will more specifically be described with reference to FIG. 3. FIG. 3 is a cross-sectional schematic diagram illustrating the function transfer product according to this Embodiment. As shown in FIG. 3, the function transfer product 14 is provided with the carrier 10. The carrier 10 is provided with the nanostructure 11 on its surface. The nanostructure is the concavo-convex structure 11 described with reference to FIG. 1A, where the concavities and convexities are of nano-order, and particularly, the average pitch of the concavities and convexities ranges from 1 nm to 1500 nm. The functional layer 12 is provided on the surface of the nanostructure 11. The arrangement of the functional layer 12 with respect to the nanostructure 11 is determined according to a use of the layered product 21, and therefore, is not limited particularly. Further, it is possible to provide the protective layer 13 on the exposed surface side of the functional layer 12. Furthermore, it is possible to provide a support substrate 15 on the surface on the side opposite to the nanostructure 11 of the carrier 10. In the following description, unless otherwise specified, both in the case where the carrier 10 is formed of only the nanostructure and in the case where the carrier 10 is formed of the nanostructure 11 and the support substrate 15, the carrier is simply expressed as the carrier 10.

<Essential Requirements (A) to (E) of the Function Transfer Product>

The function transfer product 14 according to this Embodiment as described above is one of the following function transfer products. First, the function transfer product (hereinafter, also referred to as a first function transfer product) is characterized in that:

(A) at least one functional layer 12 or more are beforehand provided on the nanostructure 11 of the carrier 10 provided with the nanostructure 11 on its surface;

(B) the average pitch of the nanostructure 11 ranges from 1 nm to 1500 nm;

(C) the functional layer 12 contains a resin; and (D) the ratio (Ra/lor) between surface roughness (Ra) on the exposed surface side of the functional layer 12 and a distance (lor) between a top position of a convex-portion of the nanostructure 11 and the exposed surface of the functional layer 12 is 1.2 or less.

Second, the function transfer product (hereinafter, also referred to as a second function transfer product) is characterized in that:

(A) at least one functional layer 12 or more are beforehand provided on the nanostructure 11 of the carrier 10 provided with the nanostructure 11 on its surface;

(B) the average pitch of the nanostructure 11 ranges from 1 nm to 1500 nm;

(C) the functional layer 12 contains a resin; and (E) space exists in each of the concave portions 11a of the nanostructure 11.

By containing a portion concurrently meeting these requirements (A), (B), (C) and (D) or (A), (B), (C) and (E), the following effects are exhibited. By using the function transfer product 14, it is possible to transfer the functional layer 12 with high accuracy to a part or the whole of the surface of a desired target object 20. It is possible to perform this transfer in a place that is the most suitable for using the layered product 21. Herein, it is the gist of exhibiting such effects to enhance arrangement accuracy and thickness accuracy with respect to the nanostructure 11 of the functional layer 12 of the function transfer product 14, improve adhesion strength between the functional layer 12 and the target object 20, and to suppress a destruction of the functional layer 12 in removing the carrier 10.

(1) As shown in above-mentioned (A), since the functional layer 12 is beforehand provided on the nanostructure 11 of the carrier 10, arrangement accuracy and thickness accuracy of the functional layer 12 with respect to the nanostructure 11 is improved. Herein, the arrangement accuracy is that the functional layer 12 is provided on the nanostructure 11 so as to reflect accuracy of the shape or arrangement of the nanostructure 11. Therefore, although details are explained in the following <Arrangement of the functional layer>, it is possible to arrange the functional layer 12 only near the bottom portion of each concave portion 11a, on the vertex portion of each convex portion 11b or only the side surface portion of each concave portion 11a of the nanostructure 11 of the carrier 10, arrange the functional layer 12 in the concave portions 11a and on the convex portions 11b of the nanostructure 11 so as to form a coating, or arrange the functional layer 12 to fill and flatten the nanostructure 11. By beforehand providing the functional layer 12 on the nanostructure 11 irrespective of the arrangement example of the functional layer 12 with respect to the nanostructure 11, it is possible to improve the arrangement accuracy and thickness accuracy of the functional layer 12. In other words, the functional layer 12 transferred onto the target object 20 is provided with a nanostructure having the arrangement and shape corresponding to the nanostructure 11 of the carrier 10. In other words, it is possible to beforehand determine and guarantee the thickness accuracy of the functional layer S12 and accuracy of the nanostructure S11 of the layered product 21 as the function transfer product 14. Accordingly, it is possible to add the function derived from the nanostructure to the target object 20 with high accuracy.

In the function transfer product 14, the effects exerted by beforehand providing the functional layer 12 will be described more specifically, using, an example, the case of providing the functional layer 12 to fill the concave portions 11a of the nanostructure 11 of the carrier 10. For example, in a photo nanoimprint method, the nanostructure of the mold and the target object are nipped via a liquid photocurable resin (functional raw material), and the photocurable resin is cured in this state. Herein, there is the case of thinning the film thickness of the photocurable resin so as to effectively develop the function derived from the nanostructure. When the film thickness of a photocurable resin is thinned to submicron scale, since the photocurable resin behaves as a viscous fluid having values of a viscosity and elastic modulus larger than those measured in the bulk raw material, filling properties into the concave portions of the nanostructure of the mold are reduced, resulting in filling failure. In other words, there is the case where nano-bubbles are generated inside the concave portion of the nanostructure of the mold. For example, a mold formed of a fluorine resin having a nanostructure with an average pitch of 300 nm was prepared, films of a photocurable resin were formed on target objects made of quartz so that a film thickness was 200 nm, 300 nm, 400 nm or 1500 nm, and the mold was bonded using a laminate roll. Next, the photocurable resin was irradiated with ultraviolet light of 100 mW/cm$^2$ up to an integral light amount of 2000 mJ/cm$^2$ that is sufficient to cure the bulk material and cured, and the mold was removed. The nanostructure surfaces of the obtained layered products comprised of photocurable resin/quartz were opaque except the case where the film thickness of the photocurable resin was 1500 nm, and portions with lower heights of the nanostructure and broken areas were checked from atomic force microscope observation. Thus, reflection properties of the accuracy are reduced in the nanostructure of the mold. Further, since an environmental atmosphere is enclosed, there is a tendency to reduce the reaction rate of the photocurable resin in the filling failure portion. Furthermore, in the case where the photocurable resin contains a solvent, the reaction rate of the photocurable resin is reduced. Since physical strength is reduced by the reaction rate being reduced, a failure of the nanostructure of the photocurable resin occurs in removing the mold.

On the other hand, in this Embodiment, since the functional layer 12 is beforehand provided on the nanostructure 11 of the carrier 10, it is made possible to perform coating without undergoing a change in physical properties of the functional raw material, and filling properties into the nanostructure 11 are improved. Further, it is also made easy to dissolve the functional raw material in a solvent to use. The capability of using a solvent means that it is possible to adjust interface free energy in the interface between a coating liquid and the nanostructure 11 of the carrier 10 without adding an impurity for the functional layer 12 and to reduce the viscosity. This means that it is possible to improve wettability of the functional raw material with respect to the nanostructure 11 of the carrier 10, and therefore, filling properties are improved. In other words, since it is possible to improve the arrangement accuracy and film thickness accuracy with respect to the nanostructure 11 of the carrier 10 of the functional layer 12, it is made possible to transfer the nanostructure with high accuracy onto the target object 20.

(2) Further, as shown in above-mentioned (B), by the average pitch of the nanostructure 11 meeting the predetermined range, it is possible to exert the function specific to nanostructure, and to transfer and form the function onto the target object 20 with high accuracy. Particularly, it is possible to suppress a destruction of the functional layer 12 in removing the carrier 10.

Figure 4:
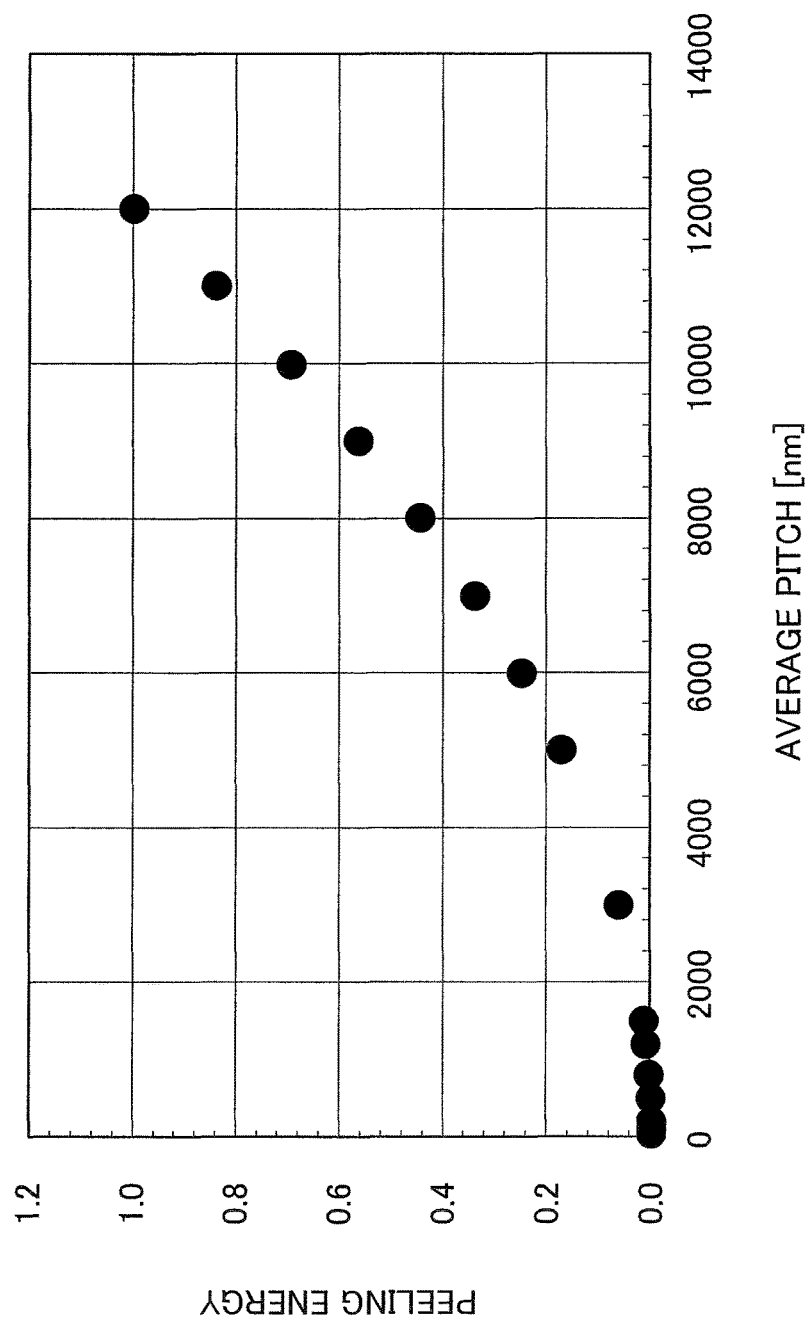
FIG. 4 is a graph showing the relationship between an average pitch of a carrier and peeling energy in the function transfer product according to this Embodiment.

Particularly, 1 nm that is the lower limit value of the average pitch of the nanostructure 11 as shown in above-mentioned (B) was determined from industrial properties in manufacturing the function transfer product 14. Further, from the viewpoint of improving the arrangement accuracy of the functional layer 12, the average pitch is preferably 10 nm or more. From the viewpoints of ensuring the arrangement accuracy and more improving the transfer accuracy, the average pitch is more preferably 30 nm or more, and most preferably 50 nm or more. On the other hand, 1500 nm that is the upper limit value of the average pitch of the nanostructure 11 was determined from peeling energy and the defect rate of the nanostructure S11 of the functional layer S12 in obtaining the layered product 21. The upper limit value of the average pitch will be described more specifically. FIG. 4 is a graph showing the relationship between the average pitch and peeling energy of the carrier. FIG. 4 shows results obtained by calculating peeling energy applied to convex portions of the functional layer 12 in peeling and removing the carrier 10 from the functional layer 12. In addition, the model used in calculation and calculation assumption is as described below.

Calculation Model

The nanostructure 11 of the carrier 10 has a plurality of concave portions 11a, and these concave portions 11a form an orthohexagonal arrangement. In the concave portions 11a, the diameter of the opening portion is 0.9 time the average pitch, and the aspect, expressed by depth of the opening portion/diameter of the opening, is 0.9. Further, the shape of the concave portion 11a is made the shape of a cone. A width of the region with the nanostructure 11 present of the function transfer product 14 is made 250 mm, and peeling is performed with a peeling angle of 10° by the force of 0.01 N. Peeling energy is calculated in dimension of erg/cm$^2$ as Gibbs free energy released in peeling and removing the carrier 10, and converted into J by multiplying by the shape and density of the concave portions 11a of the nanostructure 11.

The horizontal axis of FIG. 4 represents the average pitch, and the dimension is a nanometer. Further, the vertical axis represents peeling energy, and is normalized with the case of the average pitch of 12,000 nm being "1". From FIG. 4, it is understood that as the average pitch increases, peeing energy increases exponentially. In other words, it is meant that the peeling force applied to the nanostructure 11 of the functional layer 12 in peeling off the carrier 10 to obtain the layered product 21 increases exponentially with increases in the average pitch. Next, the failure of the nanostructure 11 of the functional layer 12 occurring in peeling and removing the carrier 10 was observed from experiments using the elastic modulus of the functional layer 12 as a parameter. At this point, the elastic deformation rate due to peeling energy is capable of being calculated from the elastic modulus of a substance forming the functional layer 12. By comparing the deformation rate by this calculation with the peeling force to break the nanostructure 11 by experiments, the upper limit value of peeling energy allowable for the function transfer product 14 was calculated, and was about 0.03 in a numeric value subsequent to normalization of FIG. 4. This is about 2000 nm in terms of the average pitch. Since fitting fluctuations with respect to the experimental values in theory were about +10%, the upper limit value was determined as 1500 nm. Particularly, in terms of improving the transfer addition velocity while ensuring transfer properties of the functional layer 12, the average pitch is more preferably 1200 nm or less.

By meeting the range of the average pitch limited by these upper limit value and lower limit value, it is possible to add the functional layer 12 developing the function specific to nanostructure to a predetermined range or the entire surface of the target object 20 with high accuracy. In addition, a more preferable range of the range of the average pitch is capable of being determined from the function specific to nanostructure corresponding to a use of the layered product 21. As the function specific to nanostructure, examples thereof are a light diffraction function, effective medium approximate function, light scattering function derived from light diffraction, surface plasmon function, evanescent wave extraction function, specific surface area increasing function, quasipotential setting function, optical confinement function, strengthening function of Lennard-Jones potential, superhydrophobic function, superhydrophilic function, slippery function, quantum function, dressed photon function, light extraction function, photonic crystal function, nano-reaction field function, quantum dot function, nanoparticle function, and metamaterial function. In the following description, such effects are collectively described as the function specific to nanostructure. In addition, the definition and measurement method of the average pitch will be described later.

(3) Further, as shown in above-mentioned (C), by the functional layer 12 containing a resin, fluidity of the uppermost layer of the functional layer 12 is improved in bringing the function transfer product 14 into contact with the target object 20, the effect of the following requirement (D) is promoted, the contact area between the target object 20 and the functional layer 12 is thereby increased, and with the increase, the adhesion force is enhanced. Further, by the following requirement (D), it is possible to suppress fluidity of the entire functional layer 12. In other words, in bringing the function transfer product 14 into contact with the target object 20, it is possible to develop fluidity of the surface layer of the functional layer 12, while suppressing fluidity of the entire functional layer 12. Accordingly, it is possible to beforehand determine the accuracy of the functional layer 12 as the function transfer product 14, and to transfer the functional layer 12 having this accuracy to the target object 20. The resin contained in the functional layer 12 is not limited, but is preferably a resin containing polar groups. In this case, since it is possible to use the hydrogen bond action and electrostatic interaction action together, the adhesion strength between the functional layer 12 and the target object 20 is increased. Further, since it is possible to use volume shrinkage due to the hydrogen bonding action, electrostatic interaction action or polymerization and the like, it is possible to decrease the interface adhesion force between the nanostructure 11 and the functional layer 12. Accordingly, transfer properties are improved. Particularly, the resin contained in the functional layer 12 is preferably contained in the uppermost layer. Furthermore, when the functional layer 12 contains a resin having cyclic portions, it is possible to decrease the adhesion between the functional layer 12 and the nanostructure 11 due to packing of the cyclic portions, and molecular space formation in the interface between the functional layer 12 and the nanostructure 11 by the cyclic portions, and therefore, transfer properties are improved. Still furthermore, in this case, when the cyclic portion is at least one or more elements selected from the group consisting of a 4-membered ring, a 5-membered ring and a 6-membered ring, the effects are more remarkable. In addition, materials forming the functional layer 12 and the thickness of the uppermost layer of the functional layer 12 will specifically be described later.

(4) Furthermore, as shown in above-mentioned (D), when the ratio (Ra/lor) between surface roughness (Ra) on the exposed surface side of the functional layer 12 and the distance (lor) between the top position of a convex-portion of the nanostructure 11 and the exposed surface of the functional layer 12 is 1.2 or less, the transfer rate and transfer accuracy of the functional layer S12 are improved. The upper limit value of this ratio (Ra/lor) is determined from the adhesion strength between the function transfer product 14 and the target object 20 and transfer accuracy of the nanostructure S11 of the functional layer S12 of the layered product 21. More specifically, when the ratio (Ra/lor) is 1.2 or less, first, fluidity of the surface layer of the functional layer 12 is increased, and with the film thickness accuracy of the functional layer 12 guaranteed, it is possible to increase the adhesion area between the target object 20 and the functional layer 12 and to enhance the adhesion strength. Next, it is possible to improve uniformity of peeling stress applied to the nanostructure 11 of the functional layer 12 in peeling and removing the carrier 10 from the functional layer 12. In other words, it is possible to suppress stress concentration, and it is thereby possible to suppress a failure typified by a cohesive destruction of the functional layer 12.

The effects of the ratio (Ra/lor) will be described more specifically. It is the gist of transfer of the functional layer 12 in the function transfer product 14 to (a) strengthen the interface adhesion strength between the functional layer 12 and the target object 20 and to (p) suppress breakage of the functional layer 12 in removing the carrier 10 with the film thickness accuracy of the functional layer 12 guaranteed. In order to (a) improve the interface adhesion strength between the functional layer 12 and the target object 20, it is necessary to increase the adhesion area between the surface of the functional layer 12 and the target object 20. In other words, it is necessary to suppress trapping atmosphere such as air in bonding in between the functional layer 12 and the target object 20. On the other hand, in order to (β) suppress breakage of the functional layer 12 in peeling and removing the carrier 10, it is necessary to uniform peeling stress applied to the functional layer 12. Herein, when the adhesion area is small and the target object 20 and the functional layer 12 are bonded partially, the stress in peeling off the carrier 10 is different between the adhesion area and the non-adhesion area. In other words, a concentration point occurs in the peeling stress, and detachment of the functional layer 12 from the target object 20 and destruction of the functional layer 12 occurs. In view of the foregoing, irrespective of the arrangement example of the functional layer 12 of the function transfer product 14, it was determined that it is essential to excellently increase the adhesion area between the functional layer 12 and the target object 20.

Herein, it is actually difficult to make both surface roughness of the target object 20 and on the functional layer 12 side of the function transfer product 14 closer to 0 infinitely to increase the adhesion area. In other words, in order to increase the adhesion area, it is necessary to increase a real contact area Ar calculated from surface roughness of the functional layer 12 and the target object 20. Herein, the real contact area Ar is determined from surface roughness of the target object 20 and surface roughness on the functional layer 12 side of the function transfer product 14. In other words, it is necessary to consider contact between rough surfaces. Herein, by defining an equivalent radius r as $(1/r)=(1/rf)+(1/rt)$ and defining an equivalent Young's modulus as $(1/E)=(1/2)\cdot\{[(1-vf^2)/Ef]+[(1-vt^2)/Et]\}$, it is possible to simplify the contact problem between rough surfaces to the contact problem between a plane and a rough surface. In addition, rf is a radius of a minute protrusion in assuming the minute protrusion that is an origin of surface roughness on the functional layer 12 side of the function transfer product 14. rt is a radius of a minute protrusion in assuming the minute protrusion that is an origin of surface roughness of the target object 20. Ef, vf and Et, vt are the Young's modulus and Poisson's ratio respectively of the functional layer 12 and the target object 20. Further, since the surface roughness generally complies with the normal distribution, it is possible to assume that the probability density function $f(\xi)$ of surface roughness is proportional to $(1/\sigma)\cdot\exp(-\xi^2/\sigma^2)$. From the above-mentioned assumption, the real contact area Ar between the surface side of the functional layer 12 of the function transfer product 14 and the target object 20 is calculated as $Ar \propto (1/E) \cdot (r/\sigma)^{1/2} \cdot Nc$. In addition, $\sigma$ is synthesis root-mean-square surface roughness between two surfaces, and Nc is an expected value of a normal load. In addition, in the present Description, in order to reduce variations in surface roughness on the functional layer 12 side of the function transfer product 14 i.e. the effect of the standard deviation infinitely, Ra that is arithmetic mean roughness is adopted as the surface roughness. Herein, PDMS (polydimethyl siloxane) with the Young's modulus of 1 MPa was used for the functional layer 12, and was arranged so as to flatten the nanostructure 11 of the carrier 10. In this state, the distance (lor), which is the distance between the top position of a convex-portion of the nanostructure 11 of the carrier 10 and the surface of the functional layer 12, was varied. In addition, variations among samples in surface roughness (Ra) on the surface side of the functional layer 12 were 28 nm to 33 nm as Ra. Used as the target object 20 was a c-surface sapphire with 4-inch Φ having surface roughness of 1 nm or less. In the case where the configuration of the function transfer product 14 is the same and the target object 20 is the same, when conditions such as a pressure in bonding the function transfer product 14 to the target object 20 are certain, the above-mentioned real contact area Ar should be certain irrespective of the distance (lor). Since it is not possible to actually measure the real contact area Ar, after bonding the function transfer product 14 to the target object 20, the function transfer product 14 was drawn in the direction inside the main surface of the target object 20, and the force F at this point was evaluated. In other words, as described already, the real contact area Ar is generally a certain value irrespective of the distance (lor), and therefore, the measured force F should be certain. However, it was confirmed that from around the point at which the ratio (Ra/lor) exceeded 1.2 by decreasing the distance (lor), the force F abruptly decreased. This is presumed that since the ratio (Ra/lor) increases, the real contact area Ar decreases. Although this mechanism is uncertain, as the reason why such a phenomenon occurs, it is conceivable that when the ratio (Ra/lor) is increased, fluidity of the surface layer of the functional layer 12 is restrained by the effect specific to nanostructure, and that it is not possible to absorb the flow in unevenness in the interface between the functional layer 12 and the target object 20.

Next, an adhesive tape was bonded to the surface of the functional layer 12 made of PDMS of the function transfer product 14, and the carrier 10 and PDMS were separated. The separated PDMS was observed with an optical microscope and scanning electron microscope. Also from the point at which the ratio exceeded 1.2, observed were breakage of the functional layer 12 made of PDMS, and particularly, many failures of the nanostructure S11 of the functional layer 12. This is presumed that when the ratio (Ra/lor) is large, in consideration of stress applied to the functional layer 12 from the nanostructure 11 of the carrier 10 in peeling and removing the carrier 10, many points on which the stress locally concentrates occur, and that the functional layer 12 causes a cohesive failure.

In view of the foregoing, by the ratio (Ra/lor) being 1.2 or less, it is possible to excellently maintain fluidity of the surface layer of the functional layer 12, and it is thereby possible to guarantee the film thickness accuracy of the functional layer 12. In this state, it is possible to (α) strengthen the interface adhesion strength between the functional layer 12 and the target object 20 and to (β) suppress breakage of the functional layer 12 in removing the carrier 10. Therefore, it is possible to beforehand determine the accuracy of the functional layer 12 as the function transfer product 14, and to obtain the layered product 21 provided with the functional layer S12 in which this accuracy is reflected.

Particularly, the ratio (Ra/lor) is preferably 0.75 or less, from the viewpoints of improving resistance of the functional layer 12 to peeling stress (impulse in peeling) increased by improving the peeling velocity of the carrier 10, and more improving the transfer accuracy. Further, from the viewpoint of improving adhesion between the functional layer 12 and the target object 20 even in the case of contact with a high velocity by excellently releasing the restriction of fluidity of the surface layer of the functional layer 12, the ratio (Ra/lor) is preferably 0.55 or less. Further, the ratio (Ra/lor) is more preferably 0.30 or less, from the viewpoints of more reducing the defect rate in transferring the functional layer 12, and decreasing the effect on the size and outside shape of the target processing product 20 as much as possible. Particularly, from the viewpoints of stabilizing the area of adhesion of the target processing product 20 and the functional layer 12 and the adhesion force, and significantly stabilizing transfer properties of the functional layer 12, the ratio (Ra/lor) is more preferably 0.25 or less, and most preferably 0.10 or less.

In addition, in terms of mass production properties and controllability of the function transfer product 14, the lower limit value of the ratio (Ra/lor) is preferably 0.002 or more.

An absolute value of the surface roughness (Ra) on the functional layer 12 side is preferably 500 nm or less, and more preferably 300 nm or less, from the viewpoints of increasing the real contact area Ar, increasing the adhesion area between the functional layer 12 and the target object 20, improving the adhesion strength, and industrially increasing controllability of the surface roughness (Ra) on the functional layer 12 side of the function transfer product 14. Further, from the viewpoints of increasing the real contact area Ar with ease, and increasing a margin of the distance (lor), the surface roughness (Ra) is preferably 150 nm, and more preferably 100 nm or less. Furthermore, in the case where the surface roughness (Ra) is 50 nm or less, it is possible to increase the velocity for bringing the function transfer product 14 into contact with the target object 20, and therefore, such a case is preferable. The surface roughness is most preferably 30 nm or less. In addition, from the viewpoint of industrial properties, the lower limit value is preferably 1 nm or more, and most preferably 2 nm or more. In addition, the definitions and measurement methods of the surface roughness (Ra) and distance (lor) will be described later.

From the above-mentioned principles, it is also possible to indicate the relationship between the function transfer product 14 and the target object 20. In other words, since the above-mentioned principles are based on the real contact area Ar when two objects overlap, it is possible to extend the ratio (Ra/lor), not only with the function transfer product 14, also to the relationship between the function transfer product 14 and the target object 20. In other words, in assuming that surface roughness on the functional layer 12 surface side of the function transfer product 14 as (Raf) and surface roughness of the target object 20 as (Rat), by defining synthesis root-mean-square surface roughness (Ra') as $(Raf^2+rat^2)^{1/2}$, when the ratio (Ra'/lor) meets the range of the ratio (Ra/lor) as described above, it is possible to highly keep the transfer accuracy. In addition, the surface roughness (Rat) of the target object 20 is measured by the same technique as in the surface roughness (Raf) on the functional layer 12 side of the function transfer product 14.

Further, as shown in above-mentioned (E), when space exists in each of the concave portions 11a of the nanostructure 11, since transfer-capable-versatility is improved in the shape and arrangement of the nanostructure 11 of the carrier 10, versatility of the function specific to nanostructure is improved. In other words, since it is possible to obtain the layered product 21 having the nanostructure S11 with versatility more than the arrangement and shape of the nanostructure 11 of the carrier 10, it is possible to decrease the number of types of carriers 10 used in the first line, and therefore, industrial properties are improved.

Herein, the existence of space in the concave portion 11a means that the inner portion of the concave portion 11a is not completely filled with the functional layer 12, and that even after providing the functional layer 12 on the nanostructure 11, for example, a void in which gas such as air exists is left inside the concave portion 11a.

For example, the state in which "space exists in the concave portion 11a" includes cases as described below.

(1) The functional layer 12 exists only on the vertex portions of the convex portions 11b without existing in the concave portions 11a (see FIG. 13B).

(2) Only a part of the inner portion of each concave portion 11a is filled with the functional layer 12, and there is a filling residual in the upper portion (see FIG. 13A).

(3) The entire inner portion of each concave portion 11a is filled with the functional layer 12, and there is a gap between the functional layer 12 and the surface of the carrier 10 defining the concave portions 11a.

(4) With the entire inner portion of each concave portion 11a filled with the functional layer 12 (see FIG. 13E and the like), space exists inside the functional layer 12.

(4-1) Air voids or the like are scattered inside the functional layer 12.

(4-2) The functional layer 12 is comprised of a plurality of layers, and there is a gap between some layer and another layer.

(5) The functional layer 12 is disposed only on the side surface portion of the carrier 10 defining the concave portions 11a.

(6) The functional layer 12 is formed on the surface of the nanostructure 11 including both the concave portions 11a and the convex portions 11b as a coating.

The cases will be described more specifically. For example, in the case where the functional layer 12 is provided only on the convex-portion vertex portions of the nanostructure 11 of the carrier 10, it is possible to transfer plane information of the convex-portion vertex portions of the nanostructure 11 to the target object 20. Further, for example, in the case of providing space in the concave portions 11a of the nanostructure 11 of the carrier 10 and providing the functional layer 12 so as to flatten the nanostructure 11, it is possible to transfer arrangement information of the nanostructure 11 to the target object 20 and to adjust height information of the nanostructure S11 of the functional layer S12 to transfer in an arbitrary range. Still furthermore, for example, in the case of providing a first functional layer so as to cover the nanostructure 11 of the carrier 10, and arranging a second functional layer so as to flatten the first functional layer so that space exists in concave portions of the first functional layer, it is possible to transfer the arrangement information and shape information of the nanostructure 11 of the carrier 10 to the target object 20 and to provide space inside the nanostructure S11 of the functional layer S12. By this means, for example, it is possible to create a large change in the refractive index, increase intensity of optical scattering properties (light diffraction or light scattering) and adjust hardness of the functional layer S12.

As described above, the first function transfer product contains the portion that concurrently meets the above-mentioned requirement (A), (B), (C) and (D). By this means, it is possible to transfer the functional layer S12 developing the function specific to nanostructure with high accuracy to a predetermined position or the entire surface of the target object 200 having a desired shape, size or material in a place suitable for use of the target object 20 i.e. obtain the layered product 21.

Further, the second function transfer product contains the portion that concurrently meets the above-mentioned requirement (A), (B), (C) and (E). By this means, in addition to the effects of the first function transfer product, it is possible to improve versatility of the function specific to nanostructure.

<More Preferable Requirements (F), (G) and (H) of the Function Transfer Product>

Further, in the above-mentioned first function transfer product and second function transfer product, by further concurrently meeting the following requirement (F), transfer properties of the functional layer 12 are more improved, and even in the case of transporting the function transfer product 14 and the case of rolling up, it is possible to hold the accuracy of the functional layer 12 provided on the nanostructure 11 of the carrier 10.

(F) The exposed surface on the side opposite to the carrier 10 of the function transfer product 14 is in a non-liquid state at a temperature of 20° C. under light shielding.

By meeting the requirement (F), it is possible to obtain the function transfer product 14 with stability. Herein, for example, "stability" means that the film thickness distribution of the functional layer 12 of the function transfer product 14 does drastically not degrade in the case of rolling up the function transfer product 14 in the first line and in the case of transporting from the first line to the second line. In other words, reduction in the function is hard to occur due to the film thickness distribution of the functional layer 12. In other words, also in the case of transporting the function transfer product 14 from the first line to the second line, since it is possible to maintain the arrangement accuracy and film thickness accuracy of the functional layer 12 due to an impact in transportation and handling in use, it is possible to transfer the functional layer S12 with high accuracy to the target object 20 in a place that is the most suitable for use of the layered product 21. Further, the accuracy is improved also in the case where the shape of the target object 20 contains a curved surface or in transferring the functional layer 12 to only a predetermined position of the target object 20. This is significantly useful, in consideration of the viewpoint of variations in the film thickness due to the flow of the functional layer 12.

Further, for example, by providing the surface layer of the functional layer 12 in a non-liquid state with fluidity by heating or applying an energy ray, it is possible to increase the contact area to the target object 20 while suppressing variations in the film thickness of the entire functional layer 12, and to more strengthen the adhesion strength to the target object 20. In a stage prior to removal of the carrier 10, by curing or solidifying the surface or the whole of the functional layer 12 provided with fluidity by heating, cooling or applying an energy ray, since the functional layer 12 holds the shape with the adhesion properties fixed, by removing the carrier 10 in this state, it is possible to transfer and form the functional layer S12 onto the target object 20 with high accuracy. Furthermore, for example, in the case where the surface or the whole of the functional layer 12 is gel, by curing or solidifying the functional layer 12 by heating or energy ray irradiation after bonding the function transfer product 14 to the target object 20, it is possible to fix adhesion properties with the target object 20 and to hold the shape of the functional layer 12. By removing the carrier 10 in this state, it is possible to add the functional layer S12 onto the target object 20 with high accuracy. Still furthermore, for example, in the case where the surface or the whole of the functional layer 12 is a sticky body, by heating and/or applying an energy ray when necessary after bonding to the target object 20 and removing the carrier 10, it is possible to add the functional layer S12 onto the target object 20 with high accuracy. In addition, the non-liquid state will be described later.

Moreover, by also concurrently meeting the following requirement (G), since adhesion properties between the functional layer 12 and the target object 20 are held in bonding the functional layer 14 to the target object 20, while physical stability of the function transfer product 14 are improved, also in the case of transporting the function transfer product 14 to a place suitable for use of the layered product 21, it is possible to reflect the accuracy of the functional layer of the function transfer product 14 to transfer the functional layer S12 to the target object 20.

(G) The exposed surface on the side opposite to the carrier 10 of the function transfer product 14 is in a non-liquid state at a temperature of 20° C. under light shielding, and in a temperature range of exceeding 20° C. to 300° C., exhibits tackiness, or increases tackiness.

In this case, when the functional layer 12 of the function transfer product 14 is not used, since the surface is in a non-liquid state, the arrangement accuracy and film thickness accuracy with respect to the nanostructure 11 of the functional layer 12 is held. Herein, by applying a predetermined temperature in directly bringing the function transfer product 14 into the target object 20, the surface of the functional layer 12 develops tackiness i.e. tackiness or increases the tackiness. In other words, while the arrangement accuracy with respect to the nanostructure 11 of the functional layer 12 is held, it is possible to suppress fluidity of the entire functional layer 12, and to improve fluidity of the interface between the functional layer 12 and the target object 20 as described in the above-mentioned requirement (D). Therefore, it is possible to increase the adhesion area between the functional layer 12 and the target object 20, and to improve the adhesion strength. Accordingly, transfer properties of the functional layer S12 are improved with respect to the target object 20.

Further, a method of adding a function to the target object 20 using the function transfer product 14 according to this Embodiment i.e. a method of transferring the functional layer 12 is characterized by (H) directly bringing the functional layer 12 into contact with one main surface of the target object 20, and then, removing the carrier 10 from the functional layer 12 as shown in FIG. 2B.

By meeting the requirement (H), the following effects are exhibited. By including the step of directly bringing the functional layer 12 of the function transfer product 14 into contact with one main surface of the target object 20, it is possible to avoid user of an impurity such as an adhesive that does not have a function in transferring the functional layer 12 to the target object 20. In the case of using an adhesive, it is necessary to increase the adhesion forces between the adhesive and the functional layer 12 and between the adhesive and the target object 20, and to decrease the adhesion force between the adhesive and the carrier 10. Therefore, when there is no optimal adhesive, the need arises for changing physical properties of the carrier 10 and the functional layer 12, and there is the case that it is not possible to obtain desired function physical properties. Further, the film thickness distribution of the adhesive and occurrence of an air void in bonding the function transfer product 14 to the target object 20 using the adhesive is directly coupled to the surface position distribution of the functional layer S12 of the layered product 21 and occurrence of a function incomplete portion, and causes degradation in the function. In other words, as shown in the above-mentioned requirement (H), by including the step of directly bringing the functional layer 12 of the function transfer product 14 into contact with one main surface of the target object 20, it is made possible to directly transfer and form the function that the functional layer 12 has onto the target object 20, and the function of the layered product 21 is improved.

As described above, by undergoing the step of directly bringing the functional layer 12 of the function transfer product 14 into contact with one main surface of the target object 20, in the case of transferring and forming the functional layer 12 onto the target object 20, it is necessary to enhance the adhesion strength between the functional layer 12 and the target object 20, and suppress a failure of the nanostructure of the functional layer 12 in removing the carrier 10. These are guaranteed by the ratio (Ra/lor) as described already. In other words, by the ratio (Ra/lor) being the predetermined value or less, it is possible to improve the interface adhesion strength between the functional layer 12 and the target object 20 and to suppress breakage of the functional layer 12. Accordingly, the transfer accuracy is improved.

As described above, the function transfer product 14 according to this Embodiment is the function transfer product 14 that concurrently meets the above-mentioned requirements (A), (B), (C) and (D) or (A), (B), (C) and (E). Further, the more preferable aspect is the function transfer product 14 that concurrently meets the above-mentioned requirements (A), (B), (C), (D) and (F) or (G) or the function transfer product 14 that concurrently meets the above-mentioned requirements (A), (B), (C), (E) and (F) or (G). By being such a function transfer product 14, it is possible to transfer the functional layer 12 with high accuracy to a predetermined position or the entire surface of the desired target object 20 in a place suitable for use of the layered product 21. The reason why such an effect is developed is that it is possible to increase the adhesion area in association with release of restriction of fluidity of the surface layer of the functional layer 12 and to suppress the destruction of the functional layer 12 in association with equalization of stress applied to the functional layer 12 in peeling and removing the carrier 10 by meeting the ranges of the ratio (Ra/lor) and the average pitch as described already. Further, by meeting the requirement (F) or (G), since maintenance properties of accuracy of the functional layer 12 are improved, also in the case of transporting from the first line to the second line, it is possible to maintain the accuracy of the function.

<Definitions and Measurement Methods of Surface Roughness (Ra), Distance (Lor) and Average Pitch>

Described next are definitions and measurement methods of the surface roughness (Ra), distance (lor) and average pitch used in the definition of the function transfer product 14. In addition, in measurement of the surface roughness (Ra), distance (lor) and average pitch described below, the surface roughness (Ra) is first measured, the distance (lor) is next measured, and the average pitch is finally measured.

Surface Roughness (Ra)

The surface roughness (Ra) is arithmetic mean roughness on the functional layer 12 side of the function transfer product 14, and in the present Description, the dimension is a nanometer. In other words, it is a value defined also in the case where the nanostructure 11 of the carrier 10 is not completely filled with the functional layer 12. The surface roughness (Ra) is defined as a value measured by using anatomic force microscope (AFM). Particularly, the present Description adopts surface roughness in the case of measuring using the following apparatus on the following conditions.

Nanoscale Hybrid Microscope VN-8000 made by KEYENCE CORPORATION

Measurement range: 200 μm (Ratio 1:1)

Sampling frequency: 0.51 Hz

In addition, when the protective layer 13 exists in the function transfer product 14, the surface roughness (Ra) is measured on the exposed surface side of the functional layer 12 after peeling off the protective layer 13.

Further, in the case where foreign substances adhere to the surface on the functional layer 12 side and scanning is performed for each foreign substance with the AFM, the surface roughness (Ra) increases. Therefore, an environment to measure is a clean room with class 1000 or less. Further, the above-mentioned apparatus VN-8000 is provided with an optical microscope. Therefore, when a foreign substance and/or flaw is observed by optical microscope observation, a descent position of a probe is determined so as to avoid the foreign substance and/or flaw. Further, before measurement, air blow cleaning is performed in an destaticized environment with an ionizer or the like. Furthermore, in order to suppress a jumping of the scanning probe by static electricity, the humidity in the measurement environment is in a range of 40% to 50%.

Distance (lor)

The distance (lor) between the top position of a convex-portion of the nanostructure 11 and the exposed surface position of the functional layer 12 is measured with a scanning electron microscope (SEM). Observation with the SEM is performed on the cross section of the function transfer product. In measurement using the SEM, in a plurality of convex portions 11b or a plurality of concave portions 11a of the nanostructure 11, measurement is performed with a magnification that 10 or more to 20 or less portions are sharply observed in an observation image, and the distance (lor) is obtained from the observation image. Samples to be measured are measured approximately in the same positions as those of samples used in AFM measurement to obtain the above-mentioned surface roughness (Ra). In addition, as the SEM, Hitachi Ultra-High Resolution Field Emission Type Scanning Electron Microscope SU8010 (made by Hitachi High-Technologies Corporation) is used. Further, as the acceleration voltage in measurement, it is possible to generally set as appropriate from charge up to sample and sample burn, and 1.0 kV is recommendable.

Moreover, images are picked at intervals of 20 μm, and five observation images are obtained. For each of the observation images, the top position of a convex-portion of the nanostructure 11 is first determined, and next, five distances (lor) are measured arbitrarily. In other words, the distances (lor) in total 25 points are obtained as data. An arithmetical mean value of the distances (lor) in total 25 points is defined as the distance (lor) of the present Description. The top position of a convex-portion of the nanostructure 11 is determined as an average position of vertexes of vertex portions of all convex portions 11b observed in the picked images. Further, the distance (lor) is an arithmetical mean value of the shortest distances between the top position of a convex-portion and the exposed surface of the functional layer 12, and as described already, is finally calculated as the arithmetical mean value of 25 points. From the foregoing, the distance (lor) is a value capable of being defined, for example, not only in the case where the concave portions 11a of the nanostructure 11 are completely filled with the functional layer 12 and also in the case where the functional layer 12 is disposed on only the vertex portions of the convex portions 11b of the nanostructure 11 or in the case where the functional layer is disposed only inside the concave portions 11a of the nanostructure 11.

Average Pitch

The average pitch of the nanostructure 11 is measured using the SEM used in measurement of the above-mentioned distance (lor). Observation with the SEM is performed on the surface of the nanostructure 11 of the carrier 10 of the function transfer product 14. Therefore, measurement of the average pitch of the nanostructure 11 is performed on the carrier 10 obtained by removing the functional layer 12 and exposing the nanostructure 11 or the carrier 10 prior to manufacturing of the function transfer product 14. Detachment of the functional layer 12 is performed by transferring the functional layer 12 to the target object 20 or dissolving only the functional layer 12 to remove. In measurement using the SEM, in a plurality of convex portions 11b or a plurality of concave portions 11a of the nanostructure 11, measurement is performed with a magnification that 100 or more to 200 or less portions are sharply observed in an observation image of the SEM, and the average pitch is obtained from the observation image. Samples to be measured are measured approximately in the same positions as those of samples used in AFM measurement to obtain the above-mentioned surface roughness (Ra). In addition, as the SEM, Hitachi Ultra-High Resolution Field Emission Type Scanning Electron Microscope SU8010 (made by Hitachi High-Technologies Corporation) is used. Further, as the acceleration voltage in measurement, it is possible to generally set as appropriate from charge up to sample and sample burn, and 1.0 kV is recommendable.

Moreover, images are picked at intervals of 20 μm, and five observation images are obtained. For each of the observation images, ten pitches are measured arbitrarily. In other words, the pitches in total 50 points are obtained as data. An arithmetical mean value of the pitches in total 50 points is defined as the pitch of the present Description. When a plurality of independent convex portions 11b is observed in the picked image, the pitch is defined as the shortest distance between center portions of vertex portions of the convex portions 11b. On the other hand, when a plurality of independent concave portions 11a is observed in the picked image, the pitch is defined as the shortest distance between center portions of opening portions of the concave portions 11a. In other words, when the nanostructure 11 of the carrier 10 is in the shape of dots, the distance between center portions of convex-portion vertex portions between closest dots is the pitch. In the shape of holes, the distance between center portions of concave-portion opening portions between closest holes is the pitch. In the shape of line-and-space, the distance between center portions of convex-portion vertex portions between closest lines is the pitch. In addition, in the case of the shape of line-and-space, the center portion in the width direction of the line is the vertex-portion center portion. In addition, as in the shape of a lattice, when the line or space and the dot-shaped convex portion or hole-shaped concave portion coexist, the pitch is measured on the dot convex portion or hole-shaped concave portion.

<Average Aspect (A)>

Next, with respect to a preferable range in a spectroscopic direction of the nanostructure 11 of the carrier 10, the range will be described with attention directed toward the average aspect. The average aspect (A) is a value obtained by dividing an average diameter of convex-portion bottom portions of the nanostructure 11 of the carrier 10 by an average height, or dividing an average diameter of concave-portion opening portions by an average depth. The average diameter of convex-portion bottom portions or the average diameter of concave-portion opening portions is measured at the same time as in observation to obtain the average pitch. On the other hand, the average height or the average depth is measured at the same time as in observation to obtain the distance (lor).

The diameter of the convex-portion bottom portion is defined as a diameter of a circumscribed circle with respect to a contour of each of a plurality of independent convex portions 11b observed in the observation image in obtaining the average pitch. Herein, as in the average pitch, measurement data of 50 points is collected, and an arithmetical mean value of the points is defined as the average diameter of convex-portion bottom portions of the present Description. On the other hand, the diameter of the concave-portion opening portion is defined as a diameter of an inscribed circle of the opening portion of each of a plurality of independent concave portions 11a observed in the observation image in obtaining the average pitch. Herein, as in the average pitch, measurement data of 50 points is collected, and an arithmetical mean value of the points is defined as the average diameter of concave-portion opening portions of the present Description. In addition, in the case of line-and-space, the width of the line corresponds to the above-mentioned convex-portion bottom portion, and the space corresponds to the diameter of the above-mentioned concave-portion opening portion. Further, as in the shape of a lattice, when the line or space and the dot-shaped convex portion or hole-shaped concave portion coexist, the diameter of the convex-portion bottom portion or concave-portion opening portion is measured on the dot convex portion or hole-shaped concave portion.

The height is defined as a height of each of a plurality of independent convex portions 11b observed in the observation image in obtaining the distance (lor). Herein, as in the distance (lor), measurement data of 25 points is collected, and an arithmetical mean value of the points is defined as the average height of present Description. On the other hand, the depth is defined as a depth of each of a plurality of independent concave portions 11a observed in the observation image in obtaining the distance (lor). Herein, as in the distance (lor), measurement data of 25 points is collected, and an arithmetical mean value of the points is defined as the average depth of present Description. In addition, in the case of line-and-space, the line corresponds to the above-mentioned convex portion, and the space corresponds to the above-mentioned concave portion. Further, as in the shape of a lattice, when the line or space and the dot-shaped convex portion or hole-shaped concave portion coexist, the height or depth is measured on the dot convex portion or hole-shaped concave portion.

The average aspect (A) is average diameter of the convex-portion bottom portion/average height or average diameter of the concave-portion opening portion/average depth. The average aspect (A) affects peeling energy applied to the functional layer 12 in peeling and removing the functional layer 12 from the carrier 10, more specifically, moment energy that is one of elements constituting the peeling energy. Particularly, when the peeling velocity is increased, since an impulse applied to the convex portion of the functional layer 12 of the layered product 21 is increased, the moment energy is increased. The upper limit value of peeling energy was obtained by measuring correspondence between the theory and experiments in determining the upper limit value of the average pitch. Herein, assuming that the upper limit value of an actually effective peeling velocity was 5 m/min., the average aspect (A) in reaching the upper limit value of the peeling energy was calculated. From this respect, it was found out that the average aspect (A) is preferably 5 or less, in order to suppress breakage of convex portions of the functional layer S12 transferred to the target object. Further, in the case of considering the force due to the acceleration in peeling and removing the carrier 10, the average aspect (A) is preferably 3.5 or less. Particularly, in order to improve the transfer accuracy also in the case where the shape of the target object 20 is not only the shape of a plate and also in the shape of a lens, cylinder or cone and in the case of increasing the peeling velocity, the aspect is preferably 2.5 or less. Further, from the respect that the arrangement accuracy of the functional layer 12 is improved on the nanostructure 11 of the carrier 10 and that the force in peeling is significantly reduced, the average aspect (A) is most preferably 1.5 or less. In addition, from the viewpoints of improving the arrangement accuracy of the functional layer and of the extent to which the function specific to nanostructure is exerted, the lower limit value is 0.1 or more. Particularly, the aspect of 0.3 or more improves industrial productivity more and is preferable. From the same viewpoint, 0.5 or more is the most preferable.

<Region Meeting the Essential Requirements Contained in the Function Transfer Product>

It is essential only that the function transfer product 14 according to this Embodiment contains a portion that concurrently meets the requirements (A), (B), (C) and (D) or requirements (A), (B), (C) and (E). When the portion that concurrently meets the requirements (A), (B), (C) and (D) or requirements (A), (B), (C) and (E) is contained in obtaining each requirement according to the definitions as described already, such a product is the function transfer product 14 according to this Embodiment. In other words, portions that do not meet the above-mentioned requirements may be scattered, or the portion that meets the above-mentioned requirements may be locally provided. The arrangement relationship between the portion that meets the above-mentioned requirements and the portion that does not meet the requirements is not limited particularly, and one may be sandwiched between the other portions, one may be surrounded by the other portions, or the portions may be arranged mutually periodically.

<Arrangement of the Nanostructure of the Carrier>

The more preferable range of the nanostructure 11 of the carrier 10 will be described next from the viewpoints of the arrangement accuracy and transfer properties of the functional layer 12. The arrangement of the nanostructure 11 of the carrier 10 is not limited particularly, as long as the arrangement meets the average pitch as described already. For example, it is possible to adopt non-rotational symmetric arrangements or rotational symmetric arrangements. The non-rotational symmetric arrangements are an arrangement low in regularity, and an arrangement in which assemblies high in regularity are scattered. As the rotational symmetric arrangement, for example, for two-time symmetry, there are an arrangement (line-and-space arrangement) in which a plurality of mutually parallel lines is arranged, arrangements obtained by drawing an orthotetragonal arrangement or orthohexagonal arrangement in a uniaxial direction, arrangements obtained by adding modulation (for example, multiplying by a sine curve) to an orthotetragonal arrangement or orthohexagonal arrangement periodically in a uniaxial direction, arrangements in which intervals among a plurality of lines are periodically modulated (for example, multiplying by a sine curve), arrangements obtained by drawing an orthotetragonal arrangement or orthohexagonal arrangement in mutually perpendicular biaxial directions at draw ratios different in respective axis directions, arrangements obtained by modulating an orthotetragonal arrangement or orthohexagonal arrangement in mutually perpendicular biaxial directions at modulation periods different in respective axis directions, and the like. Further, as arrangements having symmetry of 4-time or more, there are an orthotetragonal arrangement, orthohexagonal arrangement, arrangements obtained by modulating an orthotetragonal arrangement or orthohexagonal arrangement in mutually perpendicular biaxial directions at the same period (for example, multiplying by a sine curve), arrangements obtained by modulating an orthotetragonal arrangement or orthohexagonal arrangement in the axis direction every 60° with respect to some axis at the same period (for example, multiplying by a sine curve) and the like. In addition, the above-mentioned modulation means that the pitch of the nanostructure 11 is not constant, and varies at a predetermined period. In other words, such an arrangement is an arrangement in which the pitch of the nanostructure 11 repeats an increase and decrease at some period.

Particularly, by containing a concavo-convex structure A as described below, both the arrangement accuracy and transfer properties of the functional layer 12 are more improved. Therefore, the accuracy of the functional layer S12 of the layered product 21 is drastically improved.

As described already, in order to improve the accuracy of the functional layer S12 of the layered product 21, it is necessary to improve the arrangement accuracy of the functional layer 12 in the function transfer product 14, further improve the adhesion strength between the functional layer 12 and the target object 20, and to suppress a destruction of the functional layer S12 in removing the carrier 10. Herein, by meeting the average pitch and the ratio (Ra/lor) as described already, it is possible to improve maintenance of the accuracy of the functional layer 12 and suppress failures of the adhesion strength and functional layer as described previously. By the nanostructure 11 containing the concavo-convex structure A described below, it is possible to more improve the arrangement accuracy of the functional layer 12 and to more suppress the destruction of the functional layer S12 in removing the carrier 10.

<Concavo-Convex Structure A>

The nanostructure 11 containing the concavo-convex structure A will be described below. The concavo-convex structure A is a concavo-convex that concurrently meets the following equations (1) to (4).

The case of viewing from the arrangement of the functional layer

In manufacturing the function transfer product 14, the product inevitably undergoes the step of arranging the functional layer 12 on the nanostructure 11 of the carrier 10. Herein, as the arrangement method of the functional layer 12, it is possible to adopt both the dry process typified by deposition and sputter, and the wet process using a coating liquid (hereinafter, referred to as a functional coating liquid) of the functional layer 12. Particularly, in terms of the arrangement accuracy of the functional layer 12 and arrangement versatility, it is preferable to include the wet process. Herein, as the wet process, there are a method of immersing the carrier 10 in the functional coating liquid, a method of coating the carrier 10 with the functional coating liquid, and the like. Particularly, in terms of the arrangement accuracy of the functional layer 12, arrangement versatility and industrial properties, it is preferable to include the method of coating with the functional coating liquid.

By currently meeting the following equations (1) to (4), since uniformity of the flow of the functional coating liquid is improved, the arrangement accuracy of the functional layer 12 is improved. More specifically, it is the gist of coating the nanostructure 11 with the functional coating liquid and arranging the functional layer 12 in the nanostructure 11 with high accuracy to improve coating properties from a macroscopic viewpoint, and improve coating properties from a microscopic viewpoint. Herein, the coating properties from a macroscopic viewpoint are to discuss the coating phenomenon as a state in which convex portions 11b and concave portions 11a of the nanostructure 11 form several hundreds of assemblies or more. In other words, the functional coating liquid is in a state of recognizing surface free energy formed by the assemblies of the nanostructure 11. On the other hand, the coating properties from a microscopic viewpoint is to discuss the coating phenomenon as a state in which one to several tens of convex portions 11b or concave portions 11a of the nanostructure 11 are collected. In other words, the functional coating liquid is in a state of recognizing a single convex portion 11b or a single concave portion 11a forming the nanostructure 11.

In order to improve the coating properties from a macroscopic viewpoint, it is necessary to improve uniformity of surface free energy made by the assemblies of the nanostructure 11 in terms of the functional coating liquid. The following equation (1) is an equation to limit the arrangement of the nanostructure 11, particularly symmetry. More specifically, the ratio (Mcv/Mcc) represents one-dimensional information of the arrangement of the nanostructure 11 in terms of the functional coating liquid, and the ratio (Sh/Scm) represents two-dimensional information. In other words, the spread of one-dimensional information in terms of the functional coating liquid is two-dimensional information, and it is meant that the one-dimensional information and two-dimensional information meets a predetermined relationship i.e. the arrangement is limited. By meeting the equation (1), symmetry of the nanostructure 11 is improved, and uniformity of surface free energy of the nanostructure 11 is improved in terms of the functional coating liquid.

In order to improve the coating properties from a microscopic viewpoint, it is necessary to improve the coating properties of the functional coating liquid on a single convex portion 11b or concave portion 11a of the nanostructure 11. By concurrently meeting the following equations (2) to (4), it is possible to suppress disturbances of the flow of the functional coating liquid in the vertex-portion outer edge portion of the convex portion of the nanostructure 11. More specifically, microscopic coating properties are determined by interface free energy between the functional coating liquid and the nanostructure 11, the viscosity of the functional coating liquid, and fluidity of the functional coating liquid in the outer edge portion of the convex portion 11b of the nanostructure 11. Herein, the arrangement of the functional layer 12 with respect to the nanostructure 11 is controlled by the interface free energy between the functional coating liquid and the nanostructure 11 and the viscosity of the functional coating liquid. In other words, even in the case where the interface free energy and the viscosity change in arbitrary ranges, it is possible to improve fluidity of the functional coating liquid in the outer edge portion of the vertex portion of the convex portion 11b of the nanostructure 11. By concurrently meeting the equations (2) to (4), particularly, since it is possible to effectively suppress the anchor effect and pinning effect on the functional coating liquid in the outer edge portion of the vertex portion of the convex portion 11b of the nanostructure 11, the fluidity is guaranteed, and the arrangement accuracy of the functional layer 12 is improved.

From the foregoing, by concurrently meeting the following equations (1) to (4), since it is possible to concurrently improve both the coating properties from a macroscopic viewpoint and the coating properties from a microscopic viewpoint, film formation properties of the functional coating liquid are improved, and the arrangement accuracy and film thickness accuracy of the functional layer 12 is improved with respect to the nanostructure 11.

The Case of Viewing from Transfer Properties

To obtain the layered product 21, it is necessary to remove the carrier 10 from the functional layer 12. As the removal of carrier 10, it is possible to adopt dissolution removal and peeling removal of the carrier 10. Particularly, in terms of enhancing the effect that it is possible to use the function transfer product 14 for the desired target object 20 in a place best suitable for use of the layered product 21, the method of peeling and removing the carrier 10 is preferable. Herein, by undergoing the physical phenomenon for peeling the carrier 10 from the functional layer 12, peeling stress indispensably works on the functional layer 12. In other words, it is necessary to suppress that the functional layer 12 is broken by the peeling stress. As the destruction of the functional layer 12, there is a local destruction that the nanostructure 11 of the functional layer 12 is broken, an entire destruction that the film of the functional layer 12 is broken, and then, interface peeling that the interface between the functional layer 12 and the target object 20 is broken. Herein, by the effect of the ratio (Ra/lor) as described already, since the real contact area is increased, it is possible to uniform the peeling stress on the functional layer 12, and it is thereby possible to suppress the local destruction, entire destruction and interface peeling. By concurrently meeting the equations (1) to (4) described below, it is possible to suppress the local destruction and entire destruction more effectively. In addition, these destructions are often cohesive failures of the functional layer 12, and therefore, the term of cohesive failure is used as a representative in the following description.

In order to suppress the cohesive failure of the functional layer 12 occurring in peeling off the carrier 10 from the functional layer 12, it is important to decrease an absolute value of peeling stress applied to the functional layer 12 and to uniform the peeling stress applied to the functional layer 12. By concurrently meeting the following equations (2) to (4), it is possible to decrease the absolute value of peeling stress. This is because it is possible to reduce stress applied to the functional layer 12 from the convex-portion vertex-portion outer edge portions of the nanostructure 11 of the carrier 10. On the other hand, by meeting the following equation (1), it is possible to improve uniformity of peeling stress on the functional layer 12. In other words, it is possible to suppress stress concentration from a local viewpoint. This is because the arrangement of the nanostructure 11 meeting the following equation (1) is an arrangement high in uniformity of the surface free energy, and therefore, stress applied to the functional layer 12 in peeling off the carrier 10 is also uniformed.

Concavo-Convex Structure A

From the foregoing, by the carrier 10 containing the concavo-convex structure A that concurrently meets the following equations (1) to (4), it is possible to uniform peeling stress applied to the functional layer 12, while decreasing the absolute value of the peeling stress applied to the functional layer 12, and transfer properties are improved.

Accordingly, by concurrently meeting the following equations (1) to (4), the arrangement accuracy and film thickness accuracy of the functional layer 12 with respect to the nanostructure 11 is improved, and it is possible to improve transfer properties of the functional layer 12 to the target object 20.

[Mathematical Expression 2]

$$\sqrt{0.5/(Sh/Scm)}-1 \leq Mcv/Mcc \leq \sqrt{1.1/(Sh/Scm)}-1 \quad \text{Eq. (1)}$$

$$0.23 < (Sh/Scm) \leq 0.99 \quad \text{Eq. (2)}$$

$$0.01 \leq (Mcv/Mcc) < 1.0 \qquad \text{Eq. (3)}$$

$$0.1 \leq \text{Average aspect } (A) \leq 5 \qquad \text{Eq. (4)}$$

Figure 5:
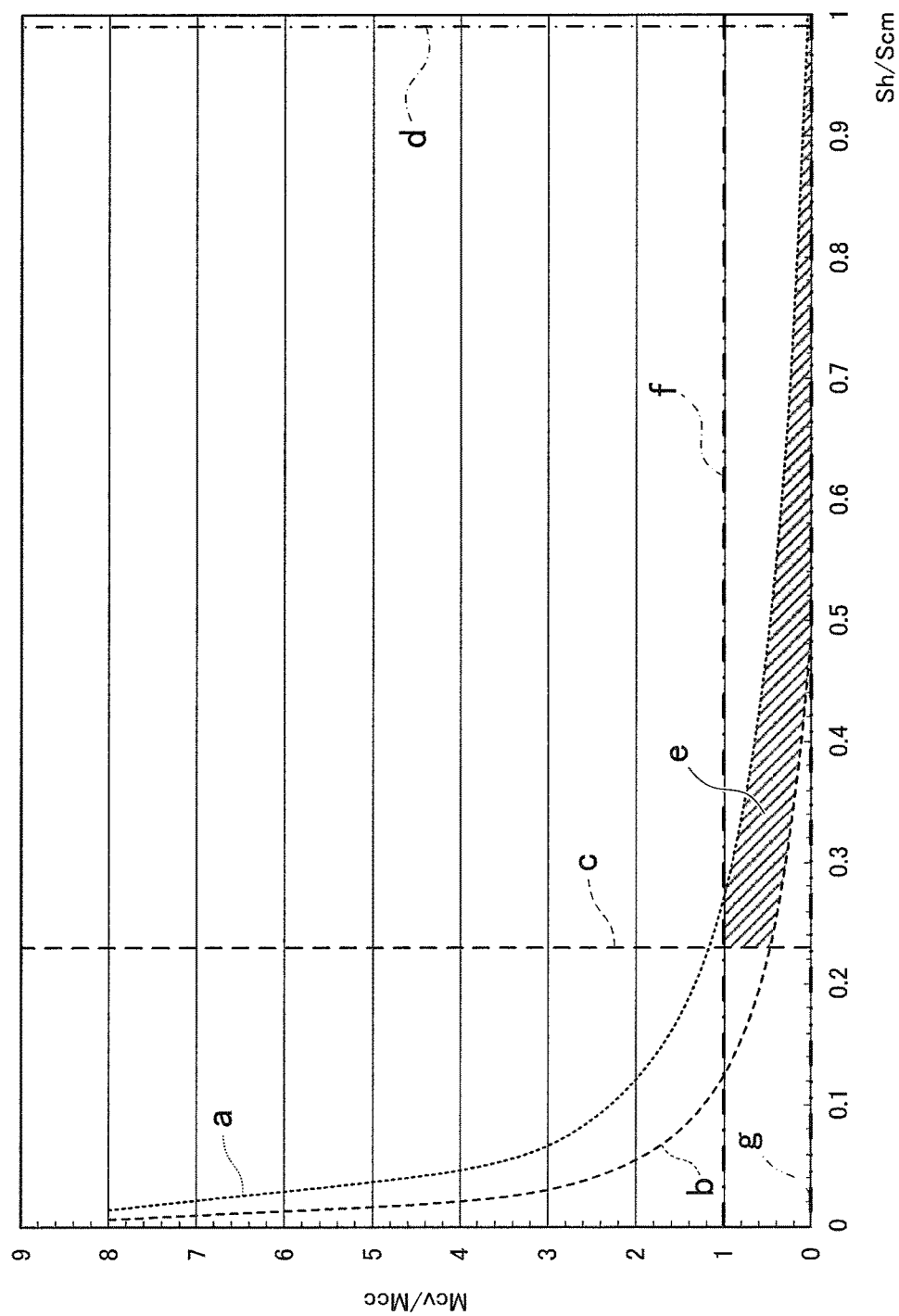
FIG. 5 is a graph to explain the first to fourth conditions of a concavo-convex structure A of the carrier of the function transfer product according to this Embodiment.

FIG. 5 is a graph to explain the first to fourth conditions of the concavo-convex structure A of the carrier 10 limited by the above-mentioned equations (1) to (4). In FIG. 5, the horizontal axis represents the ratio (Sh/Scm), and the vertical axis represents the ratio (Mcv/Mcc). The curve a shown in FIG. 5 represents (Mcv/Mcc)=√(1.1/(Sh/Scm))−1, and the curve b represents (Mcv/Mcc)=√(Sh/Scm)−1. In other words, the area of the curve b or more while being the curve a or less is the equation (1). Further, the straight line c represents (Sh/Scm)=0.23, and the straight line d represents (Sh/Scm)=0.99. In other words, the area exceeding the straight line c while being the straight line d or less in the horizontal-axis direction is the equation (2). Further, the straight line f represents (Mcv/Mcc)=1.0, and the straight line g represents (Mcv/Mcc)=0.01. In other words, the area less than the straight line f while being the straight line g or more is the equation (3). Accordingly, the function transfer product 14 using the carrier 10 provided on a part or the whole of the surface with the concavo-convex structure A meeting the area shown by the oblique-line area e in FIG. 5 and the above-mentioned equation (4) is the more preferable range of the function transfer product 14 according to the present invention.

Figure 6:
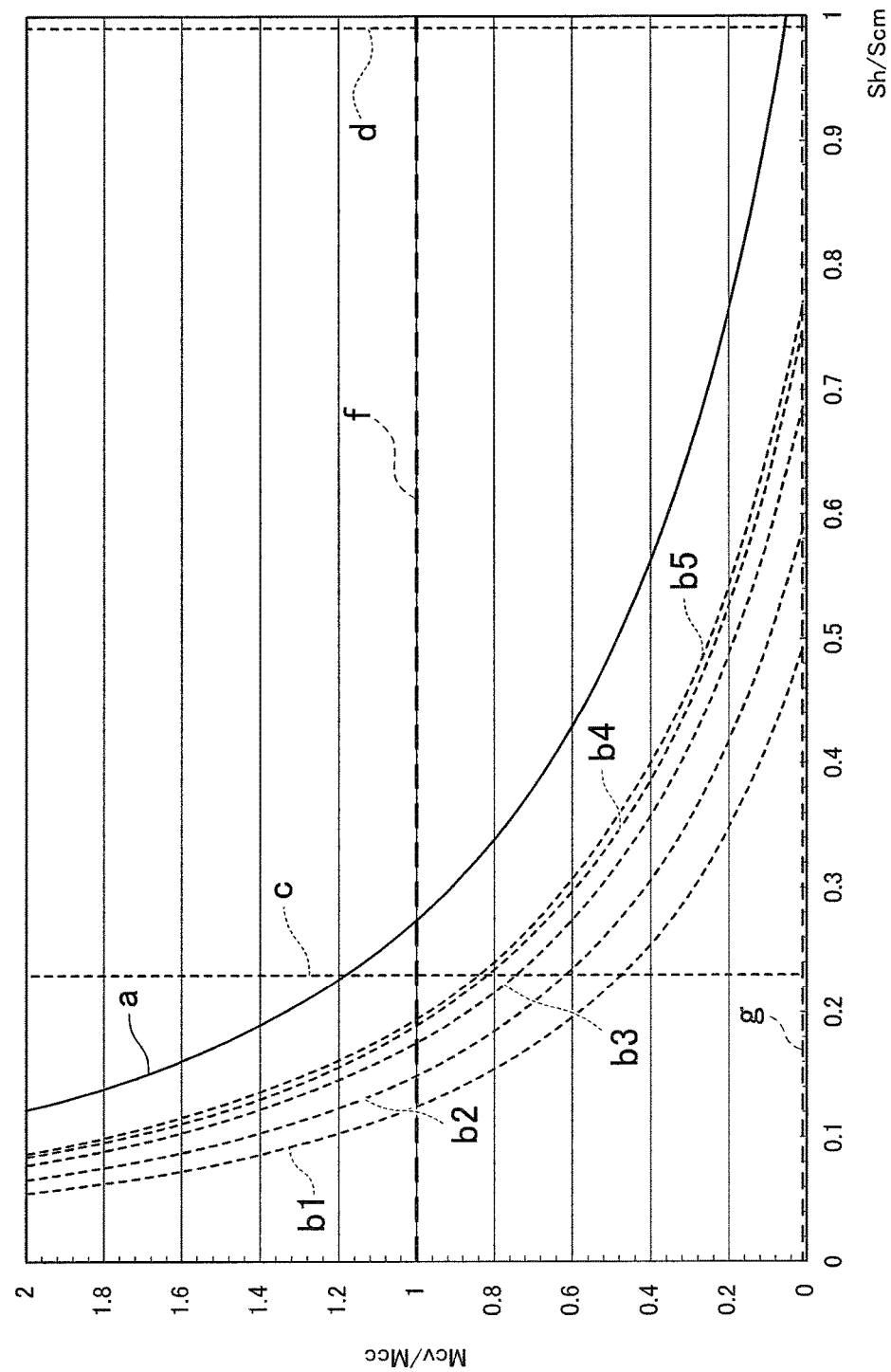
FIG. 6 is another graph to explain the first to fourth conditions of the concavo-convex structure A of the carrier of the function transfer product according to this Embodiment.

Particularly, from the viewpoints of improving uniformity of surface free energy created by the assemblies of the nanostructure 11 in terms of the functional coating liquid and improving the coating properties from a macroscopic viewpoint, the ratio (Mcv/Mcc) is preferably √/(0.6/(Sh/Scm))−1 or more, more preferably √(0.7/(Sh/Scm))−1 or more, further preferably √(0.76/(Sh/Scm))−1 or more, and most preferably √(0.78/(Sh/Scm))−1 or more. In other words, curves b1, b2, b3, b4 and b5 or more as shown in FIG. 6 are more preferable in this order. This is because symmetry of the arrangement of the nanostructure 11 is improved in the order of curves b1, b2, b3, b4 and b5. FIG. 6 is a graph, where the horizontal axis represents the ratio (Sh/Scm), and the vertical axis represents the ratio (Mcv/Mcc). When (Mcv/Mcc)=√(α/(Sh/Scm))−1 is described, in FIG. 6, the curve b1 represents α=0.5, the curve b2 represents α=0.6, the curve b3 represents α=0.7, the curve b4 represents α=0.76, and the curve b5 represents α=0.78.

Further, the curve a and straight lines c, d, f and g are the same as those in FIG. 5. In other words, the more preferable concavo-convex structure A of the carrier 10 according to the present invention is areas of the curve a or less in the vertical-axis direction, and areas exceeding the straight line c while being the straight line d or less in the horizontal-axis direction, less than the straight line f while being the straight line g or more in the vertical-axis direction, and of the curve b1, b2, b3, b4 or b5 or more in the vertical-axis direction. Particularly, when (Mcv/Mcc)=√(α/(Sh/Scm))−1 is described, as the α increases, in other words, as the curve b shifts upward from the b1 to b5 sequentially, the area of the curve a or less, exceeding the straight line c while being the straight line d or less, less than the straight line f while being the straight line g or more, and of the curve b or more is narrowed, the concavo-convex structure A meeting this narrower area improves uniformity of surface free energy of the nanostructure 11 in terms of the functional coating liquid, and therefore, uniformity of the film thickness of the functional coating liquid is improved.

Figure 7:
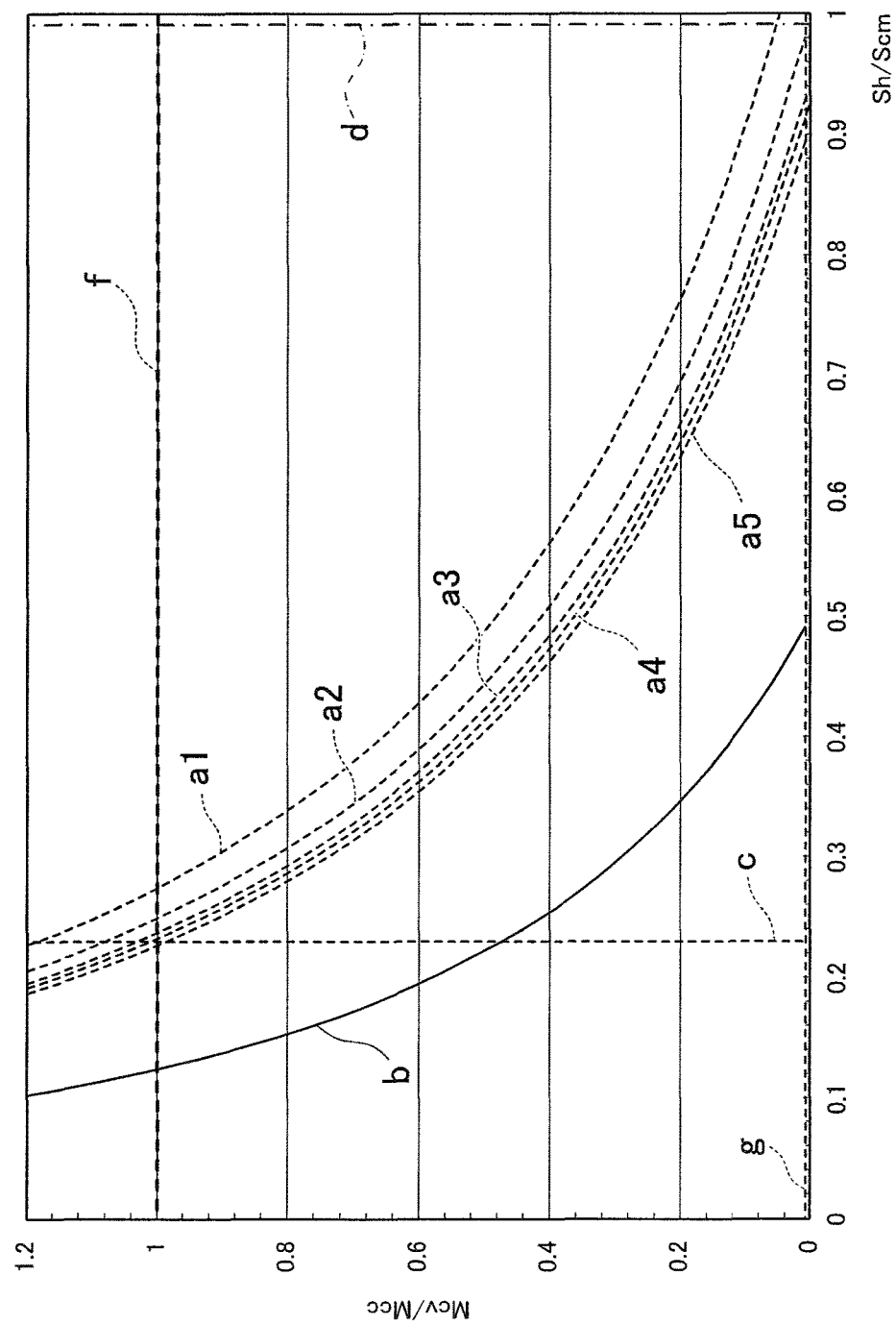
FIG. 7 is still another graph to explain the first to fourth conditions of the concavo-convex structure A of the carrier of the function transfer product according to this Embodiment.

Furthermore, from the viewpoints of improving uniformity of peeling stress on the functional layer 12 and suppressing the cohesive failure of the functional layer 12 more effectively, the ratio (Mcv/Mcc) preferably meets √(1.0/(Sh/Scm))−1 or less, preferably meets √(0.95/(Sh/Scm))−1 or less, more preferably meets √(0.93/(Sh/Scm))−1 or less, and most preferably meets √(0.91/(Sh/Scm))−1 or less. In other words, curves a1, a2, a3, a4 and a5 or less as shown in FIG. 7 are more preferable in this order. This is because uniformity of interface free energy between the nanostructure 11 and the functional layer 12 is improved in the order of curves a1, a2, a3, a4 and a5. FIG. 7 is a graph, where the horizontal axis represents the ratio (Sh/Scm), and the vertical axis represents the ratio (Mcv/Mcc). When (Mcv/Mcc)=√(α/(Sh/Scm))−1 is described, in FIG. 7, the curve a1 represents α=1.1, the curve a2 represents α=1.0, the curve a3 represents α=0.95, the curve a4 represents α=0.93, and the curve a5 represents α=0.91.

Still furthermore, the curve b and straight lines c, d, f and g are the same as those in FIG. 5. In other words, the more preferable concavo-convex structure A according to the present invention is areas of the curve b or more in the vertical-axis direction, and areas exceeding the straight line c while being the straight line d or less in the horizontal-axis direction, less than the straight line f while being the straight line g or more in the vertical-axis direction, and of the curves a1, a2, a3, a4 or a5 or less in the vertical-axis direction. Particularly, when (Mcv/Mcc)=√(α/(Sh/Scm))−1 is described, as the α decreases, in other words, as the curve a shifts downward from the a1 to a5 sequentially, the area of the curve b or more, exceeding the straight line c while being the straight line d or less, less than the straight line f while being the straight line g or more, and of the curve a or more is narrowed, the concavo-convex structure A meeting this narrow area improves uniformity of interface free energy between the nanostructure 11 and the functional layer 12, and therefore, it is possible to uniform stress to the functional layer 12 occurring in peeling off the carrier 10. In other words, it is possible to suppress the cohesive failure of the functional layer 12 more effectively.

As described above, in the carrier 10 according to this Embodiment, from the viewpoints of improving coating properties of the functional layer 12 on the carrier 10, improving the arrangement accuracy and thickness accuracy of the functional layer 12, and suppressing the cohesive failure of the functional layer 12 more effectively in removing the carrier 10, the concavo-convex structure A preferably meets the following equation (5).

[Mathematical Expression 3]

$$\sqrt{0.76/(Sh/Scm)}-1 \leq Mcv/Mcc \leq \sqrt{0.93/(Sh/Scm)}-1 \qquad \text{Eq. (5)}$$

Further, by meeting the following equation (6), it is possible to further exert the above-mentioned effects, and also in the case of improving the film formation velocity in forming the film of the functional layer 12 on the nanostructure 11 of the carrier 10, it is possible to stably arrange the functional layer 12 with respect to the nanostructure 11 with high accuracy. Furthermore, also in the case of improving the velocity in peeling off the carrier 10, since it is possible to suppress concentration of peeling stress on the functional layer 12, it is possible to keep transfer properties excellent.

[Mathematical Expression 4]

$$\sqrt{0.78/(Sh/Scm)}-1 \leq Mcv/Mcc \leq \sqrt{0.91/(Sh/Scm)}-1$$

From the viewpoints of improving rectification of the flow of the functional coating liquid in the vertex-portion outer edge portion of the convex portion of the nanostructure 11, and further improving the coating properties from a macroscopic view, the ratio (Sh/Scm) is preferably 0.4 or more. Particularly, from the viewpoint of suppress disturbances of the local flow of the functional coating liquid also in the case of increasing the coating velocity of the functional coating liquid, the ratio is preferably 0.45 or more, and most preferably 0.6 or more. Further, from the viewpoints of reducing stress applied to the functional layer 12 from the convex-portion vertex-portion outer edge portion of the nanostructure 11 of the carrier 10 in peeling off the carrier 10 from the functional layer 12, and decreasing the absolute value of peeling stress applied to the functional layer 12, the ratio (Sh/Scm) is 0.6 or more, and more preferably meets a range of 0.65 or more. Furthermore, in terms of improving microscopic coating properties of the functional coating liquid to guarantee macroscopic coating properties also in the case where surface free energy of the nanostructure 11 of the carrier 10 is extremely small, for example, the nanostructure of the carrier 10 contains fluorine and/or methyl group, the ratio (Sh/Scm) is desirably 0.7 or more. Particularly, from the viewpoint that it is possible to increase the coating velocity in such a case, (Sh/Scm) is more preferably 0.75 or more, and further preferably 0.8 or more.

Figure 8:
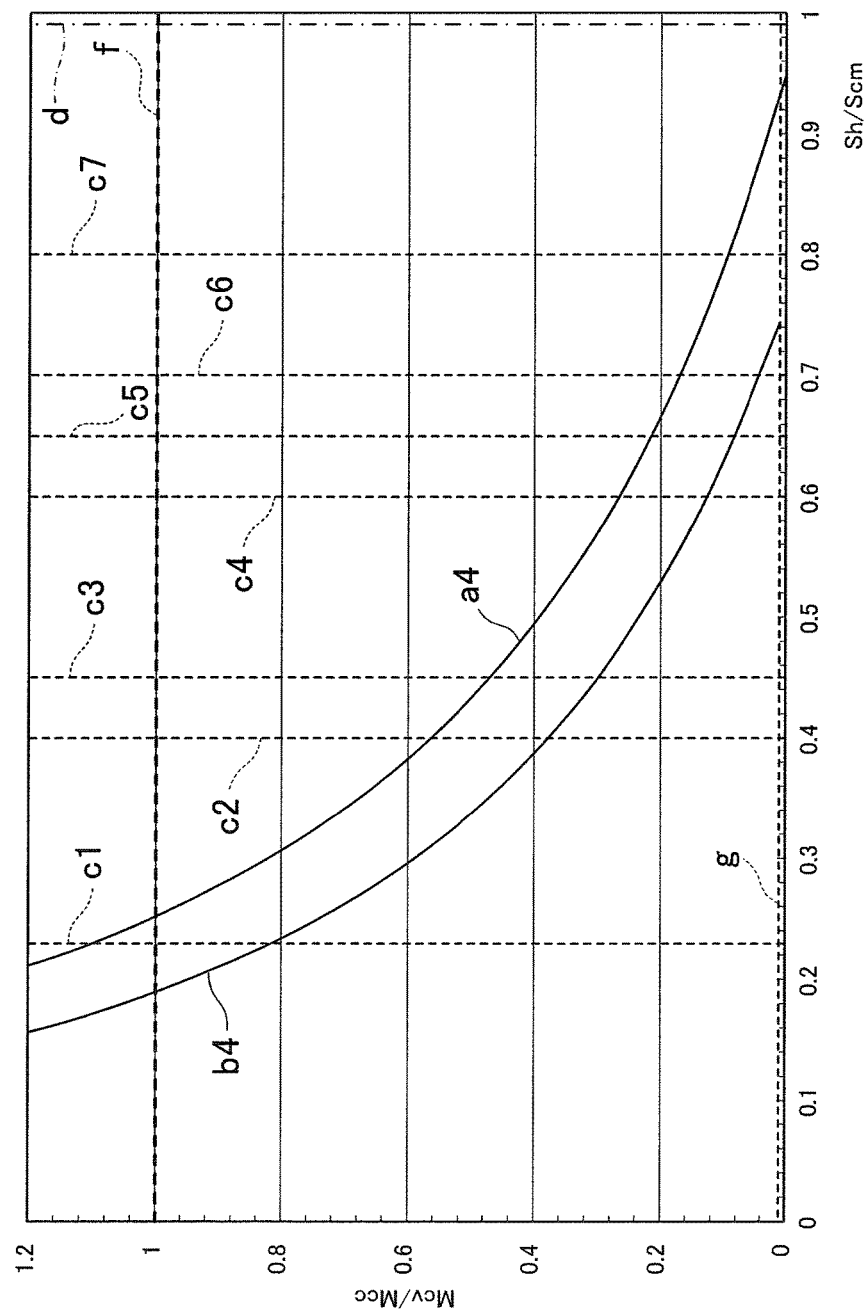
FIG. 8 is still another graph to explain the first to fourth conditions of the concavo-convex structure A of the carrier of the function transfer product according to this Embodiment.

In other words, straight lines c1, c2, c3, c4, c5, c6 and C7 or more as shown in FIG. 8 are more preferable in this order. This is because the anchor effect and pinning effect are suppressed on the functional coating liquid in the convex-portion vertex-portion outer edge portion of the nanostructure 11, and the functional coating liquid positioned inside the concave portion of the nanostructure 11 is energetically more stable than the functional coating liquid positioned on the convex-portion vertex portion of the nanostructure 11, in order of straight lines c1, c2, c3, c4, c5, c6 and C7. FIG. 8 is a graph, where the horizontal axis represents the ratio (Sh/Scm), and the vertical axis represents the ratio (Mcv/Mcc). When (Sh/Scm)=Y is described, the straight lines c1, c2, c3, c4, c5, c6 and c7 respectively represent the case where Y is 0.23, 0.4, 0.45, 0.6, 0.65, 0.7, or 0.8. Further, the curves a4 and b4 are the cases that $\alpha=0.93$ and $\alpha=0.76$, respectively, when (Mcv/Mcc)=$\sqrt{(\alpha/(Sh/Scm))}-1$ is described.

Further, the straight lines d, f and g are the same as those in FIG. 5. In other words, the more preferable concavo-convex structure A according to the present invention is areas of the curve 4a or less while being the curve b4 or more in the vertical-axis direction, and areas of the straight line d or less in the horizontal-axis direction, less than the straight line f while being the straight line g or more in the vertical-axis direction, and exceeding straight line c1, c2, c3, c4, c5, c6 or c7 or more in the horizontal-axis direction. Particularly, as the ratio (Sh/Scm) increases, in other words, as the straight line c shifts rightward from the c1 to c7 sequentially, the area is narrowed, the concavo-convex structure A meeting this narrower area more improves the coating properties from a microscopic viewpoint, improves the arrangement and thickness accuracy of the functional layer 12, decreases the absolute value of peeling stress applied to the functional layer 12 in peeling off the carrier 10, and enables transfer properties to be improved. In addition, FIG. 8 shows the curves a4 and b4 with $\alpha=0.93$ and $\alpha=0.76$, respectively, when (Mcv/Mcc)=$\sqrt{(Sh/Scm)}-1$ is described, and these curves a and b are capable of adopting the equation (1) as described above and the more preferable ranges within the equation (1).

Furthermore, the ratio (Sh/Scm) is preferably 0.95 or less. By being 0.95 or less, since it is possible to improve mechanical strength of the nanostructure 11 of the carrier 10, it is possible to suppress breakage of the nanostructure 11 of the carrier 10 in manufacturing the function transfer product 14 and using the function transfer product 14, while the number of reuse times is increased in reusing the carrier 10, and therefore, such a range is preferable.

By the ratio (Mcv/Mcc) meeting 0.02 or more, physical stability of the functional layer 12 is improved. Therefore, also in the case of transporting the function transfer product 14 from the first line to the second line, it is possible to maintain the accuracy of the functional layer 12.

Further, by the ratio (Mcv/Mcc) meeting 0.85 or less, since it is possible to suppress the anchor and pinning effects on the functional coating liquid, the microscopic coating properties are improved, and the arrangement accuracy and film thickness accuracy of the functional layer 12 is improved. From the same effects, the ratio (Mcv/Mcc) more preferably meets 0.65 or less, and most preferably meets 0.50 or less.

Furthermore, from the viewpoints of ensuring the microscopic coating properties to improve the macroscopic coating properties also in the case where surface free energy of the nanostructure of the carrier 10 is extremely small, for example, in the case of containing fluorine and/or methyl group, it is preferable to meet (Mcv/Mcc)$\leq$0.42.

In order to further exert the above-mentioned effects and excellently keep transfer properties of the functional layer 12 also in the case of increasing the peeling velocity of the carrier 10, it is preferable that (Mcv/Mcc)$\leq$0.35, and it is more preferable that (Mcv/Mcc)$\leq$0.28. Further, from the viewpoints of suppressing concentration of stress applied to the functional layer 12 and suppressing the destruction of the functional layer 12 also in the case where the outside shape of the target object 20 changes from a plane to a curved surface, it is preferable that (Mcv/Mcc)$\leq$0.18, it is more preferable that (Mcv/Mcc)$\leq$0.14, and it is particularly preferable that (Mcv/Mcc)$\leq$0.10.

By using the carrier 10 containing the concavo-convex structure A meeting the predetermined range as described above, since the arrangement accuracy and film thickness accuracy of the functional layer 12 with respect to the nanostructure 11 is improved, it is possible to manufacture the function transfer product 14 of high accuracy, and stability of the functional layer 12 is improved. Further, it is possible to improve transfer properties in transferring the functional layer 12 to the target object 20, and to increase the transfer velocity.

Figure 9:
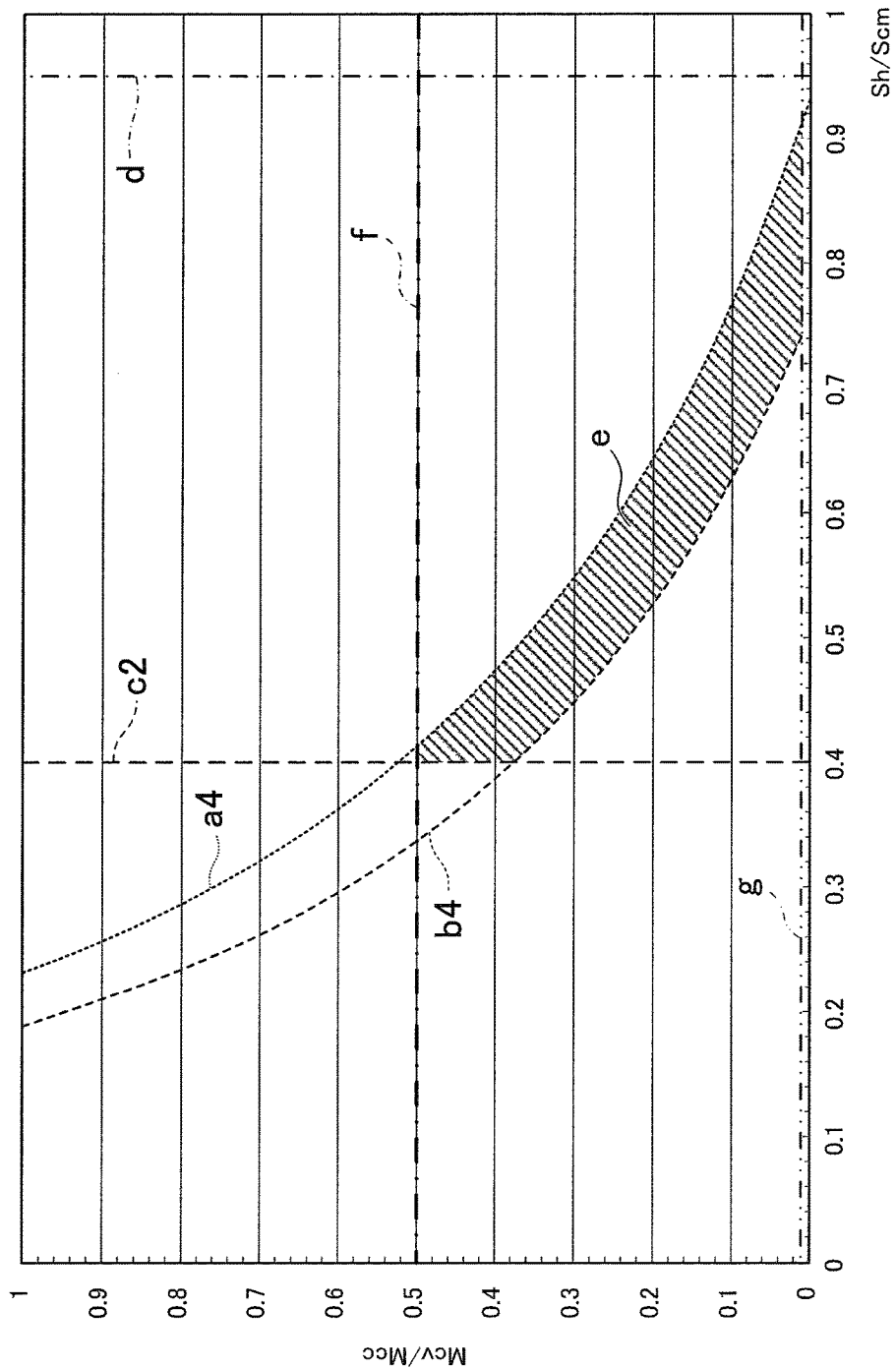
FIG. 9 is still another graph to explain the first to fourth conditions of the concavo-convex structure A of the carrier of the function transfer product according to this Embodiment.
Figure 10:
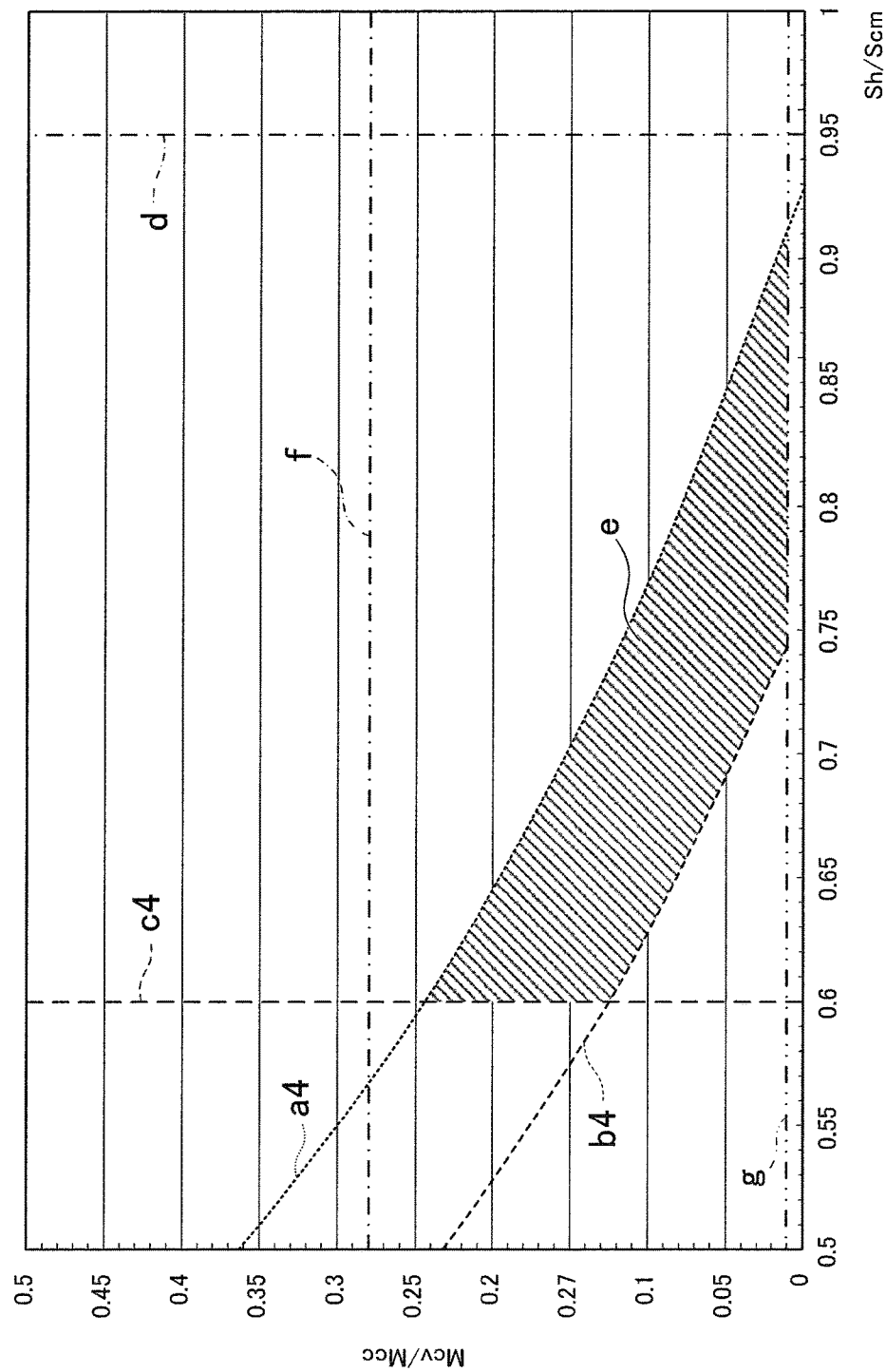
FIG. 10 is still another graph to explain the first to fourth conditions of the concavo-convex structure A of the carrier of the function transfer product according to this Embodiment.

FIGS. 9 and 10 show the ranges of the concavo-convex structure A that effectively exerts the effects as described above. The area e as shown in FIG. 9 is the area concurrently meeting (Mcv/Mcc)$\geq\sqrt{(0.76/(Sh/Scm))}-1$ (curve b4 or more), (Mcv/Mcc)=$\sqrt{(0.93/(Sh/Scm))}-1$ (curve a4 or less), (Mcv/Mcc)$\geq$0.01 (straight line g or more), (Mcv/Mcc)$\geq$0.50 (straight line f or less), (Sh/Scm)$\geq$0.40 (straight line c2 or more in the horizontal-axis direction), and (Sh/Scm)$\geq$0.95 (straight line d or less in the horizontal-axis direction). The area e as shown in FIG. 10 is the area concurrently meeting (Mcv/Mcc)=$\sqrt{(0.76/(Sh/Scm))}-1$ (curve b4 or more), (Mcv/Mcc)=$\sqrt{(\mathbf{0.93}/(Sh/Scm))}-1$ (curve a4 or less), (Mcv/Mcc)$\geq$0.01 (straight line g or more), (Mcv/Mcc)$\geq$0.28 (straight line f or less), (Sh/Scm)$\geq$0.60 (straight line c4 or more in the horizontal-axis direction), and (Sh/Scm)$\leq$0.95 (straight line d or less in the horizontal-axis direction).

Further, in the concavo-convex structure A, it is preferable that the sum (Mcc+Mcv) of the opening width of a concave-portion (Mcc) and the top width of a convex-portion (Mcv) is three times the average pitch or less. By meeting this range, it is possible to reduce disturbances of the flow of the functional coating liquid in the outer edge portion of the vertex portion of the convex portion 11b of the nanostructure 11. Therefore, film formation properties and film thickness accuracy of the functional layer 12 are improved. Further, the distribution of stress to the convex-portion bottom-portion outer edge portion of the functional layer 12 applied by the convex-portion vertex-portion outer edge portion of the nanostructure 11 of the carrier 10 is reduced in peeling off the carrier 10 from the functional layer 12. In other words, it is possible to suppress the occurrence of a point on which stress extremely concentrates in the convex-portion bottom-portion outer edge portion of the nanostructure S11 of the layered product 21. Therefore, it is possible to more effectively suppress the cohesive failure of the functional layer 12. From the viewpoint of more exerting the above-mentioned effect, the sum (Mcc+Mcv) is preferably $2\sqrt{2}$ times the average pitch or less, more preferably 1.2 time or less, and most preferably 1 time or less.

Symbol (Mcc)

The symbol (Mcc) used above is defined as an opening width of the concave portion 11a of the nanostructure 11 of the carrier 10. In addition, the symbol (Mcc) is measured by the same analysis technique from the same samples as in the average pitch described already, and is defined by the same number of average points.

Described first is the case where the nanostructure 11 of the carrier 10 has a hole structure, i.e. the case where adjacent concave portions are separated by continuous convex portions. In the case where the shape of the opening portion of the nanostructure 11 is an n-gon (n≥3) the opening portion of the nanostructure 11 is formed of n sides. In this case, the length of the longest side among the n sides is defined as the opening width of a concave-portion (Mcc). In addition, the n-gon may be a regular n-gon or irregular n-gon. For example, when a tetragon is represented, there are a regular tetragon (square), rectangle, parallelogram, trapezoid and shapes in which one or more assemblies of opposite sides of these tetragons are not parallel. On the other hand, in the nanostructure 11, when the concave-portion opening portion is a non-n-gon, the length of the longest distance between one predetermined point and another point in the outer edge portion of the concave-portion opening portion is defined as the opening width of a concave-portion (Mcc). Herein, the non-n-gon is the n-gon (n≥3) as described above including a structure without a corner, e.g. circle, ellipse, shape in which the corner of the above-mentioned n-gon as described above is rounded, or rounded corner.

In addition, it is possible to provide holes in the shape of a n-gon and holes of the non-n-gon to coexist as the above-mentioned shape of a hole as described above.

Described next is the case where the nanostructure 11 of the carrier 10 has a dot structure i.e. the case where adjacent convex portions are separated by continuous concave portions. One convex portion (A) is selected arbitrarily from a plurality of convex portions, and the distance, which is the shortest distance between one point in an outer edge portion of the convex portion (A) and an outer edge portion of another convex portion (B) surrounding the periphery of the convex portion (A), is defined as the opening width of a concave-portion (Mcc). In addition, as the contour shapes of the convex portions obtained by observing from the surface of the nanostructure 11 of the carrier 10, it is possible to adopt shapes of holes in the case where the nanostructure 11 has the hole structure as described above.

In the case of line-and-space structure, the shortest distance between adjacent convex-shaped lines is defined as the opening width of a concave-portion (Mcc).

In addition, it is possible to provide the hole structure and line-and-space structure or the dot structure and line-and space as described above to coexist.

Symbol Mcv

The symbol (Mcv) is defined as a vertex-portion width of the convex portion 11b of the nanostructure 11 in the carrier 10. In addition, the symbol (Mcv) is measured by the same analysis technique from the same samples as in the average pitch described already, and is defined by the same number of average points.

Described is the case where the nanostructure 11 of the carrier 10 has the hole structure, i.e. the case where adjacent concave portions are separated by continuous convex portions. One concave portion (A) is selected arbitrarily from a plurality of concave portions, and the distance, which is the shortest distance between one point in an outer edge portion of the concave portion (A) and an outer edge portion of another concave portion (B) surrounding the periphery of the concave portion (A), is defined as the top width of a convex-portion (Mcv).

Described next is the case where the nanostructure 11 of the carrier 10 has the dot structure, i.e. the case where adjacent convex portions are separated by continuous concave portions. In the case where the shape of the convex portion 11b is an n-gon (n≥3), the convex portion 11b of the nanostructure 11 is formed of n sides. In this case, the length of the longest side among the n sides is defined as the top width of a convex-portion (Mcv). In addition, the n-gon may be a regular n-gon or irregular n-gon. For example, when a tetragon is represented, there are a regular tetragon (square), rectangle, parallelogram, trapezoid and shapes in which one or more assemblies of opposite sides of these tetragons are not parallel. On the other hand, when the convex portion 11b of the nanostructure 11 is a non-n-gon, the length of the longest distance between one predetermined point A and another point B in the outer edge portion of the vertex portion of the convex portion 11b of the nanostructure 11 is defined as the top width of a convex-portion (lcc). Herein, the non-n-gon is the n-gon (n≥3) as described above including a structure without a corner, e.g. circle, ellipse, shape in which the corner of the above-mentioned n-gon as described above is rounded, or rounded corner.

In the case of line-and-space structure, the convex line width is defined as the top width of a convex-portion (Mcv).

Ratio (Sh/Scm)

The symbol (Scm) is a unit area. The unit area is an area of a surface that is disposed on the top portion of the nanostructure 11 inside the surface parallel to one main surface of the nanostructure 11 and that is parallel to one main surface of the nanostructure 11. The size of the unit area (Scm) is defined as a region of a 10-times the average pitch square. In addition, the symbol (Scm) is set inside the image picked by the analysis technique in obtaining the average pitch of the same sample as in the average pitch described already.

The ratio (Sh/Scm) is an aperture ratio of the nanostructure 11 in the carrier 10. When the nanostructure 11 of the carrier 10 is the hole structure, the aperture ratio is the ratio of the sum (Sh) of opening portion areas of the concave portions 11a included in the unit area (Scm) on the nanostructure 11 inside the surface parallel to the main surface of the nanostructure 11. For example, it is assumed that N concave portions 11a are included inside the unit area (Scm). The sum of the opening portion areas (Sh1 to ShN) of the N concave portions 11a is given as Sh, and the aperture ratio is given as (Sh/Scm). On the other hand, in the case where the nanostructure 11 is in the shape of dots, the aperture ratio is the opening portion areas of concave portions 11a included in the unit area (Scm) on the nanostructure 11 inside the surface parallel to the main surface of the nanostructure 11. For example, it is assumed that M convex portions 11b are included in the unit area (Scm). The sum of vertex-portion areas (Sh' 1 to Sh' M) of the M convex portions 11b is given as Sh', the area Sh of opening portions is given as Scm-Sh', and the aperture ratio is given as (Sh/Scm). The value 100 times the aperture ratio is expressed as a percentage.

In addition, the average aspect (A) in Eq. (4) is as described already.

Area Meeting the Concavo-Convex Portion a Included in the Function Transfer Product It is preferable that the function transfer product 14 according to this Embodiment contains the concavo-convex structure that concurrently meets the above-mentioned equations (1) to (4). In obtaining the equations (1) to (4) with respect to the nanostructure 11 of the carrier 10 according to the definitions as described already, when the product contains a portion that concurrently meets the equations (1) to (4), the product is the more preferable function transfer product 14 of the present invention. In other words, portions that do not meet the equations (1) to (4) may be scattered, or the portion that meets the equations (1) to (4) may be locally provided. The arrangement relationship between the portion that meets the equations (1) to (4) and the portion that does not meet the equations (1) to (4) is not limited particularly, and one may be sandwiched between the other portions, one may be surrounded by the other portions, or the portions may be arranged mutually periodically.

The concavo-convex structure A that the nanostructure 11 has is described in the foregoing.

<Functional Layer>

Described next is the composition of the functional layer 12 of the function transfer product 14. In the function transfer product 14, as described already, irrespective of the composition of the functional layer 12, it is possible to improve the arrangement accuracy of the functional layer 12, enhance the adhesion strength between the functional layer 12 and the target object 20, and to suppress the cohesive failure of the functional layer 12, and it is thereby possible to transfer the functional layer 12 of high accuracy to the target object 20, and obtain the layered product 21. Therefore, the composition of the functional layer 12 is not limited particularly, and may be an organic substance, inorganic substance or organic-inorganic composite. Further, the layer 12 may be formed of monomers, oligomers or only a polymer, or may contain pluralities thereof. Therefore, for example, it is possible to use organic particles, organic filler, inorganic particles, inorganic filler, organic-inorganic hybrid particles, organic-inorganic hybrid filler, molecules that induce the sol-gel reaction, organic polymer, organic oligomers, inorganic polymer, inorganic oligomers, organic-inorganic hybrid polymer, organic-inorganic hybrid oligomers, polymerizable resin, polymerizable monomers, metal alkoxide, metal alcoholate, metal chelate compounds, silane halide, spin-on glass, metal and metal oxide.

A metal element applicable to the functional layer 12 of the function transfer product 14 is capable of being selected as appropriate according to a use of the layered product 21. Particularly, it is preferable that the metal element is at least one or more kinds selected from the group consisting of manganese (Mn), cobalt (Co), nickel (Ni), copper (Cu), rubidium (Rb), niobium (Nb), molybdenum (Mo), technetium (Tc), ruthenium (Ru), palladium (Pd), silver (Ag), cesium (Cs), osmium (OS), platinum (Pt), gold (Au), potassium (K), lithium (Li), sodium (Na), barium (Ba), calcium (Ca), magnesium (Mg), lead (Pb), strontium (Sr), zinc (Zn), aluminum (Al), boron (B), bismuth (Bi), iron (Fe), gallium (Ga), indium (In), lanthanum (La), antimony (Sb), vanadium (V), yttrium (Y), germanium (Ge), hafnium (Hf), silicon (Si), tin (Sn), titanium (Ti), zirconium (Zr), niobium (Nb), tantalum (Ta), and tungsten (W). These elements are selected from the viewpoints of the arrangement accuracy of the functional layer 12 and physical and chemical stability of the functional layer 12. Particularly, from the viewpoint of processing accuracy in the case where the functional layer 12 is a multilayer functional layer comprised of two or more layers and nano-processing is performed on the other functional layer with one or more functional layers, it is preferable that the element is at least one kind selected from the group consisting of titanium (Ti), zirconium (Zr), chromium (Cr), zinc (Zn), tin (Sn), boron (B), indium (In), aluminum (Al), silicon (Si), molybdenum (Mo), tungsten (W) and germanium (Ge). Particularly, it is preferable that the element is titanium (Ti), zirconium (Zr), chromium (Cr), silicon (Si) or zinc (Zn), and it is the most preferable that the element is titanium (Ti), zirconium (Zr), silicon (Si) or zinc (Zn).

Further, in the case of containing an inorganic substance, from the viewpoint of particularly improving chemical stability of the functional layer 12, the functional layer 12 preferably contains the metalloxane bond (—O—Me1-O—Me2-O—). Herein, the Me1 and Me2 are both metal elements, and may be the same metal elements or may be different. As the Me1 or Me2, it is possible to adopt the metal elements as described above. For example, in the case of a single metal element, there are —O—Ti—O—Ti—O—, —O—Zr—O—Zr—O— and —O—Si—O—Si—O—. In the case of different metal elements, there are —O—Ti—O—Si—O—, —O—Zr—O—Si—O—, —O—Zn—O—Si—O—, —O—Ti—O—Zr—O—, —O—Ti—O—Zn—O—, —O—Ti—O—Si—O—Zn—O and the like. In addition, three or more kinds may be contained in metal element species of the metalloxane bond. Particularly, in the case of containing two or more kinds, from the viewpoint of the transfer accuracy, it is preferable to contain at least Si.

In metal elements contained in the functional layer 12, when the ratio $(C_{pM1}/C_{pSi})$ between the Si element concentration $(C_{pSi})$ and the total concentration $(C_{pM1})$ of metal elements except Si is 0.02 or more and less than 24, the transfer accuracy is improved, and therefore, such a range is preferable. In addition, by meeting this range, the processing accuracy is improved in the case where the functional layer 12 is a multilayer functional layer comprised of two or more layers and nano-processing is performed on the other functional layer with one or more functional layers. From the viewpoint of more exerting these effects, the ratio preferably ranges from 0.05 to 20, and most preferably ranges from 0.1 to 15. In addition, by setting the ratio $(C_{pM1}/C_{pSi})$ to be small, it is possible to decrease the refractive index of the functional layer 12, and by setting the ratio $(C_{pM1}/C_{pSi})$ to be large, it is possible to increase the refractive index of the functional layer 12.

Further, in the case of containing an inorganic substance in the functional layer 12, from the viewpoints of the arrangement accuracy of the functional layer 12 and suppression of aggregation, the inertial radius with respect to 3 weight % functional coating liquid is preferably 5 nm or less. The inertial radius is preferably 3 nm or less, more preferably 1.5 nm or less, and most preferably 1 nm or less. Herein, the inertial radius is assumed to be a radius calculated by applying Guinier plot on the measurement result obtained from measurement by small angle X-ray scattering using X-ray with a wavelength of 0.154 nm. Further, propylene glycol monomethyl ether is used as the solvent.

Particularly, when the functional layer 12 is of multilayer structure of two or more layers, and one or more functional layers are caused to function as a mask for processing on the other functional layer to perform dry etching processing on the other functional layer in a state of the layered product 21, the functional layer 12 functioning as the mask for processing preferably contains the inorganic substance or organic-inorganic composite exemplified as described above. In addition, the example in which one or more functional layers are caused to function as a mask to perform dry etching processing on the other functional layer will be described in the following <Mask transfer product>.

Particularly, by the functional layer 12 containing a resin, it is possible to decrease hardness of the functional layer 12, and to improve arrangement stability of the functional layer 12. In other words, the accuracy and film thickness accuracy of the nanostructure 11 of the functional layer 12 is improved with respect to the function transfer product 14, and, for example, also in the case of rolling up the function transfer product 14 in the shape of a roll, it is possible to suppress the occurrence of a crack in the functional layer 12. Further, by the resin being contained in the functional layer 12, physical stability of the functional layer 12 arranged in the nanostructure 11 of the carrier 10 is improved, and it is thereby possible to suppress reduction in the arrangement accuracy of the functional layer 12 due to transportation and handling of the function transfer product 14. Furthermore, by containing such a resin, since hardness of the functional layer 12 is decreased, the restriction of fluidity of the surface layer of the functional layer 12 is easy to release, described in the ratio (Ra/lor) of the requirement (D), and the effects are enhanced of increasing the real contact area between the functional layer 12 and the target object 20 and increasing the adhesion strength. The resin in the present Description is defined as an oligomer or polymer with a molecular weight of 1000 or more. As a configuration of the resin, there is an organic resin, inorganic resin or organic-inorganic hybrid resin. Only one of the resins may be contained, or a plurality of resins may be contained. As these resins, it is possible to adopt publicly-known general oligomers or polymers. For example, generally, it is possible to use resins for photoresist, resins for nanoimprint, resins for adhesives, resins for pressure-sensitive adhesives, resins for dry film resist, engineering plastics, resins for sealants, rubbers, plastics, fibers, medical plastics or medical resins. Further, it is possible to use natural resins.

The weight average molecular weight of the resin preferably ranges from 1,000 to 1,000,000, from the viewpoints of further exerting the arrangement accuracy of the functional layer 12 and the effects of the ratio (Ra/lor) and average pitch as described already. The lower limit value of 1,000 was determined from decreases in hardness of the functional layer 12 and physical stability of the functional layer 12 as described already. On the other hand, for the upper limit value of 1,000,000, as described already, the average pitch of the nanostructure 11 of the carrier 10 of the function transfer product 14 is provided with the upper limit value in the size. The upper limit value was determined from the arrangement accuracy of the functional layer 12 with respect to the nanostructure 11 in this range. Particularly, from the viewpoint of more enhancing the arrangement accuracy of the functional layer 12, the weight average molecular weight is preferably 500,000 or less, more preferably 100,000 or less, and most preferably 60,000 or less.

The degree of dispersion of the resin substantially ranging from 1 to 6 is used, and the degree of dispersion preferably ranges from 1 to 4. The degree of dispersion is the ratio (weight average molecular weight)/(number average molecular weight) between the weight average molecular weight and the number average molecular weight. In addition, the molecular weight is obtained by Gel Permeation Chromatography (GPC) made by JASCO Corporation, (Pump: Gulliver, PU-1580 type, Column: Shodex (Registered Trademark) made by SHOWA DENKO K.K. (KF-807, KF-806M, KF-806M, KF-802.5) Four parallel, Mobile layer solvent: tetrahydrofuran, use of a calibration curve with a polystyrene standard sample) as a weight average molecular weight (in terms of polystyrene).

Particularly, the resin is preferably provided in the uppermost layer of the functional layer 12. By this means, this is because it is possible to exert the above-mentioned effects by the resin contained in the uppermost layer, without containing the resin in the layer on the nanostructure 11 side of the functional layer 12. In other words, in the case of containing the resin at least in the uppermost layer of the functional layer 12, the layers except the uppermost layer may be comprised of only components except a resin. Particularly, in the case of containing the resin in the uppermost layer, from the viewpoint of exerting the above-mentioned effects in the uppermost layer, the film thickness of the uppermost layer of the functional layer 12 is preferably 5 nm or more. This is because the entanglement of the resin is effectively exerted to exert the effects of improvement in fluidity and stability as described above. Particularly, when the thickness is 20 nm or more, the degree of improvement is increased in fluidity of the uppermost layer of the functional layer 12, and it is possible to easily increase the contact area between the functional layer 12 and the target object 20. From the same viewpoints, the thickness is most preferably 50 nm or more.

Particularly, the resin contained in the functional layer 12 preferably has a polar group. In this case, since it is possible to strength intermolecular interaction inside the functional layer 12, it is possible to decrease the adhesion force between the functional layer 12 and the nanostructure 11 of the carrier 10. Further, there is a tendency to strengthen electrostatic interaction, hydrogen bond action and the like with respect to the interface between the functional layer 12 and the target object 20, and therefore, the adhesion strength between the functional layer 12 and the target object 20 is improved. From the foregoing, by containing a polar group, it is possible to improve transfer properties. The kind of the polar group is not limited particularly, and by containing at least one polar group or more of the group consisting of an epoxy group, a hydroxyl group, a phenolic hydroxyl group, an acryloyl group, a methacryloyl group, a vinyl group, a carboxyl group, a carbonyl group, an amino group, allyl group, dioxetane group, a cyano group, an isocyanate group and thiol, since there is the tendency to strengthen electrostatic interaction, hydrogen bond action and the like with respect to the interface between the functional layer 12 and the target object 20, transfer properties are improved. Particularly, from the viewpoint of reducing both the physical adhesion force and the chemical adhesion force between the nanostructure 11 of the carrier 10 and the functional layer 12, it is preferable that the resin contains at least one polar group or more selected from the group consisting of an epoxy group, a hydroxyl group, a phenolic hydroxyl group, an acryloyl group, a methacryloyl group, a vinyl group, a carboxyl group, a carbonyl group, an amino group and an isocyanate group. Further, when the resin contains at least one polar group or more selected from the group consisting of an epoxy group, a hydroxyl group, an acryloyl group, a methacryloyl group, a vinyl group, a carboxyl group and a carbonyl group, since it is possible to develop one or more phenomena of volume shrinkage due to photopolymerization, volume shrinkage due to heat polymerization and high density due to hydrogen bonds, the interface adhesion force between the nanostructure 11 of the carrier 10 and the functional layer 12 is further reduced, transfer properties are further improved, and therefore, such groups are preferable. Among the groups, by containing at least one or more of the group consisting of an epoxy group, a hydroxyl group, an acryloyl group, a methacryloyl group, a vinyl group, and a carboxyl group, the effects are further enhanced.

When the resin is a curable resin, there is a tendency that the volume of the functional layer 12 of the function transfer product 14 is smaller than the volume of the functional layer 12 in removing the carrier 10. In other words, in a stage of removing the carrier 10 from the functional layer 12, it is possible to create a gap of molecular scale or more in the interface between the nanostructure 11 of the carrier 10 and the functional layer 12. This means that the adhesion between the nanostructure 11 and the functional layer 12 significantly decreases, and therefore, it is possible to sufficiently increase the peeling velocity of the carrier 10. The curable resin is a resin that is cured by heat, light, or heat and light. For example, among the heat curable resins are phenol resins, urea resins, melamine resins, unsaturated polyester resins, epoxy resins, and silicones. Further, for example, as the photocurable resins, there are resins having epoxy groups, acryloyl groups, methacryloyl groups, vinyl groups or the like. In addition, in the case of containing the curable resin, it is preferable to contain a curing initiator corresponding to the curing principle. For the photocurable resin, it is possible to apply a photopolymerization initiator. As the photopolymerization initiator, it is possible to use publicly-known radical polymerization initiator, a cation polymerization initiator, or an anion polymerization initiator. It is also possible to combine these initiators to use. For the heat polymerization resin, it is possible to apply a heat polymerization initiator. As the heat polymerization initiator, for example, it is possible to use a publicly-known azo compound. In addition, for the photocurable resin, it is also possible to use the heat polymerization initiator. In addition, as well as the polymerization initiator, it is also possible to add a photosensitive agent.

Particularly, from the viewpoints of effectively developing the volume shrinkage of the functional layer 12 and weakening the adhesion strength between the functional layer 12 and the nanostructure 11, it is preferable to contain the photocurable resin.

Further, the resin preferably contains a resin containing at least one repeating unit or more. Further, the repeating unit is preferably a repeating unit with a ratio K of 5.5 or less, where the ratio K is a ratio (Na/Nc-No) in assuming that the number of all atoms forming the repeating unit is Na, the number of carbon atoms in the repeating unit is Nc, and that the number of oxygen atoms in the repeating unit is No. In other words, in the case where a state with three repeating units is represented, in a general formula represented by -(A)x-(B)y-(C)z-, at least one or more repeating units of A, B and C meet the ratio K≤5.5. In the case of meeting such a range, since there is a tendency to strengthen interaction between molecules of the resin, it is conceivable that the gap of molecular scale of the interface between the functional layer 12 and the nanostructure 11 is increased. In other words, transfer properties are improved. Particularly, from the viewpoints of strengthening both the intermolecular interaction and the intramolecular interaction of the resin, forming the gap over the surface of the nanostructure 11, and improving the transfer properties, the ratio K more preferably meets 4.0 or less, and most preferably meets 3.5 or less. Particularly, when the ratio K is 3.0 or less, since the carbon density inside the resin is increased, it is possible to reduce the chemical action between the functional layer 12 and the nanostructure 11 of the carrier 10, and it is possible to more decrease the adhesion between the functional layer 12 and the nanostructure 11. In addition, by meeting these ranges, the processing accuracy is significantly improved in the case of performing nano-processing on the target object 20 using the functional layer S12 of the layered product 21 as a mask for the processing. The case of performing nano-processing on the target object 20 will be described in the following <Mask Layered Product>.

In the above-mentioned description, the state is represented in which there are three repeating units capable of being described with -(A)x-(B)y-(C)z-, and the formation number of repeating units is not limited to 3, and may be from a state of 1 of a homopolymer or homooligomer to a state of 2 or 4 or more.

Further, in the case where the number of repeating units is 2 or more, at least one repeating unit or more meet the above-mentioned ratio K. In this case, the numbers of repetitions of a repeating unit G that meets the ratio K and a repeating unit B that does not meet the ratio K preferably meet the following range. It is assumed that the total value of repetitions of the repeating unit G is a, and that the total value of repeating units of the repeating unit B is β. For example, in -(A)x-(B)y-, when the repeating unit A meets the above-mentioned ratio K and the repeating unit B does not meet the above-mentioned ratio K, x=α, and y=β. Further, for example, in -(A)x-(B)y-(C)z-, when the repeating unit A meets the above-mentioned ratio K and the repeating units B and C do not meet the above-mentioned ratio K, x=α, and (y+z)=β. In addition, this is the same as in the case where the number of repeating units is 4 or more.

At this point, by meeting $\alpha/\beta \geq 1$, the effect of the intramolecular interaction is increased, transfer properties are improved, and therefore, such a range is preferable. Particularly, by meeting $\alpha/\beta \geq 1.5$, it is possible to also use the intermolecular interaction, the transfer properties are more improved, and therefore, such a range is preferable. When $\alpha/\beta$ is 2.3 or more, the effect of suppressing the chemical interaction of the interface between the functional layer 12 and the nanostructure 11 is increased, and therefore, such a range is preferable. From the viewpoint of further exerting the effect, it is more preferable that $\alpha/\beta$ is 4 or more, and it is the most preferable that $\alpha/\beta$ is 9 or more.

In addition, when $\alpha/\beta$ is 80 or more, and is more preferably 90 or more, since uniformity of energy inside the resin molecule is improved, resistance to the cohesive failure is increased in removing the carrier 10 from the functional layer 12. Further, in the case of a homopolymer or homooligomer, since β is 0, $\alpha/\beta$ is infinitely asymptotic. Further, also in the case where two or more repeating units are contained and all the repeating units meet the range of the above-mentioned ratio K, since β is 0, $\alpha/\beta$ is infinitely asymptotic. In such a case where $\alpha/\beta$ is infinitely asymptotic, since uniformity of energy inside the resin molecule is drastically improved, resistance to the cohesive failure is drastically improved in removing the carrier 10 from the functional layer 12, and therefore, such a case is the most preferable. In addition, by meeting these ranges, the processing accuracy is significantly improved in the case of performing nano-processing on the target object 20 using the functional layer S12 of the layered product 21 as a mask for the processing.

Further, the maximum value of the difference in the above-mentioned ratio K between repeating units i.e. ΔKmax is preferably 3.5 or less. By this means, it is possible to effectively exert the intermolecular interaction. Particularly, when the value is 3.0 or less, the intramolecular interaction is increased. When the value is 2.5 or less, stability of the resin is improved, and the effect is enhanced of suppressing the chemical action of the interface between the functional layer 12 and the nanostructure 11. Furthermore, from the viewpoint of making a more remarkable effect of improving resistance to the cohesive destruction of the functional layer 12 in association with improvements in equalization of energy inside the resin molecule, the value is preferably 2.0 or less, more preferably 1.5 or less, and most preferably 1.0 or less. In addition, by meeting these ranges, the processing accuracy is also significantly improved in the case of performing nano-processing on the target object 20 using the functional layer S12 of the layered product 21 as a mask for the processing.

The functional layer 12 preferably contains a material having cyclic portions. This is because by containing the material having cyclic portions, there is a tendency to induce an increase in hardness of the functional layer 12 and volume shrinkage of the functional layer 12 due to packing and arrangement of the cyclic portions. In other words, there are the effects of suppressing the cohesive destruction of the functional layer 12 in removing the functional layer 12 from the carrier 10 and decreasing the adhesion between the nanostructure 11 of the carrier 10 and the functional layer 12. Particularly, when the cyclic portion is a cyclic portion with the carbon number of 30 or less, the effects are enhanced. Further, when the cyclic portion is comprised of at least one or more elements selected from the group consisting of a 4-membered ring, a 5-membered ring and a 6-membered ring, since accumulation properties are excellent, there is a tendency to reduce free energy that the functional layer 12 has. In other words, since it is possible to reduce the chemical action between the nanostructure 11 of the carrier 10 and the functional layer 12, transfer properties are improved. Herein, the cyclic portions may be contained in the above-mentioned resin or may be contained in another component e.g. monomer. Particularly, when the functional layer 12 contains a resin and monomer, it is preferable that at least the resin contains the cyclic portion. As the cyclic portion, examples thereof are at least one or more cyclic portions selected from the following chemical formula group A. Only one kind of these compounds may be contained, or two or more kinds of these compounds may be contained.

[Chemistry 1]

Chemical formula group A

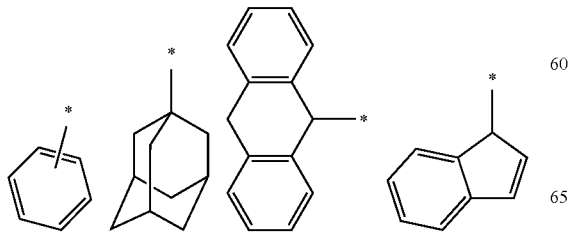

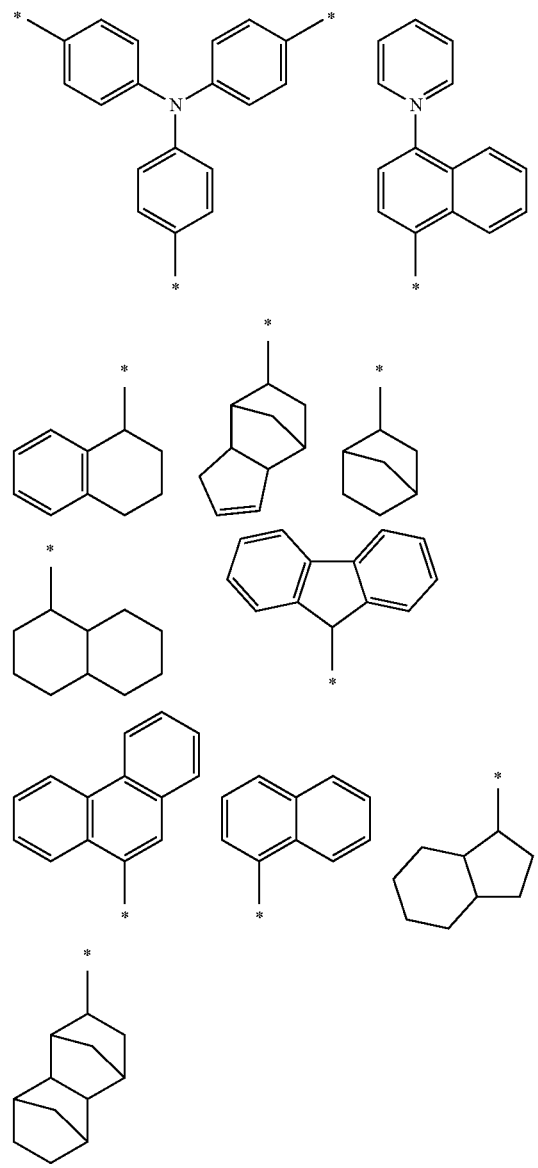

[Chemistry 2]

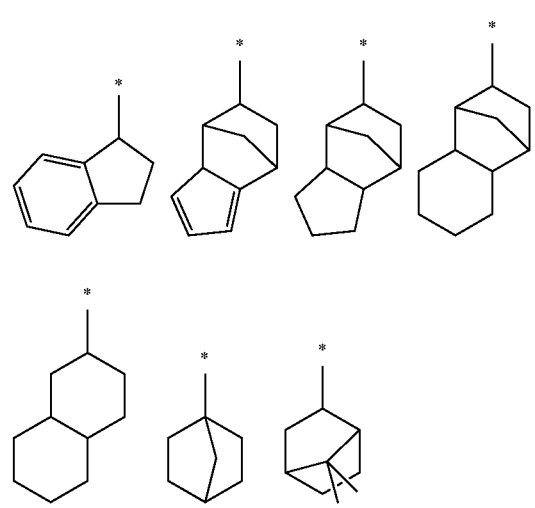

-continued

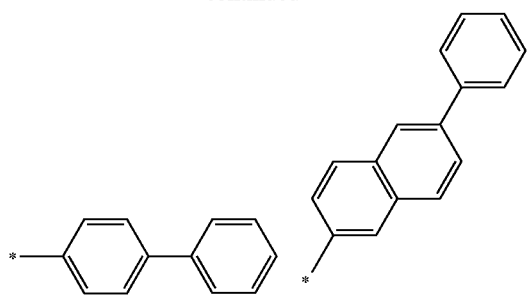
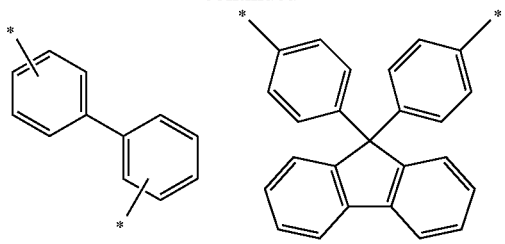

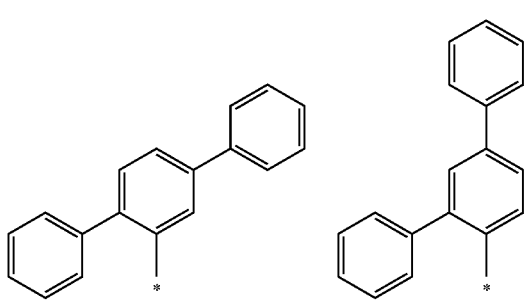
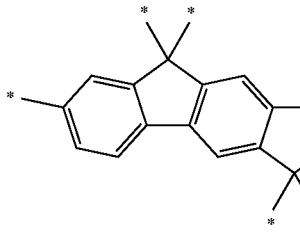

[Chemistry 3]

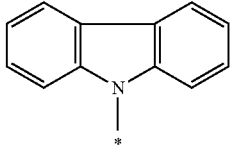

[Chemistry 4]

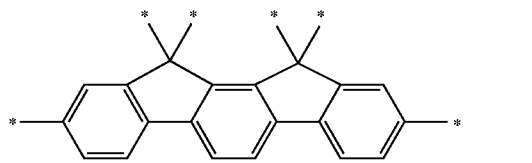
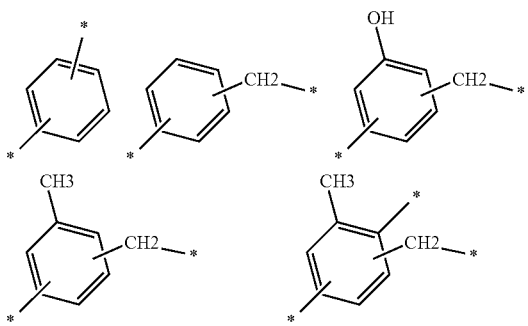

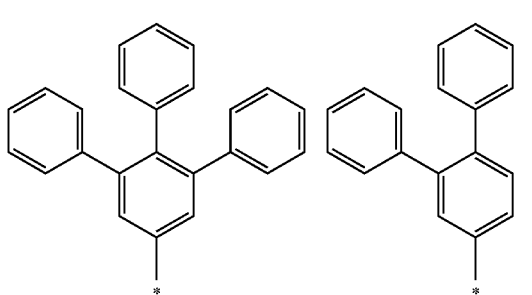
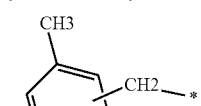
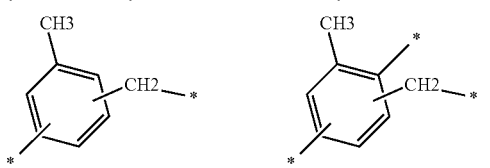

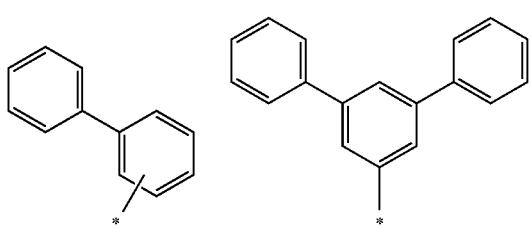

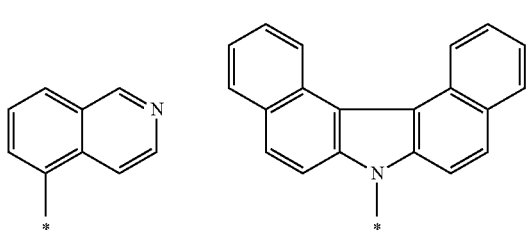

In the present Description, "*" indicated in the chemical formula is one of an oxygen element (O), a nitrogen element (N), a sulfur element (S) and a carbon element (C) through which binding is made to another element. Further, a portion that lacks atomic bonding binds to a hydrogen element (H), methyl group ($CH_3$) or hydroxyl group (OH).

As the resin having the above-mentioned cyclic portion, examples thereof are polystyrene, polyp-hydroxy styrene, poly (9-vinylcarbazole), resins having a carbazole skeleton, resins having a carbazole skeleton in the side chain, resins having a cresol novolac skeleton, resins having a phenol novolac skeleton, resins having a bisphenol A skeleton, resins having a fluorene skeleton, resins having an adamantane skeleton in the side chain, resins having an adamantyl skeleton in the side chain, and reins having a norbornane skeleton in the side chain.

Further, the resin may be an alkali-soluble resin. By being an alkali-soluble resin, it is possible to easily develop the functional layer 12 of the layered product 21 to perform patterning. When the resin is an alkali-soluble resin, it is preferable that the resin contains carboxyl groups. The amount of carboxyl groups preferably ranges from 100 to 600, and more preferably ranges from 300 to 450, in acid equivalent. The acid equivalent represents mass of a linear polymer having carboxyl groups of one equivalent in the polymer. In addition, measurement of the acid equivalent is performed using Hiranuma Automatic Titrator (COM-555) made by Hiranuma Sangyo Corporation by an electric potential difference titration method using 0.1 mol/L of aqueous sodium hydroxide.

Further, it is also possible to use a resin obtained by copolymerizing one or more kinds of monomers of each of the following two kinds of monomers. A first monomer is a carboxylic acid or acid anhydride having one polymerizable unsaturated group (for example, acrylate or methacrylate) in the molecule. A second monomer is a non-acidic compound having one polymerizable unsaturated group in the molecule, and is selected to hold various properties such as flexibility of a cured film and anti-dry etching properties. By selecting the first monomer and the second monomer, it is possible to contain the polar group as described already in the resin arbitrarily.

Particularly, the functional layer 12 preferably contains a monomer as well as the above-mentioned resin. In other words, it is preferable to contain the resin and monomer. Herein, the monomer is defined as a substance that is except the resin defined by the present Description while being a substance except a solid fine particle or solid filler. In other words, it is possible to adopt any of an organic substance, inorganic substance and organic-inorganic composite. In this case, the monomer inhibited in its mobility by the resin is released in its mobility in bringing the function transfer product 14 into contact with the target object 20, and it is possible to more improve fluidity of the surface layer of the functional layer 12. Therefore, it is possible to more promote increases in the contact area between the functional layer 12 and the target object 20 in the effects of the ratio (Ra/lor) as described already. Particularly, by the resin and monomer being contained in the uppermost layer of the functional layer 12, the effects are more remarkable. As the combination of the resin and monomer, when (resin/monomer) is described, any of (organic/organic), (organic/inorganic), (inorganic/inorganic), and (inorganic/inorganic) may be used. For example, for (organic/inorganic), it is possible to add metal alkoxide to an organic resin meeting the above-mentioned resin requirements. For (inorganic/inorganic), it is possible to add metal alkoxide to an inorganic resin meeting the above-mentioned resin requirements e.g. metal polymer and metal oxide polymer. Further, for example, for (inorganic/organic), it is possible to add an organic monomer to an inorganic resin meeting the above-mentioned resin requirements e.g. metal polymer and metal oxide polymer. In addition, the metal alkoxide may be used as a monomer, or condensed-monomers or oligomer compound thereof may be used.

Particularly, in this case, it is preferable that one of the resin and the monomer is a curable substance, and that at least the monomer is a curable substance. As the curable substance, in the description in the case where the above-mentioned resin is a curable resin, the resin of the curable resin can be replaced with a substance. In this case, since the shrinkage action of the functional layer 12 is increased, the interface adhesion strength between the nanostructure 11 and the functional layer 12 is decreased, and transfer properties are improved. Particularly, when both the resin and the monomer are curable substances, the effect is further increased. In addition, in the case of containing a curable substance, as described in the case where the resin is a curable resin above, it is preferable to contain a curing initiator.

In the case of containing the resin and monomer, at 25° C., the viscosity of the monomer preferably ranges approximately from 5 cP to 5000 cP, more preferably ranges from 8 cP to 2500 cP, and most preferably ranges from 10 cP to 1500 cP. In addition, the viscosity herein means the viscosity of a mixture obtained by mixing all monomers to use. Further, from the viewpoints of immobilizing the adhesion strength of the interface between the functional layer 12 and the target object 20 and improving physical stability of the functional layer 12, the average number of functional groups preferably ranges approximately from 1 to 6, more preferably ranges from 1 to 4, and most preferably ranges from 1.5 to 3.

In addition, when the monomer is a monomer containing the cyclic portion selected from the above-mentioned chemical formula group A, there is a tendency to increase the effect of physical stability due to the cyclic portion and the effect of reducing the chemical interaction with the surface of the nanostructure 11, and therefore, transfer properties are improved. Further, in this case, the processing accuracy is also improved in the case of performing nano-processing on the target object 20.

Further, it is also possible to contain a coloring substance such as a dye and pigment in the functional layer 12. By containing the coloring substance, in transferring and forming the functional layer 12 onto the target object 20, also in the case where the size of the nanostructure 11 is sufficiently smaller than wavelengths of visible light, it is possible determine whether transfer is performed excellently by visual inspection and optical detection means. Further, it is possible to use absorption of the coloring substance in quality control of the functional layer 12 formed on the nanostructure 11 of the carrier 10. It is possible to select the coloring substance as appropriate so as not to affect the function derived from the nanostructure 11 of the functional layer 12. Furthermore, it is also possible to use color-producing dyes typified by a combination of leuco dye or fluoran dye and halogen compound. Among the dyes, useful are a combination of tris bromomethyl phenyl sulfone and leuco dye and a combination of a triazine compound and leuco dye.

Furthermore, in order to improve stability of the functional layer 12, it is possible to contain an antioxidant. Herein, the antioxidant is preferably a light stabilizer.

The light stabilizer is classified into a radical chain initiation inhibitor, a radical scavenger and a peroxide decomposer, and it is possible to use any of the agents. The radical chain initiation inhibitor is further classified into a heavy metal deactivator and an ultraviolet absorber. As the heavy metal deactivator, there are mainly a hydrazide system and amid system, and as the ultraviolet absorber, there are mainly a benzotriazole system, benzophenone system and triazine system. Among the agents, the ultraviolet absorber is more preferable. By containing the ultraviolet absorber, it is possible to optically stabilize the functional layer 12, and therefore, it is possible to use in a place suitable for use. Further, the radical scavenger is classified into HALS and phenol-based antioxidant. As these antioxidants, it is possible to use publicly-known general antioxidants.

Still furthermore, it is also possible to add an additive such as a plasticizer to the functional layer 12 when necessary. As such a plasticizer, examples thereof are phthalic acid esters such as diethyl phthalate, p-toluenesulfonamide, polypropylene glycol, polyethylene glycol monoalkyl ether and the like.

<Requirement (F)>

Figure 11A:
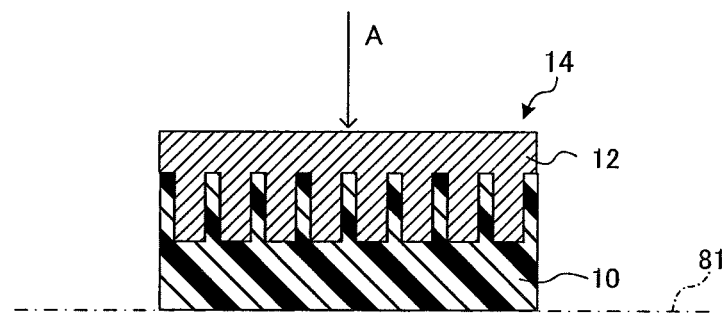
FIG. 11 contains cross-sectional schematic diagrams illustrating the function transfer product according to this Embodiment.
Figure 11B:
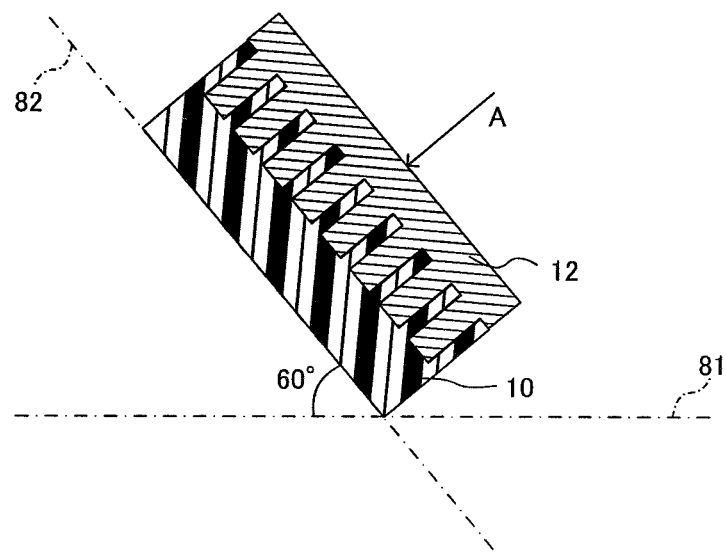

The requirement F that the function transfer product 14 preferably meets will specifically be described next. The requirement (F) is that the exposed surface on the functional layer 12 side of the function transfer product 14 is in a non-liquid state at a temperature of 20° C. under light shielding. This is because by meeting the requirement (F), it is possible to obtain the function transfer product 14 with stability. Herein, the non-liquid state is defined as being neither liquid nor gas. In other words, it is meant that the surface on the functional layer 12 side of the function transfer product 14 according to this Embodiment is neither amorphous like gas nor a state in which the shape thereof cannot be held by itself like liquid. For example, it is possible to use expression such as a semi-solid state, gel state, sticky state and solid state. Particularly, when the transfer function product 14 is inclined from a state in which the product is placed on a plane 81 as shown in FIG. 11A to a state in which a plane 82 including the bottom of the function transfer product 14 forms 60 degrees with respect to the plane 81 as shown in FIG. 11B and is left for 10 minutes, it is also possible to define as a state in which variations in the film thickness of the functional layer 12 do not occur substantially before and after inclining. A measurement point at this point is the same point (points shown by the arrows A in FIGS. 11A and 11B) before and after inclining. Herein, substantially no variation in the film thickness means that variations in the film thickness are within (X+5) % when X % is a measurement error such as an error that the measurement apparatus has occurring corresponding to various measurement circumstances.

By the exposed surface on the functional layer side of the function transfer product 14 meeting such a requirement (F), maintenance properties of the accuracy of the functional layer 12 of the function transfer product 14 are enhanced. From this viewpoint, among the functional layers 12, at least the functional layer forming the uppermost layer preferably contains a substance becoming a semi-solid state, gel state, sticky state or solid state. Therefore, the functional layer 12 preferably contains the resin as described. In addition, the most preferable state is a state in which tackiness of the surface on the functional layer 12 side of the function transfer product 14 is suppressed.

By containing the resin, since it is possible to suitably achieve the above-mentioned non-liquid state, stability of the function transfer product 14 is improved, and the transfer accuracy of the functional layer 12 is improved. The reason is that since the molecular weight is 1000 or more, in the case where the functional layer 12 is comprised of only the resin, it is possible to sharply increase the viscosity using entanglement of molecular chains i.e. make close to the non-liquid state. Further, as well as the resin, in the case of containing a monomer and oligomer with the molecular weight less than 1000, this is because it is possible to inhibit mobility of the monomer and oligomer by the resin i.e. make close to the non-liquid state. Furthermore, by containing the resin and monomer, it is possible to inhibit mobility of the monomer by the resin to achieve the non-liquid state, and to release the mobility of the monomer in bringing the function transfer product 14 into press contact with the target object 20. In other words, since fluidity of the uppermost layer of the functional layer 12 is increased, the adhesion strength between the functional layer 12 and the target object 20 is increased. Still furthermore, by containing the curable substance as described above, it is possible to immobilize the interface between the functional layer 12 and the target object 20 with the adhesion strength increased due to the flow of the surface of the functional layer 12, for example, by heat and light, and therefore, the transfer velocity and transfer properties are improved. The curable properties are most preferably photocurable properties from the viewpoint of the reaction rate. In addition, when the resin contains at least the cyclic portion as described above, since it is possible to use the chemical interaction among cyclic portions, it is possible to meet the non-liquid state easily.

<Requirement G>

The requirement G that the function transfer product 14 preferably meets will specifically be described next. The requirement (G) is the requirement (F) and that in a temperature range of exceeding 20° C. to 300° C., tackiness is exhibited, or tackiness is increased. By this means, in addition to the effects of the requirement (F), by applying a predetermined temperature in directly bringing the function transfer product 14 into contact with the target object 20, the surface of the functional layer 12 develops tackiness (tackiness) or increases tackiness. By this means, since it is possible to improve fluidity of the interface between the functional layer 12 and the target object 20 while suppressing fluidity of the entire functional layer 12, it is possible to increase the adhesion area between the functional layer 12 and the target object 20 and to improve the adhesion strength. From this viewpoint, it is preferable that the functional layer 12 contains the resin as described above. By this means, for example, the trunk polymer of the resin starts movement by heat, and tackiness is developed. Particularly, by containing the resin containing the polar group as described above, it is possible to develop tackiness easily and to excellently develop electrostatic interaction and hydrogen-bonding action with respect to the interface between the functional layer 12 and the target object 20, and therefore, the adhesion strength is increased.

Further, it is preferable to contain the resin and monomer. Particularly, when the total amount of the resin and the total amount of the monomer are 25:75 to 100:0 in parts by weight, the function transfer product 14 is in a state in which tackiness does not develop or is extremely small, and in using the function transfer product 14, develops tackiness for the first time. From this viewpoint, it is more preferable that 40:60 to 100:0, and it is the most preferable that 55:45 to 100:0.

Furthermore, as in the requirement (F), by containing the curable substance, since it is possible to immobilize the adhesion strength of the interface, transfer properties and velocity are improved. From the viewpoint of the reaction rate, the curable properties are preferably photocurable properties.

In addition, as described above, in the case of mixing a monomer with a low molecular weight, and an oligomer or polymer with a high molecular weight, the oligomer or polymer with a high molecular weight is generally referred to as a binder resin. Further, when both the binder resin and the monomer are curable substances e.g. photocurable substances, the monomer is generally referred to as a crosslinker.

In addition, as described in the requirement (G) and requirement (F), the exposed surface of the functional layer 12 of the function transfer product 14 is preferably in a non-liquid state. In other words, when the functional layer 12 is comprised of a plurality of layers, it is preferable that the functional layer disposed in the furthest position from the nanostructure 11 of the carrier 10 i.e. the uppermost layer of the functional layer 12 meets the non-liquid state as described above. In other words, the other layers disposed between the nanostructure 11 and the uppermost layer of the functional layer 12 may be liquid or gas. This is because it is possible to exert the above-mentioned effects by the uppermost layer of the functional layer 12 meeting the above-mentioned non-liquid state, irrespective of the other layers positioned inside. In addition, the layer configuration of the functional layer 12 will specifically be described later.
<Carrier>

The carrier 10 will be described next. As described already, by meeting concurrently the ranges of the ratio (Ra/lor) that is a physical property value of the functional layer 12 and the average pitch of the nanostructure 11, fluidity of the surface layer of the functional layer 12 is increased, the adhesion area between the functional layer 12 and the target object 20 is increased, and in association therewith, the adhesion strength is increased. On the other hand, it is possible to equalize peeling stress applied to the functional layer S12 from the nanostructure 11 of the carrier 10, and it is thereby possible to suppress the cohesive failure of the functional layer S12. In other words, by using the function transfer product 14, it is possible to transfer the functional layer S12 of high accuracy to the target object 20 to obtain the layered product 21. Particularly, by using the carrier 10 as described below, the effects are enhanced to improve the arrangement accuracy of the functional layer 12 with respect to the nanostructure 11 of the carrier 10 and suppress breakage of the functional layer 12 in removing the carrier 10, and therefore, such a carrier is preferable.

In addition, in the following description, the chemical composition is sometimes represented by -A-B-. The description is an expression to explain a bond between an element A and an element B, and for example, also in the case where an element A has three or more bonding functions, the same expression is used. In other words, the description of -A-B- at least represents that the element A chemically reacts with the element B, and includes that the element A forms a chemical bond with an element other than the element B.

The material forming the nanostructure 11 of the carrier 10 is not limited particularly, and it is possible to use the material forming the functional layer 12 as described already in <Functional layer>. Moreover, for example, it is possible to use inorganic materials such as silicon, quartz, nickel, chrome, sapphire, silicon carbide, diamond, diamond-like carbon, and fluorine-containing diamond-like carbon.

It is preferable to reduce free energy of the surface of the nanostructure 11 of the carrier 10. In other words, by reducing physical and chemical adhesion forces between the nanostructure 11 and the functional layer 12, it is possible to significantly improve transfer properties. As a technique for reducing free energy, it is possible to adopt a technique for performing mold release treatment on the nanostructure 11, selecting a material low in free energy, charging a component for reducing free energy of the surface and the like. As the mold release treatment on the nanostructure 11, it is possible to adopt publicly-known general mold release treatment, and it is possible to use a general stain-proofing agent, leveling agent, water repellent agent, fingerprint adherence preventing agent and the like. Further, before performing the mold release treatment, the surface of the nanostructure 11 may be coated with metal or metal oxide. In this case, it is possible to improve uniformity of the mold release treatment and the strength of the nanostructure 11. As the material low in free energy, it is possible to use fluorine-containing resins typified by PTFE, silicone resins typified by PDMS and the like. As the technique for charging the component for reducing free energy of the surface, it is possible to use segregation, bleed-out and the like. For example, it is possible to use segregation of a fluorine component and methyl group component, bleed-out of a silicone component and the like. In addition, it is possible to perform the technique for charging the component for reducing free energy of the surface also on the functional layer 12. For example, by charging a fluorine component and silicone component into the functional layer 12, since it is possible to use segregation of the fluorine component and bleed-out of the silicone component, it is possible to significantly reduce the adhesion strength between the functional layer 12 and the nanostructure 11.

Particularly, from the viewpoint of reducing adhesion between the functional layer 12 and the carrier 10 irrespective of materials of the functional layer 12, free energy of the surface of the nanostructure 11 of the carrier 10 preferably ranges from 3 $erg/cm^2$ to 18 $erg/cm^2$. This is because even in the case of changing free energy of the functional layer 12 i.e. the material of the functional layer 12 arbitrarily, adherence calculated from a change in Gibbs free energy changing by contact between the functional layer and the carrier 10 reaches a peak bottom in the above-mentioned range. Particularly, from the viewpoint of reducing the friction force in peeling and removing the carrier 10, it is the most preferable that the free energy is in a range of 3 $erg/cm^2$ to 15 $erg/cm^2$. Further, in the case of reducing surface free energy of the nanostructure 11 of the carrier 10 by segregation, surface free energy of a master mold used in manufacturing the carrier 10 by a transfer method is preferably in a range of 3 $erg/cm^2$ to 18 $erg/cm^2$. By meeting this range, the transfer accuracy of the carrier 10 is improved, and it is possible to reduce surface free energy of the nanostructure 11 of the carrier 10 by segregation more excellently.

The above-mentioned surface free energy is preferably free energy measured according to the following definition. The energy is the sum of a dispersion component (d), polar component (p) and hydrogen-bonding component (h) calculated by calculation from the theory of Kitazaki-Hata from contact angles measured by using three probe liquids. The contact angle is a value measured by the $\Theta/2$ method on the probe liquid adhering to the nanostructure 11 of the carrier 10 in a horizontal state (inclination angle 0°), and is an average value of 10-point measurement.

Apparatus: Made by Nick Corporation, Wettability Evaluation Apparatus (Contact angle meter): LSE-B100W Syringe: Glass syringe Needle to discharge the probe liquid: Teflon (Registered Trademark) coat needle 22G made by Kyowa Interface Science Co., LTD.

Probe liquid discharge amount: 2.2 µl+0.5 µl

Measurement environment: Temperature 21° C. to 25° C., Humidity 35 to 49%

Probe liquid application method: The nanostructure of the carrier is pushed into about a half of a discharge probe liquid droplet Measurement time: Assuming the time the probe liquid contacts as 0 second, a contact angle value at 1.1 second is used Probe liquid: 1-bromonaphthalene, diiodo-methane and formamide Calibration of contact angle: In assuming that the contact angle measured by contact angle measurement is $\theta r$ and that the surface area multiplication factor of the nanostructure is Rf, a value calculated as $\theta = a \cos(\cos \theta r/Rf)$ is defined as a contact angle after calibration. Using this calibrated contact angle, surface free energy is derived from the theory of Kitazawa-Hata. In addition, the surface area multiplication factor (Rf) is an indicator indicating what times the unit area is multiplied by due to formation of the nanostructure 11, and is generally referred to a roughness factor.

In addition, in the case of not calculating surface free energy using the calibrated contact angle $\Theta$ measured and calculated using above-mentioned three kinds of probe liquids, the kind of the probe liquid is increased to ethylene glycol, n-hexadecane and water sequentially, and the combination of probe liquids to introduce to the theory of Kitazawa-Hat is changed.

As the fluorine component as described above, it is possible to introduce with monomers and resins provided with polyfluoro alkylene or perfluoro (polyoxyalkylene) chain, linear perfluoro alkylene group, perfluoro oxyalkylene group having a trifluoromethyl group in the side chain with an ethereal oxygen atom inserted in between carbon atoms, linear perfluoro alkylene chain having a trifluoromethyl group in the molecular side chain or molecular structure terminal, a linear perfluoro (polyoxyalkylene) chain or the like. Particularly, in terms of increasing the effect of reducing surface free energy, the polyfluoroalkylene chain is preferably a polyfluoroalkylene group with the carbon number of from 2 to 24.

The perfluoro (polyoxyalkylene) chain is preferably comprised of one kind of perfluoro (oxyalkylene) units or more selected from the group consisting of a ($CF_2CF_2O$) unit, ($CF_2CF(CF_3)O$) unit, ($CF_2CF_2CF_2O$) unit and ($CF_2O$) unit, and is more preferably comprised of ($CF_2CF_2O$) units, ($CF_2CF(CF_3)O$) units or ($CF_2CF_2CF_2O$) units. The perfluoro (polyoxyalkylene) chain is particularly preferably comprised of ($CF_2CF_2O$) units, because physical properties (heat resistance, acid resistance, etc.) of the nanostructure 11 are excellent. From the viewpoints of reducing surface free energy and improving hardness of the nanostructure 11, the number of perfluoro (oxyalkylene) units is preferably an integer of from 2 to 200, and more preferably an integer of from 2 to 50.

In addition, the fact that surface free energy of the nanostructure 11 is low in the present Description is that a contact angle of a water droplet with respect to the surface of the nanostructure 11 of the carrier 10 is 60 degrees or more. One indicator of energy of the surface of the nanostructure 11 is a contact angle of a water droplet.

It is preferable that the contact angle of a water droplet with respect to the nanostructure 11 of the carrier 10 is 60 degrees or more and less than 180 degrees, and that the ratio (Sh/Scm) of the nanostructure 11 is 0.45 or more and less than 1. First, when the contact angle of a water droplet is 60 degrees or more, it is possible to decrease surface free energy of the nanostructure 11 of the carrier 10. In other words, since the adhesion strength between the nanostructure 11 and the functional layer 12 is reduced, the transfer accuracy is improved. From the same effects, the contact angle is more preferably 70 degrees or more, and most preferably 80 degrees or more. Further, from the viewpoints of more stabilizing the surface of the nanostructure 11, decreasing the physical adhesion force between the functional layer 12 and the nanostructure 11, and reducing also the chemical adhesion force, the contact angle is preferably 85 degrees or more, more preferably 90 degrees or more, and most preferably 95 degrees or more. In addition, the higher contact angle is more preferably in a range meeting the upper limit value as described later.

On the other hand, when the contact angle is less than 180 degrees, the arrangement accuracy of the functional layer 12 is improved with respect to the nanostructure 11 of the carrier 10. From the same effect, the contact angle is more preferably 160 degrees or less, and most preferably 140 degrees or less. Further, from the viewpoints of adjusting surface free energy of the nanostructure 11 of the carrier 10 in a moderate range, and achieving both the arrangement accuracy and the removal accuracy of the functional layer 12, the contact angle is more preferably 120 degrees or less.

In addition, as the above-mentioned contact angle of a water droplet, the contact angle measurement method established in JIS R3257 (1999) as "Wettability test method of substrate glass surface" is adopted, and as a substrate that is a contact angle measurement target, it is determined to use the carrier 10 according to this Embodiment and measure the surface of the nanostructure 11 of the carrier 10.

Further, in the function transfer product 14 according to this Embodiment, it is preferable that the nanostructure 11 of the carrier 10 contains at least one or more elements selected from the group consisting of a fluorine element, a methyl group and a siloxane bond. By containing such an element, it is possible to decrease the physical and chemical adhesion forces between the nanostructure 11 of the carrier 10 and the functional layer 12. In other words, it is made easy to increase the adhesion force between the functional layer 12 and the target object 20 relatively larger than the adhesion force between the nanostructure 11 and the functional layer 12.

Furthermore, it is also possible to decrease surface free energy of the nanostructure 11 of the carrier 10 by adding an additive containing si loxane bonds, an additive containing fluorine, or an additive containing methyl groups to raw materials of the nanostructure 11. As an additive amount, when the amount ranges approximately from 0.1 wt % to 30 wt % relative to the entire raw materials of the nanostructure, physical stability of the nanostructure 11 is improved, while transfer of the additive to the functional layer 12 is suppressed, and such a range is preferable.

For introduction of siloxane bonds, in general formula —[—Si—O—]-n, a resin containing a portion with n of 50 or more promotes reduction in surface free energy and is preferable. Particularly, n of 100 or more is preferable, n of 300 or more is more preferable, and n of 1000 or more is the most preferable. As such a resin, it is possible to use publicly-known general silicones.

Further, in the case where the nanostructure 11 is formed of a fluorine-containing resin, when the fluorine element concentration is 25 atm. % or more relative to the entire resin forming the nanostructure 11, reduction in free energy of the surface of the nanostructure 11 is large, and therefore, such a range is preferable. The concentration of 35 atm. % or more is more preferable.

In the function transfer product 14 according to this Embodiment, it is preferable that a ratio (Es/Eb) between a surface layer fluorine element concentration (Es) on the functional layer 12 surface side of the nanostructure 11 of the carrier 10 and the average fluorine element concentration (Eb) of the carrier 10 exceeds 1 and is 30000 or less. In addition, in the case where the carrier 10 is comprised of the support substrate 15 and the nanostructure 11, the average fluorine element concentration (Eb) is measured on the nanostructure 11.

By making the ratio (Es/Eb) exceeding 1, it is possible to increase the adhesion force between a support substrate 155 of the carrier 10 and the nanostructure 11, and to improve the physical strength of the nanostructure 11. On the other hand, by making the ratio (Es/Eb) 30000 or less, since the arrangement accuracy of the functional layer 12 is improved with respect to the nanostructure 11 of the carrier 10 and it is possible to effectively decrease surface free energy of the nanostructure 11 surface, it is possible to decease the adhesion force between the functional layer 12 and the nanostructure 11. In other words, by the ratio (Es/Eb) meeting the above-mentioned range, physical stability of the function transfer product 14 is improved, and it is possible to enhance the transfer accuracy. Further, reusability of the carrier 10 is improved.

As the ratio (Es/Eb) is in the ranges of from $3 \leq Es/Eb \leq 1500$ to $10 \leq Es/Eb \leq 100$, the transfer accuracy of the functional layer 12 is more improved, while reusability of the carrier 10 is improved, and therefore, such ranges are preferable. In addition, when the ratio is in the range of $20 \leq Es/Eb \leq 200$ within the above-mentioned widest range ($1 < Es/Eb \leq 30000$), the surface layer fluorine element concentration (Es) is sufficiently higher than the average fluorine element concentration (Eb), free energy on the surface of the nanostructure 11 of the carrier 10 decreases effectively, and the physical and chemical adhesion forces with the functional layer 12 are thereby reduced. Further, since as the adhesion force between the nanostructure 11 and the support substrate 15 is increased, the gradient of the fluorine element concentration inside the nanostructure 11 becomes moderate, the mechanical strength of the nanostructure 11 is increased. By this means, it is possible to obtain the carrier 10 which is excellent in adherence to the support substrate 15, excellent in mold release properties from the functional layer 12, and is excellent in reusability, and therefore, such a range is particularly preferable. From the viewpoint of more exerting the effect, the range is sequentially preferable in the order of $26 \leq (Es/Eb) \leq 189$, $30 \leq (Es/Eb) \leq 160$, and $31 \leq (Es/Eb) \leq 155$. Further, when the ratio is in a range of $(Es/Eb) \leq 155$, the effect of replicating the carrier 10 and the effect of reusing the carrier 10 are more enhanced, and therefore, such a range is preferable. In addition, in the nanostructure 11 meeting the range of above-mentioned (Es/Eb), since surface free energy of the nanostructure 11 of the carrier 10 meets the range of 3 erg/cm² to 18 erg/cm² as described already, mold release properties from the functional layer 12, adherence to the support substrate 15 and repetition usability are more improved as described above, and therefore, such a nanostructure is the most preferable.

In addition, for example, the nanostructure surface layer of the carrier 10 means an intrusion portion of approximately 1% to 10% in the thickness direction or an intrusion portion of 2 nm to 20 nm in the thickness direction, from the surface side of the nanostructure 11 toward the backside (support substrate 15 side) of the carrier 10. In addition, it is possible to quantify the surface layer fluorine element concentration (Es) by an X-ray Photoelectron Spectroscopy method (XPS method). The penetration length of X-rays of the XPS method is several nanometers, thus shallow, and therefore, is suitable for quantifying the Es value. Further, it is possible to calculate the average fluorine element concentration (Eb) of the carrier 10 from the amount of charge. Alternatively, it is also possible to identify the average fluorine element concentration (Eb) of the carrier 10 by decomposing a slice of the carrier 10 by a flask combustion method, and then, applying ion chromatography analysis to the resultant.

As raw materials to form the carrier 10 that meets such a ratio (Es/Eb), it is possible to use mixed materials of fluorine-non-containing (meth)acrylate, fluorine-containing (meth)acrylate, and photopolymerization initiator. When the mixture of these materials is photo-cured while being in contact with a master mod low in surface free energy, it is possible to make the fluorine element concentration (Es) of the surface layer portion of the nanostructure 11 of the carrier 10 larger than the average fluorine element concentration (Eb) of the carrier 10, and further, it is possible to adjust the average fluorine element concentration (Eb) of the carrier 10 to be smaller. In addition, as the surface free energy of the above-mentioned master mold low in surface free energy, the value measured by the definition as described already preferably ranges from 3 erg/cm² to 18 erg/cm². By meeting this range, segregation properties of fluorine-containing (meth)acrylate are excellent, and it is possible to adjust the ratio (Es/Eb) easily.

In addition, as the non-fluorine-containing (meth)acrylate, it is possible to use publicly-known general photocurable monomers and photocurable oligomers. Further, also as the photopolymerization initiator, similarly, it is possible to use publicly-known general photopolymerization initiators. The fluorine-containing (meth)acrylate is not limited particularly, as long as fluorine-containing (meth)acrylate is photocurable (meth)acrylate containing the fluorine element in the molecule, and for example, fluorine-containing urethane (meth)acrylates expressed by the following chemical formulas (1) to (3) enable the average fluorine element concentration (Eb) to be effectively decreased and the surface layer fluorine element concentration (Es) to be increased, and therefore, are more preferable. As such an urethane (meta) acrylate, for example, it is possible to use "OPTOOL DAC" made by Daikin Industries, Ltd.

[Chemistry 5]

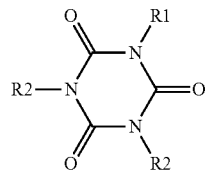

Chemical formula (1)

(In chemical formula (1), R1 represents following chemical formula (2), and R2 represents following chemical formula (3).)

[Chemistry 6]

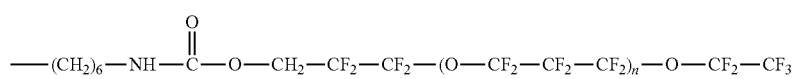

Chemical formula (2)

(In chemical formula (2), n is an integer of from 1 to 6.)

[Chemistry 7]

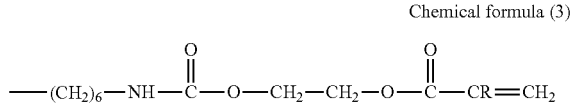

Chemical formula (3)

(In chemical formula (3), R is H or $CH_3$.)

When the nanostructure 11 of the carrier 10 used in the function transfer product 14 according to this Embodiment is an elastic body, the transfer accuracy of the functional layer 12 is further improved, and therefore, such a nanostructure 11 is preferable. This is because it is possible to suppress inclusion of environmental atmosphere in using the function transfer product 14 and to decrease an absolute value of peeling stress applied to the functional layer 12 in removing the carrier 10. From such a viewpoint, the nanostructure 11 of the carrier 10 is preferably formed of a resin such as ABS resin, polyethylene, polypropylene, polystyrene, polyvinyl chloride resin, methacrylic resin, acrylic resin, fluorine-containing acrylic resin, polyamide, polycarbonate, polyacetal, polyester, polyphenylene ether, polyurethane, fluorine-containing polyurethane, polytetrafluoroethylene (PTFE), tetrafluoroethylene, perfluoroalkyl vinyl ether copolymer (PFA), tetrafluoroethylene, hexafluoropropylene copolymer (FEP), tetrafluoroethylene, ethylene copolymer (ETFE), polyvinylidene fluoride (PVDF), polychlorotrifluoroethylene (PCTFE), chlorotrifluoroethylene, ethylene copolymer (ECTFE), silicone resin, and polydimethyl siloxane. Particularly, in the case where the structure is formed of a cured material of a photocurable resin, when the average number of functional groups of the photocurable resin that is the raw material is 6 or less, the transfer accuracy is further improved, and therefore, such a range is preferable. The number of 4 or less is more preferable, and the number of 3 or less is the most preferable. From the viewpoints of decreasing the elastic modulus of the nanostructure 11, and expanding the selection width of the functional layer 12 to transfer to the target object 20, the number of 2.5 or less is preferable, and the number of 1.5 or less is more preferable.

When the nanostructure 11 of the carrier 10 is an elastic body, the elastic body is preferably an elastic body with a glass transition temperature Tg of 100 degrees or less, and it is possible to use publicly-known commercially available rubber plates, resin plates, films and the like. Particularly, when Tg is 60° C. or less, since the degree of elastic deformation is large, transfer properties are improved, and therefore, such a range is preferable. From the same viewpoint, Tg of 30° C. or less is the most preferable. Further, when the glass transition temperature is 30° C. or less, it is possible to more promote the effects of the ratio (Ra/lor) as described already, and therefore, such a range is preferable. From the same viewpoint, the glass transition temperature is preferably 0° C. or less, and most preferably −20° C. or less. As such an elastic body low in Tg, examples thereof are a silicone rubber, nitrile rubber, fluororubber, polyisoprene (natural rubber), polybutadiene, polyvinyl acetate, polyethylene, polypropylene, nylon 6, nylon 66, polyethylene terephthalate, polyvinyl chloride, polyvinylidene chloride, polytetrafluoroethylene, polyvinylidene fluoride, polymethyl methacrylate, and polystyrene.

Further, when the nanostructure 11 of the carrier 10 is formed of a composition that dissolves in a solvent or water, it is possible to perform removal of the carrier 10 by dissolving the composition, the transfer accuracy of the functional layer 12 is improved, and such a composition is preferable.

When the carrier 10 is flexible, as the material forming the nanostructure 11, it is possible to adopt cured materials of photocurable resins, cured materials of thermosetting resins, thermoplastic resins and the like. On the other hand, when the carrier 10 is non-flexible, as the material forming the nanostructure 11, it is possible to use metal, metal oxide and the like. For example, it is possible to use inorganic materials such as silicon, quartz, nickel, chrome, sapphire, silicon carbide, diamond, diamond-like carbon, and fluorine-containing diamond-like carbon. Further, in the case of non-flexible, it is also possible to form the nanostructure 11 formed of a resin on the non-flexible support substrate 15. In the case of either of flexible and non-flexible, as described already, it is preferable to reduce free energy of the surface of the nanostructure 11.

In the case where the carrier 10 is flexible, it is possible to transfer the functional layer 12 to the target object 20 in a large area continuously. From this viewpoint, the raw material forming the nanostructure 11 is preferably a photocurable resin composition, and particularly, it is preferable to transfer the nanostructure on a cylindrical master roll surface continuously by a photo nanoimprint method to manufacture.

<Arrangement of the Functional Layer>

Examples of arrangements of the functional layer 12 with respect to the nanostructure 11 will be described below. The arrangements of the functional layer 12 will specifically be described below, but the arrangements of the functional layer 12 of the function transfer product 14 of the present invention are not limited thereto.

The functional layer 12 is capable of adopting a multi-layer functional layer structure. In this case, as described already, the uppermost layer of the functional layer 12 i.e. the functional layer in the furthest position from the nanostructure 11 of the carrier 10 is preferably in a non-liquid state. Further, it is preferable that the uppermost layer of the functional layer 12 develops adhesion to the target object 20, while is able to develop a desired function separately, in other words, the uppermost layer develops the adhesion function, and further develops another function. In other words, the uppermost layer preferably develops the adhesion function, and the function specific to nanostructure described below, or function of a non-nanostructure area 92 (see FIG. 12). By this means, the number of functions to transfer to the target object 20 increases, and it is possible to develop the function specific to nanostructure of the layered product 21 with more excellence. In addition, details will be described later, and functions of the functional layer 12 are classified into functions corresponding to the function specific to nanostructure and functions corresponding to a use of the target object 20.

When the functional layer 12 is a multilayer functional layer comprised of two or more layers and the uppermost layer of the functional layer 12 is in a non-liquid state, the number of functions of the layered product 21 is increased while maintaining transfer properties on the target object 20 of the functional layer 12. For example, in the case where a functional layer A and a functional layer B are layered in this order from the carrier 10 side of the function transfer product 14, the functional layer A may a liquid or a gas. As a liquid, for example, it is possible use a solvent, a solvent containing dispersed particles, a solvent with fluorescent substances dispersed, and an ion liquid. Particularly, in the case of an ion liquid, since the vapor pressure approaches 0, it is possible to adopt dry processing in providing the functional layer B. Particularly, from the viewpoint of the accuracy in transferring the accuracy of the functional layer 12 of the function transfer product 14 to the target object 20, when the functional layer 12 is formed of multi-functional layers comprised of two or more layers, it is preferable at least a half or more of the functional layer 12 is in a non-liquid state, it is more preferable that 80% or more of the functional layer 12 is in a non-liquid state, and it is the most preferable that all the functional layer 12 is in a non-liquid state.

As described later, in the case of forming the multifunctional layers comprised of two or more layers, there are a case where all the layers develop the functions specific to nanostructure, and another case where a layer that develops the function specific to nanostructure and another layer that develops a function corresponding to a use of the target object 20 coexist.

Figure 12:
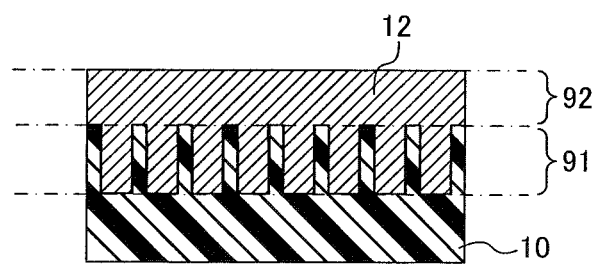
FIG. 12 is a cross-sectional schematic diagram illustrating the function transfer product according to this Embodiment.

As shown in FIG. 12, since the function transfer product 14 contains the functional layer 12 on the nanostructure 11 of the carrier 10, the functional layer 12 is classified into an area (hereinafter, referred to as a nanostructure area) 91 that contains the nanostructure 11 of the carrier 10, and an area (hereinafter, referred to as a non-nanostructure area) 92 that does not contain the nanostructure 11. The function specific to nanostructure that the functional layer S12 of the layered product 21 exerts is determined by the nanostructure area 91. In other words, when the functional layer 12 is a single layer, the functional layer 12 develops the function specific to nanostructure, and further develops adhesion to the target object 20. In the case where the functional layer 12 is an N-layer structure, it is possible to adopt a form in which a first layer to Mth layer (M≤N, N≥2) are included in the nanostructure area 91, and the Mth layer to Nth layer (M≤N, N≥2) are included in the non-nanostructure area 92. Herein, in the case of M=N, all the multilayer functional layers 12 are included in the nanostructure area 91. A layer included in the non-nanostructure area 92 is preferably capable of developing a function suitable for a use of the target object 20 except the function specific nanostructure. In other words, in the case where the functional layer 12 is a multilayer structure, it is preferable that in the case where all the functional layers 12 are included in the nanostructure area 91, the uppermost layer develops the function specific to nanostructure and the adhesion to the target object 20, and that in the case where the functional layer 12 included in the non-nanostructure area 92 exists, the uppermost layer develops the function corresponding to a user of the target object 20 and the adhesion to the target object 20.

Herein, being included in the nanostructure area 91 is defined by including the shape or arrangement corresponding to the nanostructure 11 of the carrier 10. In other words, when the functional layer 12 included in the non-nanostructure area 92, the nanostructure 11 of the carrier 10 is filled and flattened with the functional layer 12 included in the nanostructure area 91. As described above, in the function transfer product 14 of this Embodiment, it is preferable that the uppermost layer of the functional layer 12 develops the function corresponding to the layered product 21, and also has the adhesion to the target object 20.

As the function specific to nanostructure, examples thereof are a light diffraction function, effective medium approximate function, light scattering function derived from light diffraction, surface plasmon function, specific surface area increasing function, quasipotential setting function, optical confinement function, strengthening function of Lennard-Jones potential, superhydrophobic function, superhydrophilic function, slippery function, quantum function, dressed photon function, evanescent wave extraction function, light extraction function, photonic crystal function, nano-reaction field function, quantum dot function, nanoparticle function, and metamaterial function. By transferring the functional layer 12 of the function transfer product 14 to the target object 20, it is possible to directly add these functions or add a processing mask to develop these functions. In other words, by directly adding the function, it is possible to provide the functional layer that develops the function derived from the nanostructure separately in the target object 20. On the other hand, by transferring the functional layer 12 as a processing mask, it is possible to perform nano-processing on the target object 20, and it is possible to provide a fine pattern made of the same material as that of the target object 20 on the surface of the target object 20. The case of using the function transfer product 14 as a transfer product of the processing mask will specifically be described in <Mask transfer product> as described below. In either case, the function is transferred to the target object 20, and by this means, it is possible to prepare a trace substance detecting sensor, nano-reaction field, antireflection surface, high-efficient semiconductor light emitting device (LED, OLED or the like), quantum dot device, photonic crystal device, optical waveguide, nano-circuit, nano-dielectric antenna, decorative materials using light diffraction colors, decorative materials using a photonic band gap, superhydrophobic surface, superhydrophilic surface, slippery surface typified by SLIPS (Slippery Liquid-Infused Porous Surfaces), high-efficient photocatalyst surface, water collecting surface, water vapor collecting surface, anti-icing surface, anti-snow surface, surface having a minus refractive index, surface for liquid-crystal molecular orientation, high-efficient fuel cell, cleaning tool of nanoscale, adhesiveless pressure-sensitive material (tape), surface with nanoparticles arranged, electromagnetic shield and the like.

As the function provided in the functional layer 12 of the non-nanostructure area 92, it is possible to select as appropriate according to a use method of the target object 20, and examples thereof are a gas barrier function, water vapor barrier function, antifriction function, reserve printing function, hydrophobic function, lipophilic function, hydrophilic function, antistatic function, color filter function, color shift function, polarization modifying function, antireflection function, light re-directivity function, diffusion function, optical rotation function, buffer function, stress relaxation function, heat diffusion function, heat dissipation function, heat absorption function, high hardness function and coloring function.

For example, by arranging mutually independent discontiguous functional layers 12 in the nanostructure 11, it is possible to cause the functional layers 12 as nanoparticles. In this case, the function transfer product 14 is capable of being used as a nanoparticle transfer product. The nanoparticles have received attention because of developing optical performance specific to nanoscale, catalyst performance, or phenomenon for increasing sensitivity in sensing, and there are problems that it is difficult to control the size, shape and arrangement of the nanoparticles, it is difficult to control aggregation of nanoparticles, and the like. By using the function transfer product 14, since it is possible to cause the nanostructure 11 of the carrier 10 to function as a guide of nanoparticles (functional layers 12), it is possible to easily solve these problems, and it is possible to obtain the layered product 21 with nanoparticles arranged on the whole or part of the surface with high accuracy.

Further, for example, in order to (a) achieve self-cleaning, reduction in friction with respect to oil and sea water, prevention of adherence of fingerprint, prevention of freeze, prevention of adherence of slime and the like, attention is directed toward super-water repellency, super-oil repellency, SLIPS surface and the like using the effect of increasing the specific surface area specific to nanostructure. Further, for example, it has received attention (β) to improve power generation efficiency while reducing loads on maintenance of a solar battery by adding the self-cleaning function using the multiplication effect of the specific surface area specific to nanostructure and the antireflection function using the effective medium approximate effect specific to nanostructure to the surface of the solar battery receiving attention as the next generation electricity generation source. However, in either of (α) and (β) cases, there is the problem that it is difficult to add the controlled nanostructure S11 to the target object 20 in a large area. By the problem, there is the problem that the function developed in the layered product 21 is reduced and/or has the distribution. For example, in the case of using fine particles, since secondary aggregation of fine particles is used, unevenness occurs in surface free energy of scale such as one by one of the nanostructure, and becomes macroscopic unevenness, unevenness thereby occurs in the effects, and the function degrades. However, by using the function transfer product 14 according to this Embodiment, it is possible to solve the above-mentioned problems. (a) It is set that the average pitch of the nanostructure 11 of the function transfer product 14 ranges from 10 nm to 1200 nm, and that surface free energy of the nanostructure 11 ranges from 3 erg/cm$^2$ to 18 erg/cm$^2$, and for example, a fluorine component is contained in the functional layer 12. By this means, it is possible to reduce free energy of the functional layer 12 in contact with the nanostructure 11. In other words, by transferring to the target object 20, it is possible to form the nanostructure S11 low in surface free energy easily in a large area. By this means, it is possible to exhibit the effects as described in above-mentioned (α). (β) It is set that the average pitch of the nanostructure 11 of the function transfer product 14 ranges from 50 nm to 350 nm, and for example, a first function containing titanium oxide and a second functional layer having a stress relaxation function are provided in this order from the side of the nanostructure 11. By transferring to the target object 20, it is possible to form the nanostructure S11 with photocatalyst performance easily in a larger area. Further, since the first functional layer with photocatalyst performance and the target object 20 are in contact with each other via the second functional layer with the stress relaxation function, it is possible to suppress the occurrence of a crack due to the temperature difference. By this means, it is possible to exhibit the effects as described in above-mentioned (β).

Examples of arrangements of the functional layer 12 with respect to the nanostructure 11 of the carrier 10 will be described below. In the case where the functional layer 12 is contained in only the nanostructure area 91, it is possible to broadly adopt nine states as shown in FIGS. 13A to 13I. FIG. 13A illustrates that the functional layer 12 is filled and arranged only in concave portion 11a inner portions of the nanostructure 11 of the carrier 10. FIG. 13B illustrates the case where the functional layer 12 is layered and arranged only on vertex portions of the convex portions 11b of the nanostructure 11. FIG. 13C illustrates a state in which the functional layers 12 are arranged in concave portion 11a inner portions and on convex portion 11b vertex portions of the nanostructure 11 of the functional layer 12, and the functional layer 12 in concave portion 11a inner portions and the functional layer 12 on convex portion 11b vertex portions separate from each other. FIG. 13D illustrates the case where the functional layer 12 is applied to form a coat on the surface of the nanostructure 11 of the carrier 10. FIG. 13E illustrates a state in which the nanostructure 11 of the carrier 10 is filled and flattened with the functional layer 12. FIG. 13F illustrates a state in which a first functional layer 12a is filled and arranged in only concave portion 11a inner portions of the nanostructure 11 of the carrier 10, and a second functional layer 12b is further provided to flatten the functional layer 12a and the nanostructure 11 of the carrier 10. FIG. 13G illustrates a state in which the first functional layer 12 is layered and arranged on only the vertex portions of the convex portions 11b of the nanostructure 11, and the second functional layer 12b is further provided to flatten the first functional layer 12a and the nanostructure 11 of the carrier 10. FIG. 13H illustrates a state in which the first functional layers 12a are arranged in concave portion 11a inner portions and on convex portion 11b vertex portions, the functional layer 12a in concave portion 11a inner portions and the functional layer 12a on convex portion 11b vertex portions separate from each other, and the second functional layer 12b is further provided to flatten the functional layers 12a and the nanostructure 11 of the carrier 10. FIG. 13I illustrates a state in which the first functional layer 12 is applied to form a coat on the surface of the nanostructure 11 of the carrier 10, and the second functional layer 12b is further provided to flatten the functional layer 12a. It is possible to select which state to adopt as appropriate corresponding to the function to add onto the target object 20. Further, these states are not affected by the shape and arrangement of the nanostructure 11 of the carrier 10.

In FIG. 13, each of the functional layers 12, 12a and 12b is drawn as a single layer, and may be multilayer functional layers. In other words, in the N-layer multilayer functional layers as described above, this is a state in which all the N layers are included in the nanostructure area 91.

Figure 14A:
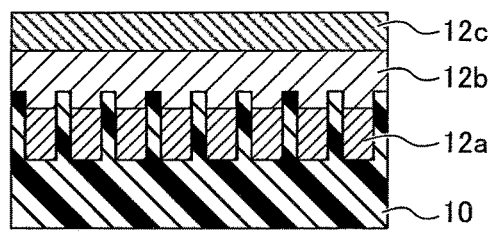
FIG. 14 contains cross-sectional schematic diagrams illustrating arrangement examples in nanostructure of the carrier of the functional layer in the function transfer product according to this Embodiment.
Figure 14B:
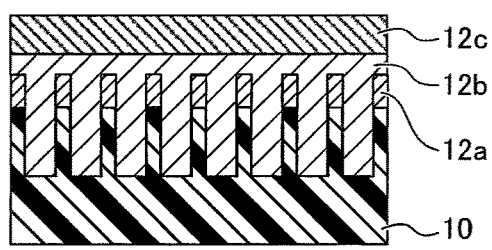
Figure 14C:
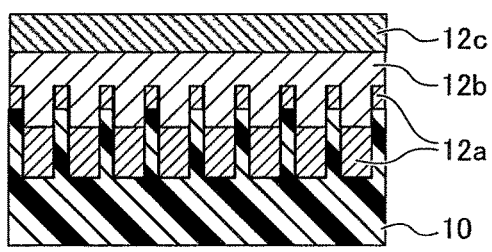
Figure 14D:
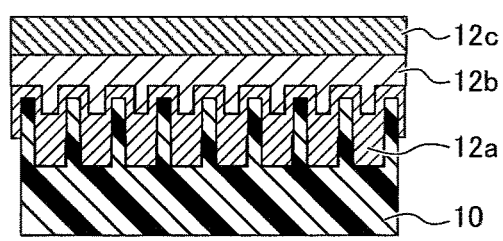
Figure 14E:
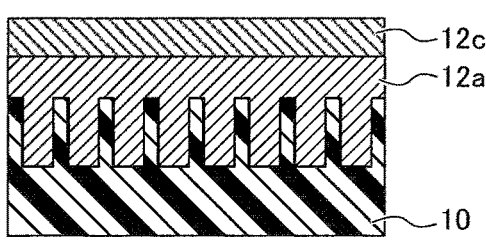

In the case of including the functional layer 12 included in the nanostructure area 91 and the functional layer 12 included in the non-nanostructure area 92, as shown in FIGS. 14A to 14E, it is possible to adopt broadly five states. FIGS. 14A to 14D show a state in which a third functional layer 12c is further provided on the surface of the second functional layer 12b with respect to the case where the first functional layer 12a and the nanostructure 11 are flattened with the second functional layer 12b described in FIG. 13. In other words, in FIGS. 14A to 14D, the functional layers 12a and 12b are included in the nanostructure area 91 as shown in FIG. 12, and function as layers to develop the functions specific to nanostructure, and the functional layer 12c is included in the non-nanostructure area 92 as shown in FIG. 12, thereby preferably develops a further function corresponding to a use of the layered product 21, and functions as a layer to develop also adhesion to the target object 20. FIG. 14E illustrates a state in which a functional layer 12c that is the second functional layer is further provided on the surface of the first functional layer 12a with respect to the case where the nanostructure 11 is flattened with the first functional layer 12a. In other words, in FIG. 14E, the functional layer 12a functions as a layer that is included in the nanostructure area 91 as shown in FIG. 12, and that functions as a layer to develop the function specific to nanostructure, and the functional layer 12c is included in the non-nanostructure area 92 as shown in FIG. 12, thereby preferably develops a further function corresponding to a use of the layered product 21, and functions as a layer to develop also adhesion to the target object 20. In addition, in FIG. 14, each of the functional layers 12a to 12c is drawn as a single layer, and these layers may be multilayer functional layers.

It is possible to select the thickness of the functional layer 12 as appropriate according to the function that the functional layer S12 of the layered product 21 should develop, and from the viewpoint of the transfer accuracy of the functional layer 12 of the function transfer product 14, it is preferable to meet a thickness range as described below. The thickness of the functional layer 12 is capable of being designed as appropriate according to a balance between the functional layer 12 included in the nanostructure area 91 and the functional layer 12 included in the non-nanostructure area 92. It is possible to divide the thickness of the functional layer 12 between the case where the functional layer 12 is included in the non-nanostructure area 92 as shown in FIG. 14 and the case where the functional layer 12 is included only in the nanostructure area 91 as shown in FIG. 13.

Case where the Functional Layer 12 is Included in the Non-Nanostructure Area 92

It is preferable that the distance (lor) as described already meets the following range. Herein, the distance (lor) is the shortest distance between the top position of a convex-portion of the convex portion 11b of the nanostructure 11 of the carrier 10 and the exposed surface of the functional layer 12, and is the arithmetical mean value obtained by analyzing by the measurement method as described already. When the distance (lor) exceeds 0 nm within the range of meeting the ratio (Ra/lor) as described above, the transfer accuracy of the functional layer 12 to the target object 20 is improved, and therefore, such a range is preferable. Particularly, from the viewpoints of suppressing the failure of molecular scale of the surface of the functional layer 12 and maintaining the adhesion strength between the target object 20 and the functional layer 12, the distance is preferably 5 nm or more, and is more preferably 10 nm or more. Further, from the viewpoints of improving fluidity of the functional layer 12 and more exerting the effects of the ratio (Ra/lor) as described already, the distance is more preferably 20 nm or more, and most preferably 50 nm or more. Furthermore, from the viewpoint of suppressing deterioration of the film thickness distribution due to the flow of the functional layer 12 in bringing the function transfer product 14 into contact with the target object 20, the distance (lor) is preferably 10,000 nm or less, and more preferably 5,000 nm or less. From the viewpoints of making manufacturability of the function transfer product 14 excellent, and decreasing an amount of the functional layer 12 to use, the distance is more preferably 3,000 nm or less, and most preferably 1,500 nm or less. Further, the distance of 1,200 or less more improves resistance to variations in the film thickness of the functional layer 12, and is preferable. Particularly, from the viewpoints of improving the elastic modulus of the functional layer 12 relative to the elastic modulus of the bulk and more effectively suppressing variations in the film thickness in contact, the distance is preferably 1,000 nm or less, more preferably 800 nm or less, and most preferably 600 nm or less.

In addition, the thickness of the functional layer 12 included in the nanostructure area 91 (see FIG. 12) can be selected as appropriate corresponding to the function specific to nanostructure, because the transfer accuracy is guaranteed by the functional layer 12c included in the non-nanostructure area 92.

Case where the functional layer 12 is included in only the nanostructure area 91.

The case is broadly classified into two corresponding to the arrangement state of the functional layer 12. The first case is a case where the nanostructure 11 of the carrier 10 is not flattened with the functional layer 12 (hereinafter, referred to as "Type A"), and is of states exemplified in FIGS. 13A to 13D. The second case is a case where the nanostructure 11 of the carrier 10 is flattened with the functional layer 12 (hereinafter, referred to as "Type B"), and is of states exemplified in FIGS. 13E to 13I.

Further, the case of Type A is broadly classified into three. First, there is the case where the functional layer 12 is arranged only in concave portion 11a inner portions of the nanostructure 11 of the carrier 10 as shown in FIG. 13A (hereinafter, referred to as "Type A1"). Next, there is the case where the functional layer 12 is arranged only on convex portion upper portions of the nanostructure 11 of the carrier 10 as shown in FIG. 13B, or the functional layers 12 are arranged on convex portion upper portions and concave portion 11a inner portions of the nanostructure 11 of the carrier 10 and are mutually separate as shown in FIG. 13C (hereinafter, referred to as "Type A2"). Finally, there is the case where the functional layer 12 is provided to cover the surface of the nanostructure 11 of the carrier 10 as shown in FIG. 13D (hereinafter, referred to as "Type A3").

In the case of Type A (see FIGS. 13A to 13D), the thickness (H1) of the functional layer 12 preferably meets a range as described below. Herein, the thickness (H1) of the functional layer 12 is defined as the shortest distance from the interface average position between the nanostructure 11 of the carrier 10 and the functional layer 12 to the exposed surface average position of the functional layer 12.

In the case of Type A1 (see FIG. 13A), from the viewpoints of suppressing inclusion of bonding atmosphere in bringing the function transfer product 14 into contact with the target object 20 and enhancing the transfer accuracy, in assuming that the height of the nanostructure 11 is Hn, the thickness (H1) of the functional layer 12 preferably ranges from 0.1 Hn to 1.2 Hn. Particularly, from the viewpoint of more improving the transfer accuracy of the functional layer 12, the thickness is preferably 0.5 Hn or more, preferably 0.75 Hn or more, and most preferably 0.85 Hn or more. Further, from the viewpoints of improving the arrangement accuracy of the functional layer 12 and improving the accuracy of the layered product 21, the thickness is preferably 0.98 Hn or less, more preferably 0.95 Hn or less, and most preferably 0.9 Hn or less.

In the case of Type A2 (see FIGS. 13B and 13C), from the viewpoints of improving bonding properties in bringing the functional layer 12 of the function transfer product 14 into contact with the target object 20 and suppressing breakage of the functional layer S12 of the layered product 21, in assuming that the height of the nanostructure 11 is Hn, the thickness (H1) of the functional layer 12 preferably ranges from 0.1 Hn to Hn. Particularly, from the viewpoint of more improving the transfer accuracy of the functional layer 12, the thickness preferably ranges from 0.2 Hn to 0.9 Hn, more preferably ranges from 0.25 Hn to 0.85 Hn, and most preferably ranges from 0.4 Hn to 0.6 Hn.

In the case of Type A3 (see FIG. 13D), from the viewpoints of bonding accuracy and transfer accuracy in bringing the functional layer 12 of the function transfer product 14 into contact with the target object 20, in assuming that the height of the nanostructure 11 is Hn, the thickness (H1) of the functional layer 12 preferably ranges from 0.01 Hn to Hn. Particularly, from the viewpoint of more improving the transfer accuracy of the functional layer 12, the thickness is preferably 0.1 Hn or more, preferably 0.15 Hn or more, and most preferably 0.2 Hn or more. Further, from the viewpoints of improving the arrangement accuracy of the functional layer 12 and improving the accuracy of the functional layer 12 provided on the target object 20, the thickness is preferably 0.9 Hn or less, more preferably 0.75 Hn or less, and most preferably 0.65 Hn or less.

Type B exemplified in FIGS. 13E to 13I is further classified into two. First, there are the case of having the functional layer 12 provided to flatten the nanostructure 11 of the carrier 10 (see FIG. 13E) and the case of having the first functional layer 12a arranged in concave portion 11a inner portions of the nanostructure 11 of the carrier 10 and the second functional layer 12b provided to flatten the first functional layer 12a and the nanostructure 11 (see FIG. 13F) (hereinafter, referred to as "Type B1"). Next, there is the case where the first functional layer 12a is provided on convex portions 11b of the nanostructure 11 of the carrier 10 and the second functional layer 12b is further provided to flatten the nanostructure 11 (hereinafter, referred to as "Type B2"), and the case is of states as exemplified in FIGS. 13G to 13I.

In the case of Type B1, the thickness (H1) is the distance from the vertex portion position of the convex portion 11b of the nanostructure 11 of the carrier 10 to the surface of the functional layer 12. On the other hand, in the case of Type B2, the thickness (H1) of the functional layer 12 is defined as a value obtained by subtracting the thickness of the functional layer 12a provided on the convex portion 11b of the nanostructure 11 of the carrier 10 from the distance (lor). In other words, in the case of Type B2, the thickness (H1) is the distance from the vertex portion position of the functional layer 12a provided on the convex portion 11b of the nanostructure 11 of the carrier 10 to the surface of the second functional layer 12b. When the thickness (H1) exceeds 0 nm, the transfer accuracy of the functional layer 12 to the target object 20 is improved, and therefore, such a thickness is preferable. Particularly, from the viewpoints of suppressing the failure of molecular scale of the surface of the functional layer 12 and maintaining the adhesion strength between the target object 20 and the functional layer 12, the thickness is preferably 5 nm or more, and is more preferably 10 nm or more. Further, from the viewpoints of improving fluidity of the functional layer 12 and more exerting the effects of the ratio (Ra/lor) as described already, the thickness is more preferably 20 nm or more, and most preferably 50 nm or more. Furthermore, from the viewpoint of suppressing deterioration of the film thickness distribution due to the flow of the functional layer 12 in bringing the function transfer product 14 into contact with the target object 20, the distance (lor) is preferably 10,000 nm or less, and more preferably 5,000 nm or less. From the viewpoints of making manufacturability of the function transfer product 14 excellent, and decreasing an amount of the functional layer 12 to use, the distance is more preferably 3,000 nm or less, and most preferably 1,500 nm or less. Further, the distance of 1,200 or less more improves resistance to variations in the film thickness of the functional layer 12, and is preferable. Particularly, from the viewpoint of improving the elastic modulus of the functional layer 12 relative to the elastic modulus of the bulk and more effectively suppressing variations in the film thickness in contact, the distance is preferably 1,000 nm or less, more preferably 800 nm or less, and most preferably 600 nm or less.

<Mask Transfer Product>

With respect to the case of using the function transfer product 14 as a transfer product of a mask for processing, described next are more preferable arrangements of the functional layer 12. By using the function transfer product 14 as a transfer product of a mask for processing, it is possible to perform nano-processing on the surface of the target object 20. In other words, by using the target object provided with the fine pattern subjected to the nano-processing, it is possible to actualize various uses as described above. In addition, in the following description, unless otherwise specified, it is assumed to meet layer structures, use methods, various physical properties and the like of the function transfer product 14 as described already.

By using the function transfer product 14 according to this Embodiment for the purpose of transferring and forming the mask function to perform nano-processing on the target object 20 onto the target object 20, it is possible to improve nano-processing accuracy in the target object surface 20. This is because it is possible to beforehand determine and guarantee factors such as the thickness of the functional layer S12 that functions as a mask and the size•arrangement of the nanostructure S11 with the accuracy of the nanostructure 11 of the carrier 10 of the function transfer product 14 and the accuracy of the film thickness of the functional layer 12. In the case where two or more functional layers 12 are contained, at least one functional layer 12 or more function as a mask for processing of the target object 20, and at least one functional layer 12 or more function as a mask to process the other functional layers. In other words, by using the function transfer product 14, it is possible to transfer the functional layer 12 onto the surface of the target object 20. In the case where the functional layer 12 is comprised of two or more layers, one functional layer or more are caused to function as a mask for processing of the other functional layer, and for example, the other functional layer is subjected to nano-processing by dry etching. Subsequently, it is possible to perform nano-processing on the target object 20 using the functional layer 12 as a mask for processing, for example, by dry etching or wet etching. On the other hand, in the case where the functional layer 12 is a single-layer functional layer, it is possible to perform nano-processing on the target object 20 using the functional layer 12 as a mask for processing, for example, by dry etching or wet etching.

In the following description, the function transfer product 14 to add a mask function to the target object 20 is referred to as a mask transfer product 14. Further, in the description of the mask transfer product 14, the terminology of dry etching rate is used, and the dry etching rate is defined as a dry etching rate on a flat surface without the nanostructure.

As the mask transfer product 14, it is possible to adopt the function transfer products 14 described already with reference to FIGS. 13 and 14. Typical examples will be described below in using the function transfer product 14 described already with reference to FIGS. 13 and 14 as the mask transfer product 14. It is possible to use the function transfer products 14 as described in FIGS. 13 and 14 that do not appear in the following description also as in the mask transfer product 14 described below.

Figure 15A:
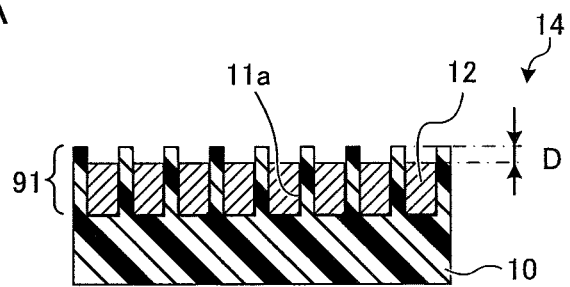
FIG. 15 contains cross-sectional schematic diagrams illustrating a mask transfer product according to this Embodiment.

FIG. 15A shows a cross-sectional schematic diagram of the mask transfer product 14 (hereinafter, referred to as a "mask transfer product (1)") in the case where the functional layer 12 is included in only the nanostructure area 91 in the mask transfer product 14 according to this Embodiment (see FIG. 13A). As shown in FIG. 15A, in the mask transfer product (1) 14, the functional layer 12 is provided to fill only concave portion 11a inner portions of the nanostructure 11 of the carrier 10. In this case, using the functional layer 12 transferred to the target object 20, it is possible to perform nano-processing on the target object 20 by wet etching or dry etching.

In assuming that the average height of the nanostructure 11 is h, when the distance, which is the distance shown by D in FIG. 15A, between the top position of a convex-portion of the nanostructure 11 of the carrier 10 and the surface of the functional layer 12 meets h/2, the transfer accuracy of the functional layer 12 added onto the target object 20 is improved. Particularly, the distance is preferably h/3 or less, and more preferably h/6 or less. On the other hand, from the viewpoint of improving processing accuracy in performing nano-processing on the target object 20 using the transferred functional layer 12, the distance D is preferably −0.2 h (minus 0.2 h) or more. Herein, the fact that the distance D is minus means that the concave portion 11a of the nanostructure 11 of the carrier 10 is completely filled with the functional layer 12, and that the thickness of the functional layer 12 is higher than the height of the nanostructure 11. From the viewpoint of arrangement controllability of the functional layer 12, the distance D is preferably 0 nm or more. Among the distances meeting these ranges, a shorter distance D is more preferable.

By meeting such a range, in using the functional layer 12 transferred onto the target object 20 using the mask transfer product (1) 14 as a mask, it is possible to form a physically stable mask on the target object 20. Therefore, also in the case where the target object 20 is a substrate hard to process, it is possible to perform nano-processing easily.

Figure 15B:
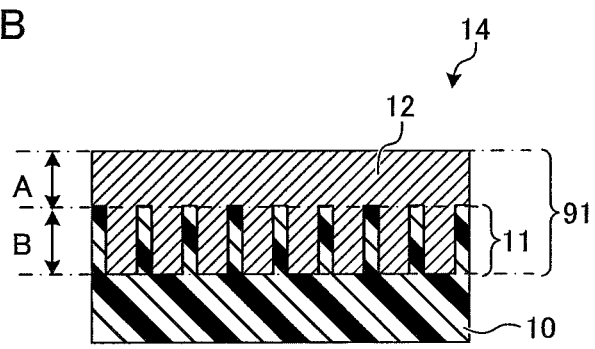

FIG. 15B shows a cross-sectional schematic diagram of the mask transfer product 14 (hereinafter, referred to as a "mask transfer product (2)") in the case where the functional layer 12 is included in only the nanostructure area 91 in the mask transfer product 14 according to this Embodiment (see FIG. 13E). As shown in FIG. 15B, in the mask transfer product (2), the functional layer 12 is provided to fill the nanostructure 11 of the carrier 10 to flatten. In this case, the concave portions are removed by dry etching, using, as a processing mask, the convex portions of the nanostructure of the functional layer 12 transferred to the target object 20. Subsequently, using the left convex portions as a processing mask, it is possible to perform nano-processing on the target object 20 by wet etching or dry etching.

When the distance, which is the distance shown by A in FIG. 15B, between the top position of a convex-portion of the nanostructure 11 of the carrier 10 and the surface of the functional layer 12 meets 10 times or less the average pitch of the nanostructure 11, the processing accuracy is improved in processing the target object 20. Particularly, 5 times or less are preferable, 4.5 times or less are more preferable, and 4 times or less are the most preferable. From the viewpoint of more exerting the effect of the average pitch as described already, 3.5 times or less are preferable, 3 times or less are more preferable, and 2.5 times or less are the most preferable. By the distance A exceeding 0 nm, bonding properties are improved in bonding the functional layer 12 of the mask transfer product (2) 14 to the target object 20, and therefore, such a distance is preferable. Within the above-mentioned range, a shorter distance A is more preferable.

Further, the distance A is smaller than the depth of the nanostructure 11 that is the distance between the concave bottom portion position and the convex-portion vertex of the nanostructure 11 of the carrier 10 shown by the distance B in FIG. 15B. Furthermore, when the distance B is 1.5 time the distance A or more, the mask function tends to exert in performing nano-processing on the target object 20, the processing accuracy of the target object 20 is improved, and therefore, such a distance is preferable. From the same effect, the distance B is more preferably 2.5 times the distance A or more. Further, from the viewpoint of improving the accuracy in the case of processing the target object 20 by dry etching, 4 times or more are preferable, 6 times or more are more preferable, and 9 times or more are the most preferable.

By meeting such a range, in using the functional layer 12 transferred onto the target object 20 using the mask transfer product (2) 14 as a mask, it is possible to form a physically stable mask on the target object 20. Therefore, also in the case where the target object 20 is a substrate hard to process, it is possible to perform nano-processing easily.

In the mask transfer products (1) and (2) in which the functional layer 12 is included in only the nanostructure area 91, when a ratio (Vf/Vt) between an etching rate (Vf) of the functional layer 12 and an etching rate (Vt) of the target object 20 is 3 or less, the processing accuracy is improved in the target object 20 with the nanostructure 11 of the carrier 10 reflected. Particularly, the ratio of 2.5 or less is more preferable, and the ratio of 2 or less is the most preferable. Further, from the viewpoint of improving the transfer accuracy of the functional layer 12, and also improving the nano-processability of the target object 20, the ratio of 1 or less is more preferable, and the ratio of 0.8 or less is the most preferable. In addition, when materials forming the functional layer 12 contain the cyclic portion as described already, the processing accuracy of the target object 20 is improved, and therefore, such materials are preferable.

In the case of performing nano-processing on the target object 20 by dry etching, as distinct from the micro-structure, the shadow effect and loading effect in dry etching are remarkable, and the processing becomes difficult. Particularly, in the case of measuring when the nanostructure exists, the ratio (vf/vt) significantly undergoes the loading effect, and becomes large. Also in such a case, by adding the functional layer 12 meeting the predetermined thickness range with high accuracy onto the target object 20, and meeting the above-mentioned ratio (Vf/Vt), it is possible to easily perform nano-processing on the target object 20 with high accuracy.

In addition, although not shown in the figure, in the mask transfer product (2) 14, the functional layer 12 may be made multilayer structure. Herein, the multilayer structure is defined as a state in which a plurality of layers is layered in the thickness direction of the carrier 10. In addition, this state includes a state in which a second functional layer is provided to flatten the nanostructure 11 of the mask transfer product (1) 14. It is assumed that as the functional layer 12, the first layer to Nth layer (N≥2) are layered sequentially in the direction of from the concave-portion 11a bottom portion to the convex-portion 11b upper portion of the nanostructure 11 of the carrier 10. When the functional layer 12 of the mask transfer product (2) 14 is the multilayer structure, a ratio (VfN/Vf1) between an etching rate (Vf1) of at least the first layer of the functional layer 12 and an etching rate (VfN) of the Nth layer is preferably larger than 1 or more. By the ratio larger than 1, in the multilayer functional layer 12 added onto the target object 20, the processing accuracy of from the second layer to the Nth layer is improved in using the first layer as a processing mask. Particularly, from the viewpoint of enhancing the arrangement accuracy of the first layer of the functional layer 12 on the nanostructure 11, the ratio is preferably 1000 or less, and more preferably 500 or less. Further, from the viewpoint of arranging uniformly inside the concave portions 11a of the nanostructure 11, the ratio is preferably 300 or less, more preferably 150 or less, and most preferably 100 or less. On the other hand, from the viewpoint of the accuracy in forming pillars formed of the multilayer functional layer S12, the ratio is preferably 3 or more, more preferably 10 or more, and further preferably 15 or more. Moreover, the Nth layer of the functional layer 12 meets the ratio (vf/vt) described in the above-mentioned single-layer case. By using the mask transfer product (2) provided with such a multilayer functional layer, it is possible to transfer and form the multi layer functional layer onto the target object 20. By performing the nano-processing by dry etching from the functional layer 12 surface side of the first layer of the multilayer functional layer 12 that is added and transferred, also in the case where the distance A is large, it is possible to perform nano-processing with ease, and it is possible to add the nanostructure to the surface of the target object 20.

Figure 15C:
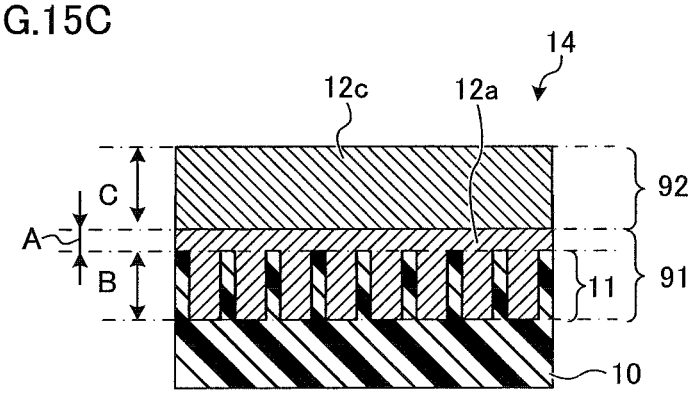

Next, FIG. 15C shows a cross-sectional schematic diagram of the case (hereinafter, referred to as a "mask transfer product (3)") where the functional layer 12a is arranged in the nanostructure area 91 and the functional layer 12c is arranged in the non-nanostructure area 92 in the mask transfer product 14 according to this Embodiment. In FIG. 15C, the distance A and the distance B are the same definitions as described previously in the mask transfer product (2) 14, and the relationship between the distance A and the distance B also meets the range as described previously. In this case, the concave portions are removed by dry etching until the target object 20 is exposed, using, as a processing mask, the convex portions of the nanostructure of the functional layer S12 transferred to the target object 20. Subsequently, using the left convex portions as a processing mask, it is possible to perform nano-processing on the target object 20 by wet etching or dry etching.

The distance C means a thickness of the functional layer 12c provided on the upper portion of the functional layer 12a provided to flatten the nanostructure 11 of the carrier 10. In this case, when the distance B is larger than the distance A and the sum (A+C) of the distance A and the distance C meets 10 times the average pitch of the nanostructure 11 or less, the processing accuracy is improved in processing the target object 20 using the mask (functional layers 12a, 12c) added onto the target object 20. Particularly, 5 times or less are preferable, 4.5 times or less are more preferable, and 4 times or less are the most preferable. Further, from the viewpoint of more effectively exerting the effect of the average pitch as described already, the distance B is preferably a distance 1.5 times the sum (A+C) of the distance A and the distance C or more. From the same effect, 2.5 times or more are preferable.

In addition, although not shown in the figure, in the mask transfer product (3) 14, each of the functional layer 12a of the nanostructure area 91 and the functional layer 12c of the non-nanostructure area 92 may be made multilayer structure.

In the case where the functional layers 12a, 12c are included in the nanostructure area 91 and the non-nanostructure area 92 as shown in FIG. 15C, when a ratio (Vfo/Vf) between an etching rate (Vf) of the functional layer 12a of the nanostructure area 91 and an etching rate (Vfo) of the functional layer 12c included in the non-nanostructure area 92 is larger than 1, the nano-processing accuracy of the target object 20 is improved, and therefore, such a ratio is preferable. From the viewpoint of the arrangement accuracy of the functional layer 12a on the nanostructure 11 of the carrier 10, the ratio is preferably 1000 or less, and more preferably 500 or less. Particularly, from the viewpoint of the accuracy of filling and arranging the functional layer 12a inside the concave portions 11a of the nanostructure 11 of the carrier 10, the ratio is preferably 300 or less, more preferably 150 or less, and most preferably 100 or less. From the viewpoint of improving the nano-processing accuracy of the target object 20, the ratio is preferably 3 or more, more preferably 10 or more, and further preferably 15 or more. In the case where the functional layer 12 is included in only the nanostructure area 91 as shown in FIG. 15B, the relationship between the etching rate of the functional layer 12c included in the non-nanostructure area 92 and the etching rate of the target object 20 meets the range in the case of replacing the etching rate (Vf) of the functional layer 12 with the etching rate (Vfo) of the functional layer 12c to read.

Further, in using the mask transfer products (1), (2) and (3) as described above, by beforehand providing a hard mask layer on the surface of the target object 20, it is possible to transfer the functional layer 12 onto the hard mask layer. In this case, it is possible to perform nano-processing on the hard mask with the mask transfer product (1), (2) or (3). By using the obtained hard mask subjected to the nano-processing, it is possible to perform nano-processing on the target object 20. Particularly, in the case of using the hard mask, it is made possible to use wet etching suitably for the nano-processing of the target object 20.

For example, by using the mask transfer product 14 as described above and selecting a sapphire wafer, silicon carbide wafer, epitaxial wafer for LED, or silicon wafer as the target object 20, it is possible to perform nano-processing on the surface of the target object 20. In other words, it is possible to form a fine pattern formed of the same material as that of the target object 20 on the surface of the target object 20. Herein, since accuracy of the fine pattern is guaranteed by the mask transfer product, the uniform nanostructure is obtained over in the target object surface 20. By using such a target object 20 provided with the fine pattern, it is possible to manufacture a high-efficient LED. In other words, since it is possible to perform nano-processing in a suitable place in assembling the LED, the defect rate of LED devices is reduced.

It is possible to manufacture an LED device by depositing at least an n-type semiconductor layer, light emitting layer and p-type semiconductor layer and preparing an n-type electrode and p-type electrode on the fine pattern surface of sapphire subjected to the nano-processing. The efficiency of an LED is determined by the product of electron injection efficiency, internal quantum efficiency and light extraction efficiency. Herein, the internal quantum efficiency undergoes the effects of crystallinity, the number of dislocations and the like of the semiconductor layer of the LED device, and therefore, it is very difficult to improve after manufacturing the LED device.

This is because decentralization of dislocations and reduction in the dislocation density of the semiconductor crystal layer is promoted by the fine pattern made by performing nano-processing on the target object 20, and the internal quantum efficiency is thereby significantly improved. Particularly, when a defect of the size such that several tens of fine patterns are collected exists in the fine pattern, by specific growth of the semiconductor crystal layer, light-emitting characteristics of the LED degrade, and the yield is decreased. In other words, by using the mask transfer product 14, uniformity of light-emitting characteristics is improved, and it is possible to improve the yield.

<Protective Layer>

Described next is the protective layer 13 provided in the function transfer product 14. The protective layer 13 is provided when necessary, corresponding to use, transportation environment and the like of the function transfer product 14. In this case, the role of the protective layer 13 is to reduce function deterioration of the functional layer 12, suppress adherence of foreign substances to the surface of the functional layer 12, and suppress occurrence of flaws in the functional layer 12. The protective layer is not limited particularly, as long as the adhesion strength between the protective layer 13 and the uppermost layer of the functional layer 12 is smaller than the adhesion strength between the functional layer 12 and the nanostructure 11 of the carrier 10 and the interface adhesion strength of each layer of the functional layer 12. Particularly, it is preferable that any component of the protective layer 13 does not adhere to the functional layer 12 not to remain. Further, as shown in FIG. 13A, when the functional layer 12 is provided inside the concave portions 11a of the nanostructure 11 of the carrier 10 and the exposed surface of the functional layer 12 is on the side closer to the concave portion 11a of the nanostructure 11 than the average position of the convex portions 11b of the nanostructure 11, in bonding the protective layer 13 to the function transfer product 14, there is the case that the convex portion 11b of the nanostructure 11 contacts the protective layer 13, and that the functional layer 12 does not contact the protective layer 13. In such a case, unless the component of the protective layer 13 adheres to the nanostructure 11 of the carrier 10 to remain in removing the protective layer 13, the layer 13 is not limited particularly.

When surface roughness on the functional layer 12 surface side of the function transfer product 14 of the protective layer 13 is described as RaP, it is preferable that a ratio (RaP/lor) between the distance (lor) described already and RaP is 1.5 times or less the ratio (Ra/lor) described already. By meeting this range, it is possible to improve bonding properties of the protective layer 13 to the functional layer 12 and provide the protective film 13 continuously by the roll-to-roll method, and it is possible to excellently keep the surface state of the functional layer 12. In addition, a more preferable range of the ratio (RaP/lor) is 1.5 time or less the more preferable range of the ratio (Ra/lor) as described above. In addition, the surface roughness (RaP) is a value measured by the same technique as in the surface roughness (Ra) on the functional layer 12 side described already. In addition, when the protective layer 13 is not disposed, it is preferable that surface roughness of the surface on the side opposite to the nanostructure 11 of the carrier 10 meets the range of above-mentioned surface roughness (RaP). In addition, the surface roughness (RaP) is a value measured by the same apparatus and method as in the surface roughness (Ra) on the functional layer 12 side of the function transfer product 14 as described already.

As surface roughness measured in conformity with JIS B 0601 of the protective film as the protective layer 13, smaller surface roughness is more preferable. For example, when center line average roughness ranges from 0.003 μm to 0.05 μm, it is possible to suppress transfer of excessive roughness to the surface in contact with the protective layer 13 of the functional layer 12, and therefore, such a range is preferable. The range of 0.005 μm to 0.03 μm is more preferable. Further, when surface roughness measured in conformity with JIS B 0601 of the surface that does not contact the functional layer 12 of the protective layer 13 ranges from 0.1 μm to 0.8 μm, and a maximum height ranges from 1 μm to 5 μm, handling properties are significantly improved in winding and collecting the protective layer 13 after removing the protective layer 13. From the viewpoint of further exerting the above-mentioned effect, it is more preferable that the surface roughness ranges from 0.15 μm to 0.4 μm, and that the maximum height ranges from 1.5 μm to 3.0 μm. These surface roughness and maximum height measured in conformity with JIS B 0601 are measured by using a contact type surface roughness meter. Further, when the protective layer 13 is not arranged, it is preferable that the surface on the side opposite to the nanostructure 11 of the carrier 10 meets the above-mentioned ranges of surface roughness and maximum height.

It is preferable that an absolute value of a difference, which is between surface free energy of the surface to bond to the functional layer 12 of the protective layer 13 and surface free energy of the surface in contact with the protective layer 13 of the functional layer 12, ranges from 2 erg/cm$^2$ to 50 erg/cm$^2$. By meeting this range, adherence between the protective layer 13 and the functional layer 12 is excellent, it is thereby possible to manufacture and wind the function transfer product 14 continuously, and it is also possible to suppress breakage of the functional layer 12 in peeling off the protective layer 13 in using the function transfer product 14. From the viewpoint of more exerting the invention, the absolute value of the difference in the surface free energy most preferably ranges from 5 erg/cm$^2$ to 30 erg/cm$^2$. For example, it is possible to adopt ethylene.vinyl acetate copolymer (EVA), low density polyethylene (LDPE), and biaxially oriented polypropylene or polycarbonate. As commercially available products, examples thereof are TORETEC series (7111, 7412K6, 7531, 7721, 7332, 7121) made by TORAY INDUSTRIES, INC., Iupilon series made by Mitsubishi Engineering-Plastics Corporation, and GF series made by Tamapoly Co., Ltd.

As a fish eye with a diameter of 80 μm or more included in the protective layer 13, 500 fish eyes/m$^2$ or more may exist. This is because it is conceivable that even in the case of using the protective layer (protective film) 13 with a large number of fish eyes, there is little effect on the interface between the nanostructure 11 and the functional layer 12. Further, in the case where the functional layer 12 contains a photocurable resin, it is also conceivable that it is possible to increase life of the functional layer 12 by using air bubbles occurring in bonding the protective layer 13.

From the viewpoint of more suppressing the occurrence of air voids developed in bonding the function transfer product 14 to the target object 20, as the fish eye with a diameter of 80 μm or more included in the protective layer 13 (protective film), 5 fish eyes/m$^2$ or less are preferable. From the viewpoints of bonding properties of the protective layer 13, web handling properties as roll-to-roll, and reduction in the environmental load, the film thickness of the protective layer 13 preferably ranges from 1 μm to 100 μm, more preferably ranges from 5 μm to 50 μm, and most preferably ranges from 15 μm to 50 μm. As commercially available products, examples thereof are polypropylene films or the like such as PP-type PT made by Shin-Etsu Film Co, Ltd., TOREFAN BO-2400 and YR12 type made by TORAY INDUSTRIES, INC., ALPHAN MA-410 and E-200C made by Oji Paper Co., Ltd. and ALPHAN E200 series made by Oji Paper Co., Ltd., and polyethylene terephthalate films or the like such as PS series such as PS-25 made by TEIJIN LIMITED, but the present invention is not limited thereto. Further, it is possible to manufacture with ease by performing sandblast processing on the commercially available film.

<Support Substrate>

Described next is the support substrate 15 of the carrier 10. The support substrate 15 is not indispensable.

Particularly, from the viewpoint of continuously producing the nanostructure 11 with high accuracy, it is preferable to use the support substrate 15. For example, in the case of manufacturing the nanostructure 11 by a transfer method, it is preferable to provide the support substrate 15. Particularly, by providing the support substrate 15, it is possible to further suppress defects such as air voids in bonding the flexible carrier 10 to the non-flexible target object 20, and it is possible to more reduce function incomplete portions in the target object surface 20. Further, by providing the support substrate 15, since it is also made possible to manufacture the function transfer product 14 continuously by the roll-to-roll method, environmental suitability is improved. Furthermore, by arranging the support substrate 15 to enable the roll-to-roll method to be applied, improved is the arrangement accuracy with respect to the nanostructure 11 of the functional layer 12 and the surface accuracy of the surface of the functional layer 12. This is because a contribution is made to improvement in the bonding accuracy in bonding the function transfer product 14 to the target object 20, and therefore, the transfer accuracy of the functional layer 12 to the target object 20 is improved.

The thickness of the support substrate 15 is preferably 150 µm or less. By this means, since flexibility of the function transfer product 14 is improved in bonding the function transfer product 14 to the target object 20, the effects are increased of suppressing a fracture of the function transfer product 14 and air voids. Particularly, when the thickness is 100 µm or less, it is possible to transfer the functional layer 12 to the target object 20 at a high bonding velocity. Further, when the thickness is 65 µm or less, even in the case where the curvature of a processing target surface of the target object 20 is increased, it is possible to excellently bond the function transfer product 14 to the target object 20. From the same effect, the thickness is most preferably 50 µm or less. On the other hand, from the viewpoint of web handling properties in manufacturing the function transfer product 14, the lower limit value is preferably 10 µm or more, and most preferably 25 µm or more.

Particularly, from the viewpoint of excellently increasing the adhesion between the nanostructure 11 and the support substrate 15, an absolute value of a difference between surface free energy of the support substrate 15 and surface tension of raw materials of materials forming the nanostructure 11 is preferably 30 erg/cm$^2$ or less, and most preferably 15 erg/cm$^2$ or less.

The support substrate 15 provided in the flexible function transfer product 14 is not limited particularly, as long as the substrate has bendability. For example, it is possible to adopt inorganic films typified by a glass film, laminate films of an inorganic film and organic resin, and resin films such as PET films, TAC films, COP films, PE films and PP films.

The haze of the support substrate 15 is preferably 96% or less. This is because the accuracy of the nanostructure 11 of the carrier 10 is improved when the haze is 96% or less. Further, when the haze is 80% or less, it is possible to suppress unevenness of scale more than a one-by-one basis of the concavo-convex structure of the nanostructure 11 of the carrier 10, and therefore, such a range is preferable. From the same effect, 60% or less is more preferable, and 50% or less is the most preferable. Further, when the haze is 30% or less, it is possible to guarantee adherence between the nanostructure 11 and the support substrate 15. Particularly, when the functional layer 12 contains a photopolymerizable substance, from the viewpoints of the transfer accuracy of the functional layer 12 and adherence to the carrier 10, the haze is preferably 10% or less, more preferably 6% or less, and most preferably 1.5% or less. Further, from the viewpoint of transferring the functional layer 12 onto the target object 20 while performing patterning, 1.5% or less is preferable. The haze is specified by JIS K 7105. It is possible to easily measure by using a commercially available haze meter (for example, NDH-1001DP made by NIPPON DENSHOKU INDUSTRIES Co., LTD. and the like). As the support substrate 15 having the above-mentioned haze value of 1.5% or less, examples thereof are polyethylene terephthalate films such as high transparent film GS series made by TEIJIN LIMITED, M-310 series made by Hoechst Diafoil Company and Mylar D series made by Du Pont and the like.

As the support substrate 15, it may be possible to adopt the support substrate 15 obtained by laminating a resin layer containing fine particles on one surface of a biaxially oriented polyester film. From the viewpoints of manufacturability of the carrier 10 and usability of the function transfer product 14, an average particle diameter of the fine particles is preferably 0.01 µm or more. From the viewpoint of transferring the functional layer 12 to the target object 20 while performing patterning, the average particle diameter of the fine particles is preferably 5.0 µm or less. From the viewpoint of further exerting the effect, the average particle diameter more preferably ranges from 0.02 µm to 4.0 µm, and particularly preferably ranges from 0.03 µm to 3.0 µm. As the fine particles, examples thereof are inorganic particles of silica, kaolin, talc, alumina, calcium phosphate, titanium dioxide, calcium carbonate, barium sulfate, calcium fluoride, lithium fluoride, zeolite or molybdenum sulfide, cross-linked polymer particles, and organic particles of calcium oxalate or the like. Particularly, from the viewpoint of transparency, particles of silica are preferable. In addition, the fine particles include fillers. These fine particles may be used alone, or may be used in combination of two or more kinds together. From the viewpoint of maintaining transparency of the support substrate 15, the content of fine particles contained in the biaxially oriented polyester film preferably ranges from 0 ppm to 80 ppm, more preferably ranges from 0 ppm to 60 ppm, and particularly preferably ranges from 0 ppm to 40 ppm. The thickness of the biaxially oriented polyester film preferably ranges from 1 µm to 100 µm, and more preferably ranges from 1 µm to 50 µm. As these support substrates 15, for example, there are A2100-16 and A4100-25 made by TOYOBO Co., Ltd. In addition, in the case of using the support substrate 15 obtained by laminating the resin layer containing fine particles on one surface of the above-mentioned biaxially oriented polyester film, from the viewpoints of adhesion and transfer durability, it is preferable to form the carrier 10 on the resin layer surface containing fine particles.

<Target Object>

The target object 20 will be described next. As described already, in the function transfer product 14, by setting the ratio (Ra/lor) and the average pitch of the nanostructure 11 in the predetermined ranges, the adhesion strength between the target object 20 and the functional layer 12 is increased, and the destruction of the functional layer 12 is suppressed in removing the carrier 10. Therefore, materials and shapes of the target object 20 are not limited particularly. The materials may be organic substances or inorganic substances. Examples thereof are quartz typified by synthetic quartz and fused quartz, glass typified by alkali-free glass, low-alkali glass and soda glass, silicon, nickel, sapphire, diamond, metal aluminium, amorphous aluminium oxide, polycrystal aluminium oxide, single-crystal aluminium oxide, titanium oxide, SUS, metals comprised of metal elements exemplified in the functional layer, metal oxides containing metal elements exemplified in the functional layer, iron oxide, copper oxide, chrome, silicon carbide, mica, zinc oxide, semiconductor substrates (nitride semiconductor substrates and the like), spinel substrates, transparent conductive inorganic substances typified by ITO, paper, synthetic leathers, and organic substances exemplified in the functional layer. Among the shapes are the shape of a disc, the shape of a plate, the shape of an n-gonal column, the shape of an n-gonal pyramid, the shape of a lens, the shape of a sphere, the shape of a film, the shape of a sheet and the like. In addition, the shape of an n-gonal column or the shape of an n-gonal pyramid includes the shape of an n-gonal column or the shape of an n-gonal pyramid including an edge portion with a radius of curvature exceeding 0.

In addition, in the case of using a wafer shape as the target object 20, the size thereof is preferably 3-inch Φ or more. This is because the effect of an edge portion of the target object 20 is a little by being 3-inch Φ or more and uniformity of the function of the layered product 21 is improved. From the same viewpoint, it is the most preferable that the size is 4-inch Φ or more.

Among the products, by using the target object 20 that the contact angle of water with respect to the surface of the target object 20 is 110 degrees or less, there is a tendency to promote the effects of the ratio (Ra/lor) described already, and therefore, such a product is preferable. From the same effect, 90 degrees or less are preferable, 60 degrees or less are more preferable, and 45 degrees or less are the most preferable. Further, when the surface roughness (Rat) of the surface of the target object 20 meets the range as described already, usability of the function transfer product 14 is improved, and therefore, such a product is preferable.

<Use Method of the Function Transfer Product>

As described already, the function transfer product 14 is used to transfer the functional layer 12 of the function transfer product 14 to the target object 20. Particularly, by including at least a step of directly bringing the functional layer 12 of the function transfer product 14 into contact with one main surface of the target object 20, and a step of removing the carrier 10 in this order, it is possible to transfer the accuracy of the functional layer 12 of the function transfer product 14 to the target object 20.

Further, as the method of adding the function to the target object 20 using the function transfer product 14 of the present invention, as described already, in assuming that the surface roughness on the functional layer 12 surface side of the function transfer product 14 is Raf and that the surface roughness of the target object 20 is Rat, and defining synthesis root-mean-square roughness Ra' as $(Raf^2+Rat^2)^{1/2}$, such a transfer method is preferable that a ratio (Ra'/lor) meets the range of the ratio (Ra/lor) as described above. By this means, the accuracy of the layered product 21 is improved, and the velocity in obtaining the layered product 21 is improved.

Further, from the viewpoint of excellently increasing adhesion between the surface of the functional layer 12 and the target object 20, an absolute value of a difference between surface free energy of the target object 20 and surface free energy of the surface of the functional layer 12 is preferably 30 erg/cm$^2$ or less, and most preferably 15 erg/cm$^2$ or less.

It is preferable that at least one of the carrier 10 and the target object 20 is flexible. When the carrier 10 is flexible, irrespective of whether or not the product 14 is flexible, it is possible to bond the function transfer product 14 to the target object 20 using a laminate roll, and it is possible to peel off the carrier 10 from the target object 20 using a peeling roll or peeling edge. On the other hand, when the target object 20 is flexible, irrespective of whether or not the product 14 is flexible, it is possible to bond the function transfer product 14 to the target object 20 using the laminate roll, and it is possible to peel off the carrier 10 from the target object 20 using the peeling roll or peeling edge. In other words, when at least one of the carrier 10 and the target object 20 is flexible, it is possible to perform the contact as a line not as a surface, and the removal as a line. By this means, it is possible to suppress generation of air voids occurring at the time of contact, significantly decrease the absolute value of the peeling force in removing the carrier 10 from the functional layer 12, and to suppress the destruction of the functional layer S12, and it is thereby possible to significantly decrease the function incomplete portions of the layered product 21. Further, since bonding operation and removal operation is made ease, in the case of using an apparatus in using the function transfer product 14, it is possible to suppress increases in the size and complexity of the apparatus.

(1) Step of Directly Bringing the Functional Layer of the Function Transfer Product to the Target Object (Bonding Step)

This step means a step of bonding the functional layer 12 of the function transfer product 14 to the target object 20. As described already, by using the flow phenomenon of the surface layer of the functional layer 12 by the ratio (Ra/lor), it is a feature of the function transfer product 14 to increase the adhesion area between the target object 20 and the functional layer 12, and thereby guarantee high adhesion strength. From this viewpoint, the bonding method is not limited particularly, and it is preferable to adopt a bonding method and bonding state so as to suppress air voids in bonding.

1-1: Environmental Atmosphere in Bonding

The air void suppression effect is improved, by performing bonding in a vacuum or under a reduced pressure. Further, it is also possible to perform bonding using an inert gas typified by nitrogen (N$_2$) gas and argon (Ar) gas. Furthermore, bonding may be performed using a compressible gas typified by pentafluoropropane and carbon dioxide. The compressible gas is a material that changes a state from gas to liquid corresponding to the applied compression force. In other words, by using the compressible gas, when the pressure applied in bonding exceeds a predetermined value, the compressible gas in a portion scheduled to form an air void is liquefied. The change from gas to liquid means abrupt volume contraction, and the air void is apparently lost. From the foregoing, in the case of using the compressible gas, it is preferable to bond at a bonding pressure of the liquefaction pressure of the compressible gas or more. Further, in order to suppress adherence of particles to the surface of the target object 20 or the functional layer surface of the function transfer product 14, it is preferable to perform bonding in a static elimination environment. Furthermore, by pressurizing while heating after bonding, it is possible to decrease generated air voids.

1-2: Cleaning of the Functional Layer Surface of the Function Transfer Product

When a foreign substance adheres to the functional layer 12 surface of the function transfer product 14 for some reason, by the fact that the size of the foreign substance becomes equal to the volume of the functional layer 12 or more, an air void derived from the foreign substance occurs. Particularly, since the air void that is sufficiently larger than the size of the foreign substance occurs, air voids occur at a rate with weights assigned to the number of foreign substance. From the foregoing, it is preferable to clean the functional surface 12 surface of the function transfer product 14 and the processing target surface of the target object 20 before bonding operation. It is possible to select the cleaning method as appropriate within the scope that the functional layer 12 does not deteriorate, and for example, it is possible to adopt an air blow, cleaning, UV-O$_3$ treatment, corona treatment, and excimer treatment.

1-3: Bonding Method

The case where one of the carrier 10 and the target object 20 is flexible The following description explains the case where one of the carrier 10 and the target object 20 is flexible, and the other one is non-flexible. The flexible material is described as a flexible body, and the non-flexible material is described as a non-flexible body. It is preferable to bond the flexible body to the non-flexible body using a laminate roll, because it is possible to more suppress the occurrence of air voids. For example, the laminate roll is placed on the surface opposite to the surface with which the non-flexible body is brought into contact of the flexible body, and the flexible body and the non-flexible body are bonded. Further, it is essential only that the laminate roll is placed at least on the surface on the side opposite to the surface with which the non-flexible body is brought into contact of the flexible body, and the number thereof and vertical arrangement are not limited particularly.

Further, when the surface of the non-flexible body has a curvature, as well as the bonding method using the laminate roll as described above, it is also possible to adopt a method of blowing air, gas, particle-containing air, or particle-containing gas to the surface on the side opposite to the surface with which the non-flexible body is brought into contact of the flexible body. In this case, since responsibility of the flexible body is excellent to the curvature of the surface of the non-flexible body, it is possible to improve bonding properties. In addition, in the case where the surface of the non-flexible body has the curvature, when the total thickness of the flexible body is 200 µm or less, the responsibility is excellent, and therefore, such a range is preferable. From this viewpoint, particularly, the thickness is preferably 100 µm or less, and most preferably 50 µm or less.

Case where the Carrier 10 and the Target Object 20 are Flexible

In this case, when the function transfer product 14 is bonded to the target object 20 using the laminate roll, it is possible to more suppress the occurrence of air voids, and therefore, such a method is preferable. For example, the function transfer product 14 and the target object 20 are arranged between two assemblies of laminate rolls and bonded so that the functional layer 12 of the function transfer product 14 and the target object 20 are brought into contact with each other. In addition, it is essential only that the laminate rolls are placed at least on the carrier 10 surface side of the function transfer product 14 and on the target object 20, and the number thereof and arrangement are not limited.

In the bonding method as described above, it is possible to select various conditions as appropriate corresponding to physical properties of the function transfer product 14 and physical properties of the target object 20. It is possible to design the conditions as appropriate with ease between persons skilled in the art. For example, when the laminate roll is heated, the temperature ranges from 40° C. to 300° C., and more preferably ranges from 60° C. to 200° C. This is to suppress excessive deformation of the carrier 10 or the nanostructure 11 of the function transfer product 14 due to the temperature.

Further, as a laminator, it is possible to use a one-stage type laminator using a set of laminate rolls, multi-stage type laminator using two assemblies of laminate rolls or more, vacuum laminator in which a portion to laminate is sealed in a container and the state is made under a reduce pressure or in a vacuum with a vacuum pump, and the like.

(2) Step of Removing the Carrier 10 (Removal Step)

This step is a step performed after bonding the functional layer 12 of the function transfer product 14 and the target object 20, and by removing the carrier 10, the functional layer 12 is transferred onto the target object 20. The removal method is not limited particularly, and it is possible to adopt a method of dissolving the carrier 10 and a method of peeling off the carrier 10. In peeling off the carrier 10, from the viewpoints of relaxing stress concentration onto the nanostructure 11 applied in peeling and stress applied to the interface between the functional layer 12 and the target object 20, it is possible to adopt the following peeling removal methods.

Case where One of the Carrier 10 and the Target Object 20 is Flexible

In this case, when the flexible body bonded to the non-flexible body is peeled off using a peeling roll and/or peeling edge, it is possible to reduce peeling stress applied to the functional layer 12 and stress applied to the interface between the functional layer 12 and the target object 20, and therefore, such a method is preferable. For example, the peeling roll and/or peeling edge is placed on the surface opposite to the surface with which the non-flexible body is brought into contact of the flexible body, and the flexible body is peeled off to obtain the layered product 21. In addition, it is essential only that the peeling roll is placed at least on the surface opposite to the surface with which the non-flexible body is brought into contact of the flexible body, and the number thereof and arrangement are not limited.

Case where the Carrier 10 and the Target Object 20 are Flexible

In this case, when the carrier 10 is peeled off from the layered product with the function transfer product 14 and the target object 20 bonded using a peeling roll and/or peeling edge, it is possible to reduce peeling stress applied to the functional layer 12 and stress applied to the interface between the functional layer 12 and the target object 20, and therefore, such a method is preferable. For example, two assemblies of peeling rolls are placed on the surface of the target object 20 and the surface of the carrier 10 in the layered product comprised of the function transfer product 14 and the target object 20, and the target object 20 and the functional layer 12 are mutually peeled off. In addition, it is essential only that the peeling rolls are placed at least on the carrier 10 surface side of the function transfer product 14 and on the target object 20, and the number thereof and arrangement are not limited.

In the peeling methods as described above, it is possible to select various conditions as appropriate corresponding to physical properties of the function transfer product 14 and the target object 20. For example, in the case where the functional layer 12 has a glass transition temperature Tg, when the temperature of the functional layer 12 before removing the carrier 10 is 0.8 Tg or less, shape stability of the nanostructure S11 is improved, and therefore, such temperatures are preferable. From the same reason, 0.65 Tg or less is more preferable, and 0.35 Tg or less is the most preferable.

Further, as the peeling rolls, a set of peeling rolls may be used, or two assemblies or more of peeling rolls may be used.

(3) Another Step Between the Bonding Step and Removal Step

Depending on physical properties of the functional layer 12, by undergoing a treatment step after bonding the function transfer product 14 and the target object 20, and then the step of removing the carrier 10, the transfer accuracy of the functional layer 12 is improved with respect to the target object 20. Particularly, when the functional layer contains a curable substance, by curing the curable substance to stabilize, transfer properties are improved.

As the treatment step, there are heating treatment, energy ray irradiation treatment, cooling treatment and the like. For example, when the functional layer 12 is cured by heating or irradiation of energy rays, shape stability of the nanostructure 11 of the functional layer 12 is improved, it is possible to fix the interface adherence between the target object 20 and the functional layer 12, and the transfer accuracy of the functional layer 12 is thereby improved. Further, for example, when the functional layer 12 shrinks by heating, the interface adhesion force between the nanostructure 11 of the carrier 10 and the functional layer 12 is decreased, and therefore, the transfer accuracy is improved. Further, for example, in the case where hardness (elastic modulus, hardness and the like) of the functional layer 12 is improved by cooling, by applying cooling treatment, shape stability of the nanostructure 11 is improved, and resistance is improved to stress to the nanostructure 11 of the functional layer 12 applied in peeling. These kinds of treatment may be used together. Further, treatment conditions of these kinds of treatment are capable of being selected as appropriate corresponding to physical properties of the functional layer 12, and therefore, are not limited particularly. For example, in the heat treatment, as the heating temperature, the temperature of the target object 20 preferably ranges from 30° C. to 350° C., and more preferably ranges from 60° C. to 200° C. For example, in the cooling treatment, as the cooling temperature, the temperature of the target object 20 preferably ranges from −20° C. to 150° C., and more preferably ranges from 0° C. to 120° C. For example, in the energy ray irradiation treatment, it is preferable that the integral light amount of an energy ray wavelength corresponding to the functional layer 12 is in a range of 500 mJ/cm$^2$ to 5000 mJ/cm$^2$. In addition, when the functional layer 12 reacts by the energy ray and is cured, by providing a shield mask to the energy ray in applying the energy ray, it is possible to manufacture the layered product 21 provided with the functional layer S12 subjected to patterning.

Further, after bonding the function transfer product 14 and the target object 20, it is possible to cut the function transfer product 14 without removing from the target object 20. For example, when the function transfer product 14 is in the shape of a continuous long film, after bonding the function transfer product 14 to the target object 20, it is possible to cut the outside larger than the outside diameter of the target object 20 in a range in which the size inside the surface is larger than the target object 20. By performing such operation, it is possible to protect the functional layer 12 that is transferred onto the target object 20 with the carrier 10. It is also possible to prepare this state in the first line to transport to the second line. By undergoing such a state, it is possible to protect the nanostructure 11 of the functional layer 12 physically and chemically, and therefore, such a state is preferable.

(4) Another Step after the Removal Step

Depending on physical properties of the functional layer 12, by applying treatment to the functional layer 12 of the layered product 21 after removing the carrier 10, it is possible to further exert the function of the functional layer 12. As the treatment, there are heating treatment, energy ray irradiation treatment, cooling treatment and the like. For example, when the functional layer 12 has reactivity to heating and/or irradiation of an energy ray, since physical shape stability and chemical stability of the functional layer 12 is improved, function stability of the functional layer 12 on the target object 20 is improved. The treatment conditions of these kinds of treatment are capable of being selected as appropriate corresponding to physical properties of the functional layer 12, and therefore, are not limited particularly. For example, in the heat treatment, as the heating temperature, the temperature of the target object 20 preferably ranges from 60° C. to 300° C., and more preferably ranges from 60° C. to 200° C. For example, in the energy ray irradiation treatment, it is preferable that the integral light amount of an energy ray wavelength corresponding to the functional layer 12 is in a range of 500 mJ/cm$^2$ to 5000 mJ/cm$^2$.

As described above, by using the function transfer product 14 according to this Embodiment, it is possible to obtain the layered product 21 provided inside the surface with the functional layer 12 exerting a high-efficient function easily in a place suitable for use of the layered product 21. Particularly, when the function transfer product 14 is flexible, it is possible to cut the function transfer product 14 to change the shape. Therefore, as well as transfer addition of the functional layer 12 to the entire surface of the target object 20, it is possible to transfer the functional layer 12 to only a predetermined portion of the target object 20.

Figure 16A:
FIG. 16 contains cross-sectional schematic diagrams illustrating target objects according to this Embodiment.
Figure 16B:
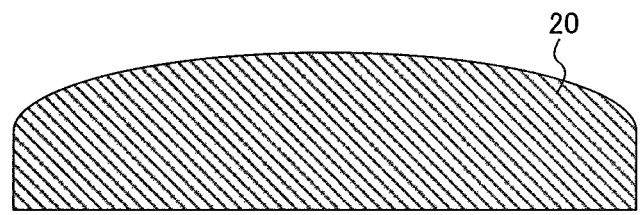
Figure 17A:
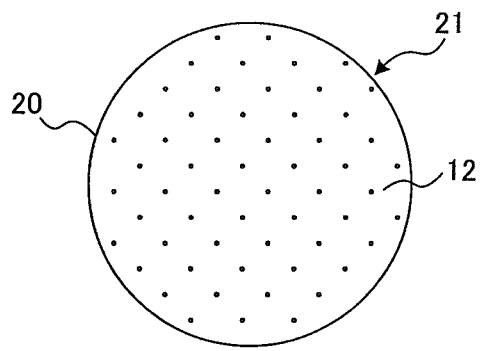
FIG. 17 contains plan schematic diagrams illustrating layered products according to this Embodiment.
Figure 17B:
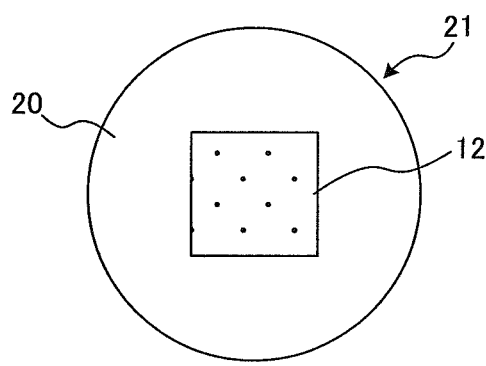
Figure 17C:
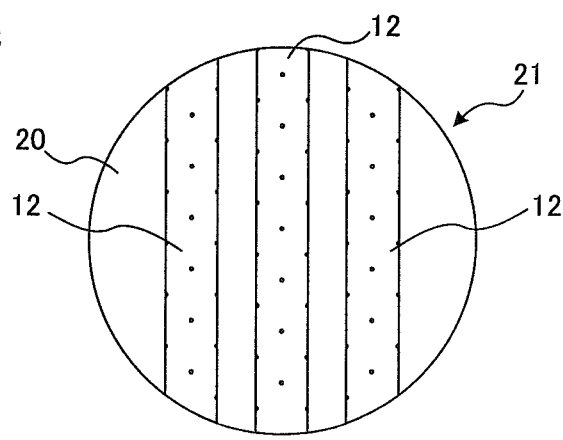
Figure 17D:
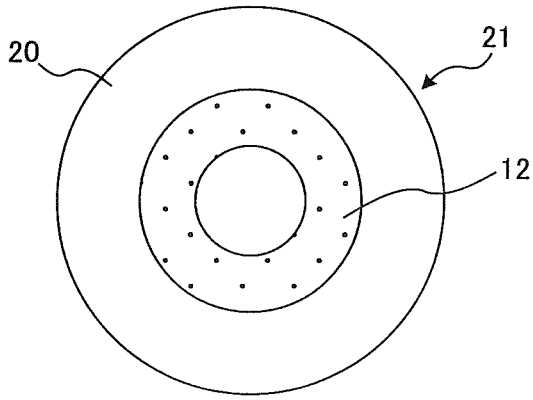

Further, for example, as shown in FIG. 16A, the target object 20 may be a disk of rectangular cross section in the thickness direction with a circular surface, or as shown in FIG. 16B, may be in the shape of a lens of cross section in the thickness direction having an upward convex curvature with a circular surface. Furthermore, although not shown in the figure, the product may be in the shape of a lens of cross section in the thickness direction having a downward convex curvature with a circular surface. In these cases, by the function transfer product 14 being flexible, as the layered product 21 as shown in FIG. 17, it is possible to transfer the functional layer 12 to the entire surface or only a predetermined portion of the target object 20. FIG. 17A illustrates the layered product 21 in which the functional layer 12 is transferred and formed on the entire surface of the target object 20. Each of FIGS. 17B to 17D illustrates the layered product 21 in which the functional layer 12 is transferred and formed on only a predetermined portion of the target object 20.

Figure 18A:
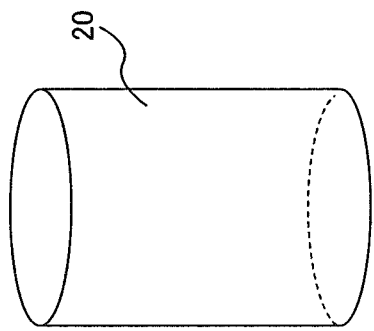
FIG. 18 contains perspective schematic diagrams illustrating target objects according to this Embodiment.
Figure 18B:
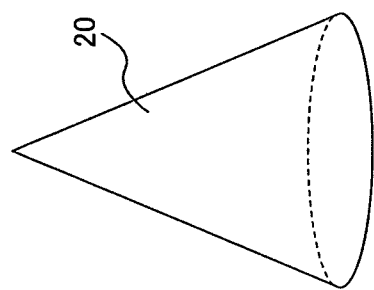
Figure 19D:
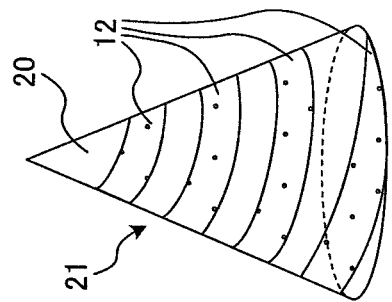
FIG. 19 contains perspective schematic diagrams illustrating layered products according to this Embodiment.
Figure 19C:
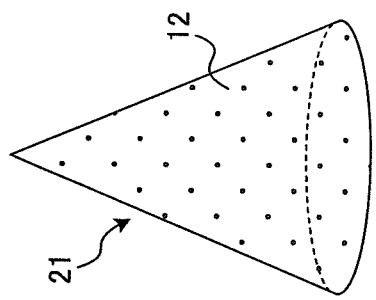
Figure 19B:
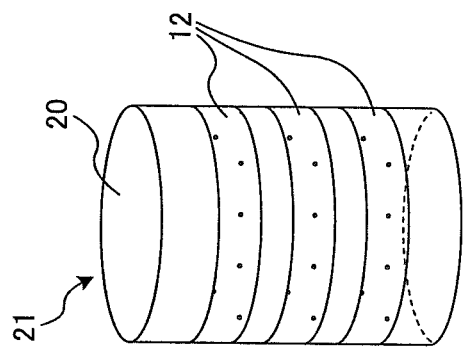
Figure 19A:
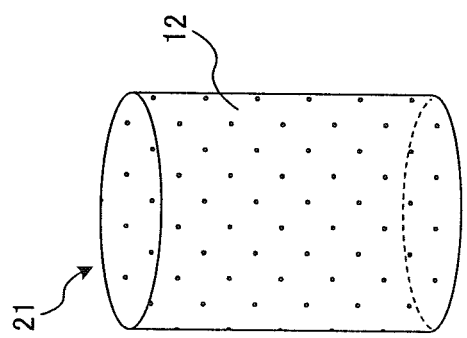

Moreover, the target object 20 may be a cylindrical body as shown in FIG. 18A, or may be a cone-shaped body as shown in FIG. 18B. Also in these cases, by the function transfer product 14 being flexible, as shown in FIG. 19, it is possible to add the functional layer 12 to the entire surface or a predetermined portion of the target object 20. FIG. 19A illustrates the layered product 21 with the functional layer 12 added to all the side surface, top surface and bottom surface of the cylindrical target object 20, FIG. 19B illustrates the layered product 21 with the functional layer 12 added to only a part of the side surface of the cylindrical target object 20, FIG. 19C illustrates the layered product 21 with the functional layer 12 added to the entire surface of the side surface of the cone-shaped target object 20, and FIG. 19D illustrates the layered product 21 with the functional layer 12 added to a part of the side surface of the cone-shaped target object 20.

<Manufacturing Method>

Described next is a manufacturing method of the function transfer product 14. The function transfer product 14 is manufactured by manufacturing the carrier 10 and arranging the functional layer 12 on the carrier 10.

(Manufacturing of the Carrier)

It is possible to manufacture the carrier 10 by performing nano-processing on the surface of the support substrate 15, or the surface of a nano-processing target layer provided on the support substrate 15 by film forming by a transfer method, photo lithography method, thermal lithography method, electron beam lithography method, interference exposure method, lithography method using nanoparticles as a mask, lithography method using a self-organizing structure as a mask or the like. Further, manufacturing may be performed by providing the nanostructure 11 on the surface of the support substrate 15 by macro-phase separation, micro-phase separation, alternate laminate method, self-arranging method of nanoparticles, method of arranging nanoparticles with an organic binder or the like. Further, it is also possible to manufacture by pouring molten resin or metal into a master mold provided on its surface with nanostructure, and peeling off after cooling. Among the methods, from the viewpoint of accuracy of the nanostructure 11 and manufacturing speed, it is preferable to adopt the transfer method. The transfer method is a method generally referred to as the nanoimprint method, among the methods are a photo nanoimprint method, thermal nanoimprint method using a thermosetting resin, thermal nanoimprint method using a thermoplastic resin, room-temperature nanoimprint method and the like, it is possible to any of the methods, and particularly, from the viewpoint of the accuracy of the nanostructure 11 and manufacturing speed, it is preferable to adopt the photo nanoimprint method. In this case, it is the most preferable that the master mold that is a mold of the nanostructure 11 is a cylindrical master mold.

(Film Formation of the Functional Layer)

The film formation method of the functional layer 12 on the nanostructure 11 of the carrier 10 is classified into dry process and wet process. In addition, in the case of forming a plurality of functional layers 12 i.e. adopting the structure of multilayer functional layers, it is possible to select the dry process or wet process arbitrarily for each layer. As the dry process, for example, it is possible to adopt a deposition method and sputter method. At this point, by varying the angle with respect to the nanostructure 11 of deposition and sputter, it is also possible to control an arrangement portion of the functional layer 12. As the wet process, for example, it is possible to adopt a method of coating the nanostructure 11 with a coating liquid obtained by diluting raw materials of the functional layer 12 with water or an organic solvent i.e. functional coating liquid, and then, removing an excessive solvent. Moreover, it is possible to adopt a method of directly applying raw materials of the functional layer 12 without diluting, and another method of applying a functional coating liquid or raw materials of the functional layer 12, and then, removing an surplus coating liquid by an air flow or physical slice.

From the arrangement accuracy and productivity of the functional layer 12, it is preferable to adopt at least the method of coating the nanostructure 11 with a functional coating method, and then, removing an surplus solvent that is the wet process. The coating method is not limited particularly, and among the methods are a die coat method, doctor blade method, micro-gravure method, bar coat method, roller coat method, spray coat method, air knife coat method, gravure coat method, flow coat method, curtain coat method, ink jet method and the like.

Further, in arranging the functional layer 12, it is preferable to adopt a non-contact type method with respect to the nanostructure 11. This is because of suppressing flaws of the nanostructure 11 and more enhancing the accuracy of the functional layer 12.

<Packing Form>

The function transfer product 14 according to this Embodiment is described in the foregoing. Described subsequently is a packing form in transporting the function transfer product 14 manufactured in the first line to the second line.

In other words, a packed product according to this Embodiment is a packing form in transporting the function transfer product 14 as described above from the first line to the second line, and is obtained by packing the function transfer product 14 in a resin-made case.

The problems occurring in transporting the function transfer product 14 from the first line to the second line will be briefly described first. As described already, the function transfer product 14 exerts the function by the nanostructure 11 of the carrier 10 and the functional layer 12. Therefore, when chemical deterioration and/or physical deterioration occurs in the carrier 10, nanostructure 11 and functional layer 12, or when adherence of foreign substances and/or flaws occur in the functional layer 12, the function exerted in the layered product 21 degrades and/or the function incomplete portion occurs. In other words, in transporting the function transfer product 14 from the first line to the second line, it is necessary to suppress the occurrence of flaws, adherence of foreign substances and deterioration of the function transfer product 14.

Further, the function transfer product 14 is applicable to various uses as described above. In other words, when the packing material is disposable, the environmental load increases. From the viewpoint, it is preferable that the packing material is reusable.

From the above-mentioned viewpoints, in transporting the function transfer product 14, it is preferable to use a resin-made case. By packing the function transfer product 14 in a resin-made case i.e. transporting the packed product in which the function transfer product 14 as described above is placed inside a resin-made packing container, it is possible to solve the above-mentioned problems. The packing material is capable of using publicly-known general resin-made packing materials, and therefore, is not limited particularly. Further, the packing form is the same. For example, it is possible to adopt packing materials and packing forms.

The function transfer product 14 inside the resin-made packing container is preferably a function transfer plate, function transfer laminate sheet, or function transfer film roll. Herein, the "function transfer plate" is the non-flexible function transfer product 14, where a material poor in flexibly such as an acrylic plate, glass plate and silicon wafer is used as the carrier 10, and for example, refers to the function transfer product 14 in the shape of a disk or in the shape of a plate. Further, the "function transfer laminate sheet" is the sheet in which the function transfer product 14 is in the shape of a sheet and a plurality of sheets is stacked. Furthermore, the "function transfer film roll" is the roll in which the function transfer product 14 is in the shape of a film, and is connected in its one end portion to a wind core i.e. core, and the film is wound around the core. By adopting these configurations, it is possible to suppress the shear force applied to the nanostructure 11 of the carrier 10 and shear force applied to the functional layer 12, and it is thereby possible to suppress the failure of the nanostructure 11 of the carrier 10. Among the forms, by adopting the form of function transfer film roll, it is possible to more exert the effects as described previously, and therefore, such a form is preferable.

Further, a film width of the function transfer film roll preferably ranges from 4 mm to 1 m. Particularly, packing y ($\geq Y$) function transfer film rolls with the film thickness of x ($<X$) m is preferred to packing Y ($\geq 1$) function transfer film rolls with the film thickness of X m. Further, a winding length of the function transfer film roll around the core preferably ranges from 10 m to 1000 m. Particularly, when the length is 600 m or less, it is possible to reduce friction occurring in putting the function transfer film roll in the packing container, and therefore, such lengths are preferable.

The function transfer product 14 placed inside a resin-made case may be directly placed inside the resin-made case, or may be packed in a resin-made bag (plastic bag) to be placed inside the resin-made case while being placed inside the plastic bag. Further, the function transfer product 14 placed inside a small resin-made case (1) may be placed inside a resin-made case (2) larger than the resin-made case (1). By thus adopting a packing form of double or more, it is possible to more maintain transfer properties of the functional layer 12, the function of the functional layer 12 and the accuracy of the nanostructure 11 of the carrier 10. Particularly, in the case of putting the function transfer product 14 packed in a resin-made bag in a resin-made case, the thickness of the resin-made case is preferably 10 times the thickness of the resin-made bag or more, preferably 20 times or more, and most preferably 45 times or more. By this means, it is possible to more suppress changes in the physical properties of the functional layer 12.

In the following description, in the case of giving the same description on the resin-made case and resin-made bag, the case and bag are simply expressed as the packing material.

Further, in order to prevent dust and like from occurring in packing, the capacity of the packing material is preferably 1.05 time the volume of the function transfer product 14 or more, more preferably 1.2 time or more, and most preferably 1.5 time or more. Particularly, when the capacity is 2 times or more, handling is made ease. In addition, the upper limit value is capable of being determined as appropriate from the viewpoint of handling and environmental load, and therefore, is not limited particularly.

As the packing material, it is possible to use packing materials made of thermoplastic resins and thermosetting resins. As the thermoplastic resins, examples thereof are polyvinyl chloride, polyethylene, polypropylene, polyethylene.polypropylene, and polystyrene. On the other hand, among the thermosetting resins are phenol resins, urea resins, epoxy resins, melamine resins and the like. By using these packing materials, adherence of the functional layer 12 to the packing material is suppressed, while shield properties of environmental atmosphere are enhanced during transport and storage, and it is thereby possible to excellently keep physical properties of the functional layer 12 and the accuracy of the nanostructure 11.

In addition, from the viewpoint of more reducing the environmental load, it is preferable that the resin-made case is a resin-made case that is foldable and that does not produce any discarded material. As such a resin-made case, there are Trade Name APA-CON (standard type), APA-CON 530, ECO-CUBE and APA-CON 25 made by APPAX Co., Ltd. and the like.

In order to make reusable from the viewpoint of reducing the environmental load, at least one of the packing materials is preferably made of a resin with lower surface free energy than surface free energy of the functional layer 12 of the function transfer product 14. By this means, even in the case where the functional layer 12 contacts the packing material, since it is possible to suppress adherence, reusability is improved. The surface free energy of the resin-made case or resin-made bag preferably ranges from 15 dyne/cm to 40 dyne/cm, and more preferably ranges from 18 dyne/cm to 38 dyne/cm. In addition, the surface free energy is obtained as critical surface tension γc.

Among the resins that meet the above-mentioned surface free energy, from the viewpoint of suppressing adherence of the functional layer 12 with more excellence, at least one of the packing materials is preferably a hydrocarbon resin such as polyolefin. Particularly, as the polyolefin, polyethylene, polypropylene, or polyethylene.polypropylene is preferable. Further, the resin-made case is preferably a case that does not produce any discarded material in folding.

It is possible to store at least one of the packing materials as described above so as to reuse without discarding. By reusing the stored packing material once or more, the environmental load is reduced. The material is preferably reusable 5 times or more. Particularly, in the case where the material is reusable 10 times or more, the effect of reducing the environmental load is increased. The material reusable 15 times or more, 20 times or more or 30 times or more sequentially further increases the effect of reducing the environmental load, and is preferable. Since it is possible to develop the function transfer product 14 of the present invention to various applications, it is extremely important to consider such environmental suitability.

Further, when the function transfer product 14 is provided with the protective layer 13, it is preferable that at least one of the support substrate 15 and the protective layer 13 is a polyolefin film and that at least one of the packing materials is made of polyolefin, and when the protective layer 13 is not provided, it is preferable that the support substrate 15 is a polyolefin film and that at least one of the packing materials is made of polyolefin. By adopting such a configuration, even when the function transfer product 14 contacts the packing material, since a difference in hardness between the product and the material is small, it is possible to more reduce the occurrence of dust by friction. Further, since the polyolefin is generally low in surface free energy, as described above, it is possible to prevent adherence of the functional layer 12 of the function transfer product 14. For example, the polyolefin is preferably polyolefin selected from the group consisting of polyethylene, polypropylene, polyethylene.polypropylene and polyethylene terephthalate. In this case, the resin-made bag preferably has a light shielding effect.

The resin-made bag may be a light shielding plastic bag typified by a black polyethylene bag. By this means, the effect is enhanced of suppressing changes in the physical properties of the functional layer 12 particularly duet to light. Therefore, it is possible to maintain the adhesion strength and color of the functional layer 12. Particularly, when the function transfer product 14 contains a photocurable substance, it is preferable to use a light shielding plastic bag with transmittance of a photosensitive wavelength of the photocurable substance of 50% or less. Particularly, the bag with the transmittance of 20% or less is capable of suppressing changes in quality in storage, as well as changes in quality in long-term transportation, and is preferable. The transmittance of 1% or less is the most preferable.

Further, from the viewpoints of suppressing changes in the physical properties of particularly the functional layer 12 of the function transfer product 14 and suppressing hard adherence of the functional layer 12 to the protective layer 13, at least one of the packing materials is preferably made of plastic having moisture barrier properties. For example, it is possible to adopt a black polyethylene bag with the surface deposited with aluminium as the resin-made bag.

Further, it is preferable to place a drying agent in at least one of the packing materials. By placing a drying agent, it is possible to decrease humidity of ambient environment of the function transfer product 14. Therefore, since physical property stabilization is made excellent particularly in the functional layer 12, and it is possible to leave a history of changes in the amount of moisture, particularly a history of the maximum amount of moisture, it is possible to promptly make a determination whether it is possible to use the transported function transfer product 14.

As the drying agent, it is possible to adopt powder of an inorganic substance, and the powder of an inorganic substance is capable of being placed in at least one or more of the above-mentioned resin-made case, the resin of the resin-made case, and the resin-made bag. In addition, when the powder of an inorganic substance is placed inside the resin-made case, from the viewpoint of suppressing scattering, it is preferable to place the power of an inorganic substance while being put in a case. Further, in the case of arranging the powder of an inorganic substance inside the resin of the resin-made case or the resin-made bag, it is preferable to blend the powder into the resin itself forming the case or bag, or coat the surface of the resin with the powder of an inorganic substance. As the powder of an inorganic substance, examples thereof are activated alumina, silica gel, zeolite, montmorillonite, activated carbon, activated carbon with the surface modified with a polar group, clay, molecular sheave, potassium hydroxide, calcium chloride, calcium oxide, calcium bromide, calcium sulfate, zinc, zinc chloride, zinc bromide, magnesium oxide, magnesium chlorate, copper sulfate, barium oxide, glass wool, and diatomaceous earth. Among the materials, preferable are zeolite, silica gel, montmorillonite, molecular sheave, activated alumina and the like. These materials may be used alone or may be used in combination of two or more kinds.

When humidity is high, the functional layer 12 may come into intimate contact with the protective layer 13, or with the support substrate 15. Further, depending on the composition of the carrier 10 or the functional layer 12, there is the case where the physical properties change due to humidity. Particularly, in the case where the functional layer 12 contains a substance that causes the sol-gel reaction typified by metal alkoxide, changes in the physical properties due to humidity are sometimes remarkable. From this viewpoint, it is preferable that at least one of the packing materials as described above is made of a low moisture-permeable resin.

Herein, moisture permeability of the low moisture-permeable resin ranges from 0 to 15 g/(24 h·m²). Particularly, from the viewpoint of minimizing the effects of the transport path and season, the moisture permeability preferably ranges from 0 to 10 g/(24 h·m²), more preferably ranges from 0 to 6 g/(24 h·m²), and most preferably ranges from 0 to 3.5 g/(24 h·m²). Among the ranges, the range of 0 to 2 g/(24 h·m²) enhances the effect of maintaining humidity in the environment in which the function transfer product 14 is packed, and is particularly preferable. In addition, the moisture permeability is measured in conformity with JIS K 7129-1992, and is defined by performing on the conditions of test temperature 40±0.5° C. and relative humidity difference 90±2% RH by the A method.

Further, when environmental humidity in which the function transfer product 14 is put in the packing material is a humidity environment of 60% or less, it is easy to prevent condensation from forming on the function transfer product 14, and therefore, such an environment is preferable. From the same viewpoint, the humidity is preferable 55% or less, more preferably 50% or less, and most preferably 45% or less.

Furthermore, it is also possible to fill the inside of the packing material with a gas. As the gas, examples thereof are dry air, nitrogen and argon.

As described above, by forming at least one of the packing materials using the low moisture-permeable resin, it is possible to suppress changes in the physical properties of the functional layer 12 particularly. From the viewpoint of further exerting the effect, the thickness of the low moisture-permeable resin preferably ranges from 15 µm to 50 mm, more preferably ranges from 20 µm to 12 mm, particularly preferably ranges from 50 µm to 6 mm, and particularly, from the viewpoints of reducing differences in the season and area to perform transportation, most preferably ranges from 100 µm to 2.5 mm. In addition, the upper limit value is determined from the viewpoints of economic efficiency, workability, and environmental suitability.

As the low moisture-permeable resin, plastic is preferable. Examples thereof are films of polyester, polypropylene, polystyrene, polyvinyl chloride, nylon, polycarbonate, polyethylene cellulose triacetate, copolymer of vinyl chloride and vinylidene chloride, cellophane and the like, and materials obtained by depositing a substance such as inorganic powder with water absorption capability or moisture absorption capability on these films.

Further, from the viewpoint of making low moisture permeability more excellent, it is also possible to bond a thin metal film such as aluminum foil and aluminum foil dry laminate film to the surface of the resin-made case. From the same viewpoint, as the resin-made bag, it is possible to adopt a thin metal film such as aluminum foil and aluminum foil dry laminate film. In addition, in the case of adopting such a thin metal film, it is also possible to excellently suppress changes in the physical properties due to light of the function transfer product 14, particularly changes in the physical properties of the functional layer 12. In addition, dry laminate is work of introducing an adhesive in between two sheets of films, thermally crimping at a temperature ranging from about 40° C. to 60° C., performing preliminary aging at room temperature for about 24 to 72 hours, and then, preforming main aging at about 30° C. to 50° C. for about 12 to 36 hours.

As the low moisture-permeable resin-made bag as described above, examples thereof are aluminum deposited films, materials with aluminium oxide deposited on a polyester film (Fine Barrier AT, Trade Name made by REIKO Co., Ltd.), silica-deposited films (TECHBARRIER S, TECHBARRIER T, TECHBARRIER H, TECHBARRIER V, Trade Name made by Mitsubishi Chemical Kohjin Packs Corporation), dry laminate products of Fine Barrier AT (Trade Name made by REIKO Co., Ltd.) and B-PE (black polyethylene) film, and dry laminate products of a film with light shielding ink applied on OP (Biaxially oriented polypropylene film) and VMCPP (uniaxially oriented polypropylene film with aluminium deposited).

In the case where the resin-made bag is comprised of the low moisture-permeable bag, as the function transfer laminate film, smaller gaps between the upper surface and lower surface of the laminated film and the resin-made bag are more preferable. Particularly, a state in which the upper surface and lower surface of the laminated film contact the resin-made bag is the most preferable. On the other hand, in the case of the function transfer film roll, smaller gaps between end portions of the function transfer film roll and the resin-made bag are more preferable, and the contact state is the most preferable. Further, for example, by providing a plastic film such as a polyethylene film and polystyrene film in between these gaps, it is possible to suppress physical changes in the function transfer laminate film and function transfer film roll, and to suppress physical changes due to humidity. Further, packing with the low moisture-permeable resin-made bag may be double or more.

The method of packing the function transfer product 14 in the low moisture-permeable resin-made bag is not limited particularly, and it is preferable to perform welding, adhesion or the like on an opening portion of a sheet by heat, chemical substance (adhesive or the like) or the like, after putting the function transfer product 14 in the bag-shaped sheet. Particularly, it is preferable to perform welding, adhesion or the like on an opening portion of the sheet by heat, chemical substance (adhesive or the like) or the like, after putting the function transfer product 14 and drying agent (for example, the above-mentioned power of an inorganic substance prevented from scattering) in the bag-shaped sheet. In addition, in the case of using a sheet-shaped drying agent, it is preferable to put the function transfer product 14 in the center of the sheet-shaped drying agent, enclose the function transfer product 14 inside the sheet-shaped drying agent in a manner of folding the sheet-shaped drying agent in half, and perform welding or adhesion on the joint of the sheet by heat, chemical substance or the like.

Further, a buffer agent (impact absorbing material) may be provided on the outer side than the function transfer product 14 while being on the inner side than the resin-made bag. In this case, resistance to an abrupt impact applied in transportation is improved, and it is thereby possible to suppress distortion of the function transfer product 14. The type of buffer agent is not limited particularly, and from the viewpoint of reducing a load imposed on transportation, the density thereof is preferably 0.8 g/cm$^3$ or less, more preferably 0.6 g/cm$^3$ or less, and most preferably 0.4 g/cm$^3$ or less.

Furthermore, it is preferable to provide a grasp tool (fix jig) to fix the function transfer product 14. Particularly, it is preferable that the grasp tool is provided so that the film portion (at least a laminate portion comprised of carrier 10/functional layer 12) of the function transfer film roll is not grounded. By providing such a configuration, it is possible to suppress distortion of the function transfer film roll.

In the case of the function transfer film roll, it is preferable to provide an end surface protective sheet. Particularly, when the end surface protective sheet has a multilayer structure of two or more layers of a film for end surface contact portion and drying agent layer, the effect of suppressing changes in quality of the function transfer product 14 due to humidity is high, and therefore, such a structure is preferable.

Further, from the viewpoint of suppressing physical deterioration of the function transfer product 14 due to an impact occurring unintentionally during transportation and storage of the function transfer product 14, it is preferable that at least one of the resin-made bag and the resin-made case meets a requirement that a trace and/or flaw is not left in the function transfer product 14 in applying a pressure of 2.5 Mpa or less through the resin-made case or the resin-made bag. For example, it is possible to achieve such a condition by setting the thickness of the resin-made case or resin-made bag in the range as described previously.

When the resin-made case is a set-up box formed by bending the above-mentioned resin, such a case is preferable from the viewpoints of suppression of function deterioration of the function transfer product and environmental suitability. The set-up box has joints (i.e. non-continuous portion of resin plates caused by assembling two or more fold plates by folding or the like), and thereby has the problem that the joint becomes misaligned and that the form of the box tends to collapse. From this viewpoint, it is preferable to place two fold plates and a banding band to pass through at least a joint portion formed by the two fold plates, and fix the banding band to at least the two fold plates. In addition, the fold plate means a resin plate forming one continuous surface surrounded by fold lines or resin plate end portions. Further, in the following description, in the case where a box bottom surface is formed of two or more fold plates, the box bottom surface is sometimes referred to as an assemble bottom.

As the form of the resin-made case, there are forms such as an American lock box type, bottom one-touch box type, Yakko type, N-scheme upper insertion type, N-scheme side insertion type, upper-and-lower insertion type, upper insertion lower windmill type, and upper insertion lower partition type. Such set-up boxes have the advantage that it is possible to fold the box to make compact after using.

The banding band passes through the joint of two fold plates on at least one of the surface of the resin-made case, is placed to pass over i.e. across the two fold plates, and is fixed to at least the two fold plates. By this means, the joint of the resin plates is hard to become misaligned, and it is possible to suppress entry of light from a gap of the joint during transportation. Therefore, particularly, physical stability of the functional layer 12 is improved. Further, it is possible to prevent the band from becoming misaligned and the lid from opening during transportation. As the method of fixing, there are an adhesive, pressure-sensitive adhesive, tape, surface fastener (for example, Magic Tape (Registered Trademark)), fusing and the like.

As the joint of fold plates in the set-up box, for example, the joint is a portion in which end portions of the fold plates are opposed or contact in the American lock box. As a butted portion, there is a portion formed of three or more fold plates. As the placement of the banding band, it is essential only that the banding band is placed to pass through a portion of the joint formed of two fold plates, and the banding band may be placed to further pass through such a joint portion formed of three or more fold plates.

Materials of the banding band are not limited particularly, and examples thereof are resin-made bands formed of nylon resins, fluorine resins (for example, Tefzel (Registered Trademark), Halar (Registered Trademark)), polyacetal resins (for example, Delrin (Registered Trademark)), polypropylene resins, polyethylene resins, polyester resins and the like, and metal-made bands formed of hoop iron. Particularly, a PP band made of polypropylene is lightweight and high in strength and therefore, is preferable.

The tensile strength of the banding band is preferably 400 N or more, more preferably 600 N or more, and most preferably 800 N or more. In addition, the tensile strength is a value measured by JIS C 2318. Further, the width of the banding band is preferably 5 mm or more, and more preferably 10 mm or more. By meeting these ranges, since the strength of the banding band is improved, the effects are strengthen of suppressing misalignment of the joint of the resin-made case and entered light.

In the banding band, it is preferable that opposite ends are bound and mutually fixed at the time of transportation and the like. By this means, it is possible to prevent the lid of the resin-made case from opening at the time of transportation and the like. For example, it is preferable to bind and fix the opposite end portions after winding the banding band to pass through the box bottom surface, side surfaces and lid surface of the resin-made case. To fix the opposite ends of the banding band, a fixing part may be used or the ends may be welded. When the PP band is used as the banding band, it is possible to weld opposite ends using an automatic binding apparatus.

The banding band is described above, and entry light suppression that is one of functions of the banding band is obtained by providing a light shielding material as a substitute as described below. In other words, with respect to entry light suppression, it is possible to solve by applying only a light shielding material. Further, by using the light shielding material and the banding band as described above together, the effects of suppressing deformation of the resin-made case and entered light during transportation are enhanced, and therefore, such use is preferable.

It is essential only that the light shielding material is placed to include the region of the joint of the above-mentioned resin-made case, and for example, the light shielding material may be disposed in a wide range including a region other than the joint such as placement in the entire box bottom surface as described later. Further, the light shielding material may be placed in the entire region of the joint of the box bottom portion, and corresponding to a use, may be placed in a part of the joint such as placement of the light shielding material in only a portion particular requiring light shielding such as a butted portion as described later.

The case of providing the light shielding material is particularly useful in the case where the joint includes the butted portion. In addition, the butted portion means a portion in which the end portions of the resin plates are opposed or contact.

The light shielding material is not limited particularly, as long as the material does not allow light of the photosensitive region wavelength of the photocurable substance contained in the function transfer product 14 to substantially transmit, and for example, packing tapes, black packing tapes, light shielding tapes and light shielding polyethylene films are preferable. In addition, not allowing light of the photosensitive region wavelength of the function transfer product 14 to substantially transmit means a state in which the photosensitive portion (particularly, functional layer 12) of the function transfer product 14 installed inside the resin-made case is not cured i.e. bonding properties and transfer properties do not degrade even in performing transportation or storage for one day in a light environment.

As preferable commercially available light shielding materials, exemplified are Polyester tape 8422 made by Sumitomo 3M Limited, light shielding tapes made by UNI INDUSTRY Corporation and the like. As light transmittance of the light shielding material, in wavelengths of 365 nm and 405 nm, the transmittance is preferably 5% or less, and more preferably 1% or less. This light transmittance is a value measured with a spectrophotometer (for example, Spectrophotometer U-3010 (made by Hitachi High-Technologies Corporation)).

From the viewpoint of preventing the light shielding material from peeling off during transport, the adhesion force of the light shielding material is preferably 3.0 N/cm or more, and more preferably 3.5 N/cm or more. Further, from the viewpoint of preventing the light shielding material from tearing during transport, the tensile strength of the light shielding material is preferably 40 N/cm or more, and elongation at breakage is preferably 35% or more. In addition, the above-mentioned adhesion force is a value measured by the 170°-removal test (300 mm/min), and the tensile strength and elongation at breakage are values measured by JIS C 2318.

The light shielding material is typically bonded to the installation area. As the method of bonding, there are an adhesive, pressure-sensitive adhesive, tape, fusing and the like.

For example, in the case where the box bottom portion of the resin-made case has the joint of three or more bottom plates that are fold pieces forming the bottom surface as a typical example, in other words, in the case where the joint is the butted portion as described previously, the area to place the light shielding material is a region including at least the joint of the three or more bottom plates. The surface to place the light shielding material may be on the inner side or on the outer side of the resin-made case.

When the function transfer product 14 is in the shape of a film, after laminating the function transfer product 14 i.e. after making the function transfer laminate film, it is possible to pack by the above-mentioned packing method. In such a case, it is important to suppress friction occurring by each film laminated in the thickness direction shifting in the surface direction. From this viewpoint, it is preferable to fix at least one point in the outer region of the main surface of the function transfer product in the function transfer laminate film. It is the most preferable to fix at least four points in the corners.

A specific example of the resin-made case according to this Embodiment will be described below with reference to FIG. 20. FIG. 20 is a perspective diagram illustrating the resin-made case to pack the function transfer product according to this Embodiment. This is an example using the American lock type resin-made case, and the box bottom surface is shown on the upper side viewed in the figure.

Ina resin-made case 201 as shown in FIG. 20, a banding band 202 is placed to wind through the box bottom surface, side surfaces and lid surface of the resin-made case 201. Further, two fixing materials 203 are provided between the banding band 202 and two fold plates 201a and 201b, and bond and fix the banding band 202 to two fold plates 201a and 201b, respectively. Herein, as the fixing material 203, for example, it is possible to use an adhesive and a surface fastener.

In the case where the function transfer product 14 is the function transfer film roll, when a state is held in which the function transfer film roll floats, it is possible to suppress the failure of the nanostructure 11 and variations in the film thickness of the functional layer 12, and therefore, such a state is preferable. From this viewpoint, the function transfer film roll preferably has a core. By supporting the opposite ends of the core with core receivers, it is possible to maintain the function transfer film roll in a floating state. By meeting these requirements, it is possible to maintain the function transfer film roll in a floating state. In addition, in supporting the opposite ends of the core of the function transfer product 14 with core receivers, by beforehand packing the function transfer product in the above-mentioned resin-made bag, and supporting the opposite ends of the core of the function transfer product 14 packed with the resin-made bag with core receivers, it is possible to excellently hold protective properties of the function transfer product 14 by the resin-made bag, and decrease the capacity of the resin-made bag, and therefore, such a manner is preferable. Herein, the shape of the core, shape of the core receiver, and the arrangement are not limited particularly. Therefore, the function transfer film roll, the core receivers and the resin-made case may be mutually independent, or the core receivers and the resin-made case may be integrated.

The function transfer film roll will be described next. When the function transfer film roll includes at least the core and an adhesion portion to connect the function transfer product to the core, it is possible to suppress physical changes in physical properties during transportation, and versatility in using increases. The adhesion portion to connect the function transfer product 14 to the core is not limited particularly, fixing with an adhesive and fixing with an adhesive tape is preferable, and from the viewpoint of reuse of the core, an adhesive tape is preferable.

Figure 21:
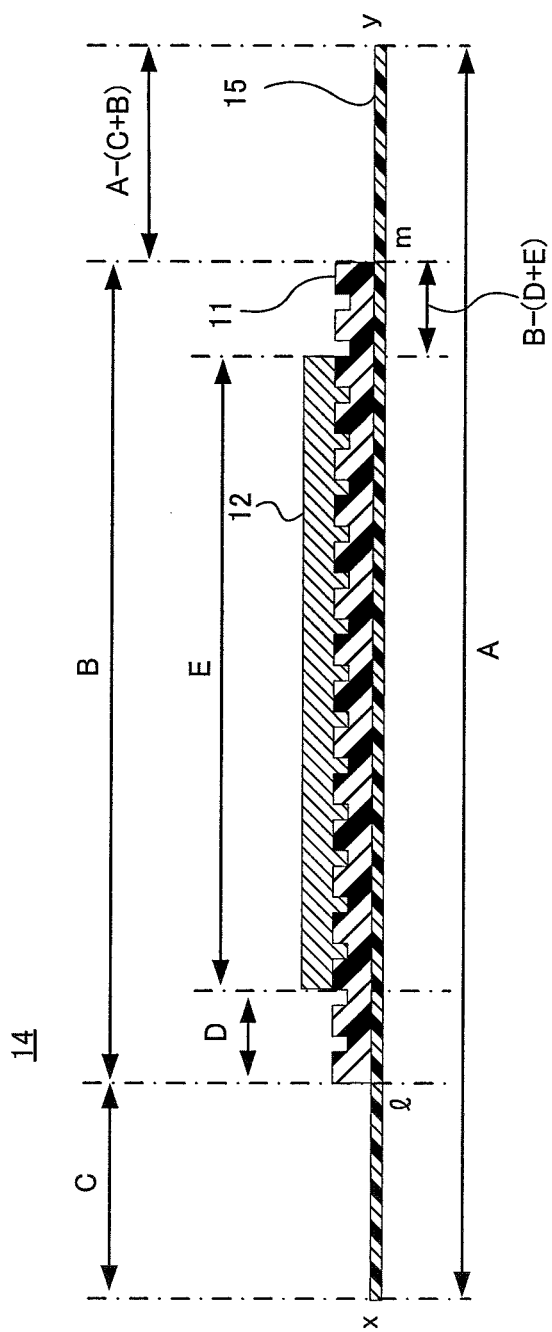
FIG. 21 is an explanatory diagram illustrating the function transfer product used in a function transfer film roll according to this Embodiment.

Particularly, by the function transfer product meeting the following requirements, it is possible to effectively suppress industrial properties in manufacturing the functional transfer film roll and physical deterioration of the functional layer in storing and transporting, and therefore, meeting the requirements is preferable. FIG. 21 is an explanatory diagram illustrating the function transfer product forming the function transfer film roll according to this Embodiment of the present invention. As shown in FIG. 21, first, it is assumed that the length of the support substrate 15 of the function transfer product 14 is A[m]. Herein, the nanostructure 11 is provided on one surface of the support substrate 15. It is assumed that the length of the portion in which the nanostructure 11 is provided is B [m]. Each of end portions in viewing the support substrate 15 in the longitudinal direction is described as x or y respectively. The nanostructure 11 is provided B [m] from a location on the inner side than the end portion x of the support substrate by C [m] as a starting point. In other words, the nanostructure 11 is provided at a distance of A−(B+C) [m] from the end portion y of the support substrate 15. In other words, the support substrate 15 is not provided with the nanostructure 11 in the portion with C [m] from the end portion x and in the portion with A−(B+C) [m] from the end portion y. The functional layer 12 is disposed on the nanostructure 11. Herein, it is described that an end portion on the end portion x side of the support substrate 15 is 1 and that an end portion on the end portion y side of the support substrate 15 is m in viewing the region with the nanostructure 11 disposed in the longitudinal direction. The functional layer 12 is provided E [m] at a distance of D [m] on the inner side of the nanostructure 11 from the end portion 1. In other words, the nanostructure 11 with the length of B [m] is not provided with the functional layer 12 in the portions with D [m] from the end portion 1 and with B−(D+E) [m] from the end portion m.

In such a function transfer product 14, by winding with the end portion x side of the support substrate 15 fixed to the core, in the case of the manufactured function transfer film roll, the cylindrical degree is improved with respect to the cross section of the function transfer film roll. In other words, since it is possible to decrease physical external forces applied to the functional layer 12, it is possible to suppress physical deterioration of the functional layer 12 during storage and transportation. In addition, for example, in describing as (A, B, C, D, E), symbols A to E each indicative of the above-mentioned distance are capable of adopting a configuration of (200, 150, 25, 0.5, 149) or (500, 440, 30, 0.5, 339).

Further, when a circular side plate is provided on each of the opposite end surfaces in the shaft direction of the core, misalignment of the function transfer film roll during transportation is suppressed, particularly improved is the protection ability of the concavo-convex structure 11 of the mold and the functional layer 12, and therefore, such a manner is preferable. In addition, it is possible to provide a plurality of grooves in the side plate. Furthermore, it is possible to wind the film-shaped function transfer product 14 using the grooves as a guide.

From the viewpoints of manufacturing and use of the function transfer product 14, it is preferable that the core has a shaft hole. The outside diameter of the core is not limited particularly, and from the viewpoints of manufacturing and operation in use, preferably ranges from 4 cm to 15 cm. Further, the diameter of the function transfer film roll in transportation may be larger or smaller than the length of the core.

For fixing of the function transfer product 14 to the core, it is preferable to use an end tape. The end edge portion of the end tape is fixed to the outer surface of the core. On the other hand, the start edge portion of the end tape is fixed to the surface on the side opposite to the functional layer 12 of the function transfer product 14. By meeting these requirements, it is possible to wind the function transfer product 14 around the core and manufacture the function transfer film roll, while suppressing the failure of the nanostructure 11 and further suppressing variations in the film thickness of the functional layer 12. Particularly, when a hue of a part or the whole of the surface of the end tape is different from a hue of the function transfer product 14, the function is exerted to inform of a use end of the function transfer product 14, and therefore, such a manner is preferable from the viewpoint of safety.

It is possible to select the length of the end tape as appropriate corresponding to apparatus specifications to use the function transfer film roll, and the length ranging from 0.3 m to 10 m is preferable from the viewpoint of winding performance of the function transfer film roll. From the same effect, the length preferably ranges from 0.5 m to 3 m, and most preferably ranges from 1 m to 3 m. It is possible to select the thickness of the end tape as appropriate from the strength required for the apparatus to use the function transfer film roll, and the thickness preferably ranges from 10 μm to 100 μm. Particularly, from the viewpoint of further improving safety, the thickness more preferably ranges from 30 μm to 70 μm. Further, the width of the end tape may be adapted to the width of the mold of the function transfer product.

Materials forming the end tape are not limited particularly, and resins are preferable. Particularly, from the viewpoints of reuse of the core and winding performance of the function transfer product 14, it is possible to use a tape and the like formed of polyethylene terephthalate, polyethylene naphthalate, polyethylene isophthalate, polybutylene terephthalate, polyolefin, polyacetate, polycarbonate, polyphenylene sulfide, polyamide, ethylene.vinyl acetate copolymer, polyvinyl chloride, polyvinylidene chloride, synthetic rubber, or liquid crystal polymer.

Further, when non-slip treatment is applied to at least one of the surfaces of the end tape, it is possible to prevent slip between end tapes in the function transfer film roll, it is thereby possible to improve winding performance of the function transfer product and physical stability in transportation, and therefore, such treatment is preferable. As the non-slip treatment, there are emboss treatment, blast treatment, coating of rubber and the like. Particularly, such treatment is effective in the case where the length of the end tap is 25 cm or more, and the above-mentioned effect is more remarkable in the case of 50 cm or more and 1 m or more sequentially.

Figure 22:
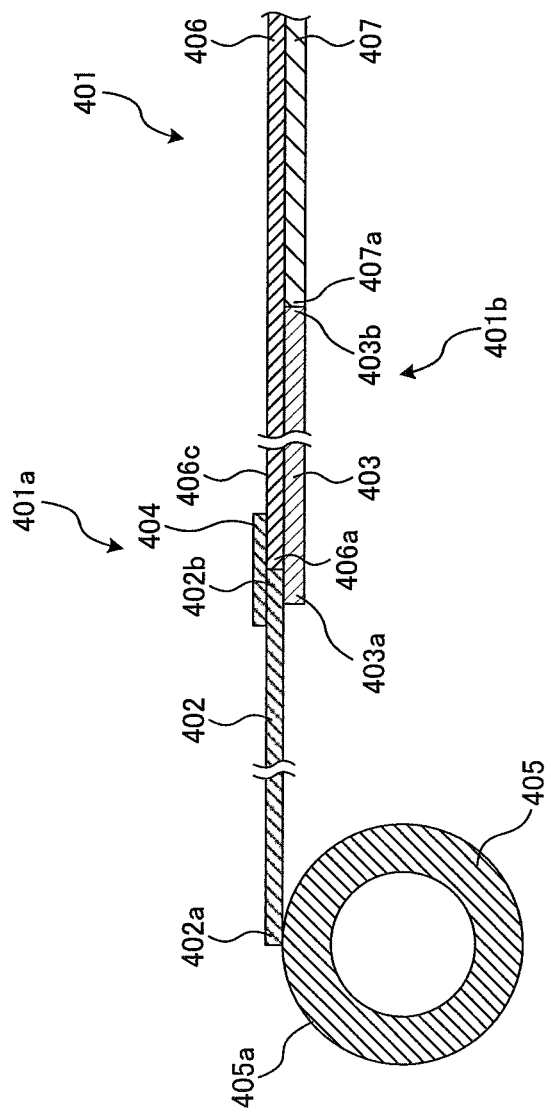
FIG. 22 is an explanatory diagram illustrating a method of fixing the function transfer product to a core in the function transfer film roll according to this Embodiment.

A specific example of the function transfer film roll according to this Embodiment will be described below with reference to FIG. 22. FIG. 22 is an explanatory diagram illustrating a method of fixing the function transfer product to a core in the function transfer film roll according to this Embodiment.

As shown in FIG. 22, an end edge portion 401a of a function transfer product 401 is comprised of an end tape 402, cover tape 403, and pressure-sensitive tape 404. By such a configuration, since the fixing strength between a core 405 and the function transfer product 401 is improved, winding accuracy of the function transfer product 401 is improved, and it is possible to manufacture the function transfer film roll with excellence. Further, it is possible to suppress misalignment in transporting the function transfer film roll, and it is thereby possible to suppress the failure of the concavo-convex structure of the mold and variations in the film thickness of the functional layer.

The method of fixing the function transfer product 401 to the core 405 will be described more specifically. The end tap 402 couples the function transfer product 401 and the core 405. It is possible to perform this fixing using a double-sided tape or the like. As the double-sided tape, for example, there are double-sided tapes made by Teraoka Seisakusho co., Ltd. On the other hand, a front edge portion 402b of the end tape 402 is joined to an end edge portion of a carrier 406 forming the function transfer product 401 with the cover tape 403 and pressure-sensitive tape 404.

The cover tape 403 covers a region 401b in which at least a functional layer 407 is not formed on the side on which the functional layer 407 is provided on the carrier 406 in the function transfer product 401. Herein, it is also possible to use the cover tape 403 to inform that a remaining amount of the function transfer product 401 wound around the core 405 is few. In this case, from the viewpoint of visual inspection detection and automatic detection, it is preferable that a hue of the cover tape is different from hues of the mold and the functional layer 407.

It is preferable that one edge portion 403a of the cover tape 403 extends up to the front edge portion 402b side of the end tape 402, and joins an end edge portion 406a of the carrier 406 of the function transfer product 401 and the front edge portion 402b of the end tape 402. In addition, it is also possible to provide space between an end edge portion 407a of the functional layer 407 and the other edge portion 403b of the cover tape 403, but in order to suppress partial peeling of the functional layer 407 of the function transfer product 401 from the nanostructure of the carrier 406, it is preferable that the other edge portion 403b of the cover tape 403 extends so as to cover the end edge portion 407a of the functional layer 407.

From the viewpoints of safety and the winding accuracy of the function transfer product 401, the thickness of the cover tape 403 preferably ranges from 10 μm to 100 μm, and more preferably ranges from 30 μm to 70 μm. It is possible to adapt the width of the cover tape 403 to the width of the functional layer 407 or the width of the carrier 406.

The pressure-sensitive tape 401 exerts the effects of enhancing the joining strength between the function transfer product 401 and the end tape 402, and further enhancing the winding accuracy of the function transfer product 401 and safety in using. One of the surfaces of the pressure-sensitive tape 404 is a pressure-sensitive surface and the joint portion between the carrier 406 and the end tape 402, and the pressure-sensitive surface is provided on the rear surface 406c side of the carrier 406. In addition, when the adhesion strength of only the cover tape 403 is high to sufficiently exert safety and winding accuracy, the pressure-sensitive tape 404 may not be provided. Further, when the adhesion strength of only the pressure-sensitive tape 404 is high to sufficiently exert safety and winding accuracy, the cover tape 403 may not be extended to the front edge portion 402b side of the end tape 402.

From the viewpoints of sufficiently enhancing the joining strength between the function transfer product 401 and the end tape 402, and improving the winding accuracy, the length of the pressure-sensitive tape 404 preferably ranges from 5 mm to 100 mm. Particularly, from the viewpoint of handling properties in using the pressure-sensitive tape 404, the length is preferably 50 mm or less, and more preferably 25 mm or less. From the viewpoints of the winding accuracy and reduction in the film thickness distribution of the functional layer 407 of the function transfer film roll, the thickness of the pressure-sensitive tape 404 preferably ranges from 10 μm to 100 μm, and more preferably ranges from 30 μm to 70 μm. Further, it is possible to adapt the width of the pressure-sensitive tape 404 to the width of the functional layer 407 or the width of the mold.

As described above, the region 401b in which at least the functional layer 407 does not exist is formed on the end edge side of the function transfer product 401. It is preferable that the region 401b is provided at least a length of a single turn of the core 405 or more from the end edge toward the start edge of the function transfer product 401.

By providing the region 401b in which at least the functional layer 407 does not exist in the function transfer product 401, there are the following effects. In the function transfer film roll such that the function transfer product 401 is wound around the core 405, the region 401b is positioned immediately above the joint portion (pressure-sensitive tape 404) of the function transfer product 401 and the end tape 402. Herein, since the joint portion is covered with the region 401b, even when unevenness exists somewhat in the joint portion, it is possible to suppress the failure of the concave-convex structure of the mold and variations in the film thickness of the functional layer 407 caused by the unevenness. Herein, from the above-mentioned reason, the length of the region 401b is not limited particularly, as long as the length is longer than at least a single turn of the core 405. However, from the viewpoint of environmental suitability, although depending on the diameter of the core 405, it is preferable that the length is substantially 50 cm or less.

EXAMPLES

Examples performed to confirm the effects of the present invention will be described.

Example 1

Using the function transfer product, the mask function to perform nano-processing on the target object was added onto the target object, and using the function, the target object was processed. Herein, evaluations were made with attention directed toward the accuracy of the functional layer that is one the effects of the function transfer product, and were specifically performed as described below.

(a) Preparation of a Cylindrical Master Mold

Cylindrical quartz glass was used as a substrate of a cylindrical master mold, and a nanostructure was formed on the quartz glass surface by a direct-write lithography method using a semiconductor laser. First, the quartz glass surface was sufficiently cleaned to remove particles. Next, a resist layer was deposited on the quartz glass surface by a sputtering method. The sputtering method was performed with power of RF 100W using CuO of 3-inch Φ (8 atm % Si contained) as a target (resist layer) to form a resist layer of 20 nm. Subsequently, while rotating the quartz glass, exposure was performed once using a semiconductor laser with a wavelength of 405 nm. Next, exposure was further performed on the once exposed resist layer using the semiconductor laser with a wavelength of 405 nm. By the exposure pattern at this point, the arrangement of the nanostructure was controlled. Next, the exposed resist layer was developed. Development of the resist layer was performed for 240 seconds using 0.03 wt % glycine aqueous solution. Next, using the developed resist layer as a mask, etching was performed on the etching layer (quartz glass) by dry etching. Dry etching was performed using $SF_6$ as an etching gas on the conditions that the processing gas pressure was 1 Pa, and that processing power was 300 W. By varying the processing time, the size of the opening portion of the nanostructure and the depth of the nanostructure were adjusted. Next, only the resist layer residual was removed from the quartz glass provided with the nanostructure on the surface using hydrochloric acid of pH1, and a cylindrical master mold was obtained. The removal time was 6 minutes.

The nanostructure of the obtained cylindrical master mold was coated with a fluorine-containing surfactant (Durasurf HD-1101Z, made by Daikin Industries, Ltd.) in an atmosphere of nitrogen, heated at 60° C. for 1 hour, and then, allowed to stand at room temperature for 24 hours to fix. Then, cleaning was performed three times using a cleaning agent (Durasurf HD-ZV, made by Daikin Industries, Ltd.), and mold release treatment was performed.

(b) Preparation of the Carrier

Using the prepared cylindrical master mold as a mold, by applying the photo nanoimprint method, the carrier was prepared continuously. As raw materials forming the carrier, the following material 1 was used.

Material 1 . . . Material obtained by mixing fluorine-containing urethane (meth)acrylate (OPTOOL DAC HP (made by Daikin Industries, Ltd.)): trimethylolpropane (EO-modified) triacrylate (M350 (made by TOAGOSEI Co., Ltd.)): 1-hydroxy-cyclohexyl-phenyl-ketone (Irgacure (Registered Trademark) 184 (made by BASF Company)): 2-benzyl-2-dimethylamino-1-(4-morpholino phenyl)-butanone-1 (Irgacure 369 (made by BASF Company))=17.5 g: 100 g: 5.5 g: 2.0 g The material 1 was applied onto an easy adhesion surface of a PET film A-4100 (made by Toyobo Co., Ltd.: width 300 mm, thickness 100 μm) by Micro Gravure coating (made by Yasui Seiki Co., Ltd.) so that the coating film thickness was 6 μm. Next, the PET film coated with the material 1 was pressed against the cylindrical master mold with a nip roll (0.1 MPa), and was irradiated with ultraviolet rays at a temperature of 25° C. and humidity of 60% under atmospheric pressure using a UV exposure apparatus (H bulb) made by Fusion UV Systems Japan Co., Ltd.) so that the integral amount of exposure below the center of the lamp was 1500 mJ/cm$^2$, photo-curing was performed successively, and obtained was a carrier G1 (length 200 m, width 300 mm) with the nanostructure transferred to the surface.

Next, using the carrier G1 as a template, a carrier G2 was prepared continuously by applying the photo nanoimprint method. In other words, a nanostructure of the carrier G2 was the same as the nanostructure of the cylindrical master mold.

The material 1 was applied onto the easy adhesion surface of the PET film A-4100 (made by Toyobo Co., Ltd.: width 300 mm, thickness 100 μm) by Micro Gravure coating (made by Yasui Seiki Co., Ltd.) so that the coating film thickness was 6 μm. Next, the PET film coated with the material 1 was pressed against the nanostructure surface of the carrier G1 with the nip roll (0.1 MPa), and was irradiated with ultraviolet rays at a temperature of 25° C. and humidity of 60% under atmospheric pressure using the UV exposure apparatus (H bulb) made by Fusion UV Systems Japan Co., Ltd. so that the integral amount of exposure below the center of the lamp was 1200 mJ/cm$^2$, photo-curing was performed successively, and obtained was a plurality of carriers G2 (length 200 m, width 300 mm) with the nanostructure transferred to the surface.

Table 1 describes details of nanostructures of the carriers G2 observed with a scanning electron microscope (hereinafter, referred to as SEM). SEM observation was performed using Hitachi Ultra-High Resolution Field Emission Type Scanning Electron Microscope SU8010 (made by Hitachi High-Technologies Corporation) with an acceleration voltage of 1.0 kV. In addition, all of SEM described in the following Examples was this apparatus. Further, when the surface layer fluorine element concentration (Es) and the average fluorine element concentration (Eb) of the carrier G2 were measured using the following apparatus, and the ratio (Es/Eb) was calculated, the ratios (Es/Eb) were between 38 to 45. In addition, all of the ratios (Es/Eb) described in the following Examples were values obtained by measuring and calculating in the same way as in Example 1.

Surface Layer Fluorine Element Concentration (Es)

The carrier G2 was cut into small pieces of about 2 mm square, and the piece was covered with a 1 mm×2 mm slot type mask and underwent measurement using X-ray Photoelectron Spectroscopy (XPS method) on the following conditions.

XPS Measurement Conditions

Used apparatus; Thermo Fisher ESCALAB 250
Excitation source; mono. AlKα 15 kV×10 mA
Analysis size; About 1 mm (shape was an ellipse)
Retrieve region
Survey scan; 0~1, 100 ev
Narrow scan; F 1 s, C 1 s, O 1 s, N 1 s
Pass energy
Survey scan; 100 ev
Narrow scan; 20 eV Average Fluorine Element Concentration (Eb)

As the average fluorine element concentration (Eb), correlation was obtained between the charge amount and the following actual measurement method, and therefore, the value calculated from the charge amount was adopted. The actual measurement was performed by decomposing a slice obtained by physically peeling off the nanostructure of the carrier G2 from the support substrate by a flask combustion method, and then, applying ion chromatography analysis to the resultant.

TABLE 1

| | PITCH (nm) | DEPTH (nm) | OPENING DIAMETER(nm) | APERTURE RATIO(%) | ARRANGEMENT |
|---|---|---|---|---|---|
| 1 | 460 | 480 | 430 | 79 | HEXAGONAL |
| 2 | 200 | 250 | 180 | 73 | HEXAGONAL |

(c) Preparation of the Function Transfer Product

The nanostructure surface of the carrier G2 was coated with a functional coating liquid 1 to prepare the function transfer product.

Functional coating liquid 1 . . . Material obtained by diluting a composition obtained by mixing a benzyl-based binder resin: bisphenol A EO-modified diacrylate (ARONIX M211B, made by TOAGOSEI Co., Ltd.): phenoxyethyl acrylate (Light acrylate PO-A, made by KYOEISHA CHEMICAL Co., Ltd.): trimethylolpropane (EO-modified)

triacrylate (ARONIX M350, made by TOAGOSEI Co., Ltd.): 1-hydroxy-cyclohexyl-phenyl-ketone (Irgacure 184, made by BASF Company): 2-benzyl-2-dimethylamino-1-(4-morpholino phenyl)-butanone-1 (Irgacure 369, made by BASF Company)=150 g: 40 g: 40 g: 20 g: 11 g: 4 g with a mixed solvent of methyl ethyl ketone and propylene glycol monomethyl ether to 10 weight %. Used as the benzyl-based binder resin was a methyl ethyl ketone solution of two-dimensional copolymers of 80 mass % of benzyl methacrylate and 20 mass % of methacrylic acid (solid 50%, weight average molecular weight 56,000, acid equivalent 430, degree of dispersion 2.7). In addition, the above-mentioned mass is described as the solid mass.

The functional coating liquid 1 was applied onto the nanostructure surface of the carrier G2 using a die coater. After coating, the resultant was shifted inside a drying oven of 80° C. for 5 minutes to remove an surplus solvent. Then, the cover film was applied, and the resultant was wound and collected.

Table 2 describes details of the function transfer product observed by the SEM and transmission electron microscope (hereinafter, referred to as TEM).

TABLE 2

|   | PITCH (nm) | DISTANCE A(nm) | DISTANCE B(nm) | A/B | DISTRIBUTION (±%) |
|---|---|---|---|---|---|
| 3 | 460 | 55 | 480 | 0.1 | 6 |
| 4 | 200 | 50 | 250 | 0.2 | 8 |

In addition, in Table 2, the distance A is the shortest distance between the top position of a convex-portion of the nanostructure of the carrier and the surface of the functional layer. Further, the distance B is the average depth of the nanostructure of the carrier. The distribution in Table 2 means the in-plane distribution of the function transfer product with respect to the center film thickness of the distance A. Furthermore, the case of using the carrier described in No. 1 of Table 1 corresponds to No. 3 of Table 2, and the case of using carrier No. 2 of Table 1 corresponds to No. 4 of Table 2. In addition, a change in the distance A before and after holding the function transfer product at an angle of 60 degrees from the plane for 15 minutes was measured with reflectance, and since any change of the film thickness distribution or more was not shown in the peak bottom of the reflection spectrum of reflectance measurement, it was judged that there was no substantial change. Further, the surface roughness (Ra) on the functional layer side was measured using an atomic force microscope (hereinafter, referred to as AFM), the distance (lor) between the top position of a convex-portion of the nanostructure and the surface of the functional layer was measured with the SEM, the ratio (Ra/lor) was calculated, and it was confirmed that the ratio was 0.141 when the average pitch was 460 nm and that the ratio was 0.127 when the average pitch was 200 nm.

Used as the AFM was Nanoscale Hybrid Microscope VN-8000 made by KEYENCE CORPORATION, the measurement range was set at 200 μm (ratio 1:1), and measurement was performed while scanning at a sampling frequency of 0.51 Hz. Observation with the AFM was performed in a clean room of class 1000 with humidity of 40% to 50%, and was performed while avoiding portions in which foreign substances were measured with an optical microscope provided in the above-mentioned apparatus VN-8000. Further, before sample measurement, the sample was subjected to static elimination with an ionizer, and further, was cleaned by an air blow. Furthermore, the distance (lor) was measured by analyzing the cross section in the approximately same position as in the sample used in the AFM using the above-mentioned SEM at an acceleration voltage of 1.0 kV. In obtaining the distance (lor), an image was picked at intervals of 20 μm, and five observation images were obtained. Five distances (lor) were measured arbitrarily from each observation image, and the arithmetical mean value of distances (lor) of total 25 points was determined as the distance (lor). Further, the observation magnification was set at a magnification such that 10 to 20 convex portions of a plurality of convex portions of the nanostructure of the carrier G2 sharply observed were held inside the observation image.

In addition, the surface roughness (Ra) and distance (lor) on the functional layer side of the function transfer product evaluated in each of the following Examples were values measured by the above-mentioned apparatus and conditions.

(d) Use of the Function Transfer Product

By using the function transfer product, the functional layer was transferred onto the target object, and subsequently, the target object was subjected to nano-processing, by causing the transferred functional layer to function as a processing mask.

As the target object, used was a c-surface sapphire substrate of 2-inch Φ.

UV-$O_3$ treatment was performed on the sapphire substrate for 10 minutes to perform cleaning, while applying hydrophilic treatment to the surface.

In a state in which the treated sapphire substrate was heated to 105° C., the functional layer surface of the function transfer product was bonded using laminate rolls at a pressure of 0.03 Mpa. Subsequently, UV light was applied using a high-pressure mercury-vapor lamp so that the integral light amount was 1200 mJ/cm$^2$, and the carrier was peeled and removed. Results obtained by performing SEM observation on the obtained sapphire substrates are summarized in Table 3.

TABLE 3

|   | PITCH(nm) | DISTRIBUTION(±%) |
|---|---|---|
| 5 | 460 | 10 |
| 6 | 200 | 11 |

Next, using $O_2$ gas, ashing treatment was performed from the functional layer side of the sapphire substrate at a pressure of 1 Pa with power of 300 W to remove the residual layer i.e. the functional layer corresponding to the distance A described in Table 2. Subsequently, using the left convex portions of the functional layer as a mask, etching was performed using $BCl_3$ gas on the conditions of pressure 0.2 Pa and 150 W/50 W, and the sapphire substrate was processed. Finally, the sapphire substrate was cleaned with a mixed solution of sulfuric acid and hydrogen peroxide. When the obtained sapphire substrate was observed using the SEM, a plurality of convex portions was formed over the inside of the surface with high uniformity at intervals corresponding to the nanostructure of the carrier.

Comparative Example 1

Using the carrier G2 described in Table 1 prepared in Example 1 as a mold, processing of a sapphire substrate was tried by the photo nanoimprint lithography method. As a photocurable resin, a photocurable resin (MUR) made by Maruzen Petrochemical Co., Ltd. was used.

A c-surface sapphire substrate was subjected to surface treatment as in Example 1, and then, a film of the photocurable resin was formed by spin coat at a rotation speed of 5000 rpm. After film formation, the resultant was heated at 80° C. for 1 minute to remove an surplus solvent.

The nanostructure surface side of the carrier G2 was bonded to the photocurable resin thin film with a laminator, and then, was pressed at a pressure of 0.05 MPa for 5 minutes. In the pressing state, UV light was applied using a UV-LED lamp so that the integral light amount was 1200 mJ/cm$^2$. Finally, by peeling and removing the carrier G2, the nanostructure was transferred and formed onto the sapphire substrate.

SEM observation was performed on the obtained sapphire substrate, and the results are summarized in Table 4.

TABLE 4

| | PITCH (nm) | RESIDUAL LAYER THICKNESS(nm) | DISTRIBUTION (±%) |
|---|---|---|---|
| 9 | 460 | 50 | 15 |
| 10 | 200 | 60 | 25 |

The same techniques as in Example 1 were applied to the obtained sapphire substrate provided with the nanostructure, and the sapphire substrate was processed. When the processed sapphire substrate was observed with the SEM, portions with few nanostructure and portions with the nanostructure firmly formed existed inside the surface.

Comparison Between Example 1 and Comparative Example 1

From Example 1 and Comparative Example 1, the following matters are understood. First, the case of Example 1 is extremely excellent in the film thickness distribution of the functional layer (solid of the functional coating liquid in Example 1, the photocurable resin in Comparative Example 1) transferred to the target object. More specifically, from Table 3 of Example 1 and Table 4 of Comparative Example 1, in the case where the average pitch of the nanostructure is 460 nm, the film thickness distribution is 10% in Example 1, while being 15% in Comparative Example 1. Further, in the case where the average pitch of the nanostructure is 200 nm, similarly, the distributions are 11% and 25%. This is conceivable as described below. In the case of Example 1, the film thickness distribution as the function transfer product is 6% to 8% from Table 2, and it is understood that the functional layer with extremely high accuracy is arranged. Further, the functional layer of the function transfer product is in a non-liquid shape and stably exists. In using the function transfer product, the surface layer of the functional layer is provided with fluidity in thermocompression. In other words, it is conceivable that it was possible to reflect the functional layer accuracy of the function transfer product in the target object to add and transfer. On the other hand, in the case of Comparative Example 1, since the liquid photocurable resin was used, it is conceivable that the entire photocurable resin developed a flow corresponding to pressure unevenness in bonding the carrier and in pressing.

Thus, since it is possible to improve the accuracy of the functional layer transferred to the target object, by using the function transfer product, the target object underwent nanoprocessing, and the accuracy of the fine pattern provided on the surface was also improved. More specifically, in the case of Example 1 using the function transfer product, when the obtained sapphire substrate was observed using the SEM, a plurality of convex portions was formed over the inside of the surface with high uniformity at intervals corresponding to the nanostructure of the carrier. On the other hand, in the case of Comparative Example 1 using the liquid photocurable resin, when the processed sapphire substrate was observed with the SEM, portions with few nanostructure and portions with the nanostructure firmly formed existed inside the surface. In the case of Comparative Example 1, since the large distribution exists in the residual layer thickness, this is because it is necessary to perform over etching (oxygen ashing) in accordance with the place with the thickest residual layer thickness.

Example 2

Using the carrier G2 described in Table 1 prepared in Example 1, a functional layer different from that in Example 1 was transferred to the target object, and next, the target object was subjected to nano-processing. In addition, in Example 2, the functional layer was partially transferred to the target object.

On the carrier G2, a film of a first functional layer included in the nanostructure area was formed, and subsequently, a second functional layer included in the non-nanostructure area was further formed.

(c) Preparation of the Function Transfer Product

First, a film of a functional coating liquid 2 was formed on the nanostructure surface of the carrier G2 to provide the first functional layer.

Functional coating liquid 2 . . . Titanium (IV) tetrabutoxide monomer (made by Wako Pure Chemical Industries, Ltd.): 3-acryloxypropyl trimethoxysilane (KBM5103, made by Shin-Etsu silicone corporation): phenyl-modified silicone (made by Dow Corning Toray Co., Ltd.): 1-hydroxy-cyclohexyl-phenyl-ketone (Irgacure 184, made by BASF Company)=90 g: 10 g: 5 g: 0.3 g were mixed and stirred at a temperature of 60° C. for 6 hours. Next, the resultant was stirred in a reduced pressure atmosphere of 200 hPa for 2 hours, and was condensed until the viscosity at 25° C. was 250 cP. Material obtained by diluting the obtained condensed material with propylene glycol monomethyl ether to 8 weight %.

The functional coating liquid 2 was applied as in Example 1.

A film of the functional coating liquid 1 was formed on the nanostructure surface of the carrier G2 provided with the first functional layer so that the film thickness was 400 nm to arrange the second functional layer. After film formation, the resultant was passed through a drying oven of 80° C. for 5 minutes, the cover film was applied, and the resultant was wound and collected.

SEM and TEM observation was performed on the obtained function transfer product. The results are described in Table 5. A, B and C in Table 5 respectively represent the following meanings.

A . . . Distance between the top position of a convex-portion of the nanostructure of the carrier G2 and the position of the interface between the first functional layer and the second functional layer B . . . Average depth of the nanostructure of the carrier C . . . Distance between the position of the interface between the first functional layer and the second functional layer and the surface of the second functional layer

TABLE 5

| | PITCH(nm) | DISTANCE A(nm) | DISTANCE B(nm) | DISTANCE C(nm) | A/B | DISTRIBUTION A (±%) | DISTRIBUTION C (±%) |
|---|---|---|---|---|---|---|---|
| 7 | 460 | 45 | 480 | 400 | 0.1 | 6 | 5 |
| 8 | 200 | 30 | 250 | 400 | 0.1 | 8 | 5 |

Further, the distribution A is the film thickness distribution with respect to the center film thickness of the distance A, and the distribution C is the film thickness distribution with respect to the center film thickness of the distance C. In addition, changes in the distance A and distance C before and after holding the function transfer product at an angle of 60 degrees from the plane for 15 minutes were measured with the SEM and TEM, and since any changes were not shown in the distributions of the distance A and distance C, it was judged that there were no substantial changes. Further, the surface roughness (Ra) on the functional layer side was measured with the AFM, the distance (lor) between the top position of a convex-portion of the nanostructure and the surface of the functional layer was measured with the SEM, the ratio (Ra/lor) was calculated, and it was confirmed that the ratio was 0.083 when the average pitch was 460 nm and that the ratio was 0.062 when the average pitch was 200 nm.

(d) Use of the Function Transfer Product

Next, using the function transfer product, the functional layer was partially transferred onto a sapphire substrate. Subsequently, the sapphire substrate was partially subjected to nano-processing using the functional layer as a processing mask.

The pretreatment to the sapphire substrate and the transfer method of the function transfer product was the same as in Example 1 except that the function transfer product with a width of 1 cm was bonded to the center portion of the sapphire substrate.

The functional layer was formed in the shape of line with a width of 1 cm in the center of the sapphire substrate. From this fact, it is understood that it is possible to transfer the functional layer to an arbitrary portion of the target object by using the function transfer product.

Table 6 describes results obtained by observing the functional layer transferred onto the sapphire substrate using the SEM and TEM.

TABLE 6

| | PITCH(nm) | DISTRIBUTION A(±%) | DISTRIBUTION C(±%) |
|---|---|---|---|
| 7 | 460 | 6 | 8 |
| 8 | 200 | 8 | 8 |

Finally, processing of the sapphire substrate was performed as in Example 1. In addition, the oxygen ashing time was only changed. When the obtained sapphire substrate was observed with the SEM, the nanostructure was provided with high uniformity over the inside of the surface.

Comparison Between Examples 1 and 2

From Examples 1 and 2, it was understood that it is possible to guarantee the accuracy of the functional layer as the function transfer product and transfer the functional layer to the target object, irrespective of the arrangement (the number of layers of the functional layer) with respect to the nanostructure of the functional layer. This is capable of being judged from Tables 2 and 3 of Example 1 and Tables 5 and 6 of Example 2. Further, in the case of using the function transfer product of Example 2, as compared with the case of using the function transfer product of Example 1, the height of the nanostructure of the obtained sapphire was high. This is because function sharing of the functional layer is performed by making the functional layer two layers. In other words, this is a state in which the nano-processing accuracy is guaranteed by the first functional layer in the nanostructure area, and etching resistance to sapphire is improved by the second functional layer in the non-nanostructure area.

Comparison Between Example 2 and Comparative Example 1

From Example 2, it was understood that it is possible to transfer the functional layer to the target object partially with high accuracy by using the function transfer product. This is capable of being judged from Table 6 of Example 2. This reason is the same as in Example 1, and this is because it is possible to bond by the flow phenomenon of the functional layer surface layer in bonding the functional layer with the accuracy fixed in the state of the function transfer product to the target object.

On the other hand, in Comparative Example 1, the same operation as in Comparative Example 1 was performed on the photocurable resin on the sapphire substrate using the carrier with a width of 1 cm. In addition, the photocurable resin in a portion that did not contact the carrier G2 was cleaned and removed with alcohol. The nanostructure in the shape of a line with a width of 1 cm was transferred and formed onto the sapphire substrate, and it was observed that the uncured photocurable resin entered the edge portion of the line-shaped pattern with a width of 1 cm, and that the pattern was thereby partially filled. Further, many stains were shown in portions in which the pattern was neither transferred nor formed, On the other hand, when alkali cleaning was performed to completely remove the stains, the stains were capable of being removed, but the disturbance was observed in the transfer-formed pattern.

As described above, from Examples 1 and 2 and Comparative Example 1, it is understood that it is possible to guarantee the accuracy of the functional layer of the function transfer product and transfer the functional layer to the entire surface of the target object or partially with high accuracy by using the function transfer product.

Example 3

It is an object of Example 3 to check whether it is possible to transfer a function that is completely different from the mask function in Examples 1 and 2 to the target object. In this case, since the composition forming the functional layer is different, it is examined whether it is possible to transfer the functional layer to the target object, while ensuring the accuracy of the functional layer as the function transfer product as in Examples 1 and 2 also in the case where the composition of the functional layer is different.

By applying the same methods as in the techniques described in Example 1, the carrier G2 was prepared which was provided with the nanostructure in which a plurality of concave portions was arranged in a hexagonal close-packed arrangement with a pitch of 200 nm, an opening portion diameter of 180 nm and a depth of 300 nm. The ratio (Es/Eb) of the carrier G2 was 37. A PET film with a thickness of 50 μm was used as the support substrate of the carrier G2. A film of the functional layer provided with the water repellent function was formed on the carrier G2 to manufacture the function transfer product. Finally, using the function transfer product, the water repellent function was transferred onto the target object.

The following functional coating liquid 3 was used. Functional coating liquid 3 . . . Photopolymerizable fluorine-containing urethane (meta) acrylate (OPTOOL DAC HP (made by Daikin Industries, Ltd.)) was added to the functional coating liquid 1. An additive amount was 15 parts by weight relative to 100 parts by weight of solid except a photopolymerization initiator. In addition, the concentration was adjusted to 10 weight with a mixed solvent of methyl ethyl ketone and propylene glycol monomethyl ether.

A film of the functional coating liquid 3 was formed on the nanostructure surface of the carrier G2 by the same techniques as the techniques described in Example 1. Film formation was performed so as to fill all the nanostructure of the carrier. In other words, the functional layer was only the functional layer included in the nanostructure area, and was a single-layer functional layer.

When the cross section of the obtained function transfer product was observed using the SEM and TEM, the nanostructure of the carrier was filled with the functional layer, and the nanostructure was flattened. Further, the shortest distance A between the top position of a convex-portion of the nanostructure of the carrier and the surface of the functional layer was 500 nm, and the distribution was +5. Further, a change in the distance A before and after holding the function transfer product at an angle of 60 degrees from the plane for 15 minutes was measured with reflectance, and since any change of the film thickness distribution or more was not shown in the peak bottom of the reflection spectrum of reflectance measurement, it was judged that there was no substantial change. In addition, the surface of the functional layer had tackiness and was a little tacky state. Further, the surface roughness (Ra) on the functional layer side was measured with the AFM, the distance (lor) between the top position of a convex-portion of the nanostructure and the surface of the functional layer was measured with the SEM, the ratio (Ra/lor) was calculated, and it was confirmed that the ratio was 0.017.

Plate-shaped glass and cylindrical rod was used as the target object. The plate-shaped glass was 250 mm□, and the cylindrical rod was glass in which the radius of the circle of the bottom was 250 mm and the height was 100 mm. Further, it was tested whether it was possible to provide water repellency on the entire surface of the plate-shaped glass for the plate-shaped glass and on the cylindrical rod so as to draw a spiral on the outer circumference.

In the case of using the plate-shaped glass, transfer was performed as described below. First, the glass surface was treated with UV-$O_3$ for 10 minutes to remove particles while making hydrophilic.

Next, in a state in which the plate-shaped glass was heated to 85° C., the function transfer product was laminated at a pressure of 0.03 Mpa. After laminating, UV light was applied using a high-pressure mercury-vapor lamp so that the integral light amount was 1200 mJ/cm$^2$. Finally, the plate-shaped glass was heated to 120° C. for 30 seconds, and in a state in which the plate-shaped glass was 30° C. or less, the carrier was peeled and removed.

The contact angle of a water droplet with respect to the plate-shaped glass was 15 degrees before transferring the functional layer with the surface cleaned by static elimination and air blow. On the other hand, the contact angle of a water droplet with respect to the plate-shaped glass with the functional layer transferred was 123 degrees, and it was confirmed that the water repellent function was provided. Further, the contact angle distribution of 20 places inside the surface was 123 degrees±4%, and excellent function uniformity was confirmed.

It is conceivable that such uniformity of the water repellent function is due to the fact that the water repellent function specific to nanostructure is guaranteed with the nanostructure shape of the carrier of the function transfer product, and that the nanostructure of the carrier is transferred to the target object with high accuracy.

From the foregoing, it was understood that it is possible to hold the accuracy of the functional layer and transfer the functional layer to the target object also in the case of further adding the fluorine component that is a strong hydrophilic component to the functional layer used in Examples 1 and 2.

In the case of using the cylindrical rod, transfer was performed as described below.

First, the cylindrical rod was immersed in a mixed solution of isopropyl alcohol and potassium hydroxide, and was subjected to ultrasonic cleaning to remove particles while making hydrophilic.

Next, in a state in which the cylindrical rod was heated to 105° C., the function transfer product made the shape of a reel with a width of 1 cm and a length of 80 cm was wound around the side surface of the cylindrical rod in a spiral manner while applying tension. Next, UV light with the integral light amount of 1200 mJ/cm$^2$ was applied using a UV-LED lamp, the resultant was heated at 120° C. for 1 minute, and after cooling the cylindrical rod to 30° C., the carrier G2 was removed.

When a water droplet was put on the side surface of the cylindrical rod before transfer-adding the functional layer with the surface cleaned by static elimination and air blow, the water droplet spread. On the other hand, when a water droplet was put on the portion with the functional layer transferred of the cylindrical rod with the functional layer transferred, the water droplet held the shape without spreading. Photographs of the water droplet on the pattern were taken, and it was possible to estimate that the contact angle was between 110 degrees and 120 degrees. In addition, the reason why between 110 degrees and 120 degrees is described herein is not due to the distribution of the contact angle, and is due to the effect of error in performing photography horizontally on the cylindrical rod side surface.

Further, when the obtained cylindrical rod was immersed in water and lifted, water droplets on the pattern were attracted to the non-pattern portions, and the water film was patterned in the shape of a spiral.

Thus, it is understood that by using the function transfer product, it is possible to add the function to the curved portion and an arbitrary portion of the target object.

Example 4

From Examples 1 and 3, it was confirmed that it is possible to transfer the function (water repellent function) with high accuracy also in the case of adding the fluorine component that is a strong hydrophilic component to the functional layer. In Example 4, as in the relationship between Examples 1 and 2, the effect of the arrangement of the functional layer was examined based on Example 3. In other words, the water repellent function was transferred to the target object by adopting techniques different from those in Example 3.

The same carrier G2 as in Example 3 was used as the carrier. A functional coating liquid 4 was applied to the nanostructure of the carrier G2, a first functional layer was filled and arranged in only inside the concave portions, then a functional coating liquid 5 was applied to cover the whole and flatten, and a film of a second functional layer was formed. In other words, the function transfer product included only the functional layers included in the nanostructure area, and the functional layers were two-layer functional layers.

Functional coating liquid 4 . . . Material obtained by mixing 3-acryloxypropyl trimethoxysilane (KBM5103, made by Shin-Etsu silicone Corporation): tetraethoxy silane (LS-2430, made by Shin-Etsu Chemical Co., Ltd.): triethoxy-1H, 1H, 2H, 2H-tridecafluoro-n-octylsilane (T1770, made by Tokyo Chemical Industry Co., Ltd.)=65 g: 35 g: 30 g to beforehand condense in an atmosphere of 60 degrees using water vapor, adding 0.15 g of 1-hydroxy-cyclohexyl-phenyl-ketone (Irgacure 184, made by BASF Company) to 100 parts by weight of the beforehand condensed material, and diluting the obtained composition with propylene glycol monomethyl ether to 3 weight %.

Functional coating liquid 5 . . . Composition in which an additive amount of polymerizable fluorine-containing urethane (meta) acrylate (OPTOOL DAC HP (made by Daikin Industries, Ltd.)) was 17.5 parts by weight to 100 parts by weight of solid except the photopolymerization initiator in the functional coating liquid 3. In addition, the concentration was adjusted to 10 weight % with a mixed solvent of methyl ethyl ketone and propylene glycol monomethyl ether.

The functional coating liquid 4 was applied by the same techniques as in Example 1. After applying, the resultant was passed through a drying oven of 80° C. for 5 minutes, and was wound and collected. When the obtained film was partially cut and the cross section was observed with the TEM, it was confirmed that the first functional layer was filled and arranged in only inside the concave portions of the nanostructure of the carrier G2. Further, the filling rate in the depth direction of the nanostructure of the first functional layer was 75%.

The carrier with the first functional layer made of solid of the functional coating liquid 4 filled and arranged was wound off, and the functional coating liquid 5 was applied using the same techniques as in Example 2. After applying, the resultant was passed through a drying oven of 80° C. for 5 minutes, the cover film was applied, and the resultant was wound and collected.

When the cross section of the obtained function transfer product was observed using the SEM, TEM and energy dispersive X-ray spectroscopy (hereinafter, referred to as EDX), solids of the functional coating liquid 4 were filled and arranged only inside the concave portions of the nanostructure of the carrier, and the functional layer derived from the functional coating liquid 5 was formed so as to fill and flatten the solids and all of the nanostructure of the carrier. In other words, the functional layer of the function transfer product had two layers, and had the configuration that all the functional layers were included in the nanostructure area. The filling rate of the first functional layer filled and arranged inside the nanostructure with respect to the concave portions of the nanostructure was 75%, and the distribution was +4%. On the other hand, the distance (lor) that was shortest distance between the convex-portion vertex-portion average position of the nanostructure of the carrier and the surface of the functional layer was 500 nm, and the distribution was ±5%.

Further, variations in the film thickness of the functional layer before and after holding the function transfer product at an angle of 60 degrees from the plane for 15 minutes were within the measurement error range, and it was thereby confirmed that there were no substantial variations. In addition, the surface of the functional layer had tackiness and was a little tacky state. Further, the surface roughness (Ra) on the functional layer side was measured with the AFM, the distance (lor) between the top position of a convex-portion of the nanostructure and the surface of the functional layer was measured with the SEM, the ratio (Ra/lor) was calculated, and it was confirmed that the ratio was 0.088.

Using the function transfer product, the functional layer was transferred onto the target object. The used target object and the transfer method were the same as in the study on the plate-shaped glass of Example 3.

When the contact angle was measured by putting a water droplet on the obtained glass surface, the angle was 142 degrees, and it is was confirmed that the water repellent function was provided. Further, the distribution of 20 points inside the surface was 142 degrees±5%, and excellent function uniformity was confirmed.

From Examples 3 and 4, it is understood that it is possible to excellently transfer the functional layer to the target object irrespective of the arrangement of the functional layer. Further, by adding the studies of Examples 1 and 2, it is understood that this tendency is not dependent on the composition of the functional layer.

The reason why water repellency was improved as compared with Example 3 is that the functional layer was made the two-layer configuration and that the fluorine element concentration of the first functional layer closer to the nanostructure front end was increased. In addition, when the fluorine component contained in the functional coating liquid 5 was eliminated, it was confirmed that dropping properties of a water droplet on the nanostructure surface deteriorated. This is presumed that water repellency is guaranteed with the first functional layer of the nanostructure front end, and that a water droplet partially forming the Wenzel mode adheres to the second functional layer. In other words, it was understood that by making the functional layer two layers, it is possible to develop a high water repellent function by the first functional layer near the nanostructure, and that it is possible to improve the dropping properties and adhesion properties by the second functional layer.

As such uniformity of the water repellent function, it is conceivable that the water repellent function specific to nanostructure is guaranteed with the nanostructure shape of the carrier of the function transfer product, and that the nanostructure of the carrier is transferred to the target object with high accuracy.

(Comparative Example 2) Water Repellent Surface Transfer Product

A water repellent functional layer was added to the plate-shaped glass used in Examples 3 and 4 using other techniques. The pretreatment method of the plate-shaped glass was the same as in Example 3.

Next, a film of the functional coating liquid 3 diluted to 50 weight with methyl ethyl ketone as a dilute solvent was formed on one side of the treated plate-shaped glass by a bar coater method. Next, the plate-shaped glass was placed on a hotplate of 105° C. and was allowed to stand for 5 minutes to remove the solvent. Next, the nanostructure surface of the carrier G2 used in Example 3 was bonded to the functional coating liquid 3 film using a laminator at a pressure of 0.03 Mpa at a temperature of 105° C. Subsequently, light was applied through the carrier using a metal halide light source so that the integral light amount was 1200 mJ/cm$^2$. Finally, the carrier was removed.

When the contact angle was measured with respect to the obtained plate-shaped glass, the angle was 95 degrees around the center of the plate-shaped glass, while being 98 degrees around the edge of the plate-shaped glass.

From the foregoing, it is understood that water repellency was added, but was low as compared with Examples 3 and 4 in the techniques. The reason is conceivable that since the viscosity of the functional coating liquid 3 was high, filling properties inside the concave portions of the nanostructure of the carrier was insufficient, and that the transfer accuracy of the nanostructure was low.

By comparing between Example 3 and Comparative Example 2, it is understood that the more remarkable water repellent function addition effect appeared in the case of using the function transfer product, although the materials forming the functional layer were the same. The reason is conceivable that the functional layer is beforehand provided on the nanostructure of the carrier in the function transfer product, filling properties of the functional layer inside the nanostructure of the carrier are thereby improved, and that due to the improvement, it is possible to reflect the accuracy of the nanostructure of the carrier by using the function transfer product, and to transfer the functional layer to the target object.

Example 5

In Example 5, the effect of the ratio (Ra/lor) between the surface roughness (Ra) on the functional layer side of the function transfer product and the distance (lor) between the top position of a convex-portion of the nanostructure of the carrier and the surface of the functional layer was examined briefly. In addition, the effect of the ratio (Ra/lor) was discussed separately in Example 6 as described below in detail.

The cylindrical master mold, carrier G1 and carrier G2 were prepared as in Example 1. In addition, in preparing the carriers G1 and G2, the coating film thickness of the material 1 was set at 2 μm.

The carrier G2 was cut and observed with the SEM. The nanostructure of the carrier G2 was hole-shaped structure that a plurality of concave portions was provided in intersection positions of a triangular lattice. Further, the average pitch was 300 nm, the average opening diameter was 280 nm, the average aperture ratio was 79%, and the average concave-portion depth was 300 nm. Furthermore, the opening diameter of the concave portion was larger than the diameter of the concave bottom portion, and the concave-portion side surface had a slope. Still furthermore, the convex-portion vertex portion and the concave-portion side surface portion were of continuously connected structure. Moreover, the ratio (Es/Eb) was 43.

The nanostructure surface of the carrier G2 was coated with a functional coating liquid 6 to obtain the function transfer product.

Functional coating liquid 6 . . . Material obtained by diluting a composition obtained by mixing benzyl-based binder resin: tricyclodecane dimethanol diacrylate (SR833, made by SARTOMER Company): tris(2-hydroxyl ethyl) isocyanurate triacrylate (SR833, made by SARTOMER Company): 1-hydroxy-cyclohexyl-phenyl-ketone (Irgacure 184 (made by BASF Company)) 2-benzyl-2-dimethylamino-1-(4-morpholino phenyl)-butanone-1 (Irgacure 369 (made by BASF Company))=77.1 g: 11.5 g: 11.5 g: 1.47 g: 0.53 g with a mixed solvent of propylene glycol monomethyl ether and methyl ethyl ketone. In addition, used as the benzyl-based binder resin was a methyl ethyl ketone solution of two-dimensional copolymers of 80 mass % of benzyl methacrylate and 20 mass % of methacrylic acid (solid 50%, weight average molecular weight 56,000, acid equivalent 430, degree of dispersion 2.7).

The carrier G2 was wound out, and the functional coating liquid 6 was directly applied on the nanostructure surface using a die coater. Herein, the inter-lip distance of the die coater, discharge pressure and the dilute concentrate of the functional coating liquid 6 were determined so that the distance (lor) between the top position of a convex-portion of the nanostructure and the surface of the functional coating liquid 6 was 200 nm. After coating, the resultant was passed through inside a blast drying oven of 95° C., the cover film was applied to the surface of the functional layer comprised of solids of the functional coating liquid 6, and the resultant was wound around a core with 3-inch Φ and collected. Herein, the surface roughness (Ra) of the functional layer was controlled by controlling the type of the cover film and the pressure and temperature in bonding the cover film.

The function transfer product was cut, and the cross section was observed with the TEM and SEM. The distance (lor) was 140 nm. Further, the surface roughness (Ra) on the functional layer surface side of the function transfer product was measured using the AFM.

As shown in Table 7, function transfer products No. 11 to No. 14 were obtained in which the surface roughness (Ra) and the ratio (Ra/lor) was mutually different.

A sapphire substrate (C-surface, off angle 0.2 degree, one-surface mirror surface finish, 2-inch Φ) was subjected to surface treatment as in Example 1. Next, the function transfer product was bonded to the sapphire substrate. At this point, bonding was performed after checking that the surface temperature of the sapphire substrate was heated to 100° C. to 110° C. Next, the sapphire substrate was naturally cooled to 23° C.

The carrier G2 was peeled and removed from the sapphire substrate returned to room temperature. After removing, transfer properties were judged on the functional layer transferred onto the sapphire substrate, using the optical microscope provided in the AFM.

These results are summarized in Table 8. In addition, the tests are described in "Transfer" in Table 8.

Evaluations described in Table 8 conformed to the following guidelines. In addition, the following evaluation guidelines include air voids generated by foreign substances in a bonding atmosphere.

⊚+ . . . Case where the number of air voids with the diameter ranging from 10 μm to 500 μm was 2 or less.

⊚ . . . Case where the number of air voids with the diameter ranging from 10 μm to 500 μm ranged from 3 to 5.

○ . . . Case where the number of air voids with the diameter ranging from 10 μm to 500 μm ranged from 6 to 10.

Δ . . . Case where the number of air voids with the diameter ranging from 10 μm to 500 μm ranged from 11 to 20.

x . . . Case where the number of air voids with the diameter ranging from 10 μm to 500 μm was 21 or more.

TABLE 7

|    | Ra (nm) | Ra/lor |
|----|---------|--------|
| 11 | 8       | 0.06   |
| 12 | 33      | 0.24   |
| 13 | 45      | 0.32   |
| 14 | 120     | 0.86   |

TABLE 8

|    | TRANSFER | SUBSTRATE PROCESSING | DISTRIBUTION | TOTAL |
|----|----------|----------------------|--------------|-------|
| 11 | ⊚+       | ○                    | ⊚+           | ⊚+    |
| 12 | ⊚+       | ○                    | ⊚            | ⊚     |
| 13 | ○        | ○                    | ○            | ○     |
| 14 | Δ        | ○                    | Δ            | Δ     |

From Tables 7 and 8, it is understood that as the ratio (Ra/lor) was smaller, the air voids i.e. the air layer formed in the interface between the functional layer and the target object was decreased, and that transfer properties were made excellent. The reason is conceivable that as the ratio (Ra/lor) is decreased, fluidity of the surface layer of the functional layer is increased, and that the contact area of the interface between the functional layer and the target object is increased in bonding the function transfer product to the target object. Particularly, it is conceivable that when the ratio (Ra/lor) is 0.4 or less, it is possible to effectively suppress generation of air voids in bonding. In addition, the effect of the ratio (Ra/lor) was discussed more specifically in following Example 6.

Next, nano-processing of the sapphire substrate was performed. Etching was performed from the functional layer surface side using an oxygen gas as in Example 1, and the sapphire substrate surface was partially exposed. Subsequently, reactive ion etching using $BCl_3$ gas and $Cl_2$ gas was performed to perform nano-processing on the sapphire substrate. Etching was performed with ICP: 200 W, BIAS: 100 W and pressure of 0.2 Pa. In addition, the etching rate ratio was obtained on the flat film, and etching rate of the sapphire/etching rate of the functional layer was substantially 6. A reactive ion etching apparatus (RIE-101iPH, made by SAMCO Inc.) was used.

Finally, cleaning was performed using a solution obtained by mixing sulfuric acid and hydrogen peroxide solution in a weight ratio of 2:1 to obtain the sapphire substrate provided with the nanostructure on its surface.

It was observed that a plurality of almost cone-shaped convex portions was mutually spaced and arranged on the sapphire substrate. Further, it was also confirmed that the flat surface was prepared on the concave-portion bottom surface. Furthermore, it was confirmed that the contour shape was not a perfect circle, and was slightly distorted. Still furthermore, the slope angle of the convex-portion side surface of the almost cone-shaped convex portion changed in two stages.

From SEM observation on the dry-etched sapphire substrate in the portion in which the functional layer was transferred onto the sapphire substrate using the film for nano-processing, it was confirmed that the nanostructure was formed on the sapphire substrate irrespective of the types of function transfer products as described in Table 7. The results are described in Table 8. In addition, in Table 8, "Substrate processing" corresponds to the observation results.

From the foregoing, it is understood that by using the function transfer product, it is possible to excellently process the sapphire in the portion to which the functional layer is capable being transferred.

(5) Preparation of a Semiconductor Light Emitting Device

By MOCVD, on the obtained sapphire substrate were layered successively (1) AlGaN low-temperature buffer layer, (2) n-type GaN layer, (3) n-type AlGaN clad layer, (4) InGaN light emitting layer (MQW), (5) p-type AlGaN clad layer, (6) p-type GaN layer and (7) ITO layer. The film formation conditions were made so that the asperities on the sapphire substrate were embedded and flattened in layering the (2) n-type GaN layer. Finally, the resultant was made a chip, and output performance on the chip was evaluated.

Evaluations were made from a diagram in which the horizontal axis represents performance of the LED chip, and the vertical axis represents the number of LED chips. These results are described in Table 8. In addition, the test results are described in "Distribution" in Table 8.

Using the LED chip distribution in the case of using a sapphire substrate without having the structure i.e. flat substrate as a reference, Δ represents the case where the distribution was shifted to the right by 2% to 4% from the reference distribution, ○ represents the case where the distribution was shifted to the right by 5% to 7%, ⊚ represents the case where the distribution was shifted to the right by 8% to 9%, and ⊚+ represents the case where the distribution was shifted to the right by 10% or more. Further, X represents the case where the shift of the distribution was less than 2%.

From the foregoing, it is understood that by using the function transfer products described in No. 11 to No. 14 of Table 7, it is possible to improve the performance distribution of the LED, and that the effect is increased particularly as the ratio (Ra/lor) is decreased. The reason is conceivable as described below.

By using the function transfer product, it is possible to form a nano-pattern on a part or the whole of the surface of the sapphire substrate. In the case where the nano-pattern is formed on the sapphire substrate, it is possible to disturb a growth mode of chemical deposition in growth of the semiconductor crystal layer. In other words, it is possible to decrease dislocations existing inside the semiconductor layer of the LED, and it is thereby possible to improve internal quantum efficiency. Therefore, it is conceivable that the number of high-efficient LED chips increased according to the transfer accuracy.

Example 6

In Example 6, the effect of the ratio (Ra/lor) on transfer properties was examined in detail, where the ratio (Ra/lor) is the ratio between the surface roughness (Ra) on the exposed surface side of the functional layer of the function transfer product and the distance (lor) between the top position of a convex-portion of the nanostructure of the carrier of the function transfer product and the exposed surface of the functional layer. Further, it was examined whether or not the layer configuration of the functional layer of the function transfer product i.e. arrangement of the functional layer with respect to the nanostructure of the carrier affected the effect of the ratio (Ra/lor).

As the function transfer product, the following five types of function transfer products A1 to A5 were prepared, and for each of the function transfer products, the distance (lor)

and surface roughness (Ra) on the exposed surface side of the functional layer were set as parameters, and the ratio (Ra/lor) was adjusted.

The carrier G2 of the function transfer product was prepared by preparing a cylindrical master mold, and transferring a concavo-convex structure of the cylindrical master mold to a film by a continuous light transfer method.

The preparation method of the cylindrical master mold was the same as in Example 1, the average pitch and arrangement of the nanostructure were controlled by exposure pulses of the semiconductor laser, and the shape of the nanostructure was controlled by the time of dry etching.

The manufacturing methods of the carriers G1 and G2 were the same as in Example 1, and the material 1 of Example 1 was changed to a material obtained by mixing fluorine-containing urethane (meth)acrylate (OPTOOL Mcc . . . Opening width of a concave-portion of the nanostructure of the carrier G2, the dimension is a nanometer.

Sh/Scm . . . Aperture ratio of the nanostructure of the carrier G2, dimensionless value.

Mcv/Mcc . . . Ratio of the above-mentioned Mcv to Mcc, dimensionless value.

ΘH2O . . . Contact angle of a water droplet with respect to the nanostructure surface side of the carrier G2, the dimension is a degree.

Θpgme . . . Contact angle of propylene glycol monomethyl ether with respect to the nanostructure surface side of the carrier G2, the dimension is a degree. In addition, propylene glycol monomethyl ether was one of solvents used in coating the nanostructure surface of the carrier G2 with the functional layer.

TABLE 9

| FUNCTION TRANSFER PRODUCT | STATE | CARRIER G2 | | | | | | | |
|---|---|---|---|---|---|---|---|---|---|
| | | AVERAGE PITCH (nm) | AVERAGE OPENING DIAMETER (nm) | Mcv (nm) | Mcc (nm) | Sh/Scm | Mcv/Mcc | ΘH2O | Θpgme |
| A1 | FIG. 13E | 700 | 600 | 100 | 600 | 0.67 | 0.17 | 126 | 83 |
| A2 | FIG. 13F | 700 | 650 | 50 | 650 | 0.78 | 0.08 | 135 | 92 |
| A3 | FIG. 13G | 700 | 300 | 400 | 300 | 0.17 | 1.33 | 129 | 91 |
| A4 | FIG. 13H | 700 | 600 | 100 | 600 | 0.67 | 0.17 | 119 | 75 |
| A5 | FIG. 13I | 700 | 630 | 70 | 630 | 0.73 | 0.11 | 87 | 41 |

DAC HP (made by Daikin Industries, Ltd.)): trimethylolpropane (EO-modified) triacrylate (M350 (made by TOAGOSEI Co., Ltd.)): 1-hydroxy-cyclohexyl-phenyl-ketone (Irgacure 184 (made by BASF Company)): 2-benzyl-2-dimethylamino-1-(4-morpholino phenyl)-butanone-1 (Irgacure 369 (made by BASF Company))=1.5 g-2.0 g: 100 g: 5.5 g: 2.0 g. The carriers G1 and G2 were prepared using the same composition. Herein, by adjusting an amount of the fluorine-containing urethane (meth)acrylate, surface free energy of the carrier G2 was adjusted. More specifically, adjusted were the contact angle with respect to water of the carrier G2 and the contact angle with respect to propylene glycol monomethyl ether that was one of solvents used in applying the functional layer. Further, the film thickness of the above-mentioned materials was set at 3 μm in preparing the carriers G1 and G2.

Preparation of Function Transfer Products A1 to A5

By forming a film of at least one functional layer or more on the nanostructure surface of the prepared carrier G2, the function transfer products A1 to A5 were prepared. Table 9 describes the relationship between the carrier G2 and the functional layer and physical properties of the carriers G2 in the prepared function transfer products A1 to A5. In addition, terms in Table 9 represent the following meanings. In addition, the ratios (Es/Eb) of the carriers G2 were 73.5, 49, 47, 147 and 735 in the order of the function transfer products A1 to A5.

Function transfer product . . . One of the function transfer products A1 to A5.

State . . . Correspondence with the cross-sectional schematic diagram illustrated in FIG. 13.

Average pitch . . . Average pitch of the nanostructure of the carrier G2, the dimension is a nanometer.

Average opening diameter . . . Average opening diameter of the nanostructure of the carrier G2, the dimension is a nanometer.

Mcv . . . Top width of a convex-portion of the nanostructure of the carrier G2, the dimension is a nanometer.

(Function Transfer Product A1)

The function transfer product A1 was the case where a single-layer functional layer was provided to flatten the nanostructure of the carrier G2. The following composition A-1 was applied onto the nanostructure surface of the carrier G2. In addition, as the coating method, a bar coat method was adopted. In coating by the bar coat method, the composition A-1 was diluted with a mixed solvent of propylene glycol monomethyl ether, acetone and 2-propanol. The dilute concentration was varied between 5.2 weight % to 20 weight %, and coating was performed at a velocity of 50 mm/sec. In other words, the distance (lor) that corresponded to the film thickness of the functional layer was controlled by the dilute concentration. After coating, the resultant was allowed to stand in a drying oven of 105° C. for 15 minutes. The functional layer after removing from the drying oven was in a non-liquid state, and did not exhibit tackiness. In other words, it was confirmed that the layer was in a non-liquid state at a temperature of 20° C. under light shielding. Further, when the temperature was raised gradually, it was confirmed that tackiness developed from around 60° C. Next, a protective layer was bonded to the surface of the functional layer using a laminator. Used as the protective layer was a PET film subjected to surface mold release treatment, a COP film or the carrier G1. Further, as the carrier G1, used was the carrier in which the average pitch of the nanostructure of the carrier G1 was 200 nm, 300 nm, 460 nm, 700 nm, 900 nm or 1200 nm. In other words, the surface roughness (Ra) of the functional layer surface was controlled by transferring physical properties of the protective layer surface to the functional layer.

Composition A-1

Composition obtained by mixing a binder resin containing the following cyclic portion (A) and a monomer containing the following cyclic portion (B).

Binder resin: Cresol novolac-based epoxy acrylate with acrylate modification rate of approximately 100%. Homooligomer with the following cyclic portion (A) as a repeating unit, including the number of repeating units ranging from 0 to 6. The average molecular weight was about 1200. In addition, repetition is obtained by repeating with "*" bound to the carbon element of $CH_2$ and "*" bound to the six-membered ring.

Monomer: Monomer having the following cyclic portion (B) containing the fluorene skeleton. The molecular weight was 546, and the monomer was a two-functional photopolymerizable monomer. The photocurable group was an acryloyl group.

The mixing ratio of the binder resin and the monomer was 4.8:5.2 in parts by weight. In addition, as a photopolymerization initiator, 2-(dimethylamino)-2-[(4-methylphenyl)methyl]-1-[4-(4-morpholinyl)phenyl]-1-butanone (Irgacure 379EG, made by BASF Company) that is an α-amino alkyl phenon system was selected, and added so that the amount was 3.49 weight % relative to the total amount of the binder resin and the monomer.

[Chemistry 8]

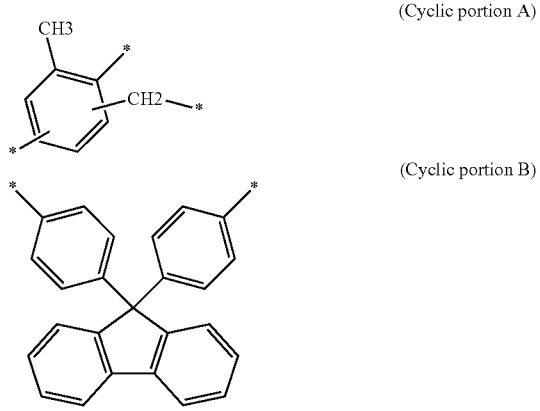

(Cyclic portion A)

(Cyclic portion B)

(Function Transfer Product A2)

The function transfer product A2 was the case where the first functional layer was provided inside the concave portions of the nanostructure of the carrier G2, and the second functional layer was provided to flatten the first functional layer and the nanostructure of the carrier. First, the following composition A-2 was applied onto the nanostructure surface of the carrier G2. In addition, as the coating method, the bar coat method was adopted. In coating by the bar coat method, the composition A-2 was diluted with a mixed solvent of propylene glycol monomethyl ether and acetone. The dilute concentration was 7.1 weight %, and coating was performed at a velocity of 10 mm/sec. After coating, the resultant was allowed to stand in the drying oven of 105° C. for 10 minutes. The arrangement of the first functional layer with respect to the carrier G2 was confirmed with the SEM and TEM. The first functional layer was filled and arranged inside the concave portions of the nanostructure of the carrier G2. The filling amount was 450 nm as the thickness of the first functional layer. In addition, the depth of the nanostructure of the carrier G2 was 600 nm. Further, the first functional layer was not arranged on the convex-portion vertex portions of the nanostructure of the carrier G2.

Next, a film of the second functional layer was formed to flatten the first functional layer and the nanostructure of the carrier G2. As the second functional layer, the above-mentioned composition A-1 was adopted, and was applied by the same method as in the function transfer product A1.

In addition, the coating velocity of the bar coat method was 25 mm/sec. The distance (lor) that corresponded to the film thickness of the second functional layer was controlled by the dilute concentration as in the function transfer product A1. Further, as in the function transfer product A1, the second functional layer after removing from the drying oven was in a non-liquid state, and the surface did not exhibit tackiness. In other words, it was confirmed that the layer was in a non-liquid state at a temperature of 20° C. under light shielding. Further, when the temperature was raised gradually, it was confirmed that tackiness developed from around 60° C. As in the function transfer product A1, the protective layer was bonded to the surface of the second functional layer using the laminator, and the surface roughness (Ra) of the second functional layer surface was controlled.

Composition A-2

Material obtained by mixing titanium tetrabutoxide, tetramer (made by Wako Pure Chemical Industries, Ltd.): titanium tetrabutoxide, monomer (made by Wako Pure Chemical Industries, Ltd.): 3-acryloxypropyl trimethoxysilane (made by Shin-Etsu silicone corporation): phenyl-modified silicone (made by Dow Corning Toray Co., Ltd.): photopolymerization initiator=35.86 g: 29.34 g: 34.8 g: 5.0 g: 2.6 g. In addition, as the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and mixed in a ratio of Irgacure 184:Irgacure 369=2.75:1.

(Function Transfer Product A3)

The function transfer product A3 was the case where the first functional layer was provided on the convex-portion vertex portions of the nanostructure of the carrier G2, and the second functional layer was provided to flatten the first functional layer and the nanostructure of the carrier. First, as the first functional layer, the above-mentioned composition A-2 was selected. The above-mentioned composition A-2 was diluted with propylene glycol monomethyl ether to 25 weight %, and was applied onto a polyethylene terephthalate film by the bar coat method. After coating, the resultant was allowed to stand in an environment of 24° C. for 2 minutes.

Next, the nanostructure surface of the carrier G2 was bonded to the composition A-2 film on the polyethylene terephthalate film, and subsequently, the carrier G2 was peeled off. Herein, the temperature in bonding was set at 60° C. The arrangement of the first functional layer with respect to the carrier G2 was checked with the SEM and TEM. The first functional layer was arranged on the convex-portion vertex portions of the nanostructure of the carrier G2. The thickness of the first functional layer was 220 nm. In addition, the depth of the nanostructure of the carrier G2 was 280 nm. Further, the first functional layer was not arranged in the concave bottom portions of the nanostructure of the carrier G2. Next, a film of the second functional layer was formed to flatten the first functional layer and the nanostructure of the carrier G2. As the second functional layer, the above-mentioned composition A-1 was adopted, and was applied by the same method as in the function transfer product A1. In addition, the coating velocity of the bar coat method was set at 10 mm/sec. The distance (lor) that corresponded to the film thickness of the second functional layer was controlled by the dilute concentration as in the function transfer product A1. Further, as in the function transfer product A1, the surface of the second functional layer after removing from the drying oven did not exhibit tackiness. In other words, it was confirmed that the layer was in a non-liquid state at a temperature of 20° C. under light shielding. Further, when the temperature was raised gradually, it was confirmed that tackiness developed from around 60° C. Furthermore, as in the function transfer product A1, the protective layer was bonded to the surface of the second functional layer with the laminator, and the surface roughness (Ra) of the second functional layer was controlled.

(Function Transfer Product A4)

The function transfer product A4 was the case where first functional layers were provided in concave-portion inner portions and on convex-portion vertex portions of the nanostructure of the carrier G2 to be mutually separate, and the second functional layer was provided to flatten the first functional layers and the nanostructure of the carrier. First, the above-mentioned composition A-2 was applied onto the nanostructure surface of the carrier G2 as in the function transfer product A2. After coating, the resultant was allowed to stand in the drying oven of 105° C. for 10 minutes. The arrangement of the first functional layers with respect to the carrier G2 was checked with the SEM and TEM. The first functional layer was filled and arranged in the concave-portion inner portions of the nanostructure of the carrier G2, while being arranged on the convex-portion vertex portions. Further, the first functional layer in the concave-portion inner portions and the first functional layer on the convex-portion vertex portions were mutually separate. The filling amount with respect to the concave-portion inner portion was 470 nm as the thickness of the first functional layer. The thickness of the first functional layer arranged on the convex-port ion vertex portion was about 30 nm. Further, the first functional layer arranged on the convex-portion vertex portion was arranged on the convex-portion vertex portion while forming a plurality of nanoparticles, without forming a uniform film on the convex-portion vertex portion of the nanostructure of the carrier G2. In addition, the depth of the nanostructure of the carrier G2 was 560 nm.

Next, a film of the second functional layer was formed to flatten the first functional layers and the nanostructure of the carrier G2. As the second functional layer, the above-mentioned composition A-1 was adopted, and was applied by the same method as in the function transfer product A1. In addition, the coating velocity of the bar coat method was set at 25 mm/sec. The distance (lor) that corresponded to the film thickness of the second functional layer was controlled by the dilute concentration as in the function transfer product A1. Further, as in the function transfer product A1, the surface of the second functional layer after removing from the drying oven did not exhibit tackiness. In other words, it was confirmed that the layer was in a non-liquid state at a temperature of 20° C. under light shielding. Further, when the temperature was raised gradually, it was confirmed that tackiness developed from around 60° C. Furthermore, as in the function transfer product A1, the protective layer was bonded to the surface of the second functional layer with the laminator, and the surface roughness (Ra) of the second functional layer was controlled.

(Function Transfer Product A5)

The function transfer product A5 was the case where the first functional layer was provided to cover the surface of the nanostructure of the carrier G2, and the second functional layer was provided to flatten the first functional layer. First, the above-mentioned composition A-2 was applied onto the nanostructure surface of the carrier G2 as in the function transfer product A2. After coating, the resultant was allowed to stand in the drying oven of 105° C. for 1.0 minutes. The arrangement of the first functional layer with respect to the carrier G2 was checked with the SEM and TEM. The first functional layer was arranged to cover the nanostructure of the carrier G2. Further, film formation was made so that the film thickness of the first functional layer around the concave portion of the carrier G2 was thicker than the film thickness of the first functional layer in the vicinity of the convex portion of the nanostructure of the carrier G2. More specifically, using the concave bottom portion of the nanostructure of the carrier G2 as a reference, the film thickness of the first functional layer was 380 nm. Using the convex-portion vertex portion of the nanostructure of the carrier G2 as a reference, the film thickness of the first functional layer was 90 nm. In addition, the depth of the nanostructure of the carrier G2 was 590 nm.

Next, a film of the second functional layer was formed to flatten the first functional layer and the nanostructure of the carrier G2. As the second functional layer, the above-mentioned composition A-1 was adopted, and was applied by the same method as in the function transfer product A1. In addition, the coating velocity of the bar coat method was 25 mm/sec. The distance (lor) that corresponded to the film thickness of the second functional layer was controlled by the dilute concentration as in the function transfer product A1. Further, as in the function transfer product A1, the surface of the second functional layer after removing from the drying oven did not exhibit tackiness. In other words, it was confirmed that the layer was in a non-liquid state at a temperature of 20° C. under light shielding. Further, when the temperature was raised gradually, it was confirmed that tackiness developed from around 60° C. Furthermore, as in the function transfer product A1, the protective layer was bonded to the surface of the second functional layer using the laminator, and the surface roughness (Ra) of the second functional layer surface was controlled.

Evaluations of Function Transfer Products

The transfer accuracy of the functional layers of the function transfer products A1 to A5 was evaluated. As the target object, used was a C-surface sapphire (off angle 0.2°) of 4 inches. First, the processing target surface of the target object was subjected to UV-$O_3$ treatment, and next to an air blow under static elimination to remove particles. The cleaned target object was put on a hot plate of 85° C., and in this state, each of the function transfer products A1 to A5 was laminated. UV light was applied to the target object with the function transfer product bonded from the function transfer product side using a high-pressure mercury-vapor light source. The integral light amount of the UV light was adjusted to be 990 mJ/cm$^2$. Next, the target object with the function transfer product bonded was put on a hot plate of 120° C. for 30 seconds, and subsequently, an air blow was performed to cool. After cooling, the carrier G2 was removed.

First, a preliminary test on peeling properties was performed. As the preliminary test, ultraviolet rays were applied to the function transfer products A1 to A5 in a nitrogen substitute environment to cure the functional layers. For the ultraviolet rays, a UV-LED light source with illuminance of 87 mW/cm$^2$ and a wavelength of 365 nm was used, and the integral light amount was set at 1800 mJ/cm$^2$. Next, a pressure-sensitive tape was bonded to the surface of the functional layer. Finally, the pressure-sensitive tape was peeled and removed, and it was checked whether the functional layer and the carrier G2 separated. As the results, in all of the function transfer products A1 to A5, it was confirmed that the functional layer was capable of being separated from the carrier G2.

First, the adhesion between the functional layer and the target object was evaluated. In order to excellently transfer the functional layer to the target object, it is important to increase a real contact area between the functional layer and the target object, and thereby increase the adhesion strength. The peeling strength was measured in peeling the carrier G2 from the cooled function transfer product/target object at a velocity of 10 mm/sec. Herein, from the preliminary study, it is confirmed that the functional layer and the carrier G2 were easily separable from each other. In other words, a control factor of the measured peeling strength is the interface adhesion force between the functional layer and the target object. Further, the uppermost layers of the functional layers of the function transfer products A1 to A5 were the same. In other words, when a difference occurred in the peeling strength, it is conceivable that the real contact area changed.

Figure 23:
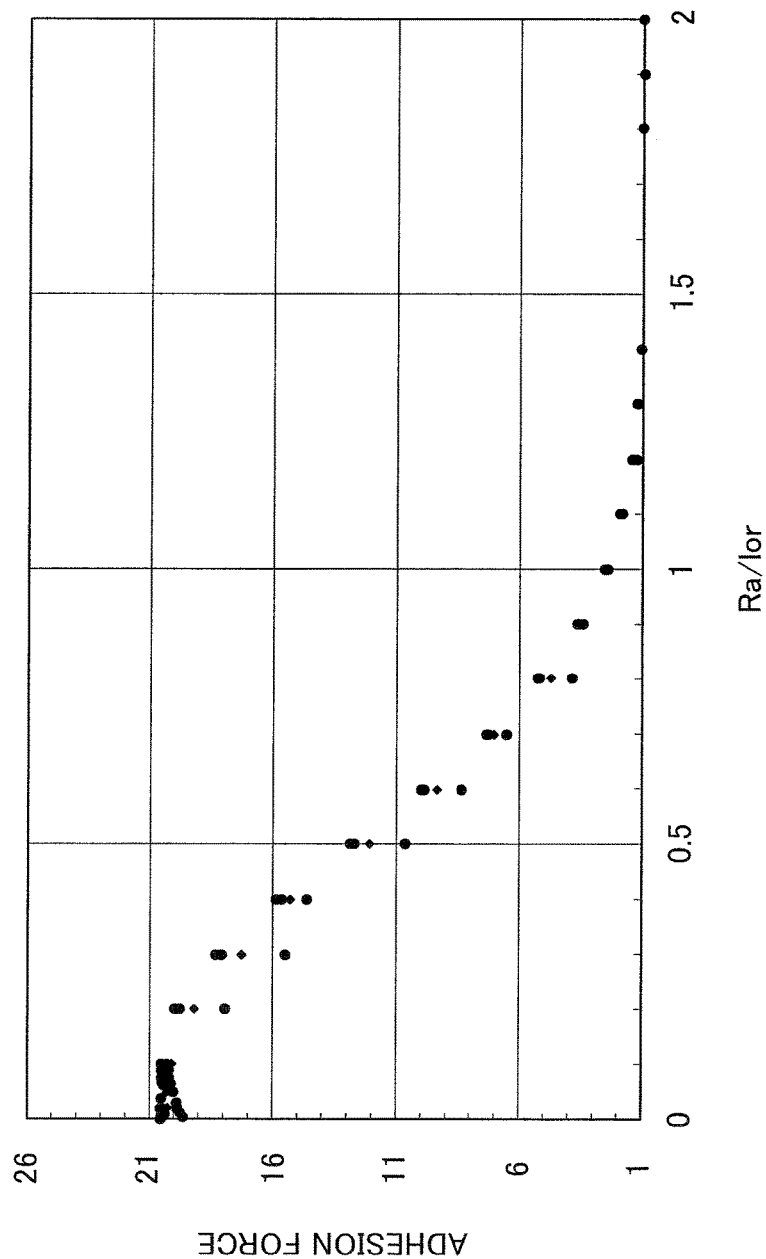
FIG. 23 is a graph showing the relationship between a ratio (Ra/lor) and adhesion force of the function transfer product of Example 6.

For each of the function transfer products A1 to A5, the peeling strength was measured, and it was confirmed that as the ratio (Ra/lor) was larger, the peeling strength was smaller. From this respect, normalization was performed assuming the time the ratio (Ra/lor) was 2.00 as 1, and the graph was prepared. FIG. 23 shows the prepared graph. FIG. 23 is the graph showing the relationship between the ratio (Ra/lor) and adhesion force of the function transfer product of Example 6. The horizontal axis of FIG. 23 represents the ratio (Ra/lor), and the vertical axis represents the peeling strength in normalizing the case where the ratio (Ra/lor) was 2.00 as 1 i.e. the adhesion force between the target object and the functional layer. Further, FIG. 23 draws data in the case of using the function transfer products A1 to A5 to coexist.

From FIG. 23, the following matters are understood. First, irrespective of the function transfer products A1 to A5, the adhesion force between the functional layer and the target object i.e. the peeling strength was increased, as the ratio (Ra/lor) was decreased. In other words, it is understood that the relationship between the ratio (Ra/lor) and the peeling strength is controlled by the uppermost layer of the functional layer forming the function transfer product. Next, the peeling strength rises from a point at which the ratio (Ra/lor) is 1.2 as a critical point. The reason is presumed that fluidity of the uppermost layer of the functional layer in bonding the function transfer product to the target object was improved with the point at which the ratio (Ra/lor) is 1.2 as a boundary, and that the real contact area between the functional layer and the target object increases. Further, in the case where the ratio (Ra/lor) exceeded 1.2, there was a portion in which the cohesive destruction of the functional layer was observed in the functional layer transferred to the target object. The reason is conceivable that resistance of the functional layer to peeling stress degraded or uniformity of peeling stress degraded in removing the carrier G2, and that a concentration point of peeling stress occurred. From the foregoing, it was understood that when the ratio (Ra/lor) is 1.2 or less, the adhesion strength between the functional layer of the function transfer product and the target object is improved, and that it is possible to suppress the cohesive destruction of the functional layer in peeling off the carrier G2.

The transfer properties were more specifically evaluated next. First, the peeling velocity in peeling the carrier G2 from function transfer product/target object was made a parameter. Herein, in the target object after peeling off the carrier G2, a peeling velocity Vm was recorded when the transfer rate of the functional layer was decreased to 10% or less. In other words, since as the peeling velocity Vm is increased, it is possible to improve the velocity in transferring the functional layer to the target object using the function transfer product, and convenience of the function transfer product is thereby improved. Further, 10 measurement points were selected arbitrary from the area with the functional layer added, AFM observation was performed on the selected portions, and it was judged whether the nanostructure of the carrier G2 was transferred. More specifically, 100 convex portions were observed for one some measurement point. In other words, total 1000 convex portions were observed, and defects included in the 1000 convex portions were measured. From these measurements, evaluation indicators were prepared. In addition, the peeling velocity Vm was normalized using the case where the ratio (Ra/lor)=1.2 as 1 from the above-mentioned study, and was described as a peeling velocity Vm ratio.

Evaluation Indicators

⊚+ . . . The peeling velocity Vm ratio was 4.5 or more, and the defect rate was 0.5% or less.

⊚ . . . The peeling velocity Vm ratio was 4.5 or more, and the defect rate exceeded 0.5% and was 1% or less.

○+ . . . The peeling velocity Vm ratio was 4.3 or more and less than 4.5, and the defect rate was 1% or less.

○ . . . The peeling velocity Vm ratio was 3.8 or more and less than 4.3, and the defect rate was 1.5% or less.

Δ+ . . . The peeling velocity Vm ratio was 2.2 or more and less than 4.3, and the defect rate was 2.5% or less.

Δ . . . The peeling velocity Vm ratio was 1.0 or more and less than 2.2, and the defect rate was 5% or less.

x . . . The case where the ratio (Ra/lor) exceeded 1.2.

Table 10 describes the results of the function transfer product A1, Table 11 describes the results of the function transfer product A2, Table 12 describes the results of the function transfer product A3, Table 13 describes the results of the function transfer product A4, and Table 14 describes the results of the function transfer product A5. In each of Tables 10 to 14, the vertical axis shows the surface roughness (Ra) on the functional layer surface side measured with the AFM, and the horizontal axis shows the distance (lor) measured from SEM observation. Further, Tables 10 to 14 show concurrently the ratio (Ra/lor) and the above-mentioned evaluation result via "/". In addition, "-" means that evaluations were not made.

TABLE 10

| FUNCTION TRANSFER | lor(nm) | | | |
|---|---|---|---|---|
| PRODUCT A1 | 30 | 100 | 300 | 500 |
| Ra(nm) 3 | 0.100/⊚+ | 0.030/⊚+ | 0.010/⊚+ | 0.006/⊚+ |
| 7 | 0.233/⊚ | 0.070/⊚+ | 0.023/⊚+ | 0.014/⊚+ |
| 25 | 0.833/Δ | 0.250/⊚ | 0.083/⊚+ | 0.050/⊚+ |
| 52 | 1.733/X | 0.520/Δ+ | 0.173/⊚ | 0.104/⊚ |
| 89 | 2.967/X | 0.890/Δ | 0.297/○+ | 0.178/⊚ |
| 145 | — | 1.450/X | 0.483/Δ+ | 0.290/○+ |
| 232 | — | — | 0.773/Δ | 0.464/Δ+ |

TABLE 11

| FUNCTION TRANSFER | lor(nm) | | | |
|---|---|---|---|---|
| PRODUCT A2 | 20 | 80 | 350 | 650 |
| Ra(nm) 5 | 0.400/○ | 0.100/⊚+ | 0.023/⊚+ | 0.012/⊚+ |
| 21 | 1.050/Δ | 0.263/○+ | 0.060/⊚+ | 0.032/⊚+ |
| 50 | 2.500/X | 0.625/Δ+ | 0.143/⊚ | 0.077/⊚+ |
| 79 | — | 0.988/Δ | 0.226/⊚ | 0.122/⊚ |
| 134 | — | 1.675/X | 0.383/○ | 0.206/⊚ |

TABLE 12

| FUNCTION TRANSFER | | lor(nm) | | |
|---|---|---|---|---|
| PRODUCT A3 | 250 | 500 | 700 | 950 |
| Ra(nm) 6 | 0.024/⊚+ | 0.012/⊚+ | 0.009/⊚+ | 0.006/⊚+ |
| 32 | 0.128/⊚ | 0.064/⊚+ | 0.046/⊚+ | 0.034/⊚+ |
| 88 | 0.352/○ | 0.176/⊚ | 0.126/⊚ | 0.093/⊚+ |
| 160 | 0.640/Δ+ | 0.320/○ | 0.229/⊚ | 0.168/⊚ |

TABLE 13

| FUNCTION TRANSFER | | lor(nm) | | |
|---|---|---|---|---|
| PRODUCT A4 | 60 | 120 | 480 | 990 |
| Ra(nm) 3 | 0.050/⊚+ | 0.025/⊚+ | 0.006/⊚+ | 0.003/⊚+ |
| 12 | 0.200/⊚ | 0.100/⊚+ | 0.025/⊚+ | 0.012/⊚+ |
| 19 | 0.317/○ | 0.158/⊚ | 0.040/⊚+ | 0.019/⊚+ |
| 44 | 0.733/Δ+ | 0.367/○ | 0.092/⊚+ | 0.044/⊚+ |
| 69 | 1.150/Δ | 0.575/Δ+ | 0.144/⊚ | 0.070/⊚+ |
| 89 | 1.483/X | 0.742/Δ+ | 0.185/⊚ | 0.090/⊚+ |
| 116 | — | 0.967/Δ | 0.242/⊚ | 0.117/⊚ |

TABLE 14

| FUNCTION TRANSFER | | lor(nm) | | |
|---|---|---|---|---|
| PRODUCT A5 | 150 | 450 | 900 | |
| Ra(nm) 2 | 0.013/⊚+ | 0.004/⊚+ | 0.002/⊚+ | |
| 15 | 0.100/⊚+ | 0.033/⊚+ | 0.017/⊚+ | |
| 26 | 0.173/⊚ | 0.058/⊚+ | 0.029/⊚+ | |
| 38 | 0.253/⊚ | 0.084/⊚+ | 0.042/⊚+ | |
| 61 | 0.407/○ | 0.136/⊚ | 0.068/⊚+ | |
| 98 | 0.653/Δ+ | 0.218/⊚ | 0.109/⊚ | |

From the results of Tables 10 to 14, the following matters are understood. First, it is understood that it is possible to screen the evaluation results by the ratio (Ra/lor) irrespective of the types of the function transfer products A1 to A5. In other words, it is possible to control the transfer properties by the ratio (Ra/lor) that is a physical property value of the functional layer forming the function transfer product, irrespective of the number of functional layers and the arrangement of the functional layer in the function transfer product. More specifically, when the ratio (Ra/lor) was 0.773 or more, the improvement rate of the peeling velocity Vm was low, and the defect rate due to transfer was large. This is because the case of a large ratio (Ra/lor) promoted the cohesive destruction of the functional layer due to peeling stress concentration increased by improving the peeling velocity of the carrier G2, particularly, the cohesive failure in the vicinity of the concave-portion opening portion of the nanostructure of the carrier G2. Next, when the ratio (Ra/lor) was 0.742 or less, the peeling velocity Vm was significantly improved, and the defect rate in transfer was decreased. This is because decreases in the ratio (Ra/lor) mean that the roughness Ra on the functional layer surface side is decreased in terms of the distance (lor) that corresponds to the film thickness of the functional layer. In other words, by the ratio (Ra/lor) decreasing, in other words, by the roughness (Ra) decreasing or the distance (lor) increasing, since fluidity of the surface layer of the functional layer of the function transfer product is improved, the transfer velocity is increased. Further, by improvement in the fluidity, as described already, since the real contact area between the functional layer and the target object is increased and in association therewith the adhesion strength is increased, it is possible to reduce unevenness of stress applied to the functional layer applied from the target object side in peeling off the carrier G2, and it is conceivable that the transfer accuracy was thereby improved. From this viewpoint, it is understood that the ratio (Ra/lor) is preferably 0.75 or less. Further, by the ratio (Ra/lor) being 0.407 or less, it is understood that the transfer velocity was further increased, and that the transfer accuracy was improved. The reason is conceivable that the fluidity of the functional layer surface layer was increased in bonding the function transfer product to the target object, and that the effect of absorbing unevenness of the interface between the functional layer and the target object was increased. More specifically, by the fluidity of the functional layer surface layer improving, even in bonding at a high velocity, the real contact area between the functional layer and the target object is increased. By this means, the adhesion force between the functional layer and the target object is increased. By this means, it is possible to decrease unevenness of stress applied from the target object side to the functional layer applied in removing the carrier G2, it is possible to suppress the cohesive destruction of the functional layer in the vicinity of the concave-portion opening portion of the carrier G2, and the transfer accuracy is improved. From this viewpoint, it is understood that the ratio (Ra/lor) is preferably about 0.55 or less. Further, by the ratio (Ra/lor) being 0.297 or less, the peeling velocity Vm ratio was 4.3 or more and less than 4.5, and was about to be saturated. Furthermore, the defect rate was 1% or less and was extremely small. As the reason, it is conceivable that the ratio enters the range that the principles as described already tend to develop. Still furthermore, also in the case of increasing the size of the target object to 6-inch Φ and in the case of offsetting the target object of 4-inch Φ, approximately the same effects were obtained. The reason is conceivable that the effect of absorbing unevenness of the interface between the functional layer and the target object was more increased due to the flow of the functional layer surface layer. From this viewpoint, the ratio (Ra/lor) is more preferably 0.30 or less. Particularly, by the ratio (Ra/lor) being 0.253 or less, it is understood that the defect rate was particularly decreased further. This is presumed that since the real contact area and the adhesion force between the target object and the functional layer were almost saturated, unevenness of stress with respect to the functional layer was decreased in peeling off the carrier G2. Further, it was understood that by the ratio (Ra/lor) being 0.100 or less, even when the peeling rate Vm was high, it was possible to decrease the defect rate to 0.5% or less. From the foregoing, it was understood that the ratio (Ra/lor) is more preferably 0.25 or less, and most preferably 0.10 or less.

On the other hand, the lowest value of the surface roughness (Ra) on the functional layer side was separately examined. In preparation of the function transfer products A1 to A5 as described above, using a silicon wafer subjected to single-layer surface treatment with a fluorine-based silane coupling agent as a substitute for the protective layer, the wafer is bonded to the functional layer in a vacuum. At this point, bonding was performed in a state heated to 40° C. Further, the wafer was cooled to 24° C. and removed. Thus, samples with the surface roughness (Ra) extremely decreased were prepared. Herein, it was possible to decrease the surface roughness (Ra) to about 1 nm. In other words, as the ratio (Ra/lor), 0.001 was studied as the minimum value. Also in the case of using such a function transfer product with extremely small surface roughness (Ra) and ratio (Ra/lor), the tendency of the defect rate and peeling velocity Vm as described above was confirmed. However, it is understood that mass productivity and controllability of the function transfer product deteriorates. Accordingly, from the viewpoint of industrial properties, it was understood that the minimum value of the ratio (Ra/lor) is preferably 0.002 or more.

Further, the absolute value of the surface roughness (Ra) on the functional layer side was controlled by surface roughness of the protective layer in Example 6. Particularly, in Example 6, it was possible to control Ra up to 232 nm at the maximum. Further, in the case of using the carrier G1 as the protective layer, it was understood that the surface roughen (Ra) was improved to about 500 nm when the aspect of the nanostructure of the carrier G1 was made 5.5, and on the other hand, it was found out that there was a portion in which the nanostructure of the protective layer was broken in removing the protective layer from the function transfer product. From this viewpoint, from the viewpoints of controlling the surface roughness (Ra) on the functional layer side with high controllability and further controlling with high manufacturability, it was understood that the surface roughness (Ra) on the functional layer side is preferably 500 nm or less, and more preferably 300 nm or less.

Use of the Function Transfer Products A1 to A5

Next, the functional layer of each of the function transfer products A1 to A5 was caused to function as a processing mask, and nano-processing was performed on the target object. Herein, a C-surface sapphire of 4-inch Φ was used as the target object.

(Use of the Function Transfer Product A1)

The same operation as in the above-mentioned "Evaluations of function transfer products" was performed, and the functional layer was transferred onto the target object. Herein, as the function transfer product A1, in Table 10, each of the sample with for of 30 nm and Ra of 3 nm and the sample with for of 100 nm and Ra of 25 nm was used.

Etching using an oxygen gas was performed from the functional layer surface side of the target object provided with the functional layer to partially expose the target object surface. The etching conditions were that a pressure was 1 Pa and that power was 300 W, and the time required for the surface of the target object to be partially exposed was adjusted.

Next, reactive ion etching (hereinafter, referred to as ICP-RIE) using a mixed gas of $BCl_3$ gas and chlorine gas was performed to perform nano-processing on the target object. Etching was performed with ICP: 150W, BIAS: 50W, and pressure 0.2 Pa, and the ICP-RIE apparatus (RIE-101iPH, made by SAMCO Inc.) was used.

Finally, the product was cleaned with a solution obtained by mixing sulfuric acid and hydrogen peroxide solution in a weight ratio of 2:1.

When the obtained target objects were observed with the SEM, in the case of using any of the function transfer products A1, it was found out that a plurality of convex portions with an average pitch of 700 nm was formed. Further, it was found out that by adjusting the time of ICP-RIE, it was possible to control the diameter of the convex-portion bottom portion and the shape of the convex-portion vertex portion. As the diameter of the convex-portion bottom portion, it was possible to prepare three products of 350 nm, 440 nm and 550 nm. Further, as the shape of the convex-portion vertex portion, it was possible to prepare three types of the shape with a table top, cone shape with an edge portion with a radius of curvature of the convex-portion vertex portion exceeding 0, and the shape of a lens. It was possible to adjust the size of the table top by the time of ICP-RIE, and it was possible to prepare sizes of 50 nm, 150 nm and 420 nm.

From the foregoing, it was confirmed that by using the function transfer product A1, the functional layer is capable of developing two functions of the adhesion function to the target object and the mask function for processing on the target object.

(Use of the Function Transfer Product A2)

The same operation as in the above-mentioned "Evaluations of function transfer products" was performed, and the functional layer was transferred onto the target object. Herein, as the function transfer product A2, each of the sample with for of 30 nm and Ra of 5 nm and the sample with for of 650 nm and Ra of 50 nm as shown in Table 11 was used.

Etching using an oxygen gas was performed from the functional layer surface side of the target object provided with the functional layer as in the above-mentioned "Use of the transfer function product A1" to partially expose the target object surface. In addition, the time required for the surface of the target object to be partially exposed was adjusted. When the functional layer after etching was observed with the SEM, it was confirmed that the volume of the first functional layer decreased few, and that only the second functional layer was subjected to nano-processing. In other words, the first functional layer functioned as a mask for processing of the second functional layer.

Next, as in the "Use of the function transfer product A1", ICP-RIE was performed, and nano-processing was performed on the target object. The target object after performing ICP-RIE for 5 minutes was observed with the SEM and EDX. As a result, it was confirmed that the first mask layer was not observed, and that the second functional layer was left.

Finally, the product was cleaned with a solution obtained by mixing sulfuric acid and hydrogen peroxide solution in a weight ratio of 2:1.

When the obtained target objects were observed with the SEM, in the case of using any of the function transfer products A2, it was found out that a plurality of convex portions with an average pitch of 700 nm was formed. Further, it was found out that by adjusting the time of ICP-RIE, it was possible to control the diameter of the convex-portion bottom portion and the shape of the convex-portion vertex portion. As the diameter of the convex-portion bottom portion, it was possible to prepare three products of 320 nm, 530 nm and 660 nm. Further, as the shape of the convex-portion vertex portion, it was possible to prepare three types of the shape with a table top, cone shape with an edge portion with a radius of curvature of the convex-portion vertex portion exceeding 0, and the shape of a lens. It was possible to adjust the size of the table top by the time of RIE, and it was possible to prepare sizes of 30 nm, 900 nm and 330 nm.

From the foregoing, it was confirmed that by using the function transfer product A2, the first functional layer functions as a mask for processing on the second functional layer, and that the second functional layer is capable of developing three functions of the adhesion function to the target object, the adhesion function to the first functional layer, and the mask function for processing on the target object.

(Use of the Function Transfer Product A3

The same operation as in the above-mentioned "Evaluations of function transfer products" was performed, and the functional layer was transferred onto the target object. Herein, as the function transfer product A3, each of the sample with for of 500 nm and Ra of 32 nm and the sample with for of 950 nm and Ra of 88 nm as shown in Table 12 was used.

Etching using an oxygen gas was performed from the functional layer surface side of the target object provided with the functional layer as in the above-mentioned "Use of the transfer function product A1" to partially expose the target object surface. In addition, the time required for the surface of the target object to be partially exposed was adjusted. When the functional layer after etching was observed with the SEM, it was confirmed that the volume of the first functional layer decreased few, and that only the second functional layer was subjected to nano-processing. In other words, the first functional layer functioned as a mask for processing of the second functional layer.

Next, as in the Use of the function transfer product 1, ICP-RIE was performed, and nano-processing was performed on the target object. The target object after performing ICP-RIE for 3 minutes was observed with the SEM and EDX. As a result, it was confirmed that the first mask layer was not observed, and that the second functional layer was left.

Finally, the product was cleaned with a solution obtained by mixing sulfuric acid and hydrogen peroxide solution in a weight ratio of 2:1.

When the obtained target objects were observed with the SEM, in the case of using any of the function transfer products A3, it was found out that a plurality of concave portions with an average pitch of 700 nm was formed. Further, it was found out that by adjusting the time of ICP-RIE, it was possible to control the diameter of the concave-portion opening portion and the shape of the convex-portion vertex portion. As the diameter of the concave-portion opening portion, it was possible to prepare three products of 300 nm, 450 nm and 590 nm. Further, as the shape of the convex-portion vertex portion, it was possible to prepare two types of the shape with a table top, and the shape with an edge portion with a radius of curvature of the convex-portion vertex portion exceeding 0. It was possible to adjust the size of the table top by the time of ICP-RIE, and it was possible to prepare sizes of 350 nm, 120 nm and 40 nm.

From the foregoing, it was confirmed that by using the function transfer product A3, the first functional layer functions as a mask for processing on the second functional layer, and that the second functional layer is capable of developing three functions of the adhesion function to the target object, the adhesion function to the first functional layer, and the mask function for processing on the target object.

(Use of the Function Transfer Product A4)

The same operation as in the above-mentioned "Evaluations of function transfer products" was performed, and the functional layer was transferred onto the target object. Herein, as the function transfer product A4, in Table 13, each of the sample with for of 480 nm and Ra of 19 nm and the sample with for of 990 nm and Ra of 69 nm was used.

Etching using an oxygen gas was performed from the functional layer surface side of the target object provided with the functional layer as in the above-mentioned "Use of the transfer function product A1" to partially expose the target object surface. In addition, the time required for the surface of the target object to be partially exposed was adjusted. When the functional layer after etching was observed with the SEM, it was confirmed that the volume of the first functional layer decreased few, and that only the second functional layer was subjected to nano-processing. In other words, the first functional layer functioned as a mask for processing of the second functional layer. Further, on the target object were formed the pattern of the second functional layer with a large diameter and the second functional layer with a small diameter. The pattern of the second functional layer with a small diameter was derived from the first functional layer arranged on the vertex portions of the convex portions of the nanostructure of the carrier of the function transfer product A4. More specifically, the pattern of the second functional layer with a large diameter was arranged in a hexagonal arrangement, and the second functional layer with a small diameter was provided between mutually adjacent convex portions of the second functional layer with a large diameter hexagonally arranged.

Next, as in the "Use of the function transfer product A1", ICP-RIE was performed, and nano-processing was performed on the target object. The target object after performing ICP-RIE for 5 minutes was observed with the SEM and EDX. As a result, it was confirmed that the first mask layer was not observed, and that the second functional layer was left.

Finally, the product was cleaned with a solution obtained by mixing sulfuric acid and hydrogen peroxide solution in a weight ratio of 2:1.

When the obtained target objects were observed with the SEM, in the case of using any of the function transfer products A4, it was found out that a plurality of convex portions with an average pitch of 700 nm was formed. Further, in the plurality of convex portions, small convex portions with the diameter ranging from about 10 nm to 50 nm were partially provided between adjacent convex portions. Furthermore, it was found out that by adjusting the time of ICP-RIE, it was possible to control the diameter of the convex-portion bottom portion and the shape of the convex-portion vertex portion. As the diameter of the convex-portion bottom portion, it was possible to prepare three products of 280 nm, 320 nm and 450 nm. Further, as the shape of the convex-portion vertex portion, it was possible to prepare three types of the shape with a table top, cone shape with an edge portion with a radius of curvature of the convex-portion vertex portion exceeding 0, and the shape of a lens. It was possible to adjust the size of the table top by the time of ICP-RIE, and it was possible to prepare sizes of 10 nm, 80 nm and 120 nm.

From the foregoing, it was confirmed that by using the function transfer product A4, the first functional layer functions as a mask for processing on the second functional layer, and that the second functional layer is capable of developing two functions of the adhesion function to the target object, and the mask function for processing on the target object.

(Use of the Function Transfer Product A5)

The same operation as in the above-mentioned "Evaluations of function transfer products" was performed, and the functional layer was transferred onto the target object. Herein, as the function transfer product A5, each of the sample with for of 450 nm and Ra of 15 nm and the sample with for of 900 nm and Ra of 38 nm as shown in Table 14 was used.

Etching using an oxygen gas was performed from the functional layer surface side of the target object provided with the functional layer as in the above-mentioned "Use of the transfer function product A1" to partially expose the target object surface. In addition, the time required for the surface of the target object to be partially exposed was adjusted. When the functional layer after etching was observed with the SEM, the portion was removed which corresponded to the first functional layer coating positioned on the convex portions of the nanostructure of the carrier of the function transfer product, and the first functional layer was left which formed the coating in the concave-portion inner walls of the nanostructure of the carrier. Further, the second functional layer was left which was arranged under the first functional layer forming the coating in the concave-portion inner walls of the nanostructure of the carrier, and the second functional layer was removed which was positioned under the first functional layer coating positioned on the convex portions of the nanostructure of the carrier. In other words, the first functional layer functioned as a mask for processing of the second functional layer.

Next, as in the "Use of the function transfer product A1", ICP-RIE was performed, and nano-processing was performed on the target object. The target object after performing ICP-RIE for 5 minutes was observed with the SEM and EDX. As a result, it was confirmed that the first mask layer was not observed, and that the second functional layer was left.

Finally, the product was cleaned with a solution obtained by mixing sulfuric acid and hydrogen peroxide solution in a weight ratio of 2:1.

When the obtained target objects were observed with the SEM, in the case of using any of the function transfer products A5, it was found out that a plurality of convex portions with an average pitch of 700 nm was formed. Further, it was found out that by adjusting the time of ICP-RIE, it was possible to control the diameter of the convex-portion bottom portion and the shape of the convex-portion vertex portion. As the diameter of the convex-portion bottom portion, it was possible to prepare three products of 450 nm, 570 nm and 660 nm. Further, as the shape of the convex-portion vertex portion, it was possible to prepare three types of the shape with a table top, cone shape with an edge portion with a radius of curvature of the convex-portion vertex portion exceeding 0, and the shape of a lens. It was possible to adjust the size of the table top by the time of ICP-RIE, and it was possible to prepare sizes of 15 nm, 40 nm and 150 nm.

From the foregoing, it was confirmed that by using the function transfer product A5, the first functional layer functions as a mask for processing on the second functional layer, and that the second functional layer is capable of developing two functions of the adhesion function to the target object, and the mask function for processing on the target object.

Example 7

In Example 7, examined were effects on transfer properties exerted by physical properties of the uppermost layer of the functional layer of the function transfer product and the type of the target object. Herein, it is understood that the arrangement of the functional layer in the function transfer product does not affect the transfer properties from Example 6, and therefore, the function transfer product A1 of Example 6 was used as a representative.

Function transfer products B were prepared by the same techniques as in the function transfer product A1 of Example 6. In addition, as the functional layers of the function transfer products B, each of the following compositions B-1 to B-21 was used. Further, each of the following compositions B-1 to B-21 was dissolved in any of propylene glycol monomethyl ether, cyclohexanone, acetone, 2-propanol, N-methyl pyrrolidone, tetrahydrofuran, cyclohexane and toluene, or a mixed solvent. Particularly, it was preferentially studied to dissolve in a hydrophilic solution, and when the composition was not dissolved in hydrophilic solutions, hydrophobic solvents were studied. Furthermore, Tables 15 and 16 describe polar groups that each of the composition has. In addition, in Tables 15 and 16, it is meant to contain a polar group shown with a white circle. In other words, a blank field without any description means that the polar group is not contained. Furthermore, in the polar groups as described in Tables 15 and 16, polar groups provided in a polymerization initiator are not described.

TABLE 15

|  | B-1 | B-2 | B-3 | B-4 | B-5 | B-6 | B-7 | B-8 | B-9 | B-10 | B-11 |
|---|---|---|---|---|---|---|---|---|---|---|---|
| EPOXY GROUP |  |  |  | ○ | ○ |  |  |  |  |  |  |
| HYDROXYL GROUP |  |  |  |  |  | ○ |  |  |  |  |  |
| PHENOLIC HYDROXYL GROUP |  |  |  |  | ○ |  |  |  |  |  |  |
| ACRYLOYL GROUP |  |  | ○ |  |  |  |  | ○ | ○ | ○ | ○ |
| METHACRYLOYL GROUP |  |  |  | ○ | ○ | ○ |  |  |  | ○ |  |
| VINYL GROUP |  |  |  |  |  |  |  |  |  |  |  |
| CARBOXYL GROUP | ○ |  | ○ |  |  |  | ○ | ○ |  | ○ | ○ |
| CARBONYL GROUP | ○ |  |  |  |  |  |  | ○ |  |  |  |
| AMINO GROUP |  |  |  |  |  |  |  |  | ○ |  |  |
| ISOCYANATE GROUP |  |  |  |  |  |  |  |  |  |  |  |

TABLE 16

|  | B-12 | B-13 | B-14 | B-15 | B-16 | B-17 | B-18 | B-19 | B-20 | B-21 |
|---|---|---|---|---|---|---|---|---|---|---|
| EPOXY GROUP | ○ |  |  |  | ○ | ○ |  |  |  |  |
| HYDROXYL GROUP |  | ○ |  |  | ○ | ○ |  |  |  |  |
| PHENOLIC HYDROXYL GROUP | ○ |  |  |  |  |  |  |  |  |  |
| ACRYLOYL GROUP | ○ | ○ | ○ | ○ | ○ | ○ |  |  |  |  |
| METHACRYLOYL GROUP | ○ |  |  |  |  |  |  |  |  |  |
| VINYL GROUP |  |  |  |  |  |  |  |  |  |  |
| CARBOXYL GROUP |  |  |  | ○ |  |  |  |  |  |  |
| CARBONYL GROUP |  |  |  |  |  |  |  |  |  |  |
| AMINO GROUP |  |  |  | ○ |  |  |  |  |  |  |
| ISOCYANATE GROUP |  |  |  |  |  | ○ |  |  |  |  |

Composition B-1

The composition was copolymer comprised of the following repeating unit (a) and repeating unit (b). The molecular weight was 2900. The ratio (Nb/Na) between the number Nb of repetitions of the repeating unit b and the number Na of repetitions of the repeating unit a was 0.25.

[Chemistry 9]

(Repeating unit (a))

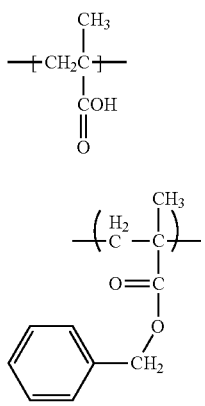

(Repeating unit (b))

Composition B-2

The composition was cresol novolac-based epoxy acrylate containing the following repeating unit (c), and the acrylate substation rate was approximately 100%. The composition was homooligomer containing the number n of repeating units ranging from 0 to 6. The average molecular weight was 1200. In addition, repetition was repeated by "*" bound to the carbon element of $CH_2$, and "*" bound to the six-membered ring. Further, as a photopolymerization initiator, 3.17 weight % of 2-(dimethylamino)-2-[(4-methylphenyl)methyl]-1-[4-(4-morpholinyl)phenyl]-1-butanone (Irgacure 379EG, made by BASF Company) that is an α-amino alkyl phenon system was added.

[Chemistry 10]

(Repeating unit (c))

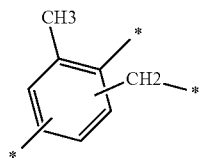

Composition B-3

The composition was copolymer comprised of the above-mentioned repeating unit (a) and the following repeating unit (d). The molecular weight was 5500, and the ratio (Na/Nd) between the number Na of repetitions of the repeating unit (a) and the number Nd of repetitions of the repeating unit (d) was 1.5. In addition, as a photopolymerization initiator, 4.2 weight % of 1-[9-ethyl-6-(2-methyl benzoyl)-9H-carbazole-3-yl]-,1-(0-acetyloxime) (Irgacure OXE02, made by BASF Company) that is an oxime ester-based ethanone was added.

[Chemistry 11]

(Repeating unit (d))

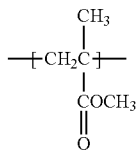

Composition B-4

The composition was cresol novolac-based epoxy methacrylate, and homopolymer with a methacrylate modification rate of about 50%. The molecular weight was about 3000. As a photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, mixed in a ratio of Irgacure 184:Irgacure 369=2.75:1, and added in an amount of 3.18 weight %.

Composition B-5

The composition was phenol novolac-based epoxy methacrylate, and was homopolymer with a methacrylate modification rate of about 50%. The molecular weight was about 3000. As a photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, mixed in a ratio of Irgacure 184:Irgacure 369=2.75:1, and added in an amount of 3.18 weight %.

Composition B-6

The composition was polyethylene glycol having the following repeating unit (e), and the molecular weight was about 4000. In addition, the terminals were hydroxyl groups.
(Repeating unit (e))

$$-(CH_2-CH_2-O)_n-$$

Composition B-7

The composition was amino ethylated copolymerized acrylic polymer comprised of the above-mentioned repeating unit (a) and the following repeating unit (f). The average molecular weight was about 20,000, and the ratio (Na/Nf) between the number Na of repetitions of the repeating unit (a) and the number Nf of repetitions of the repeating unit (f) was 0.67.

[Chemistry 12]

(Repeating unit (f))

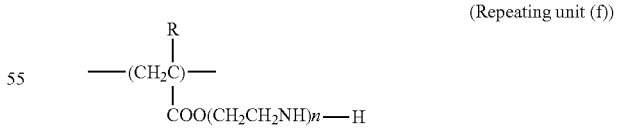

Composition B-8

The composition was a material obtained by mixing, into the copolymer as described in the composition B-1, tricyclodecane dimethanol diacrylate and tris(2-hydroxyethyl) isocyanurate triacrylate that are monomers. In addition, the ratio between the total weight of the polymer and the total weight of the monomers was set at 5.5:4.5. Further, 5.5 weight % of photopolymerization initiator was added relative to the monomer total weight. As the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and were mixed in a ratio of Irgacure 184:Irgacure 369=2.75:1.

Composition B-9

The composition was a material obtained by mixing, into the cresol novolac-based epoxy acrylate as described in the composition B-2, tricyclodecane dimethanol diacrylate and tris(2-hydroxyethyl) isocyanurate triacrylate that are monomers. In addition, the ratio between the total weight of the polymer and the total weight of the monomers was set at 7.9:2.1. Further, 5.5 weight % of photopolymerization initiator was added relative to the oligomer and monomer total weight. As the photopolymerization initiator, 2-(dimethylamino)-2-[(4-methylphenyl)methyl]-1-[4-(4-morpholinyl)phenyl]-1-butanone (Irgacure 379 EG, made by BASF Company) that is an α-amino alkyl phenon system was selected.

Composition B-10

The composition was a material obtained by mixing, into the copolymer as described in the composition B-3, tricyclodecane dimethanol diacrylate and tris(2-hydroxyethyl) isocyanurate triacrylate that are monomers. In addition, the ratio between the total weight of the polymer and the total weight of the monomers was set at 4.2:5.8. Further, 5.5 weight % of photopolymerization initiator was added relative to the polymer and monomer total weight. As the photopolymerization initiator, 1-[9-ethyl-6-(2-methyl benzoyl)-9H-carbazole-3-yl]-, 1-(0-acetyloxime) (Irgacure OXE 02, made by BASF Company) that is an oxime ester-based ethanone was selected.

Composition B-11

The composition was a material obtained by mixing, into the polymethyl methacrylate as described in the composition B-4, 2-ethylhexyl EO-modified acrylate and trimethylolpropane triacrylate that are monomers. In addition, the ratio between the total weight of the polymer and the total weight of the monomers was set at 4.0:6.0. Further, 5.5 weight % of photopolymerization initiator was added relative to the monomer total weight. As the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and were mixed in a ratio of Irgacure 184:Irgacure 369=2.75:1.

Composition B-12

The composition was a material obtained by mixing, into the phenol novolac-based epoxy methacrylate as described in the composition B-5, tricyclodecane dimethanol diacrylate and tris(2-hydroxyethyl) isocyanurate triacrylate that are monomers. In addition, the ratio between the total weight of the polymer and the total weight of the monomers was set at 8.2:1.8. Further, 5.5 weight % of photopolymerization initiator was added relative to the polymer and monomer total weight. As the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and were mixed in a ratio of Irgacure 184:Irgacure 369=2.75:1.

Composition B-13

The composition was a material obtained by mixing, into the polyethylene glycol as described in the composition B-6, tricyclodecane dimethanol diacrylate and tris(2-hydroxyethyl) isocyanurate triacrylate that are monomers. In addition, the ratio between the total weight of the polymer and the total weight of the monomers was set at 5.5:4.5. Further, 5.5 weight % of photopolymerization initiator was added relative to the monomer total weight. As the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and were mixed in a ratio of Irgacure 184:Irgacure 369=2.75:1.

Composition B-14

The composition was a material obtained by mixing, into the copolymer as described in the composition B-7, tricyclodecane dimethanol diacrylate and trimethylolpropane EO-modified triacrylate that are monomers. In addition, the ratio between the total weight of the polymer and the total weight of the monomers was set at 6.7:2.3. Further, 5.5 weight % of photopolymerization initiator was added relative to the monomer total weight. As the photopolymerization initiator, 1-[9-ethyl-6-(2-methyl benzoyl)-9H-carbazole-3-yl]-, 1-(0-acetyloxime) (Irgacure OXE 02, made by BASF Company) that is an oxime ester-based ethanone was selected.

Composition B-15

Added to a material obtained by mixing phenyl glycidyl ether acrylate with a viscosity at 50° C. of about 3000 mPa·s and pentaerythritol triacrylate hexamethylene diisocyanate urethane prepolymer with a viscosity at 25° C. of about 25000 mPa·s in a weight ratio of 75:25 was 5.5 weight % of photopolymerization initiator. As the photopolymerization initiator, 2-(dimethylamino)-2-[(4-methylphenyl)methyl]-1-[4-(4-morpholinyl)phenyl]-1-butanone (Irgacure 379 EG, made by BASF Company) that is an α-amino alkyl phenon system was selected.

Composition B-16

The composition was a material obtained by mixing titanium polymer having the following repeating unit (g), side chain phenyl-modified silicone (made by Shin-Etsu silicone corporation SH710), titanium tetrabutoxide, 3-acryloxypropyl trimethoxysilane and 3-glycidyloxypropyl trimethoxysilane, and the mixing ratio was 1:1.3:1.5:0.42:0.42. Further, 5.5 weight % of photopolymerization initiator was added relative to 3-acryloxypropyl trimethoxysilane. As the photopolymerization initiator, 2-(dimethylamino)-2-[(4-methylphenyl)methyl]-1-[4-(4-morpholinyl)phenyl]-1-butanone (Irgacure 379 EG, made by BASF Company) that is an α-amino alkyl phenon system was selected.

[Chemistry 13]

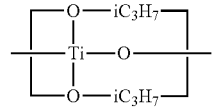

(Repeating unit (g))

Composition B-17

The composition was a material obtained by mixing polydimethyl siloxane with a molecular weight of 40000, side chain phenyl-modified silicone (made by Shin-Etsu silicone corporation SH710), titanium tetrabutoxide, 3-acryloxypropyl trimethoxysilane and 3-glycidyloxypropyl trimethoxysilane, and the mixing ratio was 1:1.3:1.5:0.42:0.42. Further, 5.5 weight % of photopolymerization initiator was added relative to 3-acryloxypropyl trimethoxysilane. As the photopolymerization initiator, 2-(dimethylamino)-2-[(4-methylphenyl)methyl]-1-[4-(4-morpholinyl)phenyl]-1-butanone (Irgacure 379 EG, made by BASF Company) that is an α-amino alkyl phenon system was selected.

Composition B-18

The composition was the titanium polymer as described in the composition B-16.

Composition B-19

The composition was polydimethyl siloxane with a molecular weight of about 40000, and was the same as that used in the composition B-17.

Composition B-20 The composition was polyisoprene with a molecular weight of 5800.

Composition B-21

The composition was polystyrene with a molecular weight of 56,000.

A film of the functional layer was formed as in the function transfer product A-1 of above-mentioned Example 6. As in Example 6, the functional layer after removing from the drying oven was in a non-liquid state. Further, for the compositions B-1 to B-15, when the temperature was raised gradually, it was confirmed that tackiness developed or increased from around 60° C. to 80° C. The functional layer was transferred to the target object by performing the same operation as in the function transfer product A1 of Example 6. In addition, the temperature in bonding to the target object was changed to a range of 95° C. to 145° C. Herein, as the target object, the following target objects T-1 to T-15 were used.

- target object T-1 . . . Quartz glass.
- target object T-2 . . . Sapphire (c-surface).
- target object T-3 . . . Silicon carbide (Sic).
- target object T-4 . . . Gallium nitride.
- target object T-5 . . . Gold. In addition, the product obtained by depositing gold on a surface of quartz glass.
- target object T-6 . . . Silver. In addition, the product obtained by depositing silver on a surface of quartz glass.
- target object T-7 . . . Indium tin oxide (ITO).
- target object T-8 . . . Polyethylene terephthalate (PET).
- target object T-9 . . . Synthetic leather (the leather surface layer was a polyurethane film.)
- target object T-10 . . . Quartz glass subjected to surface treatment with a material obtained by mixing methyl trimethoxy silane and tetraethoxysilane in a molar ratio of 1:99. The contact angle of a water droplet was 41 degrees. In addition, the surface treatment was performed as described below. First, the quartz glass was immersed in an anhydrous toluene solvent, and was heated at temperatures between 105° C. to 110° C. for 30 minutes. Next, the methyl trimethoxy silane and tetraethoxysilane in the above-mentioned ratio were dissolved in anhydrous toluene in a concentration of 10 weight %. The quartz glass subjected to immersion heating treatment was immersed in the anhydrous toluene solvent with the above-mentioned methyl trimethoxy silane and tetraethoxysilane dissolved therein. At this point, the state was held at 24° C. for 8 hours. Subsequently, the quartz glass was removed, cleaned sufficiently with anhydrous toluene, then cleaned with acetone, and was finally cleaned with ethanol. After cleaning, the quartz glass was dried at 120° C. for 15 minutes, and the treatment was completed.
- target object T-11 . . . Quartz glass subjected to surface treatment with a material obtained by mixing methyl trimethoxy silane and tetraethoxysilane in a molar ratio of 10:90. The contact angle of a water droplet was 71 degrees. In addition, the surface treatment was performed as in the target object T-10.
- target object T-12 . . . Quartz glass subjected to surface treatment with a material obtained by mixing methyl trimethoxy silane and tetraethoxysilane in a molar ratio of 25:75. The contact angle of a water droplet was 88 degrees. In addition, the surface treatment was performed as in the target object T-10.
- target object T-13 . . . Quartz glass subjected to surface treatment with a material obtained by mixing methyl trimethoxy silane and tetraethoxysilane in a molar ratio of 50:50. The contact angle of a water droplet was 94 degrees. In addition, the surface treatment was performed as in the target object T-10.
- target object T-14 . . . Quartz glass subjected to surface treatment with a material obtained by mixing methyl trimethoxy silane and tetraethoxysilane in a molar ratio of 65:35. The contact angle of a water droplet was 101 degrees. In addition, the surface treatment was performed as in the target object T-10.
- target object T-15 . . . Quartz glass subjected to surface treatment with a material obtained by mixing methyl trimethoxy silane and tetraethoxysilane in a molar ratio of 92:8. The contact angle of a water droplet was 109 degrees. In addition, the surface treatment was performed as in the target object T-10.

Table 17 describes combinations of the compositions B-1 to B-21 of the functional layer and the target objects T-1 to T-15 on which tests of transfer properties were performed and the evaluation results. The evaluation indicators are as described below. First, the function transfer product B was analyzed as in Example 6, and the ratio (Ra/lor) was calculated. Herein, the ratio is a value with respect to the function transfer product B, and therefore, expressed as a ratio B. Next, the calculated ratio B was compared with the transfer property study results of the function transfer products A1 of Example 6. In other words, the transfer property evaluation result with respect to the ratio (Ra/lor) of the function transfer product A1 the same or the closest as/to the ratio B was checked. Also in the function transfer product B, the transfer properties were evaluated as in the function transfer product A1 of Example 6, the case where the evaluation result was "Δ" of Example 6 i.e. the peeling velocity Vm ratio was 1.0 or more and less than 2.2 and the defect rate was 5% or less was described as "X", the case where the evaluation result degraded but did not fall below the Δ evaluation was described as "▲", and the case where the evaluation result was the same or improved was described as "●". Further, in Table 17, fields with no description mean that the evaluations were not made.

TABLE 17

| | | PROCESSING TARGET PRODUCT | | | | | | | | | | | | | | |
|---|---|---|---|---|---|---|---|---|---|---|---|---|---|---|---|---|
| | | T-1 | T-2 | T-3 | T-4 | T-5 | T-6 | T-7 | T-8 | T-9 | T-10 | T-11 | T-12 | T-13 | T-14 | T-15 |
| FUNCTIONAL LAYER COMPOSITION | B-1 | ● | ● | ● | | | | | | | | | | | | |
| | B-2 | | | | ● | ● | ● | | | | | | | | | |
| | B-3 | | | | | | | ● | ● | ● | | | | | | |
| | B-4 | | | | | | | | | | ● | ● | ● | | | |
| | B-5 | | | | | | | | | | | | | ● | ● | ● |
| | B-6 | ● | ● | ● | | | | | | | | | | | | |
| | B-7 | | | | ● | ● | ● | | | | | | | | | |
| | B-8 | | | | | | | ● | ● | ● | | | | | | |
| | B-9 | | | | | | | | | | ● | ● | ● | | | |
| | B-10 | | | | | | | | | | | | | ● | ● | ● |
| | B-11 | ● | ● | ● | | | | | | | | | | | | |
| | B-12 | | | | ● | ● | ● | | | | | | | | | |
| | B-13 | | | | | | | ● | ● | ● | | | | | | |
| | B-14 | | | | | | | | | | ● | ● | ● | | | |
| | B-15 | | | | | | | | | | | | | ● | ● | ● |
| | B-16 | ● | ● | ● | | | | | | | | | | | | |
| | B-17 | | | | ● | ● | ● | | | | | | | | | |
| | B-18 | | | | | | | ▲ | ▲ | ▲ | ▲ | ▲ | | | | |
| | B-19 | ▲ | | | | | | | | | | | ▲ | ▲ | ▲ | ▲ |
| | B-20 | | ▲ | ▲ | ▲ | ▲ | ▲ | | | | | | | | | |
| | B-21 | | | | | | | ▲ | ▲ | ▲ | ▲ | ▲ | | | | |

From Table 17, the following matters are understood. First, by containing polar groups in the functional layer, the transfer properties are excellently held. On the other hand, also in the case of not containing polar groups, there is no case where the peeling velocity Vm ratio was 1.0 or more and less than 2.2 and the defect rate was 5% or less. Further, these results are not dependent on the materials and surface physical properties of the target objects. In other words, it was understood that by meeting the ratio (Ra/lor), the transfer properties were made excellent, particularly, in the case where the functional layer contained polar groups. This is because particularly important factors in the transfer properties are to increase the adhesion strength between the functional layer and the target object, and to control the destruction of the functional layer. Herein, the adhesion strength between the functional layer and the target object is guaranteed by increases in the real contact area due to the ratio (Ra/lor) as described previously, and by the functional layer containing polar groups, this is because the adhesion strength per unit area between the functional layer and the target object is improved. The reason is conceivable that electrostatic interaction and hydrogen bond action work which occur by containing polar groups. Further, it was also understood that the adhesion between the carrier G2 and the functional layer was decreased by containing, as the polar group, at least one of an epoxy group, a hydroxyl group, an acryloyl group, a methacryloyl group, a vinyl group, a carboxyl group, an isocyanate group and a carbonyl group. This is useful because of leading to improvement in the transfer accuracy. This is presumed that in the case of containing polar groups, since it is possible to develop one or more phenomena of shrinkage due to photopolymerization, shrinkage due to heat polymerization and high density due to hydrogen bonds, the interface adhesion force between the carrier G2 and the functional layer was reduced. Among the groups, it was confirmed that by containing at least one or more of an epoxy group, a hydroxyl group, an acryloyl group, a methacryloyl group, a vinyl group, and a carboxyl group, the above-mentioned effects are further enhanced.

Further, when the effect of a foreign substance in bonding the function transfer product to the target object was separately examined, it was found out that the effect of a foreign substance was hard to undergo in the case of using the compositions B-1 to B-15. More specifically, protein was intentionally bonded to the surface of the target object as a foreign substance, and in this state, the function transfer product was bonded. As a result, in the case of using the compositions B-1 to B-15, when the diameter of the foreign substance was Φ, the sizes of air bubbles generated in the foreign substance portions by bonding were 5Φ or less, and in the case of using the other compositions, the generated air bubbles were 8Φ or more. It was confirmed that the compositions B-1 to B-15 developed tackiness or increased tackiness from around 60° C. to 80° C. in raising the temperature gradually. In other words, by meeting such a condition, since fluidity of the surface layer of the functional layer is increased in bonding the function transfer product to the target object, the reason is conceivable that fluidity of the functional layer around the foreign substance was increased, and that the effect of absorbing unevenness such as a foreign substance was also increased. From the foregoing, it was understood that the functional layer of the function transfer product is preferably in a non-liquid state at 20° C. under light shielding, and develops tackiness by heating. In addition, from the viewpoints of selectivity of materials of the functional layer and industrial properties, the lowest temperature at which tackiness is developed is around 300° C. In other words, it is preferable that the functional layer is in a non-liquid state at 20° C. under light shielding, and develops tackiness in a range of exceeding 20° C. to 300° C.

Further, for another study, the function transfer product as shown in FIG. 14E was prepared in which the nanostructure of the carrier was flattened with the first functional layer and the second functional layer was further provided on the first functional layer. Herein, as the first functional layer, any one of the compositions B-18 to B-21 was used, and as the second functional layer, any one of the composition B-1 to B-3 was used. In this case, the result was "●" in using the above-mentioned evaluation indicators. In other words, in the function transfer product, it was understood that the transfer properties were more improved when the uppermost layer contained polar groups. Further, when the film thickness of the uppermost layer of the functional layer was examined in the case where the uppermost layer contained polar groups, it was confirmed that the transfer properties started to improve from about 5 nm, and was sharply made excellent in a range of 20 nm to 30 nm, and that it was possible to stably perform transfer in thicknesses of 50 nm or more. Accordingly, it was understood that the uppermost layer of the function transfer product contains polar groups, and that the film thickness is preferably 5 nm or more, more preferably 20 nm or more and most preferably 50 nm or more.

Example 8

In Example 8, examined were effects on the transfer accuracy exerted by the relationship between physical properties of the carrier and physical properties of the functional layer. From Examples 6 and 7, it is understood that the transfer properties are kept excellent when the ratio (Ra/lor) is in the predetermined range, and that the transfer properties are kept more excellent when the uppermost layer of the functional layer contains polar groups. Therefore, in Example 8, the form of the function transfer product A1 of Example 6 was represented, and the function transfer product C using the composition A-1 of Example 6 was prepared and used in the study. Herein, physical properties of the carrier were made parameters, and changed. Further, used as the target object targeted for transfer were the target objects T-2, T-8, T-9 and T-13 with significantly different surface physical properties.

Carriers used in the study were the following carriers C-1 to C-8.

Carrier C-1 . . . The carrier was the carrier G2 described in Example 6, where an additive amount was 2 parts by weight of fluorine-containing urethane (meth)acrylate (OP-TOOL DAC HP (made by Daikin Industries, Ltd.)) relative to trimethylolpropane (EO-modified) triacrylate (M350 (made by TOAGOSEI Co., Ltd.)). The contact angle of a water droplet was 94 degrees. The ratio (Es/Eb) was 115.

Carrier C-2 . . . The carrier was the carrier G2 described in Example 6, where an additive amount was 5 parts by weight of fluorine-containing urethane (meth)acrylate (OP-TOOL DAC HP (made by Daikin Industries, Ltd.)) relative to trimethylolpropane (EO-modified) triacrylate (M350 (made by TOAGOSEI Co., Ltd.)). The contact angle of a water droplet was 98 degrees. The ratio (Es/Eb) was 68.

Carrier C-3 . . . The carrier was the carrier G2 described in Example 6, where an additive amount was 10 parts by weight of fluorine-containing urethane (meth)acrylate (OP-TOOL DAC HP (made by Daikin Industries, Ltd.)) relative to trimethylolpropane (EO-modified) triacrylate (M350 (made by TOAGOSEI Co., Ltd.)). The contact angle of a water droplet was 111 degrees. The ratio (Es/Eb) was 54.

Carrier C-4 . . . The carrier was the carrier G2 described in Example 6, where an additive amount was 15 parts by weight of fluorine-containing urethane (meth)acrylate (OP-TOOL DAC HP (made by Daikin Industries, Ltd.)) relative to trimethylolpropane (EO-modified) triacrylate (M350 (made by TOAGOSEI Co., Ltd.)). The contact angle of a water droplet was 121 degrees. The ratio (Es/Eb) was 48.

Carrier C-5 . . . The carrier was polydimethyl siloxane.

Carrier C-6 . . . The carrier was obtained by forming films of $SiO_2$ with 10 nm and Cr with 10 nm on the surface of the carrier G2 described in Example 6, and treating with a surface treatment agent (Durasurf HD-1101Z, made by Daikin Industries, Ltd.).

Carrier C-7 . . . The carrier was a cured material of a mixture obtained by mixing trimethylolpropane triacrylate: trimethylolpropane (EO-modified) triacrylate: silicone diacrylate (EBECRYL 350 (made by Daicel-cytec Co., Ltd.)): 1-hydroxy-cyclohexyl-phenyl-ketone (Irgacure 184 (made by BASF Company)): 2-benzyl-2-dimethylamino-1-(4-morpholino phenyl)-butanone-1 (Irgacure 369 (made by BASF Company))=20 g: 80 g: 1.5 g: 5.5 g: 2.0 g.

Carrier C-8 . . . The carrier was obtained by depositing diamond-like carbon (DLC) on the concavo-convex structure made of silicon. In addition, the DLC was deposited by an ionized deposition method.

Among the carriers C-1 to C-8, the carriers C-1 to C-4, C-6 and C-7 were manufactured by the same manufacturing method as in the carrier G2 of Example 6. Further, the carrier C-5 was prepared by forming a film of polydimethyl siloxane on a plate-shaped master mold obtained by performing nano-processing on plate-shaped quartz by applying the same principles as the manufacturing principles of the cylindrical master mold of Example 6, and peeling. The carrier C-8 was manufactured by performing nano-processing on a plate-shaped silicon (Si) wafer by applying the same principles as the manufacturing principles of the cylindrical master mold of Example 6, and subsequently depositing diamond-like carbon on the nanostructure surface.

Tests were performed by using each of the target objects T-2, T-8, T-9 and T-13 on which the tests of transfer properties were performed and the carriers C-1 to C-8 as the carrier. In other words, evaluations were made on 32 combinations. The evaluation indicators are as described below. First, the function transfer product C was analyzed as in Example 6, and the ratio (Ra/lor) was calculated. Herein, the ratio is a value with respect to the function transfer product C, and therefore, expressed as a ratio C. Next, the calculated ratio C was compared with the transfer property study results of the function transfer products A1 of Example 6. In other words, the transfer property evaluation result with respect to the ratio (Ra/lor) of the function transfer product A1 the same or the closest as/to the ratio C was checked. Also in the function transfer product C, the transfer properties were evaluated as in the function transfer product A1 of Example 6, the case where the evaluation result was "A" of Example 6 i.e. the peeling velocity Vm ratio was 1.0 or more and less than 2.2 and the defect rate was 5% or less was described as "X", the case where the evaluation result degraded but did not fall below the Δ evaluation was described as "▲", and the case where the evaluation result was the same or improved was described as "●". The results are shown in Table 18.

TABLE 18

|  |  | PROCESSING TARGET PRODUCT | | | |
|---|---|---|---|---|---|
|  |  | T-2 | T-9 | T-8 | T-13 |
| CARRIER | C-1 | ● | ● | ● | ● |
|  | C-2 | ● | ● | ● | ● |
|  | C-3 | ● | ● | ● | ● |
|  | C-4 | ● | ● | ● | ● |
|  | C-5 | ● | ● | ● | ● |
|  | C-6 | ● | ● | ● | ● |
|  | C-7 | ● | ● | ● | ● |
|  | C-8 | ● | ● | ● | ● |

From Table 18, the following matters are understood. The target object T-8 is polyethylene terephthalate, and the target object T-2 is the sapphire. In other words, the target object T-8 is formed of the organic substance, and has the surface with strong hydrophobicity. On the other hand, the target object T-2 is formed of the inorganic substance, and has the surface with strong hydrophilicity. Further, the target object T-9 is the synthetic leather, is formed of the organic product, and has the surface with strong hydrophilicity as compared with the target object T-8. Furthermore, the target object T-13 is the substance obtained by partially modifying methyl groups on the quartz, is formed of the inorganic substance, and has the surface with strong hydrophobicity as compared with the target object T-2. In other words, as the target object, tests were made on four types of the inorganic product or organic product and surface with strong hydrophilicity or surface with strong hydrophobicity.

All of the carriers C-1 to C-4 are fluorine-containing resins, and since the concentrations of fluorine causing segregation to the nanostructure surface differ, the contact angles of a water droplet differ. In other words, the carriers have surfaces with different hydrophobicity intensity degrees. On the other hand, the carrier C-5 is polydimethylsiloxane. In other words, the carrier is formed of inorganic polymer, and many methyl groups exist on the surface. Further, in the carrier C-6, the inorganic coating film exists on the nanostructure made of the organic substance. Therefore, the hardness of the nanostructure is significantly improved. The carrier C-7 is the cured material of the acrylic resin, and has the composition without containing fluorine. Finally, in the carrier C-8, the surface is formed of diamond like carbon. As the results, it is understood that the transfer properties are kept excellent irrespective of the combinations between the carriers C-1 to C-8 and the target objects T-2, T-8, T-9 and T-13. In other words, as described already, by the ratio (Ra/lor) meeting the predetermined range, fluidity of the uppermost layer of the functional layer is improved in bonding the function transfer product to the target object, the real contact area between the functional layer and the target object is increased, and in association therewith, the adhesion strength between the functional layer and the target object is improved. Further, since it is possible to suppress the failure typified by the cohesive destruction of the functional layer in peeling off the carrier by uniforming peeling stress, it is possible to highly keep the transfer properties.

In addition, the adhesion between the functional layer and the carrier was studied in detail, and it was understood that the adhesion was low in the case of using the carriers C-1 to C-7. This is importance in terms of maintaining improvement in the transfer accuracy. In other words, it was found out that it is preferable that the carrier contains any one of the fluorine element, methyl group and siloxane bond or more.

Example 9

In Example 9, examined were effects on the transfer accuracy exerted by the average pitch and average aspect of the nanostructure of the carrier. From Examples 6 to 8, it is understood that by controlling the ratio (Ra/lor) that is the physical property value of the functional layer of the function transfer product, and particularly, by containing polar groups in the uppermost layer of the functional layer, it is possible to improve the transfer properties irrespective of the arrangement of the functional layer in the function transfer product, materials of the target object, materials of the carrier and materials of the functional layer. Therefore, as the transfer target product, the function transfer product A-1 described in Example 6 was used, and only the nanostructure of the carrier G2 was changed. The average pitch and average aspect were made parameters of the nanostructure. Thus, the effects on the transfer accuracy were examined when the nanostructure of the carrier was made parameters. In addition, used as the target object was the target object T-2.

The average pitch of the nanostructure of the carrier G2 was controlled by changing pulse irradiation intervals of the semiconductor laser in manufacturing the cylindrical master mold. Further, the aspect was controlled by pulse intensity of the semiconductor laser and dry etching time. In addition, one cylindrical master mold was divided into seven zones, and the nanostructure was changed for each zone. In other words, the cylindrical master mold included seven types of nanostructure areas. Therefore, the carrier G2 manufactured with the cylindrical master mold was provided with the nanostructure areas divided into seven in the width direction of the carrier G2. Therefore, in using the function transfer product, only the corresponding nanostructure portion was cut and used. In addition, the carrier G2 and function transfer product were manufactured as in Example 6. In Example 9, carriers D-1 to D-13 were manufactured for the average pitch and aspect.

The manufactured carrier G2 was analyzed using the SEM. The results are shown in Tables 19 and 20. Table 19 organizes so that the average pitch of the nanostructure of the carrier G2 is the parameter, and Table 20 is the case of organizing so that the aspect of the nanostructure of the carrier G2 is the parameter. Further, meanings of the terms described in Tables 19 and 20 are the same as in Tables 15 and 16. The average aspect was calculated by dividing the average depth by the average opening diameter. The ratio (Es/Eb) ranged from 38 to 45.

TABLE 19

| | AVERAGE PITCH (nm) | AVERAGE ASPECT | AVERAGE OPENING DIAMETER (nm) | Mcv (nm) | Mcc (nm) | Sh/Scm | Mcv/Mcc | RESULT |
|---|---|---|---|---|---|---|---|---|
| D-1 | 150 | 0.85 | 135 | 15 | 135 | 0.73 | 0.11 | ⊚ |
| D-2 | 300 | 0.85 | 270 | 30 | 270 | 0.73 | 0.11 | ⊚ |
| D-3 | 450 | 0.85 | 405 | 45 | 405 | 0.73 | 0.11 | ⊚ |
| D-4 | 700 | 0.85 | 630 | 70 | 630 | 0.73 | 0.11 | ⊚ |
| D-5 | 900 | 0.85 | 810 | 90 | 810 | 0.73 | 0.11 | ⊚ |
| D-6 | 1200 | 0.85 | 1080 | 120 | 1080 | 0.73 | 0.11 | ○ |
| D-7 | 1500 | 0.85 | 1350 | 150 | 1350 | 0.73 | 0.11 | Δ |
| D-8 | 2500 | 0.85 | 2250 | 250 | 2250 | 0.73 | 0.11 | X |

TABLE 20

| AVERAGE PITCH (nm) | AVERAGE ASPECT | AVERAGE OPENING DIAMETER(nm) | Mcv(nm) | Mcc(nm) | Sh/Scm | Mcv/Mcc | RESULT |
|---|---|---|---|---|---|---|---|
| D-9 | 300 | 0.3 | 270 | 30 | 270 | 0.73 | 0.11 | ◎ |
| D-10 | 300 | 0.6 | 270 | 30 | 270 | 0.73 | 0.11 | ◎ |
| D-11 | 300 | 0.9 | 270 | 30 | 270 | 0.73 | 0.11 | ◎ |
| D-12 | 300 | 1.2 | 270 | 30 | 270 | 0.73 | 0.11 | ◎ |
| D-13 | 300 | 1.6 | 270 | 30 | 270 | 0.73 | 0.11 | ○ |
| D-14 | 300 | 2.2 | 270 | 30 | 270 | 0.73 | 0.11 | ○ |

As in the function transfer product A1 of Example 6, the functional layer was transferred to the target object T-2. The target object provided with the functional layer was analyzed using the AFM and SEM. At this point, the transfer accuracy was judged from the correspondence relationship between the observed shape of a plurality of convex portions and the shape of a plurality of concave portions of each of the carrier D-1 to D-14. Herein, the case where a deviation between the shape of the concave portion of each of the carriers D-1 to D-14 and the shape of the convex portion of the functional layer transferred to the target object was less than 3% was represented as ◎, and the case where the deviation was 3% or more and less than 5% was represented as ○. Further, evaluations were made by representing the case where the existence number of portions in which the convex portion was lost was 5 or more and less than 20 relative to 1000 convex portions as Δ, and the case where 20 or more portions existed as x. The results are collected and described in Tables 19 and 20.

From Table 19, the following matters are understood. In the case where the average pitch was 2500 nm, the rate at which convex portions of the function transfer product was failed increased. The reason is conceivable that the area of the concave-portion inner surface of the nanostructure of the carrier D-8 increased, and that the friction force was increased which was applied to the functional layer in removing the carrier D-8. Actually, when the adhesion between the carrier and the functional layer was measured, it was confirmed that the adhesion increased as the carrier number was higher from the carrier D-1 to the carrier D-8. The number of lost convex portions of the functional layer was 25 among 1000 convex portions in using the carrier D-8. In other words, the loss rate was 2.5%. The loss rate of convex portions of the functional layer of 2.5% is not a problem corresponding to a use of the function transfer product, while having an effect corresponding to a use. For example, in the case of considering addition of the antireflection function based on effective medium approximate with the function transfer product, scattered light increases due to the loss of convex portions, and therefore, the effect is given. For example, in the case of adding the water repellent function with the function transfer product, the loss of convex portions of 2.5% affects water repellent performance little. From this viewpoint, in consideration of support for all the functions, it is preferable that the average pitch of the nanostructure of the carrier is less than 2500 nm. In the case of using the carrier D-7, the loss rate was 0.7%. In this case, for example, the effect is extremely small on many applications such as a substrate for a LED, antireflection based on effective medium approximate, water repellency, hydrophilicity, slipper surface, photocatalyst and fuel cell. Accordingly, the average pitch is preferably 1500 nm or less. In addition, the average pitch is most preferably 1200 nm or less. In addition, the lower limit value is not limited particularly. From the viewpoint of industrial properties, the value is preferably 1 nm or more. Further, in considering that the accuracy of the nanostructure is improved, it was understood that the value is more preferably 30 nm or more, and most preferably 50 nm or more.

From Table 20, it is understood that the transfer accuracy is decreased, as the aspect is increased. This is because moment energy applied to the functional layer in removing the carrier is higher by increases in the aspect. When fitting was made to the theoretical calculation result using the data obtained from Table 20, it was presumed that the point at which many convex portions of the functional layer are failed to make the evaluation X is that the aspect is about 5. From this viewpoint, it is understood that the aspect is preferably 5 or less. Further, in the case of considering the force by acceleration in removing the carrier, it was understood that the aspect is preferably 3.5 or less. This is an industrially important viewpoint because it is possible to improve the velocity in peeling off the carrier. Particularly, in order to improve the transfer accuracy in the case where the shape of the target object is not only the shape of a plate but also the shape of a lens, the shape of a cylinder or the shape of a cone, and in the case where the peeling velocity is increased, it was understood that the aspect is preferably 2.5 or less. Further, from Table 20, it is understood that the transfer accuracy is significantly improved when the aspect is less than 1.6. This is because the filling properties of the functional layer in the nanostructure of the carrier are improved and the force in peeling is significantly decreased. Accordingly, the aspect of the nanostructure of the carrier is most preferably 1.5 or less. In addition, the lower limit value is not limited particularly, and from the viewpoints of industrial productivity and accuracy in manufacturing, the value is preferably 0.3 or more, and most preferably 0.5 or more.

Example 10

In Example 10, examined were effects on film formation properties of the functional layer and effects on the transfer accuracy exerted by the arrangement of the nanostructure of the carrier. From Examples 6 to 9, it is understood that by controlling the ratio (Ra/lor) that is the physical property value of the functional layer of the function transfer product, and particularly, by containing polar groups in the uppermost layer of the functional layer, it is possible to improve the transfer rate irrespective of the arrangement of the functional layer in the function transfer product, materials of the target object, materials of the carrier and materials of the functional layer. Further, it is understood that the transfer accuracy is improved when the average pitch of the nanostructure of the carrier of the function transfer product is 1500 nm or less, and the aspect is 5 or less. It is an object of Example 10 to examine effects of the arrangement of the nanostructure of the carrier exerted on film formation properties and transfer accuracy of the functional layer. Particularly, in order to analyze the film formation properties in detail, as the function transfer product, the function transfer product A4 described in Example 6 was used, and only the nanostructure of the carrier G2 was changed. In addition, the ratio (Es/Eb) ranged from 35 to 45. The function transfer product A4 was the function transfer product in which first functional layers were provided in the concave-portion inner portions and on the convex-portion vertex portions of the nanostructure of the carrier G2 to be mutually separate, and the second functional layer was provided to flatten the first functional layers and the nanostructure of the carrier. Particularly, by noting the portion arranged inside the concave portion of the nanostructure of the carrier in the first functional layer, the film formation properties were examined in detail. Used as parameters of the nanostructure of the carrier were the aperture ratio (Sh/Scm) of the nanostructure and the ratio (Mcv/Mcc) between the top width of a convex-portion (Mcv) and the opening width of a concave-portion (Mcc). This is because it is possible to represent the arrangement of nanostructure by the average aperture ratio (Sh/Scm) and the ratio (Mcv/Mcc). In addition, used as the target object was the target object T-2.

As in the function transfer product A4 of Example 6, the first functional layers and second functional layer were formed. In addition, the nanostructure of the carrier of the function transfer product was controlled by the exposure method and exposure pattern of the semiconductor laser and dry etching time in manufacturing the cylindrical master mold.

As in the function transfer product A4 of Example 6, the function transfer product was bonded onto the target object T-2, and the carrier was removed. The obtained layered product comprised of first functional layer/second functional layer/target object was cut, and EDX and SEM observation was performed on the cross section. Five observation samples were prepared, and ten points were observed for each sample. A good evaluation was given to the case where the rate at which the convex portions were broken, the distribution of the thickness of the first functional layer on the convex-portion vertex portions and the distribution of the thickness of the second functional layer were in a range of 0% to 15%, and the other cases were made a poor evaluation.

Figure 24:
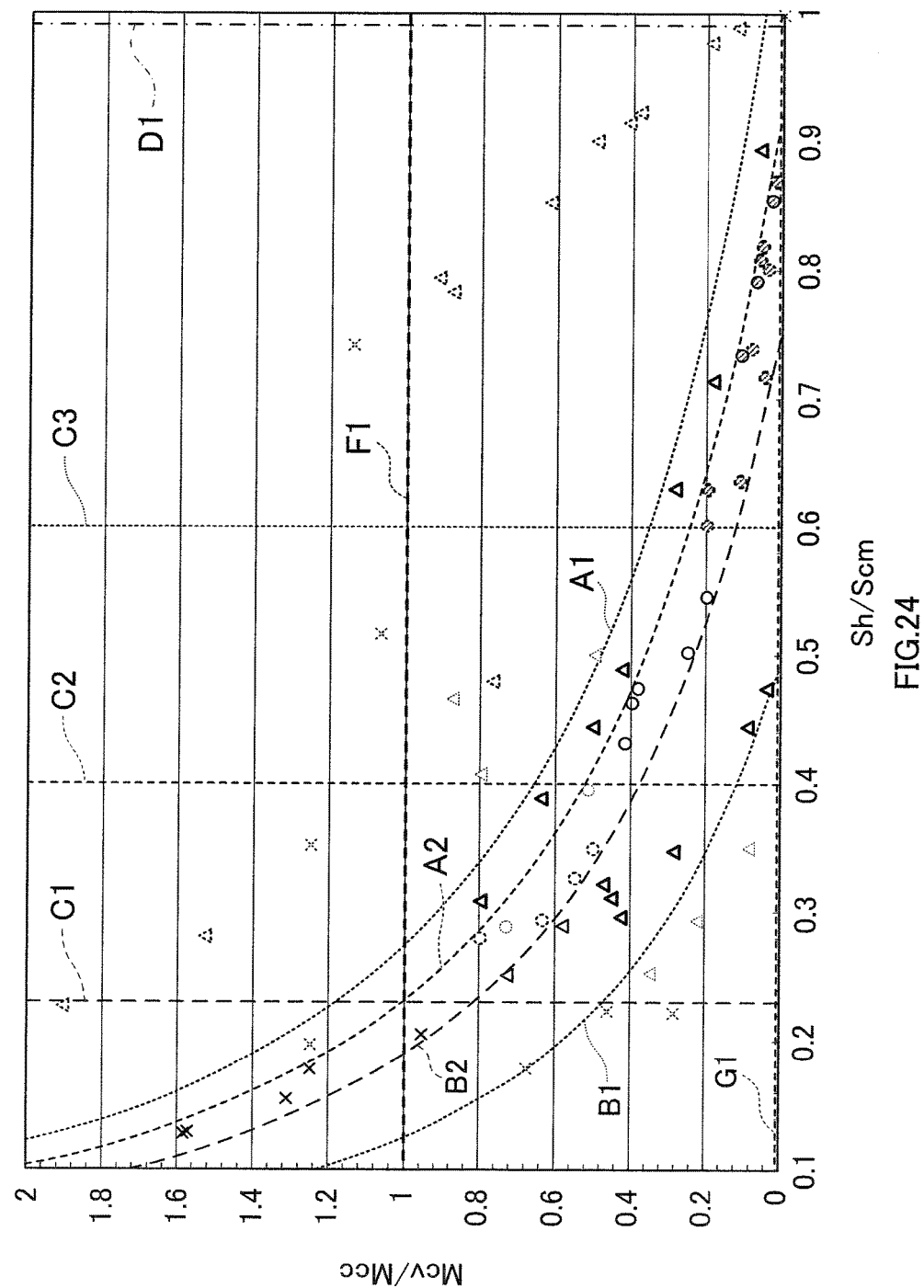
FIG. 24 is a graph showing evaluation results of Example 10.

The results are described in FIG. 24. FIG. 24 is a graph showing the evaluation results of Example 10. In FIG. 24, the horizontal axis represents the ratio (Sh/Scm) with respect to the nanostructure of the carrier, and the vertical axis represents the ratio (Mcv/Mcc) with respect to the nanostructure of the carrier. The circular signs and triangular sings in FIG. 24 represent the cases that the above-mentioned evaluation results were the good evaluation, and it is shown that the circle sing is a higher evaluation than the triangular sign, the solid line is a higher evaluation than the dashed line, and that the shaded portion is a higher evaluation than the solid line. Further, in FIG. 24, X signs indicate the case where the above-mentioned evaluation results were the poor evaluation. In addition, also in the poor evaluations, the rate at which the convex portions were broken, the distribution of the thickness of the first functional layer on the convex-portion vertex portions and the distribution of the thickness of the second functional layer remained within a range of 18% to 26%.

<Triangular Sign>
Triangular Sign of Dashed Line
The case where the distributions exceeded 10% and were 15% or less.
Triangular Sign of Solid Line
The case where the distributions exceeded 8% and were 10% or less.

<Circular Sign>
White circular sign of dashed line
The case where the distributions exceeded 5% and were 8% or less.
White circular sign of solid line
The case where the distributions exceeded 3% and were 5% or less.
Black-shaded circular sign
The case where the distributions were 0% or more and 3% or less.

The curve A1 represents $(Mcv/Mcc)=\sqrt{(1.1/(Sh/Scm))}-1$, the curve A2 represents $(Mcv/Mcc)=\sqrt{(0.93/(Sh/Scm))}-1$, the curve B1 represents $(Mcv/Mcc)=\sqrt{(0.5/(Sh/Scm))}-1$, the curve B2 represents $(Mcv/Mcc)=\sqrt{(0.76/(Sh/Scm))}-1$, the straight line C1 represents (Sh/Scm)=0.23, the straight line C2 represents (Sh/Scm)=0.4, the straight line C3 represents (Sh/Scm)=0.6, the straight line D1 represents (Sh/Scm)=0.99, the straight line F1 represents lcv/lcc=1, and the straight line G1 represents lcv/lcc=0.01.

From the above-mentioned results, it is understood that by concurrently meeting the above-mentioned equations (1), (2) and (3), the functional layers were transferred with high thickness accuracy of the first functional layer and with high thickness accuracy of the second functional layer. For this, first, it is conceivable that uniformity of the coating liquid of the first functional layer and the coating liquid of the second functional layer applied onto the nanostructure of the carrier is improved on a scale sufficiently larger than the nanostructure. In addition, in the following description, the coating liquid of the first functional layer and the coating liquid of the second functional layer are respectively described as the first coating liquid and functional coating liquid. In other words, it is conceivable that in the coating liquid of the case of viewing on a scale such as one by one of the nanostructure of the carrier, it is possible to decrease the energy gradient inside the coating liquid of the case of averaging viewed on a macro scale such as several thousands to several tens of thousands of nanostructures of the carrier, coating properties are thereby improved, and that the arrangement accuracy of the first functional layer and the film thickness accuracy of the second functional layer was thereby improved. Further, in the case of meeting the above-mentioned range, it is conceivable that it is possible to decrease peeling stress applied to the bottom-portion outer edge portion of the convex portion of the nanostructure of the second functional layer in removing the carrier from the first functional layer and the second functional layer, and that the transfer properties were thereby improved.

Further, it is understood that by concurrently meeting the above-mentioned equations (5), (2) and (3), it was possible to transfer with high thickness accuracy of the first functional layer and with high thickness accuracy of the second functional layer. For this, it is conceivable that in the coating liquid of the case of viewing on a scale such as one by one of the nanostructure of the carrier, it is possible to decrease the energy gradient inside the coating liquid of the case of averaging viewed on a macro scale such as several thousands to several tens of thousands of nanostructures of the carrier. In other words, it is conceivable that uniformity of the coating liquid applied onto the nanostructure of the carrier is improved on a scale sufficiently larger than the nanostructure of the carrier, and that coating properties are improved.

Further, it is understood that by concurrently meeting the above-mentioned equation (5), $0.4 \leq (Sh/Scm) \leq 0.99$, and equation (3), transfer was performed while more reflecting the thickness accuracy of the first functional layer and the thickness accuracy of the second functional layer. The reason is conceivable that in the case of meeting the above-mentioned ranges, in the coating liquid applied to the nanostructure of the carrier, energy of the coating liquid positioned on the concave portion of the nanostructure becomes unstable, and that in order to resolve the instability of energy, the coating liquid is easy to flow in the concave-portion inner portion of the nanostructure of the carrier. Further, peeling stress applied to the bottom-portion outer edge portion of the concave portion of the nanostructure of the carrier in removing the carrier is suppressed by moment energy decreasing. It is presumed the transfer accuracy is improved by this means. Further, it is understood that these effects are more remarkable by concurrently meeting the above-mentioned equation (5), $0.6 \leq (Sh/Scm) \leq 0.99$, and equation (3).

In addition, it was observed that the nanostructure of the used carrier as described above was the hole structure in which mutually separate concave portions were divided by continuous convex portions, and that the area of the hole opening portion was larger than the area of the hole bottom portion.

In addition, repetition transfer properties (durability) of the carrier were checked, and it was confirmed that the repetition transfer properties were more excellent as Sh/Scm decreased to 0.95, 0.93 and 0.91 in the range of $Sh/Scm \leq 0.99$. The repetition transfer properties herein mean repeating the acts of manufacturing the function transfer product A4, cleaning the used function transfer product A4 with a solvent, obtaining the used carrier, manufacturing the function transfer product A4 again using the used carrier, and using again. More specifically, the number of repetitions was 3 in the case of Sh/Scm=0.99. Then, as Sh/Scm decreased to 0.95, 0.93 and 0.91, the number of repetitions increased to 5, 10, and 15. This is presumed that the physical strength of the convex portions surrounding the concave portions of the nanostructure of the carrier was increased. From the foregoing, it is understood that it is possible to manufacture the function transfer product A4 many times using a single carrier when Sh/Scm is 0.95 or less. Particularly, when Sh/Scm is 0.93 and further 0.91, the above-mentioned effect is more remarkable.

Next, the target object was subjected to nano-processing using the function transfer product A4. Using the first functional layer/second functional layer/target object with the results of FIG. 24 of above-mentioned Example 10 obtained, etching using oxygen was performed as in Example 6 to perform the nano-processing on the second functional layer. In the following description, the layered product such that the second functional layer was subjected to etching processing using the first functional layer as a processing mask is described as a fine mask pattern. Next, as in Example 6, ICP-RIE was performed to perform the nano-processing on the target object. In addition, in the following description, the target object processed using the fine mask pattern is described as a fine pattern structure product, and the nanostructure provided on the surface of the target object is described as a fine pattern.

As described above, the obtained fine pattern structure products, and fine mask patterns that were former products of the fine pattern structure products were evaluated. The evaluation indicators were as described below.

The distribution with respect to the thickness of the trunk of the fine mask pattern, and the distributions of the height of the convex portion and the convex-portion bottom portion diameter of the fine pattern of the fine pattern structure product were calculated by SEM observation. The case where the distributions exceeded 10% was made a poor evaluation, and the case of 10% or more was made a good evaluation.

Figure 25:
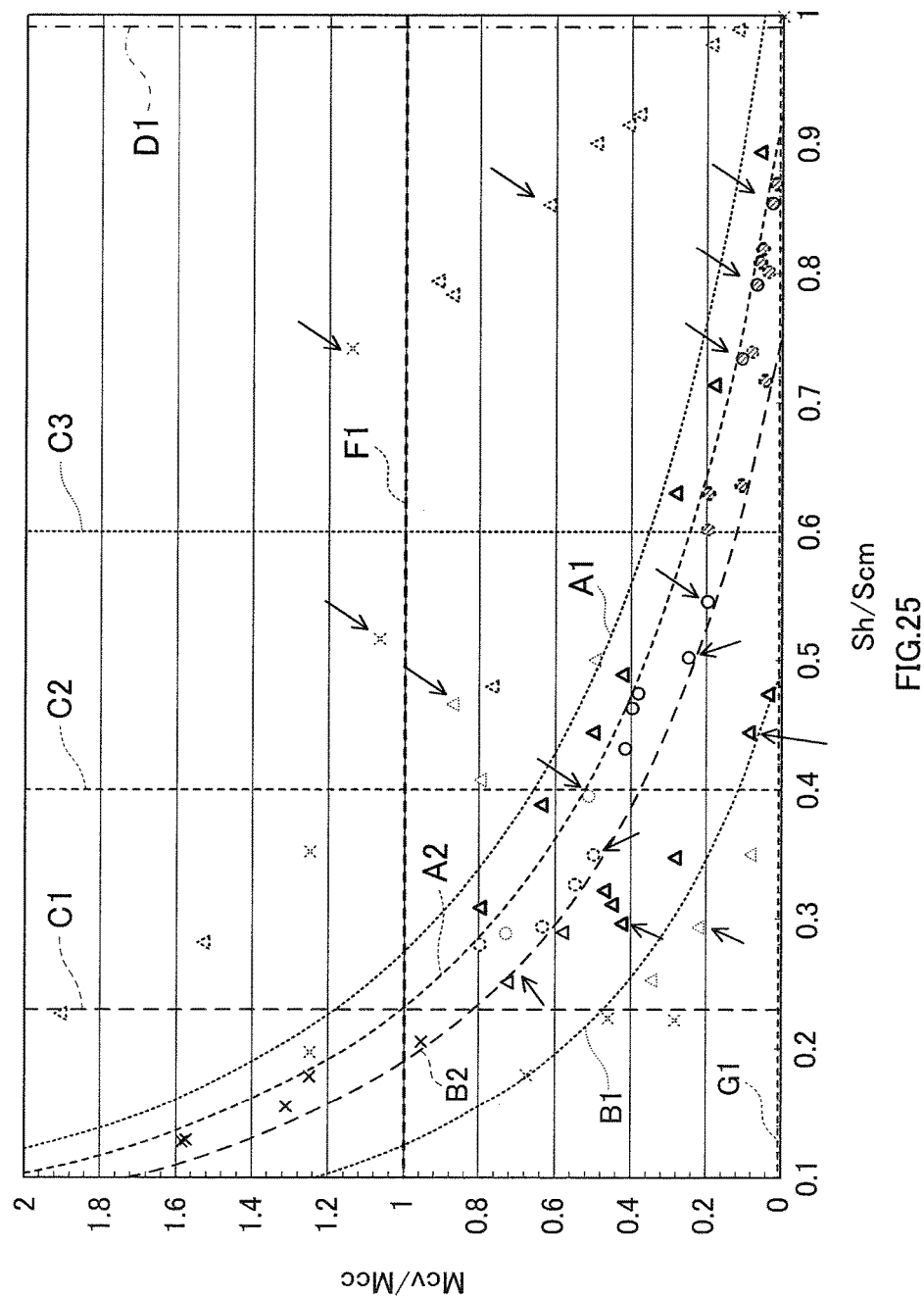
FIG. 25 is a graph showing evaluation results of a fine pattern structure product and fine mask pattern of Example 10.

The results are shown in FIG. 25. FIG. 25 is a graph showing the evaluation results of the fine pattern structure products and fine mask patterns of Example 10. In FIG. 25, samples evaluated as described above are indicated by the arrows with respect to FIG. 24.

The signs that are not indicated by arrows in FIG. 25 are the same as those in FIG. 24, and the signs indicated by the arrows mean the following evaluation results. The circular signs and triangular sings indicated by the arrows represent the cases that all of the above-mentioned evaluation results were the good evaluation, and it is shown that the circle sing is a higher evaluation than the triangular sign, the solid line is a higher evaluation than the dashed line, and that the shaded portion is a higher evaluation than the solid line. Further, the X signs indicated by the arrows represent the case where at least one poor evaluation was present in the above-mentioned evaluations. In addition, also in the cases of the X signs, the distributions were all included in a range of exceeding 10% to 15% or less.

<Triangular Sign>
  Triangular sign of dashed line
    The case where the distributions were 10% or less and 9% or more.
  Triangular sign of solid line
    The case where the distributions were less than 9% and 8% or more.
<Circular Sign>
  White circular sign of dashed line
    The case where the distributions were less than 8% and were 6% or more.
  White circular sign of solid line
    The case where the distributions were less than 6% and 4% or more.
  Black-shaded circular sign
    The case where the distributions were less than 4%.

The curves A1, A2, B1 and B2 and the straight lines C1, C2, C3, D1, F1 and G1 are the same as those in FIG. 24.

From the above-mentioned results, it is understood that by concurrently meeting the above-mentioned equations (1), (2) and (3), improvements are made to accuracy of the fine mask pattern obtained by performing dry etching processing on the second functional layer using the first functional layer as a processing mask, and to accuracy of the fine pattern obtained by performing etching processing using the fine mask pattern as a processing mask. This is because from the principles as described already, by the nanostructure of the carrier meeting the predetermined range, improved was filling arrangement accuracy of the first functional layer in the concave portions of the nanostructure of the carrier and film thickness uniformity of the second functional layer, it was thereby possible to lowly maintain the distributions of the first functional layer and second functional layer transferred onto the target object using the function transfer product A4, and it was possible to process the fine mask pattern and fine pattern while reflecting the accuracy of the first functional layer and second functional layer with high accuracy. In other words, as the filling arrangement accuracy of the first functional layer in the concave-portion inner portions of the nanostructure and film thickness uniformity of the second functional layer is improved, the accuracy of the fine pattern structure product is improved. Herein, excellence in the filling arrangement properties of the first functional layer means that the first functional layer partially adhering to the concave-portion inner walls of the nanostructure of the carrier is little or does not exist in the first functional layer arranged in the concave-portion inner portions of the nanostructure of the carrier. Accordingly, as considered in FIG. 24, it is conceivable that the accuracy of the fine pattern structure product is more improved by meeting the following range, and the improvement was actually confirmed by the study.

By concurrently meeting the above-mentioned equations (5), (2), and (3), the accuracy of the fine pattern structure product was more improved. Further, by concurrently meeting the above-mentioned equation (5), $0.4 \leq (Sh/Scm) \leq 0.99$, and equation (3), the accuracy of the fine pattern structure product was further improved. Furthermore, it was confirmed that by concurrently meeting the above-mentioned equation (5), $0.6 \leq (Sh/Scm) \leq 0.99$, and equation (3), these effects were more remarkable.

Next, using the obtained fine pattern structure product i.e. sapphire substrate provided with the fine pattern, LED devices were prepared, and light-emitting characteristics were evaluated. In addition, in the following study, the average pitches of the nanostructures of the carriers were totally adjusted to 300 nm.

By an organic metal chemical vapor deposition method (MOCVD), a semiconductor light emitting device was prepared by successively stacking, on the fine pattern structure product, (1) AlGaN low-temperature buffer layer, (2) n-type GaN layer, (3) n-type AlGaN clad layer, (4) InGaN light emitting layer (MQW), (5) p-type AlGaN clad layer, (6) p-type GaN layer and (7) ITO layer. The fine pattern on the sapphire substrate was embedded and flattened on the deposition conditions in layering the (2) n-type GaN layer. Next, the semiconductor light emitting device (A) was subjected to etching processing, and electrode pads were attached. In this state, using a prober, a current of 20 mA was passed through between p-electrode pad and n-electrode pad to measure light emitting output of the semiconductor light emitting device (A).

The following two evaluations were performed. First, using a sapphire substrate without being provided with the fine pattern, a semiconductor light emitting device was prepared by the above-mentioned method. Assuming that the light emitting output of the semiconductor light emitting device is 1, the evaluation was made to the light emitting output of the semiconductor light emitting devices prepared by using the fine pattern structure products. Second, the evaluation was made to the distributions of the light emitting output of the semiconductor light emitting devices.

Figure 26:
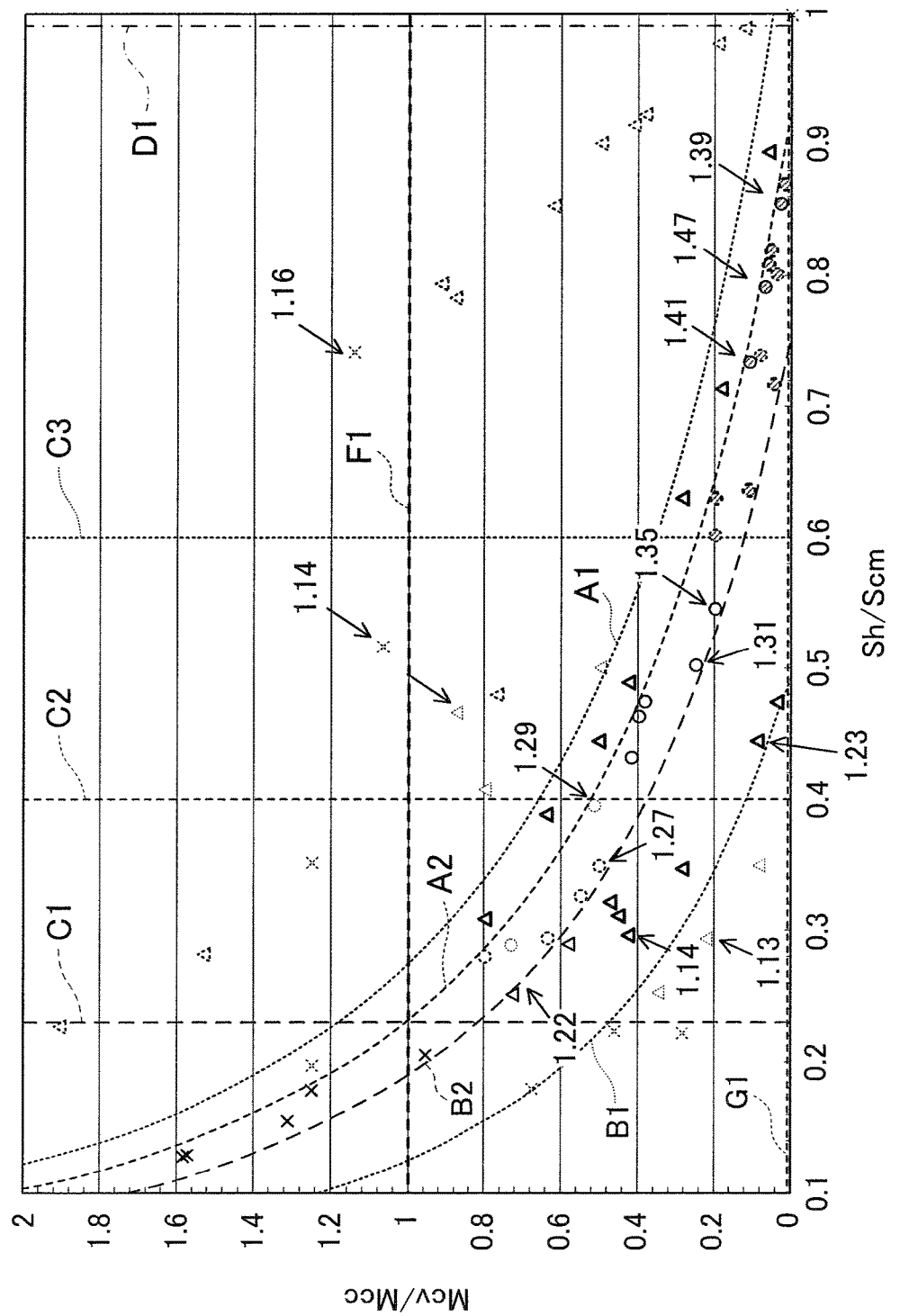
FIG. 26 is a graph showing evaluation results of semiconductor light emitting devices of Example 10.

The results are shown in FIG. 26. FIG. 26 is a graph showing the evaluation results of the semiconductor light emitting devices of Example 10. FIG. 26 indicates the samples evaluated as described above by arrows with respect to FIG. 24.

In FIG. 26, the signs that are not indicated by arrows are the same as those in FIG. 24, and the signs indicated by the arrows mean the following evaluation results. The circular signs and triangular sings indicated by the arrows represent the cases that the evaluation result of the output distribution of the semiconductor light emitting device as described above was good, and it is shown that the circular sign is a higher evaluation than the triangular sign, the solid line is a higher evaluation than the dashed line, and that the shaded portion is a higher evaluation than the solid line. Further, the X signs indicated by the arrows represent the case where the light emitting output distribution was judged being too large. Further, the numeric value in FIG. 26 means the light emitting output ratio.

<X sign>
The case where the distribution of light emitting output exceeded ±15% and was ±20% or less.

<Triangular Sign>
Triangular sign of dashed line
The case where the distribution of light emitting output was ±15% or less.
Triangular sign of solid line
The case where the distribution of light emitting output was ±11% or less.

<Circular Sign>
White circular sign of dashed line
The case where the distribution of light emitting output was +8% or less.
White circular sign of solid line
The case where the distribution of light emitting output was +6% or less.
Black-shaded circular sign
The case where the distribution of light emitting output was +4% or less.

The curves A1, A2, B1 and B2 and the straight lines C1, C2, C3, D1, F1 and G1 are the same as those in FIG. 24.

From the above-mentioned results, it is understood that by concurrently meeting the above-mentioned equations (1), (2) and (3), it is possible to manufacture semiconductor light emitting devices with high light emitting intensity and small light emitting output distribution. As described above, by meeting these ranges, this is because it is possible to manufacture the function transfer product A4 with high arrangement accuracy of the first functional layer and high film thickness accuracy of the second functional layer, improved was the arrangement accuracy with respect to the second functional layer of the first functional layer transferred onto the target object and the film thickness uniformity of the second functional layer, the accuracy of the fine mask pattern was thereby enhanced, and the accuracy of the fine pattern was finally improved. By using the sapphire substrate provided with such a fine pattern, it is presumed that first, the distribution of the effect of disturbing the growth mode of the semiconductor crystal layer inside the surface is decreased, i.e. it is possible to disturb the growth mode uniformly, and that internal quantum efficiency is improved inside the surface. Further, by the effect of light diffraction properties due to the fine pattern, light extraction efficiency is improved. In view of the foregoing, it is presumed that since external quantum efficiency of the semiconductor light emitting device is improved, the light emitting output was increased, and that the distribution was further decreased.

Further, it was confirmed that by concurrently meeting the above-mentioned equations (5), (2), and (3), both the light emitting output and the distribution of light emitting output was improved. The reason is presumed that it is possible to manufacture the fine pattern structure product with high accuracy from the already described mechanism, and that by meeting the above-mentioned ranges, since accuracy of the flat surface of the concave bottom portion of the fine pattern structure product is improved, internal quantum efficiency is more improved.

Furthermore, it was confirmed that by concurrently meeting the above-mentioned equation (5), $0.4 \leq (Sh/Scm) \leq 0.99$, and equation (3), both the light emitting output and the distribution of light emitting output was more improved. The reason is considerable due to the results of the fact that it is possible to manufacture the fine pattern structure product with high accuracy from the already described mechanism, and of improvement in light extraction efficiency caused by the fact that it is possible to increase the volume of the convex portion of the fine pattern structure product. Still furthermore, it was confirmed that by concurrently meeting the above-mentioned equation (5), 0.6≤(Sh/Scm)≤0.99, and equation (3), these effects were more remarkable.

The light emitting output slightly decreased near Sh/Scm being 0.85, and the reason is conceivable that the area of the concave bottom portion of the fine pattern structure product was too small. With respect thereto, it was confirmed that it is possible to resolve by applying over etching in etching to form the fine mask pattern and etching to form the fine pattern. In other words, it was possible to easily control the diameter of the bottom portion, the height, the size of the table top and the inclined angle of the side surface of the convex portion of the fine pattern by the conditions of etching.

Example 11

As described above, from Examples 6 to 10, it was understood that it is possible to transfer while reflecting the accuracy of the functional layer of the function transfer product in the target object when the function transfer product meets the ratio (Ra/lor) and the average pitch of the nanostructure. Particularly, it was understood that the transfer properties are improved by at least the uppermost layer of the functional layer containing polar groups, and that both the arrangement accuracy and the transfer properties of the functional layer are improved by the nanostructure meeting the predetermined range. The function transfer products were broadly classified into two. First, it is the case where the functional layer is transferred to the target object, and the function specific to nanostructure is developed by the transferred functional layer. Next, it is the case where the functional layer is transferred to the target object, the target object is subjected to nano-processing using the transferred functional layer as a processing mask, and the function specific to nanostructure is produced in the target object subjected to nano-processing. In Example 11, substrates hard to process were selected, and more preferable physical properties of the functional layer were examined in the case of performing nano-processing on the target object using the function transfer product. From Example 6, it is understood that it is possible to perform nano-processing on the target object by adopting any of the function transfer products A1 to A5. Therefore, in Example 11, the function transfer product A3 was represented and used. In addition, the function transfer product A3 was the function transfer product in which the first functional layer was provided on the convex-portion vertex portions of the nanostructure of the carrier G2, and the second functional layer was provided to flatten the first functional layer and the nanostructure of the carrier. Further, the carrier G1 was used as the carrier. Furthermore, the manufacturing method and use method of the function transfer product A3 were the same as in Example 6, and the target object was processed. As the target object, the target object T-2 was selected. The parameters were compositions of the first functional layer and second functional layer.

As the first functional layer, the following compositions F-1 to F7 were used.

Composition F-1
The composition was a material obtained by mixing titanium tetrabutoxide, tetramer (made by Wako Pure Chemical Industries, Ltd.): titanium tetrabutoxide, monomer (made by Wako Pure Chemical Industries, Ltd.): 3-acryloxypropyl trimethoxysilane (made by Shin-Etsu silicone corporation): phenyl-modified silicone (made by Dow Corning Toray Co., Ltd.): photopolymerization initiator=35.86 g: 29.34 g: 34.8 g: 5.0 g: 2.6 g. In addition, as the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and mixed in a ratio of Irgacure 184:Irgacure 369=2.75:1.

Composition F-2 The composition was a material obtained by mixing tetra-propoxy zirconium: 3-acryloxypropyl trimethoxysilane (made by Shin-Etsu silicone corporation): phenyl-modified silicone (made by Dow Corning Toray Co., Ltd.): photopolymerization initiator=65.2 g: 34.8 g: 5.0 g: 2.6 g. In addition, as the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and mixed in a ratio of Irgacure 184:Irgacure 369=2.75:1.

Composition F-3
The composition was a material obtained by mixing tetra-propoxy zirconium:zinc tert-butoxide:3-acryloxypropyl trimethoxysilane (made by Shin-Etsu silicone corporation):phenyl-modified silicone (made by Dow Corning Toray Co., Ltd.): photopolymerization initiator=65.2 g: 1.956 g: 34.8 g: 5.0 g: 2.6 g. In addition, as the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and mixed in a ratio of Irgacure 184:Irgacure 369=2.75:1.

Composition F-4
The composition was a material obtained by mixing titanium tetrabutoxide: tin(IV) tetrabutoxide: 3-acryloxypropyl trimethoxysilane (made by Shin-Etsu silicone corporation): phenyl-modified silicone (made by Dow Corning Toray Co., Ltd.): photopolymerization initiator=65.2 g: 1.956 g: 34.8 g: 5.0 g: 2.6 g. In addition, as the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and mixed in a ratio of Irgacure 184:Irgacure 369=2.75:1.

Composition F-5
The composition was a material obtained by mixing tetra-ethoxy boron: 3-acryloxypropyl trimethoxysilane (made by Shin-Etsu silicone corporation): phenyl-modified silicone (made by Dow Corning Toray Co., Ltd.): photopolymerization initiator=39.12 g: 26.08 g: 1.956 g: 34.8 g: 5.0 g: 2.6 g. In addition, as the photopolymerization initiator, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system were selected, and mixed in a ratio of Irgacure 184:Irgacure 369=2.75:1.

Composition F-6

Titanium tetrabutoxide: 3-acryloxypropyl trimethoxysilane=70 g: 30 g were mixed, and then, 1 g of ethanol with 3.12% of water added was dropped into the mixture. Next, the resultant was stirred in an atmosphere of 80° C. for 24 hours to promote hydrolysis and polycondensation.

Subsequently, the pressure was reduced to remove water, ethanol and butanol and propanol that were by-products. In addition, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system which are photopolymerization initiators were mixed in a ratio of Irgacure 184:Irgacure 369=2.75:1, added to a solvent used in coating, and were used. Further, the photopolymerization initiators were set at 7.5 weight % relative to 3-acryloxypropyl trimethoxysilane.

Composition F-7

Titanium tetrabutoxide: tetra-propoxy zirconium:tetra-ethoxyboron:3-acryloxypropyl trimethoxysilane=65 g: 35 g: 5 g: 30 g were mixed, and then, 1.2 g of ethanol with 6.12% of water added was dropped into the mixture. Next, the resultant was stirred in an atmosphere of 80° C. for 24 hours to promote hydrolysis and polycondensation.

Subsequently, the pressure was reduced to remove water, ethanol and butanol and propanol that were by-products. In addition, 1-hydroxy-cyclohexyl-phenyl-ketone (Irgacure 184, made by BASF Company) that is an α-hydroxy alkyl phenon system, and 2-benzyl-2-dimethylamino-1-(4-morpholino phenyl)-butanone-1 (Irgacure 369, made by BASF Company) that is an α-amino alkyl phenon system which are photopolymerization initiators were mixed in a ratio of Irgacure 184:Irgacure 369=2.75:1, added to a solvent used in coating, and were used. Further, the photopolymerization initiators were set at 7.5 weight % relative to 3-acryloxypropyl trimethoxysilane.

The above-mentioned compositions F-1 to F-7 were used according to the manufacturing method of the function transfer product A3 of Example 6 to prepare formed products each provided with the first functional layer on convex-portion vertex portions of the nanostructure of the carrier G1. The obtained formed products were analyzed using the SEM and EDX together. As a result, it was confirmation that the first functional layer was provided on only the convex-portion vertex portions of the nanostructure of the carrier G1, irrespective of the types of compositions. Further, the thicknesses of the first functional layers slightly differed among the compositions F-1 to F-7, and were in a range of 200 nm to 240 nm. In addition, the depth of the nanostructure of the carrier G1 was the same as in Example 6, and was 280 nm.

As the second functional layer, the following compositions F-8 to F-19 were used.

Composition F-8 Binder resin containing the following cyclic portion (C): The resin was copolymer comprised of the above-mentioned repeating unit (a) and the following repeating unit (h). The molecular weight was 2900. The ratio (Nh/Na) between the number Nh of repetitions of the repeating unit (h) and the number Na of repetitions of the repeating unit (a) was 9. In addition, X represents the cyclic portion (C), and corresponds with "*" of the cyclic portion (C).

[Chemistry 14]

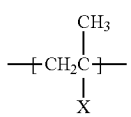

(Repeating unit (h))

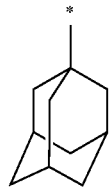

(Cyclic portion (c))

Composition F-8

Binder resin containing the following cyclic portion (D): The resin was poly(N-vinylcarbazole) polymer with a molecular weight of 580. In addition, as the photopolymerization initiator, 3.8 weight % of 1-hydroxy-cyclohexyl-phenyl-ketone (Irgacure 184, made by BASF Company) that is an α-hydroxy alkyl phenon system was added to the binder resin.

[Chemistry 15]

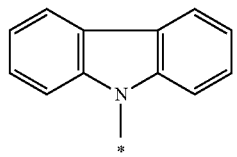

(Cyclic portion (D))

[Chemistry 16]

(Structural formula of the binder resin of the composition F-9)

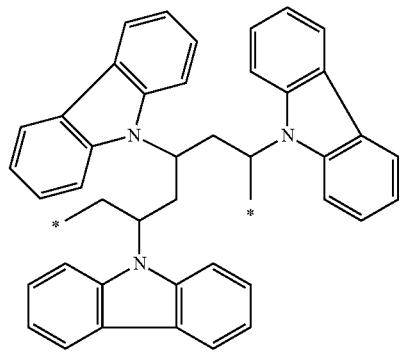

Composition F-10

Binder resin containing the above-mentioned cyclic portion (D): The resin was poly(N-vinylcarbazole) polymer with a molecular weight ranging from 25000 to 50000.

[Chemistry 17]

(Structural formula of the binder resin of the composition F-10)

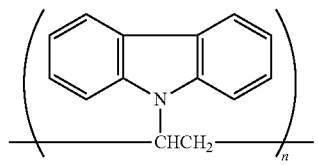

Composition F-11

The composition was the binder resin as described in the composition A-1. In addition, as the photopolymerization initiator, 3.17 weight % of 1-[9-ethyl-6-(2-methyl benzoyl)-

9H-carbazole-3-yl]-, 1-(0-acetyloxime) (Irgacure OXE 02, made by BASF Company) that is an oxime ester-based ethanone was added to the binder resin.

Composition F-12

The monomer having the cyclic portion (B) as described in the composition A-1 was added to the composition F-8. The molecular weight of the monomer was 546, and was photopolymerizable monomer with two functional groups. The photopolymerizable group was an acryloyl group. The mixing ratio between the binder resin and the monomer was set at 3.6:6.4 in parts by weight.

Composition F-13

The monomer used in the composition F-12 was added to the composition F-9. The mixing ratio between the binder resin and the monomer was set at 7.1:2.9 in parts by weight. In addition, an additive amount of the photopolymerization initiator was adjusted to 3.48 weight % relative to the total amount of the binder resin and the monomer.

Composition F-14

The monomer used in the composition F-12 was added to the composition F-10. The mixing ratio between the binder resin and the monomer was set at 6.2:3.8 in parts by weight.

Composition F-15

The monomer used in the composition F-12 was added to the composition F-11. The mixing ratio between the binder resin and the monomer was set at 4.8:5.2 in parts by weight. In addition, an additive amount of the photopolymerization initiator was adjusted to 3.49 weight % relative to the total amount of the binder resin and the monomer.

Composition F-16

The composition was a binder resin made of copolymer comprised of the following repeating unit (i) and the above-mentioned repeating unit (a), the average molecular weight was 5500, and the ratio (Ni/Na) between the number Ni of repetitions of the repeating unit (i) and the number Na of repetitions of the repeating unit (a) was 1.5. In addition, 4.2 weight % of 1-[9-ethyl-6-(2-methyl benzoyl)-9H-carbazole-3-yl]-, 1-(0-acetyloxime) (Irgacure OXE 02, made by BASF Company) that is an oxime ester-based ethanone and the photopolymerization initiator was added to the binder resin.

[Chemistry 18]

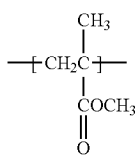

(Repeating unit (i))

Composition F-17

The composition was a binder resin made of copolymer comprised of the above-mentioned repeating unit (i) and the above-mentioned repeating unit (a), the average molecular weight was 100000, and the ratio (Ni/Na) between the number Ni of repetitions of the repeating unit (i) and the number Na of repetitions of the repeating unit (a) was 0.67. In addition, 3.12 weight % of 1-[9-ethyl-6-(2-methyl benzoyl)-9H-carbazole-3-yl]-,1-(0-acetyloxime) (Irgacure OXE 02, made by BASF Company) that is an oxime ester-based ethanone and the photopolymerization initiator was added to the binder resin.

Composition F-18

The monomer used in the composition F-12 was added to the composition F-16. The mixing ratio between the binder resin and the monomer was set at 4.3:5.7 in parts by weight. In addition, an additive amount of the photopolymerization initiator was adjusted to 3.48 weight % relative to the total amount of the binder resin and the monomer.

Composition F-19

The monomer used in the composition F-12 was added to the composition F-17. The mixing ratio between the binder resin and the monomer was set at 4.8:5.2 in parts by weight. In addition, an additive amount of the photopolymerization initiator was adjusted to 3.48 weight % relative to the total amount of the binder resin and the monomer.

Each of the above-mentioned compositions F-8 to F-19 was applied onto the nanostructure surface of the carrier G1 provided with the first functional layer as in Example 6. In addition, the dilute solvent was changed to a mixed solvent of cyclohexanone, propylene glycol monomethyl ether and methyl isobutyl ketone. Further, the drying temperature was set at 105° C.

As in use of the function transfer product A3 of Example 6, processing of a sapphire substrate was performed. Used as the sapphire substrate was a c-surface sapphire of 4-inch Φ with an off angle of 0.2 degree. First, as in the function transfer product A3 of Example 6, the functional layer of the function transfer product was transferred to the target object. Next, as in Example 6, etching using an oxygen gas was performed, and nano-processing was performed on the second functional layer using the first functional layer as a processing mask. When the etching processing was suspended in this state, and the first functional layer and the second functional layer were observed using the SEM, it was confirmed that the volume of the first functional layer changed little, and that the second functional layer was subjected to the nano-processing. From another study, when respective flat films of the compositions F-1 to F-19 were prepared and the etching rates were calculated, the rates of the compositions F-1 to F-7 were 0.1 time to 0.02 time the rates of the compositions F-8 to F-19. In other words, since the first functional layer was sufficiently high in dry etching resistance as compared with the second functional layer, the second functional layer was capable of being preferentially subjected to nano-processing. Further, with the TEM and EDX combined, metal elements contained in the first functional layer were mapped, and mapping of metal elements was observed in the side walls of the second functional layer. This means that the metal component contained in the first functional layer shifted to the second functional layer side walls during the dry etching processing. As described already, the first functional layer was sufficiently high in etching resistance as compared with the second functional layer. Accordingly, since the side walls of the second functional layer were protected by the first functional layer, it is conceivable that etching proceeded excellently. Next, using the second functional layer as a processing mask, as in Example 6, RIE was performed, and the target object was subjected to nano-processing.

Finally, cleaning was performed as in Example 6 to obtain the sapphire substrate provided with the fine pattern on its surface.

The fine pattern of the sapphire provided with the fine pattern on its surface was observed using the SEM. From the observed image, in the fine pattern, a plurality of convex portions was arranged mutually independently. Herein, a direction perpendicular to the average surface of the convex-portion bottom portion was assumed to be a direction X. A line segment that passed through the vertex of the convex portion and that was parallel to the direction X was assumed to be a line segment Y. Next, a line segment that passed through the center portion of the convex-portion bottom portion and that was parallel to the direction X was assumed to be Z. At this point, the line segments Y and Z were parallel to each other. A distance between the line segments Y and Z was assumed to be a distance YZ. The distance YZ is an indicator indicative of a deviation amount of the convex-portion vertex, and by representing the average pitch as Pave, (YZ/Pave) can generally be expressed as a ratio with the average pitch. As the ratio (YZ/Pave) is smaller i.e. approaches 0, it is meant that performance as a mask for etching processing is higher in the second functional layer i.e. the above-mentioned compositions F-8 to F-19.

TABLE 21

| COMPOSITION | YZ/Pave | EVALUATION SIGN |
|---|---|---|
| F-8 | 0.022 | ◯ |
| F-9 | 0.007 | ◉ |
| F-10 | 0.007 | ◉ |
| F-11 | 0.007 | ◉ |
| F-12 | 0.015 | ◯ |
| F-13 | 0.004 | ◉ |
| F-14 | 0.004 | ◉ |
| F-15 | 0.004 | ◉ |
| F-16 | 0.050 | Δ |
| F-17 | 0.079 | Δ |
| F-18 | 0.059 | Δ |
| F-19 | 0.118 | Δ |

The results are described in Table 21. From Table 21, the following matters are understood. In addition, in Table 21, a value of 0.004 described in the field of YZ/Pave means that the distance YZ is 0 or approximately 0. Since it is difficult to accurately judge 0 nm from SEM observation, a value of 3 nm that is approximately 0 is substituted into the distance YZ in a stage of exceeding resolution. First, by using the binder resin or monomer having the cyclic portion, the ratio (YZ/Pave) is decreased. In other words, mask performance is improved as dry etching. As the reason, it is possible to consider that packing of cyclic portions between molecules tends to occur, the density of the second functional layer is improved, and that by π electrons existing in the cyclic portion, it is possible to trap chlorine radicals during dry etching, while delocalizing. Among the matters, by the binder resin containing the cyclic portion, the ratio (YZ/Pave) was more decreased, and accuracy of the fine pattern was improved. The reason is presumed that the binder resin has a large molecular weight, and therefore, is high in motion mobility, but by containing the cyclic portion, is capable of using flatness properties of the cyclic portion, packing of cyclic portions and the like to thereby decrease the mobility. Further, since the binder resin contains mainly the repeating units and the cyclic portion is arranged for each repeating unit, it is presumed that the cyclic portion density contained in the first mask layer is increased, and that the trapping effect of chlorine radicals as described above is enhanced. Among the matters, the ratio (YZ/Pave) is more decreased by containing the cyclic portions in both the binder resin and the monomer. It is conceivable this is because the effect of the cyclic portion as described already is enhanced. Further, in the case of noting the binder resin, the processing accuracy was more excellent in the case of adopting the homopolymer or homooligomer than in adopting the copolymer. The reason is presumed that a dry etching rate difference exists in molecules forming the binder resin in the case of the copolymer.

Further, when extreme dry etching was separately performed by applying heat to the stage in dry etching processing, in the case where the second functional layer contained photo-reactive portions, it was confirmed that the above-mentioned ratio (YZ/Pave) was decreased. The reason is presumed that the mobility of the binder resin is bound by photoreaction (photo-radical reaction) and that resistance to thermal vibration is improved. The highest effect was in the case where photocurable groups were contained in both the binder resin and the monomer.

From the foregoing, in the case of using the function transfer product as the mask transfer product, it was understood that cyclic portions are preferably contained in the functional layer functioning as a processing mask of the target object in the functional layers forming the function transfer product, and that it is effective that the functional layer is comprised of the binder resin and the monomer and that at least one of the binder resin and the monomer is polymerizable.

In addition, as in the preliminary study of Example 6, a pressure-sensitive tape was bonded to the functional layer surface of the function transfer product, and then, was peeled off. At this point, when the strength required for peeling was measured, it was confirmed that the strength was decreased to 80% to 60% in the case where the functional layer contains cyclic portions as compared with the case of not containing. This is important in using the function transfer product. In other words, since it is possible to decrease the adhesion strength between the functional layer and the nanostructure by containing cyclic portions in the functional layer, it is meant that it is possible to suppress the destruction of the functional layer with more excellence. This tendency was remarkable particularly in the case of containing both the cyclic portion and the photopolymerizable group.

In addition, the present invention is not limited to the above-mentioned Embodiment, and is capable of being carried into practice with various modifications thereof. In the above-mentioned Embodiment, the sizes, shapes and the like shown in the accompanying drawings are not limited thereto, and are capable of being modified as appropriate within the scope of exhibiting the effects of the invention.

INDUSTRIAL APPLICABILITY

The present invention is applicable to provide target objects with various functions, and for example, is suitably applicable to a trace substance detecting sensor, nano-reaction field, antireflection surface, high-efficient semiconductor light emitting device, quantum dot device, photonic crystal device, decorative materials using light diffraction colors, decorative materials using a photonic band gap, optical waveguide, nano-circuit, nano-dielectric antenna, superhydrophobic surface, superhydrophilic surface, high-efficient photocatalyst surface, water (water vapor) collecting surface, surface having an anti-icing•anti-snow surface or a minus refractive index, absorbent, adhesiveless pressure-sensitive sheet, fuel cell and the like.

The present application is based on Japanese Patent Application No. 2012-134287 filed on Jun. 13, 2012, Japanese Patent Application No. 2012-167556 filed on Jul. 27, 2012, and Japanese Patent Application No. 2012-280226 filed on Dec. 21, 2012, entire contents of which are expressly incorporated by reference herein.

The invention claimed is:

1. A function transfer product for transferring a functional layer onto a target object, the function transfer product comprising:

a carrier provided with a concavo-convex structure on a main surface thereof; and at least one functional layer or more provided on the concavo-convex structure, wherein an average pitch of the concavo-convex structure ranges from 1 nm to 1500 nm, the functional layer comprises a resin containing a photocurable monomer, a ratio (Ra/lor) between surface roughness (Ra) on an exposed surface side that is on an opposite side of the functional layer with respect to the carrier and a distance (lor) between a top position of a convex-portion of the concavo-convex structure and the exposed surface of the functional layer is in a range from 0.002 to 1.2, a mass average molecular weight of the resin ranges from 1,000 to 60,000, the surface roughness (Ra) ranges from 2 nm to 300 nm, the exposed surface side that is on an opposite side of the functional layer with respect to the carrier is in a non-liquid state at 20° C. under light shielding, and in a temperature range of exceeding 20° C. to 300° C., the exposed surface side that is on an opposite side of the functional layer with respect to the carrier of the function transfer product exhibits tackiness, or tackiness of the exposed surface is increased.

2. The function transfer product according to claim 1, wherein the resin contains a polar group.

3. The function transfer product according to claim 2, wherein the polar group contains at least one polar group or more selected from the group consisting of an epoxy group, a hydroxyl group, an acryloyl group, a methacryloyl group, a vinyl group, a carboxyl group, and a carbonyl group.

4. The function transfer product according to claim 2, wherein the functional layer contains a photocurable substance.

5. The function transfer product according to claim 2, wherein the ratio (Ra/lor) is 0.75 or less.

6. The function transfer product according to claim 5, wherein an average aspect (A) of the concavo-convex structure ranges from 0.1 to 5.0.

7. The function transfer product according to claim 6, wherein the ratio (Ra/lor) is 0.25 or less.

8. The function transfer product according to claim 1, wherein the carrier is provided with a concavo-convex structure A on a part or whole of the surface, in the concavo-convex structure A a ratio (Mcv/Mcc) between a top width of a convex-portion (Mcv) and an opening width of a concave-portion (Mcc) and a ratio (Sh/Scm) between an opening portion area (Sh) existing in a region of a unit area (Scm) of the concavo-convex structure A and the unit area (Scm) meet following equation (1), the ratio (Sh/Scm) meets following equation (2), the ratio (Mcv/Mcc) meets following equation (3), and the average aspect (A) of the concavo-convex structure A meets following equation (4),

[Mathematical Expression 1]

$$\sqrt{0.5/(Sh/Scm)}-1 \leq Mcv/Mcc \leq \sqrt{1.1/(Sh/Scm)}-1 \quad \text{Eq. (1)}$$

$$0.23 < (Sh/Scm) \leq 0.99 \quad \text{Eq. (2)}$$

$$0.01 \leq (Mcv/Mcc) < 1.0 \quad \text{Eq. (3)}$$

$$0.1 \leq A \leq 5. \quad \text{Eq. (4)}$$

9. The function transfer product according to claim 1, wherein the resin contains a cyclic portion.

10. The function transfer product according to claim 9, wherein the cyclic portion is comprised of at least one or more elements selected from the group consisting of a 4-membered ring, a 5-membered ring and a 6-membered ring.

11. The function transfer product according to claim 9, wherein the functional layer contains the resin and a monomer.

12. The function transfer product according to claim 9, wherein the functional layer contains a photocurable resin or a photocurable monomer.

13. The function transfer product according to claim 1, wherein the concavo-convex structure contains at least one or more elements selected from the group consisting of a fluorine element, a methyl group and a siloxane bond.

14. The function transfer product according to claim 13, wherein a ratio (Es/Eb) between a surface layer fluorine element concentration (Es) on the functional layer surface side of the concavo-convex structure and an average fluorine element concentration (Eb) of the concavo-convex structure exceeds 1 and is 30000 or less.

15. The function transfer product according to claim 1, wherein the carrier is in the shape of a film, and a width of the carrier is 3 inches or more.

16. A functional layer transfer method including:

a step of directly bringing the functional layer of the function transfer product according to claim 1 into contact with one main surface of a target object; and a step of removing the carrier from the functional layer, in this order.

17. A packed product, wherein the function transfer product according to claim 1 is packed in a resin-made case.

18. A function transfer film roll, wherein the function transfer product according to claim 1 is in the shape of a film, one end portion of the function transfer product is connected to a core, and the function transfer product is wound around the core.

* * * * *